US010356925B2

(12) United States Patent
Nordin et al.

(10) Patent No.: US 10,356,925 B2
(45) Date of Patent: Jul. 16, 2019

(54) CABLE PATHWAY SYSTEM FOR NETWORK ARCHITECTURE

(71) Applicant: Panduit Corp., Tinley Park, IL (US)

(72) Inventors: Ronald A. Nordin, Naperville, IL (US); Alva B. Eaton, Nottingham Park, IL (US)

(73) Assignee: Panduit Corp., Tinley Park, IL (US)

( * ) Notice: Subject to any disclaimer, the term of this patent is extended or adjusted under 35 U.S.C. 154(b) by 0 days.

(21) Appl. No.: 16/108,412

(22) Filed: Aug. 22, 2018

(65) Prior Publication Data
US 2018/0376608 A1  Dec. 27, 2018

Related U.S. Application Data

(62) Division of application No. 14/847,442, filed on Sep. 8, 2015, now Pat. No. 10,076,049, which is a division (Continued)

(51) Int. Cl.
*H05K 7/02*  (2006.01)
*H04Q 1/02*  (2006.01)
(Continued)

(52) U.S. Cl.
CPC ............ *H05K 7/02* (2013.01); *H04Q 1/025* (2013.01); *H04Q 1/06* (2013.01); *H04Q 1/11* (2013.01);
(Continued)

(58) Field of Classification Search
CPC .......... H05K 7/02; H05K 7/20; H05K 5/0247; H05K 5/0213; H05K 7/183; H05K 7/1491;
(Continued)

(56) References Cited

U.S. PATENT DOCUMENTS 2,328,724 A * 9/1943 Johnson ............... H04Q 1/06
  379/325
5,574,251 A * 11/1996 Sevier ............... H05K 7/183
  174/50

(Continued)

FOREIGN PATENT DOCUMENTS

EP  1455542 A1  9/2004
WO  2009058928 A1  5/2009

OTHER PUBLICATIONS

Cisco Cabling for Next Generation Data Center, 101 pages, 2010.
(Continued)

*Primary Examiner* — Muhammad Ijaz
(74) *Attorney, Agent, or Firm* — Christopher S. Clancy; James H. Williams; Aimee E. McVady

(57) ABSTRACT

A cable management system for a network cabinet has first and second server equipment rails, first and second air dams, and a front cable support. The server equipment rails are mounted to a base frame of the network cabinet such that the server equipment rails extend from the base frame towards a front of the network cabinet. The air dams are mounted to the base frame of the network cabinet such that the air dams extend from the base frame towards opposing sides of the network cabinet. The front cable support has a generally U-shaped tray that is connected to the first and second server equipment rails such that the tray extends across a front of the network cabinet, transverse to the server equipment rails.

14 Claims, 81 Drawing Sheets

Related U.S. Application Data of application No. 13/455,471, filed on Apr. 25, 2012, now Pat. No. 9,185,824.

(60) Provisional application No. 61/479,382, filed on Apr. 26, 2011.

(51) Int. Cl.
   *H05K 7/14* (2006.01)
   *H04Q 1/06* (2006.01)
   *H05K 7/18* (2006.01)

(52) U.S. Cl.
   CPC ........... *H05K 7/1491* (2013.01); *H05K 7/183* (2013.01); *Y10T 29/49826* (2015.01)

(58) Field of Classification Search
   CPC ............. H05K 7/1497; H05K 7/20554; H05K 7/20745; H04Q 1/06; H04Q 1/11; H04Q 1/025; G06Q 10/087; G06Q 10/08; G07F 9/026; G07F 17/3202; G07F 17/3223; G07F 17/32; G06F 19/00; G06F 19/3456
   USPC ........................................ 248/60, 68.1, 74.4
   See application file for complete search history.

(56) References Cited

U.S. PATENT DOCUMENTS

| | | | |
|---|---|---|---|
| 6,170,784 B1 | 1/2001 | MacDonald et al. | |
| 6,245,998 B1 | 6/2001 | Curry et al. | |
| 6,394,398 B1 | 5/2002 | Reed et al. | |
| 6,468,112 B1* | 10/2002 | Follingstad | G02B 6/4452 |
| | | | 385/135 |
| 6,577,498 B1 | 6/2003 | Land et al. | |
| 6,985,357 B2 | 1/2006 | Cauthron | |
| 7,119,280 B1 | 10/2006 | Ray et al. | |
| 7,142,416 B2 | 11/2006 | Subbarao et al. | |
| 7,327,563 B2 | 2/2008 | Cauthron | |
| 7,452,236 B2 | 11/2008 | Verdiell et al. | |
| 7,547,845 B2 | 6/2009 | Azemard | |
| 7,601,988 B2 | 10/2009 | Seo et al. | |
| 7,643,291 B2 | 1/2010 | Mallia et al. | |
| 7,715,207 B2 | 5/2010 | Behrens et al. | |
| 7,855,885 B2 | 12/2010 | Adducci et al. | |
| 2002/0020682 A1 | 2/2002 | Broome | |
| 2003/0079901 A1 | 5/2003 | Chan | |
| 2004/0099771 A1 | 5/2004 | Schloss | |
| 2004/0173545 A1 | 9/2004 | Canty et al. | |
| 2004/0231875 A1 | 11/2004 | Rasmussen et al. | |
| 2007/0165618 A1 | 7/2007 | Niazi et al. | |
| 2007/0175836 A1 | 8/2007 | Bumeder et al. | |
| 2007/0210680 A1 | 9/2007 | Appino et al. | |
| 2007/0221393 A1* | 9/2007 | Adducci | E05C 9/043 |
| | | | 174/50 |
| 2007/0293138 A1* | 12/2007 | Adducci | H05K 7/186 |
| | | | 454/184 |
| 2008/0023212 A1 | 1/2008 | Larsen et al. | |
| 2008/0111032 A1 | 5/2008 | Yang et al. | |
| 2008/0247132 A1 | 10/2008 | Kosacek et al. | |
| 2008/0273306 A1 | 11/2008 | Campbell et al. | |
| 2008/0290611 A1* | 11/2008 | Dukes | H02G 3/22 |
| | | | 277/637 |
| 2009/0014614 A1* | 1/2009 | Warmoth | H05K 7/1489 |
| | | | 248/309.1 |
| 2009/0147944 A1* | 6/2009 | McSorley | H05K 7/186 |
| | | | 379/454 |
| 2009/0179116 A1* | 7/2009 | St-Louis | G02B 6/4452 |
| | | | 248/68.1 |
| 2009/0236117 A1* | 9/2009 | Garza | H02G 3/30 |
| | | | 174/100 |
| 2009/0321371 A1* | 12/2009 | Rathbone | H05K 7/1491 |
| | | | 211/26.2 |
| 2010/0012370 A1 | 1/2010 | Larsen et al. | |
| 2010/0142544 A1 | 6/2010 | Chapel et al. | |
| 2010/0200707 A1* | 8/2010 | Garza | H02G 3/0456 |
| | | | 248/68.1 |
| 2010/0219726 A1 | 9/2010 | Nicewicz et al. | |
| 2010/0302754 A1 | 12/2010 | Nordin et al. | |
| 2011/0051341 A1 | 3/2011 | Baldassano et al. | |
| 2011/0069436 A1 | 3/2011 | Jian | |
| 2011/0074117 A1 | 3/2011 | Caveney et al. | |
| 2012/0063099 A1* | 3/2012 | Alaniz | H05K 7/1447 |
| | | | 361/724 |
| 2012/0273438 A1* | 11/2012 | Nordin | H04Q 1/025 |
| | | | 211/26 |
| 2016/0262277 A1* | 9/2016 | Lewis, II | H05K 5/0234 |
| 2017/0223865 A1* | 8/2017 | Lewis, II | H05K 5/0234 |
| 2017/0325353 A1* | 11/2017 | Cox | H05K 7/1491 |

OTHER PUBLICATIONS

Panduit® Installation Guidelines, 10 Gig™ SPF+ Direct Attach Copper Cable Assembly PN533A, 7 pages, 2010.
Panduit® Data Centers Mapping Cosco Nexus, Catalyst, and MDS Logical Architectures into Panduit Physical Layer Infrastructure Solutions, 11 pages, Apr. 2008.

* cited by examiner

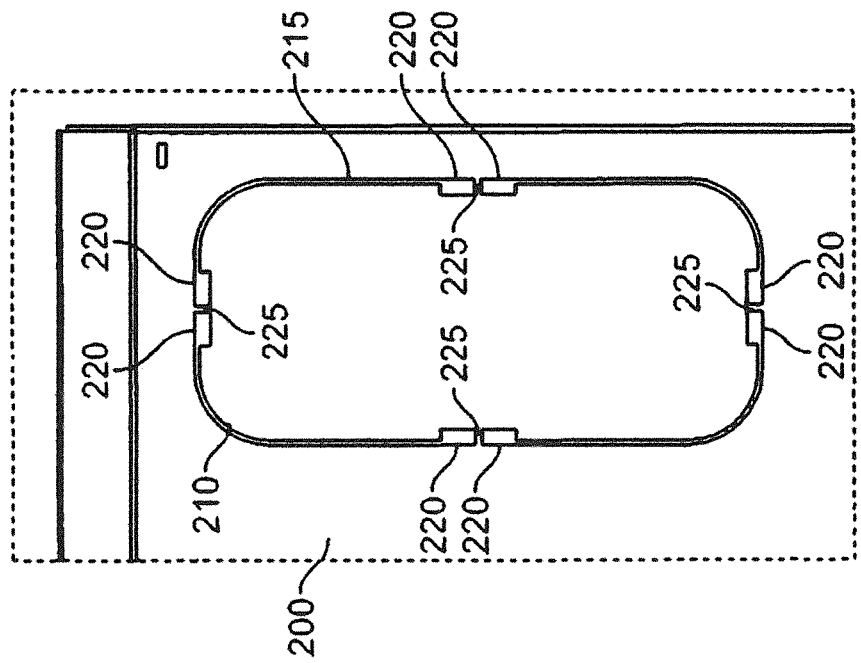
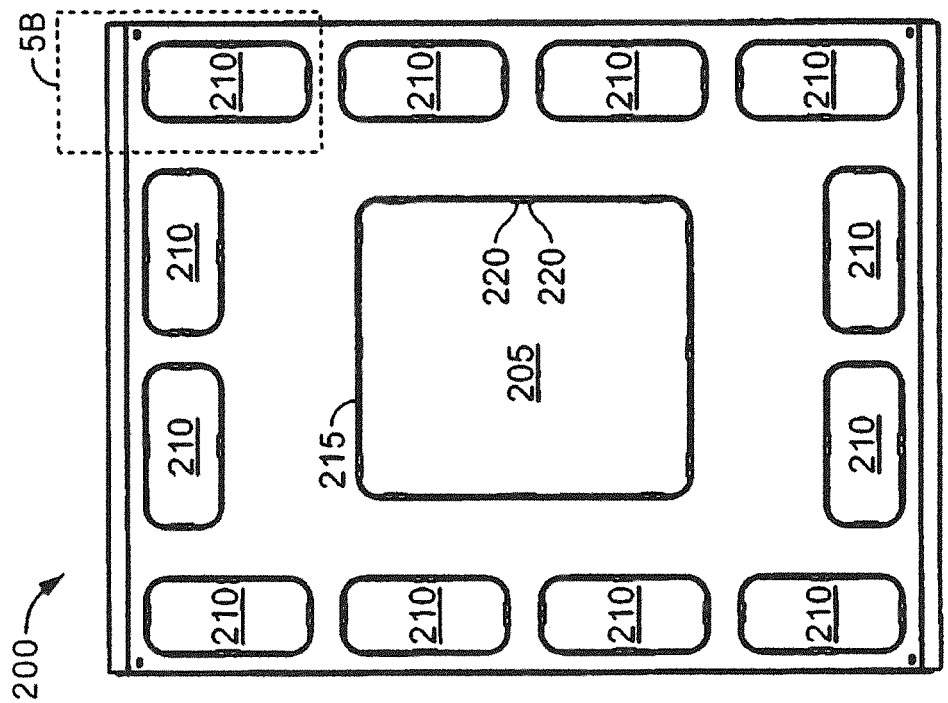

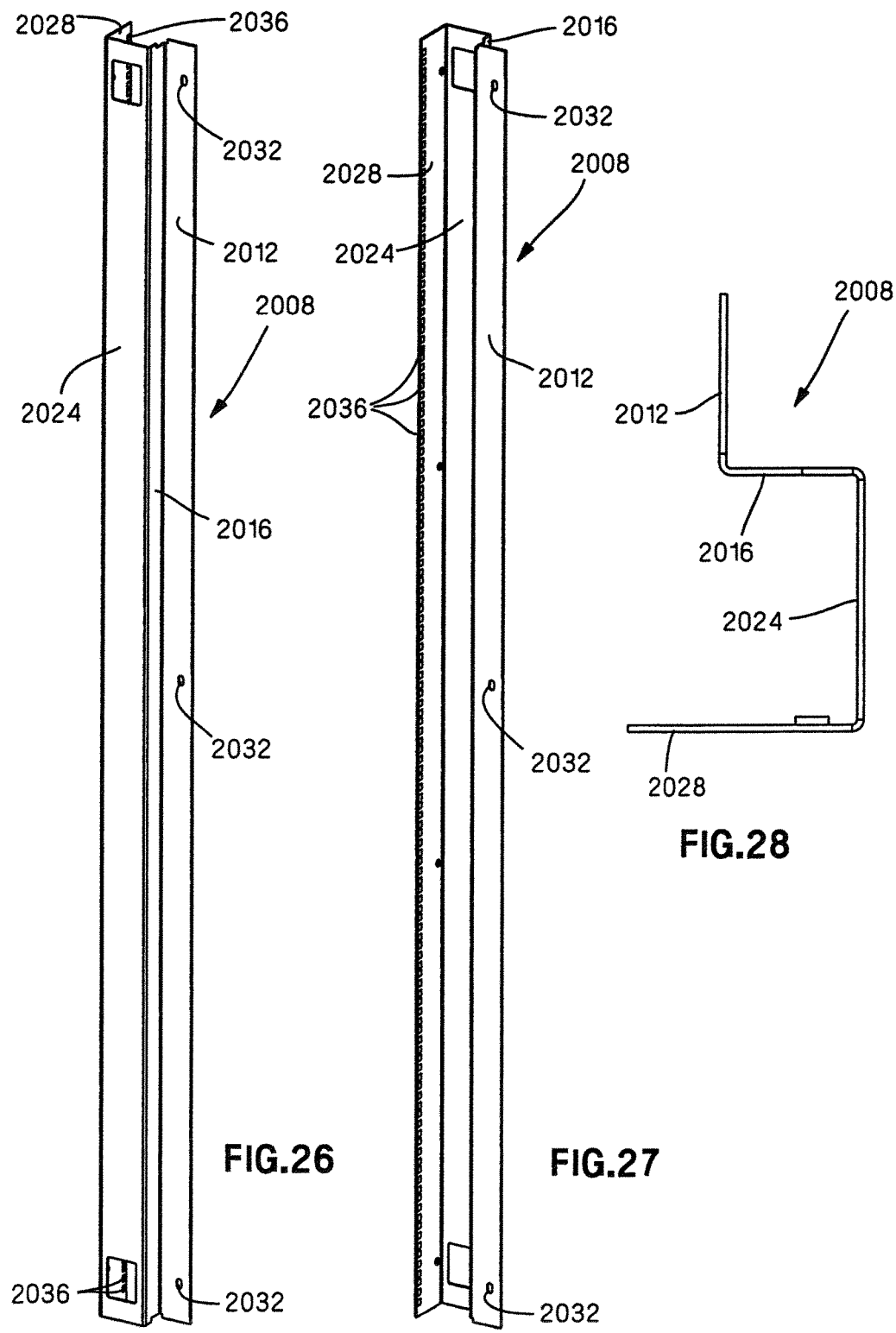

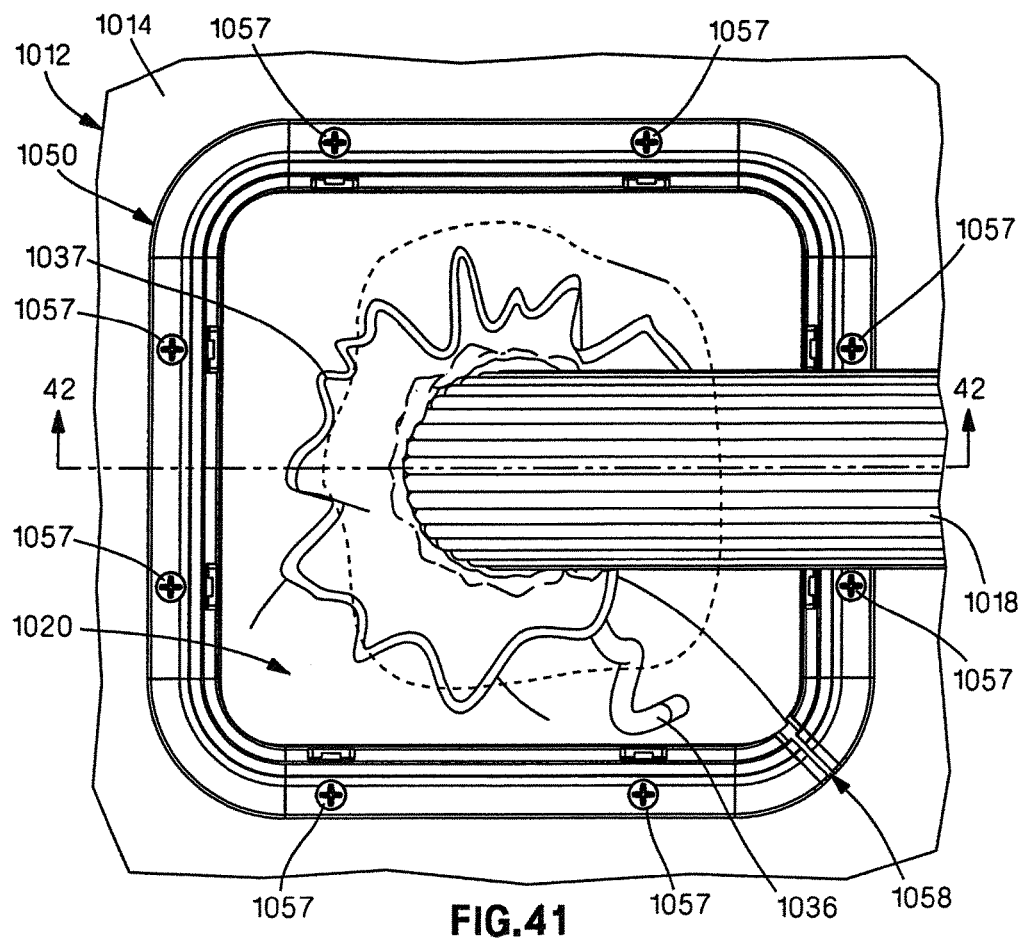
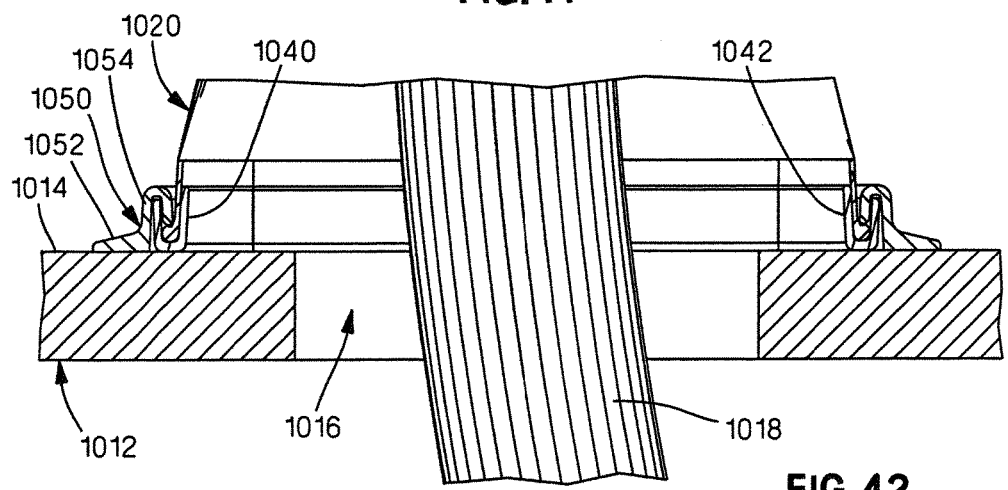

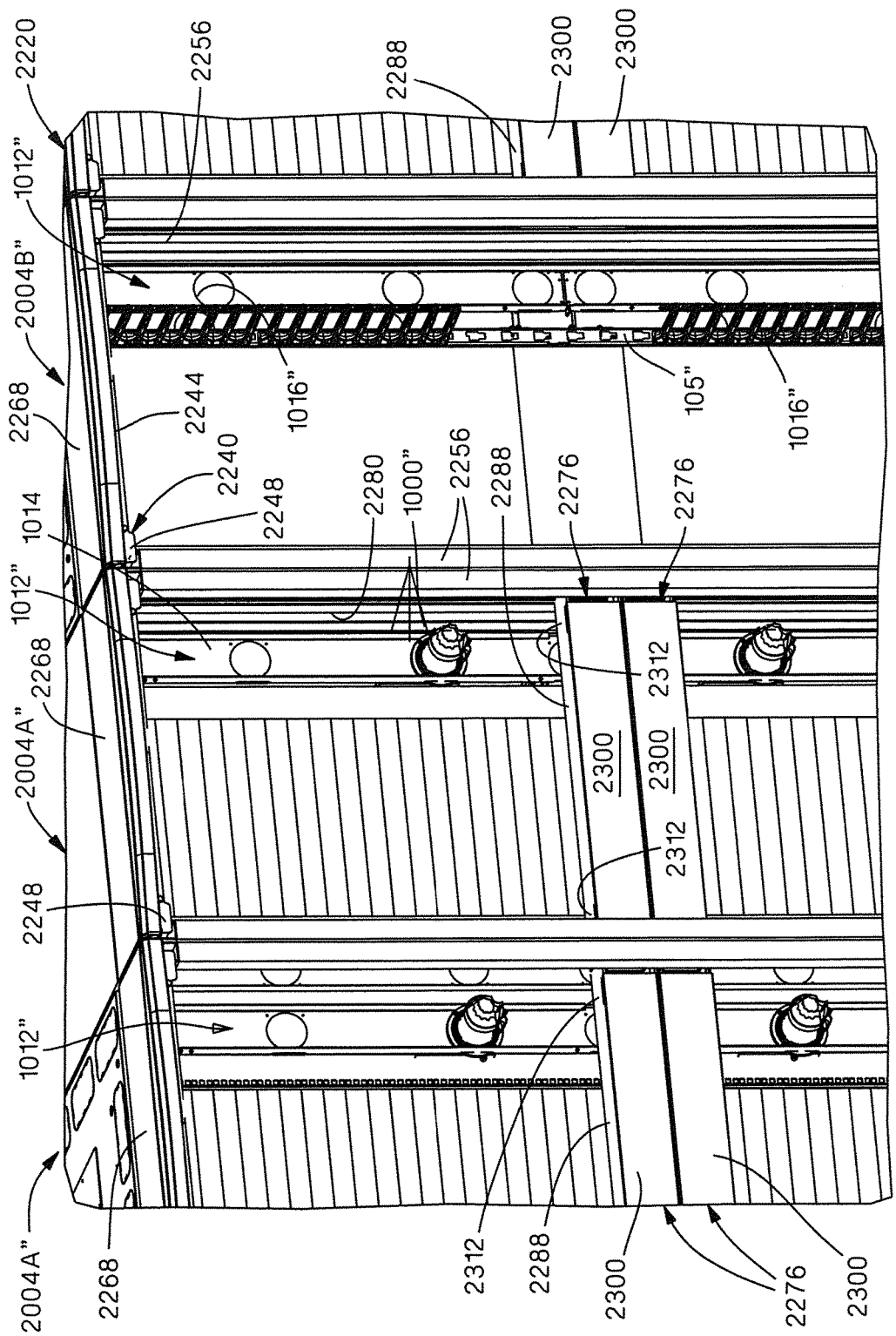

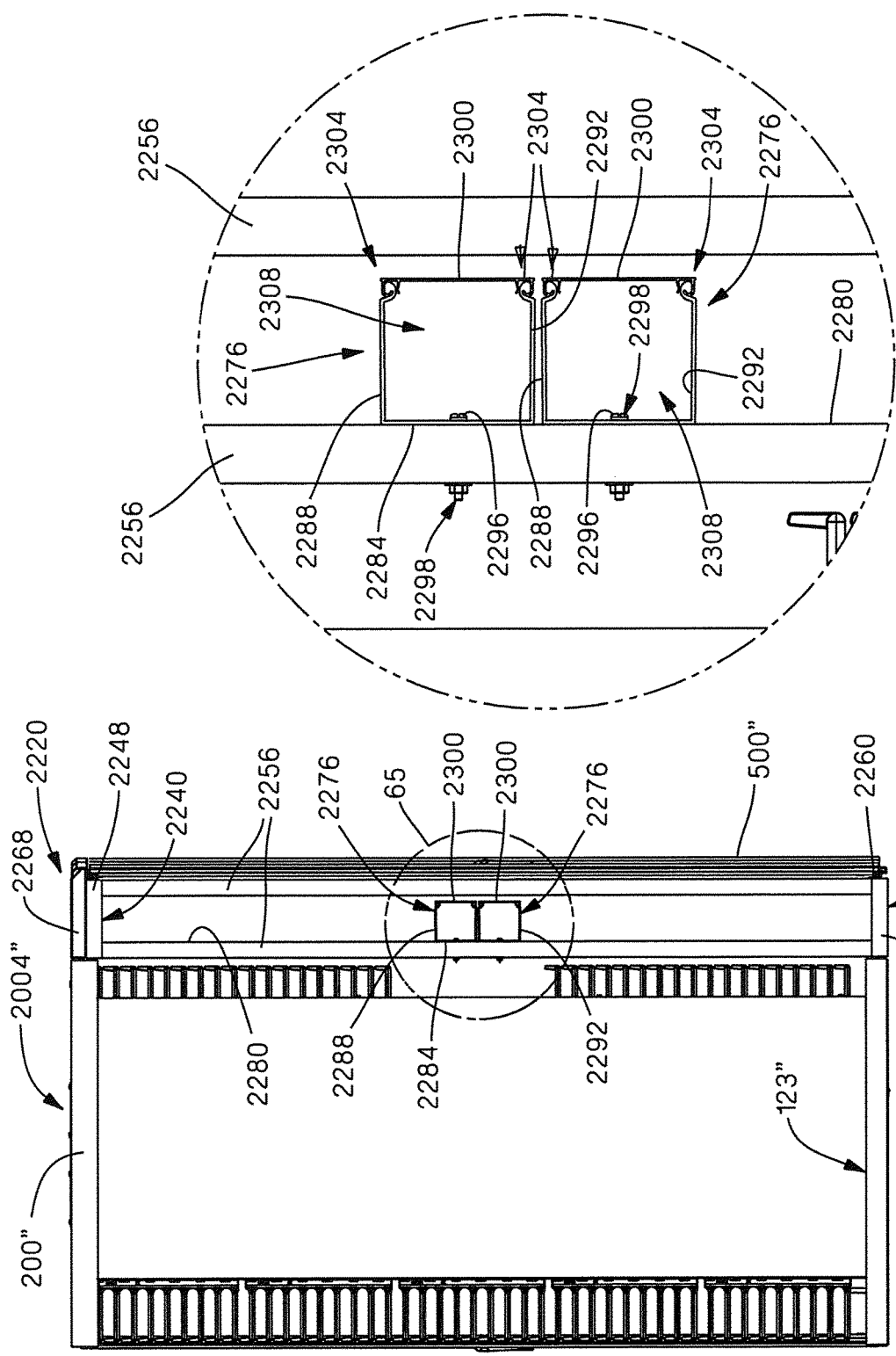

CABLE PATHWAY SYSTEM FOR NETWORK ARCHITECTURE

ROSS-REFERENCE TO RELATED APPLICATIONS

This application is a divisional of U.S. patent application Ser. No. 14/847,442, filed Sep. 8, 2015, which is a divisional of U.S. patent application Ser. No. 13/455,471, filed Apr. 25, 2012, which issued as U.S. Pat. No. 9,185,824 on Nov. 10, 2015, and claims the benefit of U.S. Provisional Patent Application No. 61/479,382, filed Apr. 26, 2011, and entitled Cable Pathway System for Network Architecture, which is incorporated herein by reference.

FIELD OF INVENTION

This invention relates to network cabinets for cable connections and, more particularly, to grounded cabinets for switching, server, and patching applications.

BACKGROUND

There is a need for cabinets that provide cabinet access to the internal portions of the cabinet to install or modify cable connections and to provide less obtrusive ways to ground the cabinet, as well as other features that provide efficiencies and conveniences.

High performance data center architects desire to utilize 10G SFP+ passive copper cabling to interconnect servers to switches due to its low latency, low power, and low cost as compared to competitive cabling alternatives such as, for example, copper 10G-Base-T or fiber 10G-Base-SR. However, when used in a passive manner, 10G SFP+ copper cabling has a length limitation of 7 meters, thereby limiting the number of network cabinets that can be ganged together and connected with 10G SFP+ cabling. Conventionally, when using 10G SFP+ cabling, switches and servers would have to be in the same network cabinet or, at most, in an immediately adjacent network cabinet.

Additionally, network architects have a desire to treat a network cabinet as a removable component. However, cabling extending between ganged together network cabinets extends through the network cabinets and must be disconnected from electrical components and pulled from a network cabinet prior to removal of the network cabinet. This is an extremely daunting task requiring significant time and makes it difficult for the architect to keep the disconnected cables organized for reconnection to a new network cabinet when replacing the removed network cabinet.

SUMMARY

The present invention relates generally to an improved cable management system for network architecture.

In one embodiment, a cable management system for a network cabinet is provided comprising first and second server equipment rails, first and second air dams, and a front cable support. The first and second server equipment rails and first and second air dams are configured for mounting to a base frame of the network cabinet. The front cable support comprising a generally U-shaped tray connected to the first and second server equipment rails and extends across a front of the network cabinet.

In another embodiment, a method of installing a cable management system is provided comprising the steps of: mounting first and second server equipment rails to a base frame of a network cabinet such that the server equipment rails extend from the base frame towards a front of the network cabinet; mounting first and second air dams to the base frame of the network cabinet such that the air dams extend from the base frame towards opposing sides of the network cabinet; and connecting a generally U-shaped tray to the first and second server equipment rails such that the tray extends transverse to the first and second equipment rails.

In another embodiment, a cable management system for a data center set up with a middle of row (MOR) architecture is provided. The data center comprises a server cabinet, a plurality of intermediate network cabinets and an end network cabinet positioned on a first side of the server cabinet, and a second plurality of intermediate network cabinets and a second end network cabinet positioned on a second side of the server cabinet, opposite the first side. The cable management system comprises a pair of server equipment rails, a pair of air dams, and a front cable support. The server equipment rails are mounted to a base frame of each of the intermediate network cabinets and the air dams are mounted to the base frame of each of the intermediate network cabinets and end network cabinets. The front cable support comprises a generally U-shaped tray connected to the first and second server equipment rails of each of the intermediate network cabinets and extends across a front of the intermediate network cabinets.

In another embodiment, a cable management system for a network cabinet is provided comprising first and second air dams that are configured for mounting to a base frame of the network cabinet. A docking assembly is configured for connection to a front of the network cabinet and comprises a base frame defining an internal area. A generally C-shaped cable tray is connected to the docking assembly and is disposed within the internal area.

In another embodiment, a method of installing a cable management system for a network cabinet is provided, comprising the steps of: mounting first and second air dams to a base frame of the network cabinet such that the air dams extend from the base frame towards opposing sides of the network cabinet; connecting a docking assembly to a front of the network cabinet, the docking assembly comprising a base frame defining an internal area; and positioning a generally C-shaped cable tray within the internal area of the docking assembly and connecting the cable tray to the docking assembly.

BRIEF DESCRIPTION OF THE DRAWINGS

Certain embodiments of the present invention are illustrated by the accompanying figures. It should be understood that the figures are not necessarily to scale and that details that are not necessary for an understanding of the invention or that render other details difficult to perceive may be omitted. It should be understood, of course, that the invention is not necessarily limited to the particular embodiments illustrated herein.

FIG. 5A is a top view of the top cover of the network cabinet of the present invention;

FIG. 5B is an enlarged partial view of a cable entry knockout shown in FIG. 5A;

FIG. 26 is a top rear perspective view of a server equipment rail of the network cabinets shown in FIG. 22;

FIG. 27 is a top rear perspective view of the server equipment rail shown in FIG. 26;

FIG. 28 is a top view of the server equipment rail shown in FIG. 26;

FIG. 41 is a front view of the sealing assembly shown in FIG. 40;

FIG. 42 is a cross-sectional view taken along line 42-42 in FIG. 41;

FIG. 63 is a top front perspective view of a portion of the network cabinets and docking assemblies shown in FIG. 52;

FIG. 64 is an end view of one of the network cabinets and one of the docking assemblies shown in FIG. 52;

FIG. 65 is an enlarged detail of a portion of FIG. 64;

DETAILED DESCRIPTION

Figure 1:
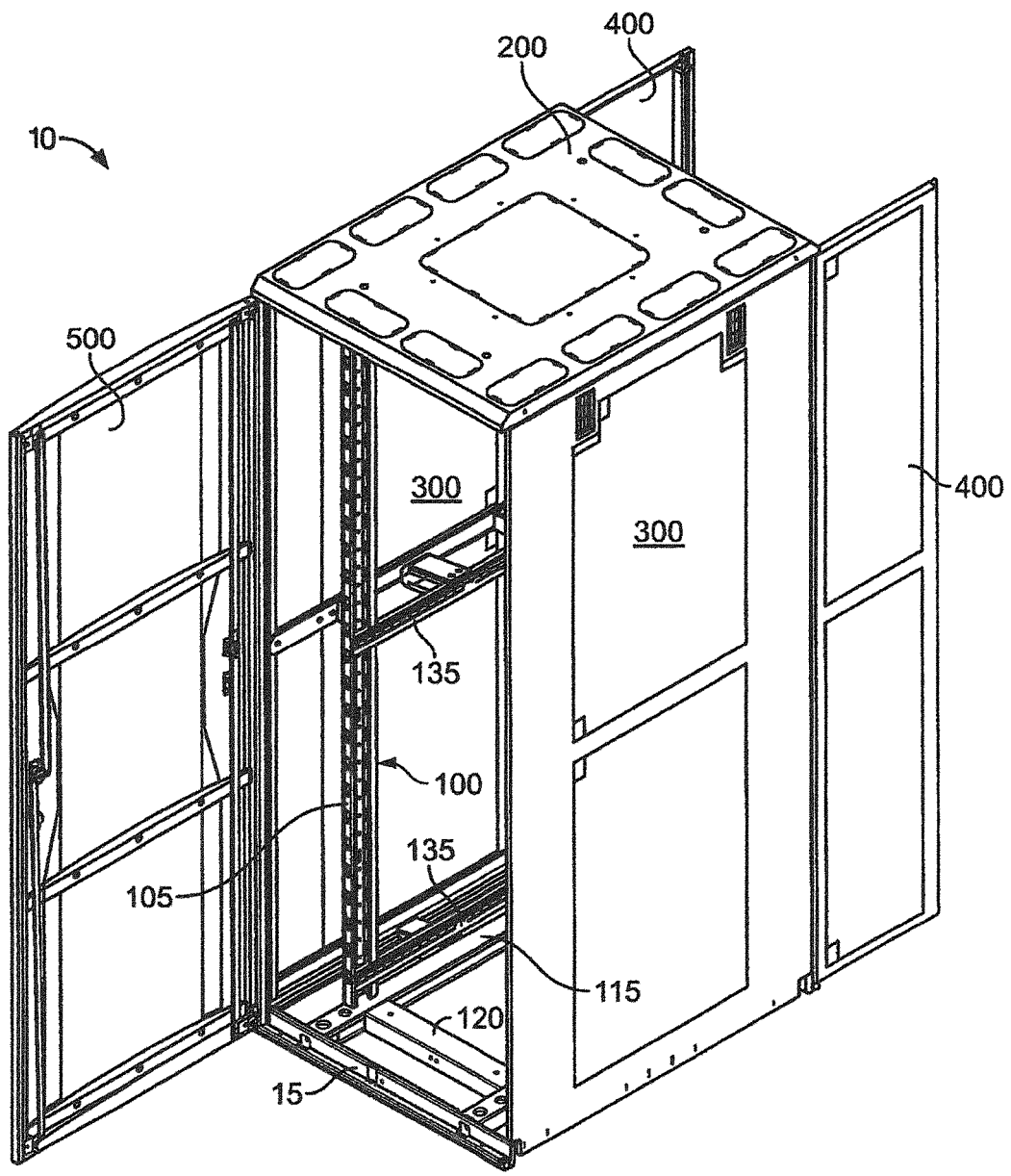
FIG. 1 is a front perspective view of the network cabinet of the present invention.

Referring to FIG. 1, one embodiment of a network cabinet 10 according to the present invention is shown. In the embodiment shown, the network cabinet generally includes a base frame 100, top cover 200, side panels 300, back doors 400, and front door 500. When fully assembled, the exemplary network cabinet is approximately 32 inches wide, 40 inches deep, and 84 inches high and has 45 rack units with a 2,000 pound load rating.

Figure 2A:
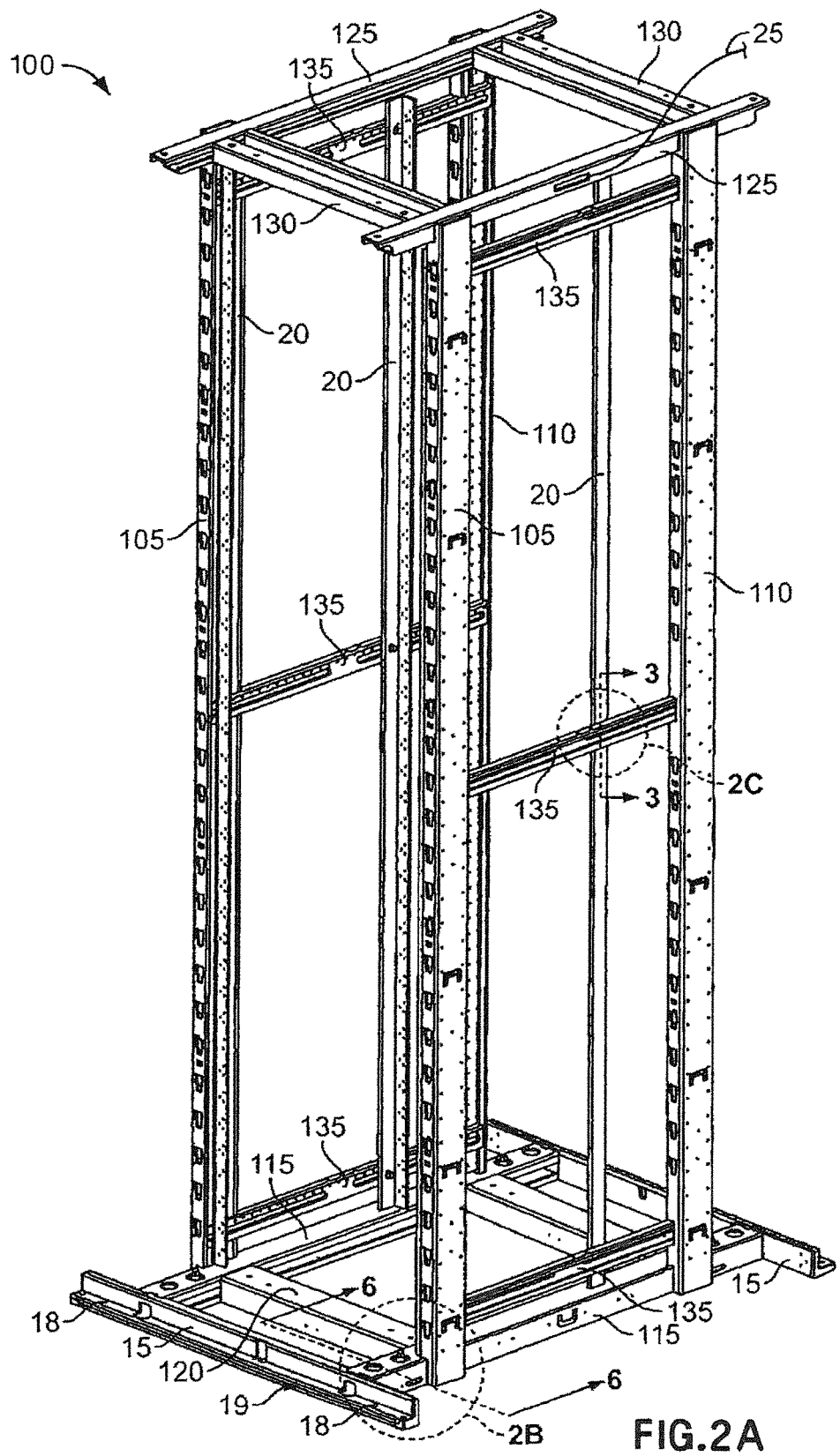
FIG. 2A is a front perspective view of the base frame of the network cabinet of the present invention.

Referring to FIG. 2A, an exemplary base frame 100 of the network cabinet 10 is shown. In this embodiment, the base frame 100 is conductive and generally includes a pair of front vertical frame rails 105, a pair of back vertical frame rails 110, a pair of front to back base beams 115, a pair of side to side base beams 120, a pair of front to back top beams 125, a pair of side to side top beams 130, and front to back support beams 135, all of which are typically steel but can be made of any suitable conductive or non-conductive material. As can be seen in FIGS. 1 and 2A and as described in more detail below, the front and back vertical frame rails 105, 110 are inset from side panels 300, back doors 400, front door 500, and the corners of the network cabinet 10 that are formed by side panels 300, back doors 400, and front door 500. This inset provides unobstructed space along all of the sides of the network cabinet 10 for cable management pathways.

In the embodiment shown, the side to side base beams 120 have a rectangular cross-section geometry and are positioned between and perpendicular to the front to back base beams 115, which also have a rectangular cross-section geometry. The side to side base beams 120 are welded to the front to back base beams 115 and, along with the door mounts 15, form a base member for the network cabinet and define openings 123, as seen in FIG. 2D as the cross-hatched areas. The front vertical frame rails 105 and back vertical frame rails 110 have a generally "C" shaped cross-section geometry and are positioned vertically on the front to back base beams 115 and welded to the front to back base beams 115. The space created by setting frame rails 105, 110 back from the side panels 300 provides cable management pathway between the frame rails 105, 110 and the side panels 300 when the network cabinet is fully assembled.

The side to side top beams 130 have a generally "U" shaped cross-section geometry and are positioned between and perpendicular to the front to back top beams 125, which have a generally "C" shaped cross-section geometry. The side to side top beams 130 are welded to the front to back top beams 125 to form a support for the top cover and are supported by vertical frame rails 105, 110. The front to back top beams 125 are positioned at the top end of the front and back vertical frame rails 105, 110 and welded to the front and back vertical frame rails 105, 110. The front and back vertical frame rails 105, 110 are positioned so that they are set back from the corresponding ends of the front to back base beams 115. The space created by setting the frame rails 105, 110 back from the ends of the front to back base beams 115 provides a cable management pathway between the frame rails 105, 110 and the front and back doors 500, 400 when the network cabinet is fully assembled.

In the embodiment shown, the front to back support beams 135 have a generally "C" shaped cross-section geometry, are positioned between and perpendicular to corresponding front and back vertical frame rails 105, 110, and are welded to the front and back vertical frame rails 105, 110. By welding together all of the steel components of the base frame 100, the base frame 100 is a single conductive, bonded unit. In this example, a ground whip 25 is bonded to front to back top beam 125 and is, in turn, connected at its opposing end to a main building ground. Ground whip 25 can also be attached to any other base frame 100 structural member to provide a single ground point for the base frame 100.

Figure 2B:
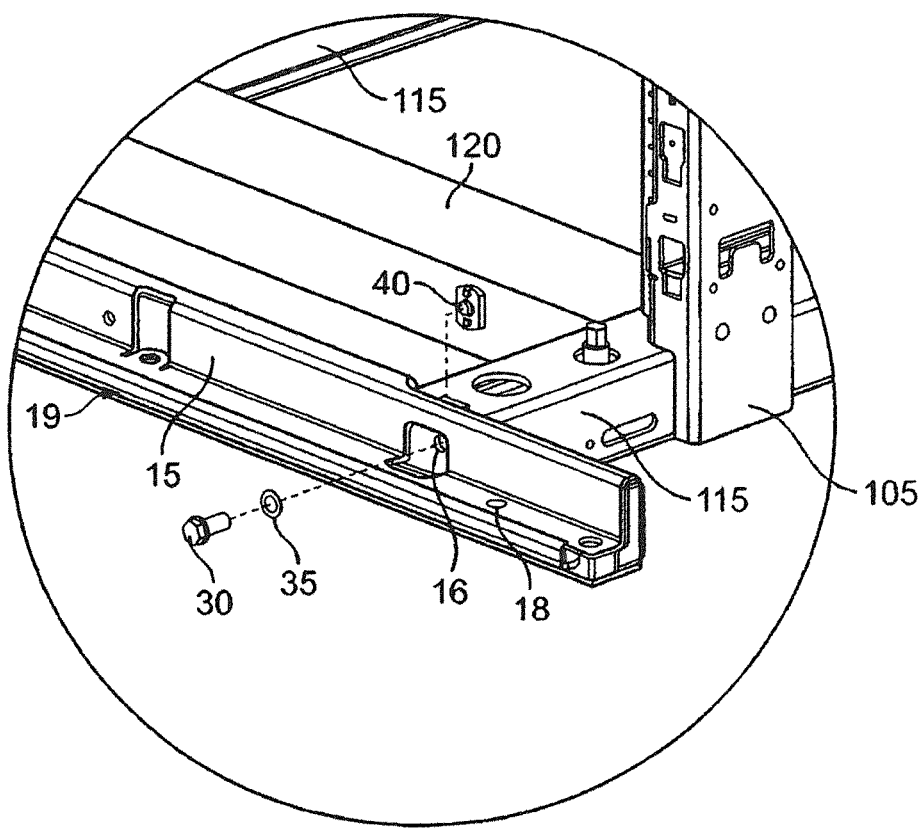
FIG. 2B is an enlarged partial exploded view of the front door mount and base frame shown in FIG. 2A.

Referring to FIGS. 2A and 2B, a pair of steel door mounts 15 are shown that have a generally "L" shaped cross-section geometry and are used to support the back and front doors 400, 500. Each door mount 15 is attached to an end of each front to back base beam 115 by bolts 30 that extend through holes 16 in the door mounts 15 and thread into nuts 40 that are welded to end caps (not shown), which are attached and bonded to the ends of the front to back base beams 115, such as by welding. In addition, as shown in FIG. 2B, at one of the two attachment points the door mount 15 is also bonded to the front to back base beam 115 by placing an internal tooth lock washer 35 between the bolt 30 and the door mount 15. The bolt 30 is inserted through the internal tooth lock washer 35 and through a hole 16 in the door mount 15 and is threaded into nut 40. The internal tooth lock washer 35 has teeth that pierce the paint or coating on the door mount 15 and bite into the metal of the door mount 15 to provide a ground path between the door mount 15 and the front to back base beam 115 through lock washer 35, bolt 30, and nut 40. An anti-oxidant paste could also be placed on the door mount 15, between the door mount 15 and lock washer 35, to prevent possible corrosion where the teeth of the lock washer 35 bite into the metal of the door mount 15. Alternatively, a regular washer could be used and the area around the hole 16 could be masked off or a serrated head bolt could be used in place of the bolt 30 and internal tooth lock washer 35 to similarly provide a bond between door mount 15 and front to back base beam 115 if bonding is desired.

Although the various elements of base frame 100 have been described above as having a particular geometry, being made of a particular material, and having particular connections, it will be understood that each of these elements could be made of varying geometries, varying materials, and connected by any suitable means as a particular application requires.

Figure 2C:
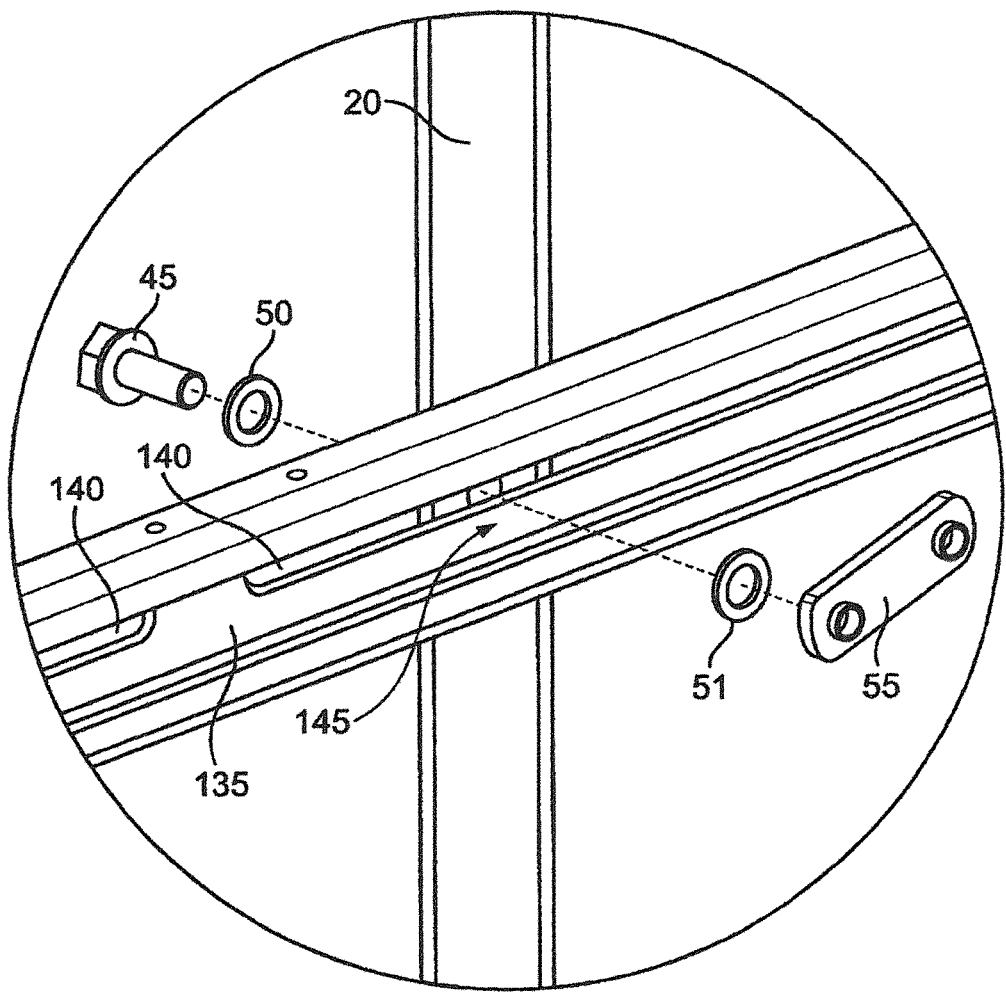
FIG. 2C is an enlarged partial exploded view of the adjustable equipment rail and base frame shown in FIG. 2A.
Figure 2D:
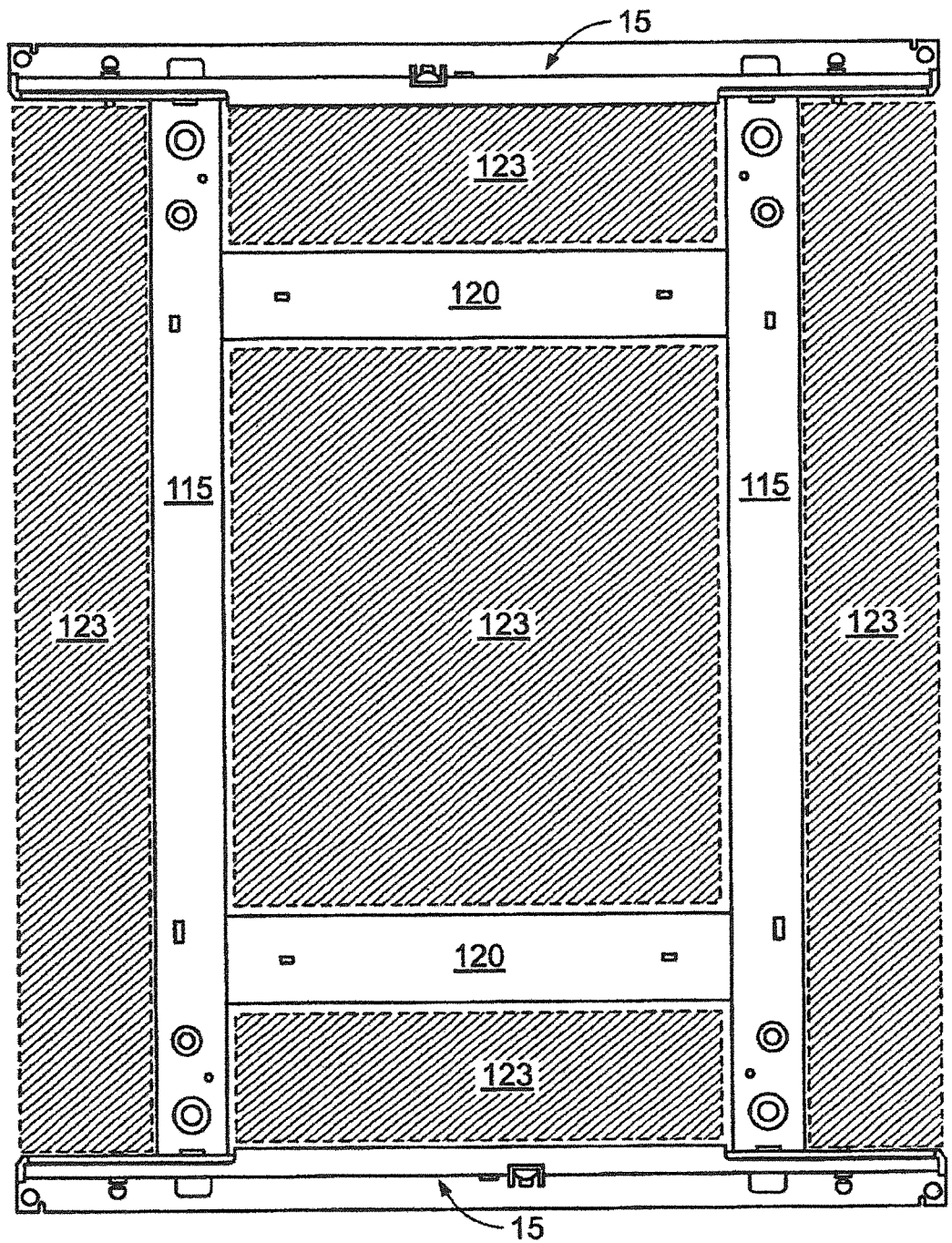
FIG. 2D is a top view of the base member of the network cabinet of the present invention.
Figure 3:
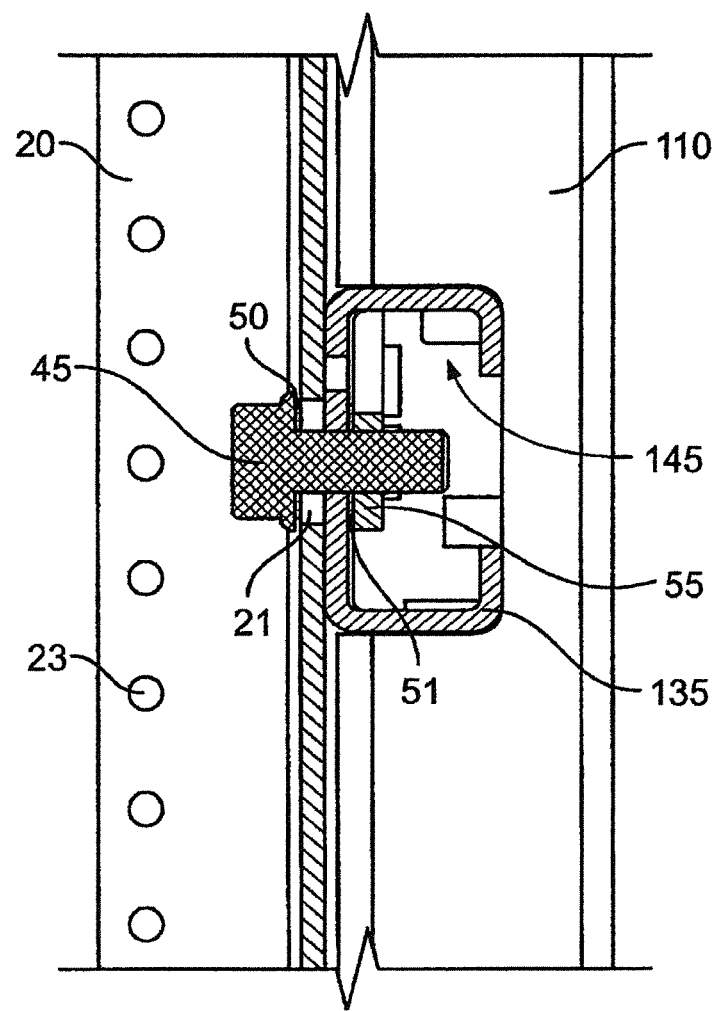
FIG. 3 is a cross-sectional view taken along line 3-3 in FIG. 2A.

Referring to FIGS. 2A, 2C, and 3, in this embodiment steel adjustable equipment rails 20 are shown that have a generally "L" shaped cross-section geometry and are used to mount equipment, such as patch panels, switches, or other network hardware equipment (not shown) in the network cabinet. Adjustable equipment rails 20 can also be made of other materials and have other geometries as required by a particular application. As can best be seen in FIG. 3, the equipment rails 20 each have a series of mounting holes 23 that are used to mount equipment to the equipment rails 20. In one example, the mounting holes 23 can be tapped holes that are threaded to accept a mounting bolt or screw (not shown) or in another example can be square holes that are adapted to accept a caged nut, which will then accept a mounting bolt or screw. In addition, as described in more detail below, the equipment rails 20 can be adjusted in relation to the frame rails 105, 110 by sliding them forward and backward along the front to back support beams 135. The equipment rails 20 enable equipment to be mounted at four points and in the exemplary network cabinet 10 can accommodate mounting depths of up to 25.9 inches.

Each equipment rail 20 can extend approximately from a front to back base beam 115 to the corresponding front to back top beam 125 and is connected to each of the three front to back support beams 135 which are each positioned at different elevations opposing sides of the base frame 100. In this embodiment, the equipment rails are connected to two of the front to back support beams 135 by inserting a bolt 45 through a hole 21 in one side of the equipment rail 20 and through a slot 140 (see FIG. 2C) in the front to back support beams 135 so that the threaded end of the bolt 45 extends into a channel 145 formed by the front to back support beam 135. A jam-nut 55 is positioned within the channel 145 and the bolt is threaded into the jam-nut 55. The jam-nut 55 here has an oblong configuration in which the length of the jam-nut 55 is greater than the width of the channel 145, thereby preventing rotation of the jam-nut 55 within the channel 145. The use of the jam-nut 55 allows the bolt 45 to be tightened without the need for a wrench or other tool to hold the nut securely within the channel 145. In addition, the use of bolt 45 and jam-nut 55 allows easy loosening of the connection between the adjustable equipment rails 20 and the front to back support beams 135, allowing for easy adjustment of the equipment rails 20 along front to back support beam 135.

In addition, as shown in FIGS. 2C and 3, in this embodiment at the third connection of equipment rail 20 to a front to back support beam 135, the connection is bonded by placing an internal tooth lock washer 50 between the bolt 45 and the equipment rail 20 and a second internal tooth lock washer 51 between the jam-nut 55 and the front to back support beam 135. The internal tooth lock washers 50, 51 have teeth that pierce the paint or coating and bite into the metal of the equipment rail 20 and front to back support beams 135. An anti-oxidant paste could also be placed on the equipment rail 20 and front to back support beam 135, underneath the lock washers 50, 51, to prevent possible corrosion where the teeth of the lock washers 50, 51 bite into the metal of the equipment rail 20 and front to back support beam 135. This provides a ground path from the equipment rail 20 to the front to back support beams 135 through the bolt 45, lock washers 50, 51, and jam-nut 55. This bonding makes adjustment of the equipment rails 20 more convenient since there are no jumper wires to disconnect and reconnect when the equipment rails 20 are moved. Alternatively, regular washers could be used and the area around the hole in the adjustable equipment rail 20 and the slot 140 in the front to back support beam 135 could be masked off or a serrated head bolt could be used in place of the bolt 45 and lock washer 50 if bonding is desired.

Figure 4A:
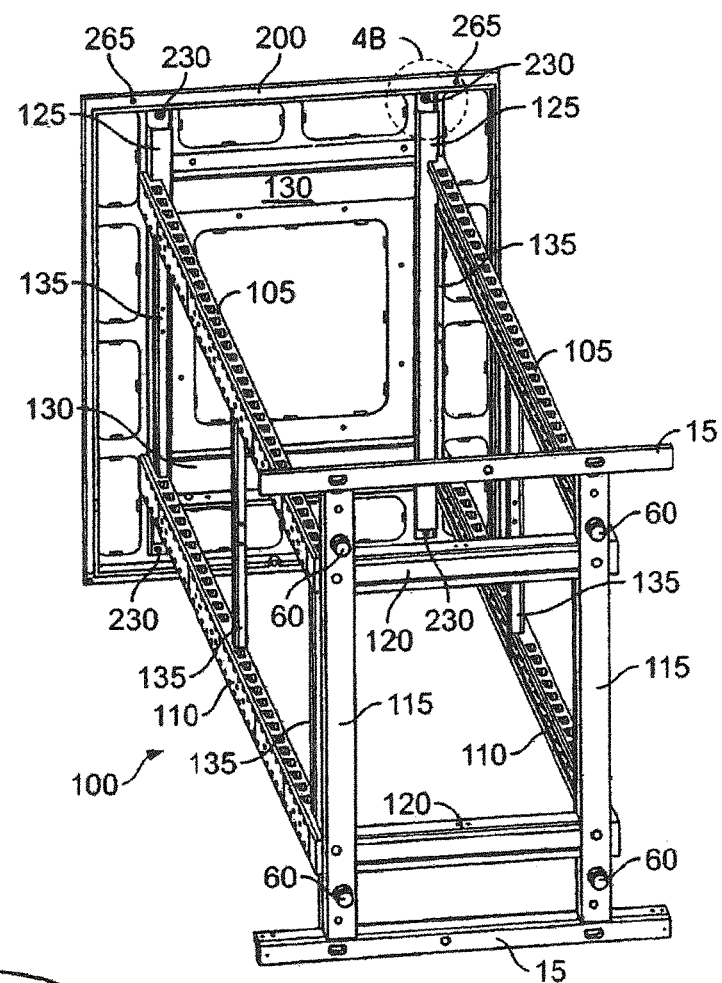
FIG. 4A is a bottom perspective view of the base frame of FIG. 2A and top cover of the network cabinet of the present invention.
Figure 4B:
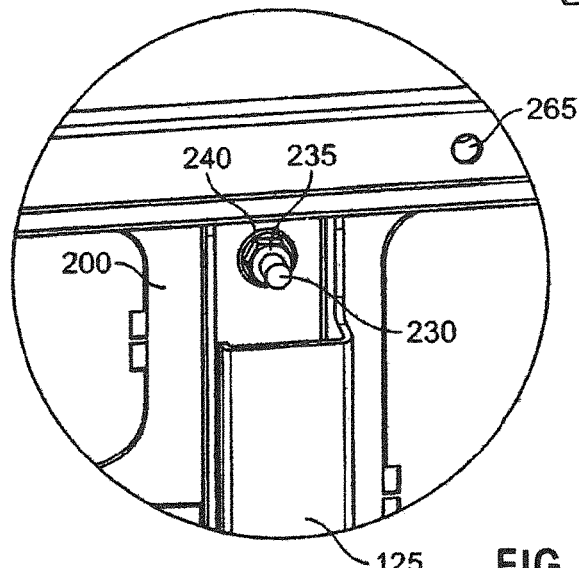
FIG. 4B is an enlarged partial view of the base frame and top cover shown in FIG. 4A.

Referring to FIGS. 4A and 4B, in this embodiment the top cover 200 is generally rectangular steel sheet having rolled over edges that is positioned on the front to back top beams 125 and side to side top beams 130 and secured to the front to back top beams 125. Four steel threaded members 230 are welded to the bottom side of the top cover 200 and extend from the bottom side of the top cover 200 such that they align with holes or slots (not shown) in the top surfaces of the front to back top beams 125. The threaded members 230 are aligned with and inserted into the holes in the front to back top beams 125 such that they extend through the holes. On three of the threaded members 230, hex nuts 235 are threaded onto the threaded members 230 to secure the top cover 200. On the fourth threaded member 230, the top cover 200 is also bonded to the front to back top beam 125 by placing an internal tooth lock washer 240 between the hex nut 235 and the front to back top beam 125. An anti-oxidant paste could also be placed on the front to back top beam 125, underneath the lock washer 240, to prevent possible corrosion where the teeth of the lock washer 240 bites into the metal of the front to back top beam 125. This provides a ground path from the top cover 200 to the front to back top beam 125 through the threaded member 230, hex nut 235, and lock washer 240. Alternatively, a regular washer could be used and the area around the hole in the front to back top beam 125 could be masked off or an internal tooth hex nut could be used in place of hex nut 235 and lock washer 240 if bonding is desired. In addition, top cover 200 could be constructed of any geometry and material and be connected via any means appropriate for a given application.

Referring to FIGS. 5A and 5B, the top cover 200 also has a center knockout 205 and multiple cable entry knockouts 210. The center knockout 205 can be removed to form an opening in top cover 200 to provide access to and ventilation for a fan mounted in the cabinet, for louvers, for cable entry, etc., and the cable entry knockouts 210 can be removed to form openings in top cover 200 to provide cable entry access in an over-head cable deployment application.

In this particular embodiment, each knockout 205, 210 is formed by cutting a slot 215 through the top cover 200 around the periphery of each knockout 205, 210. The slot 215 is cut almost completely around the periphery of each knockout 205, 210, except for the areas of the joining webs 225, which connect the main portion of the top cover 200 to the knockouts 205, 210 and hold the knockouts 205, 210 in place prior to removal. Each knockout 205, 210 has a minimum of four joining webs 225, as shown in FIG. 5B. The use of at least four joining webs 225 securely holds the knockouts 205, 210 in place in the installed position, whereas typical larger-size knockouts in sheet-metal components have been loosely held with only two joining webs and have been susceptible to inadvertent removal. In addition, at the end of each portion of the slot 215, there is an enlarged opening 220, which is sized to accept common hand tool cutters that can be used to cut the joining webs 225, which makes removal of the knockouts 205, 210 easier.

Figure 6:
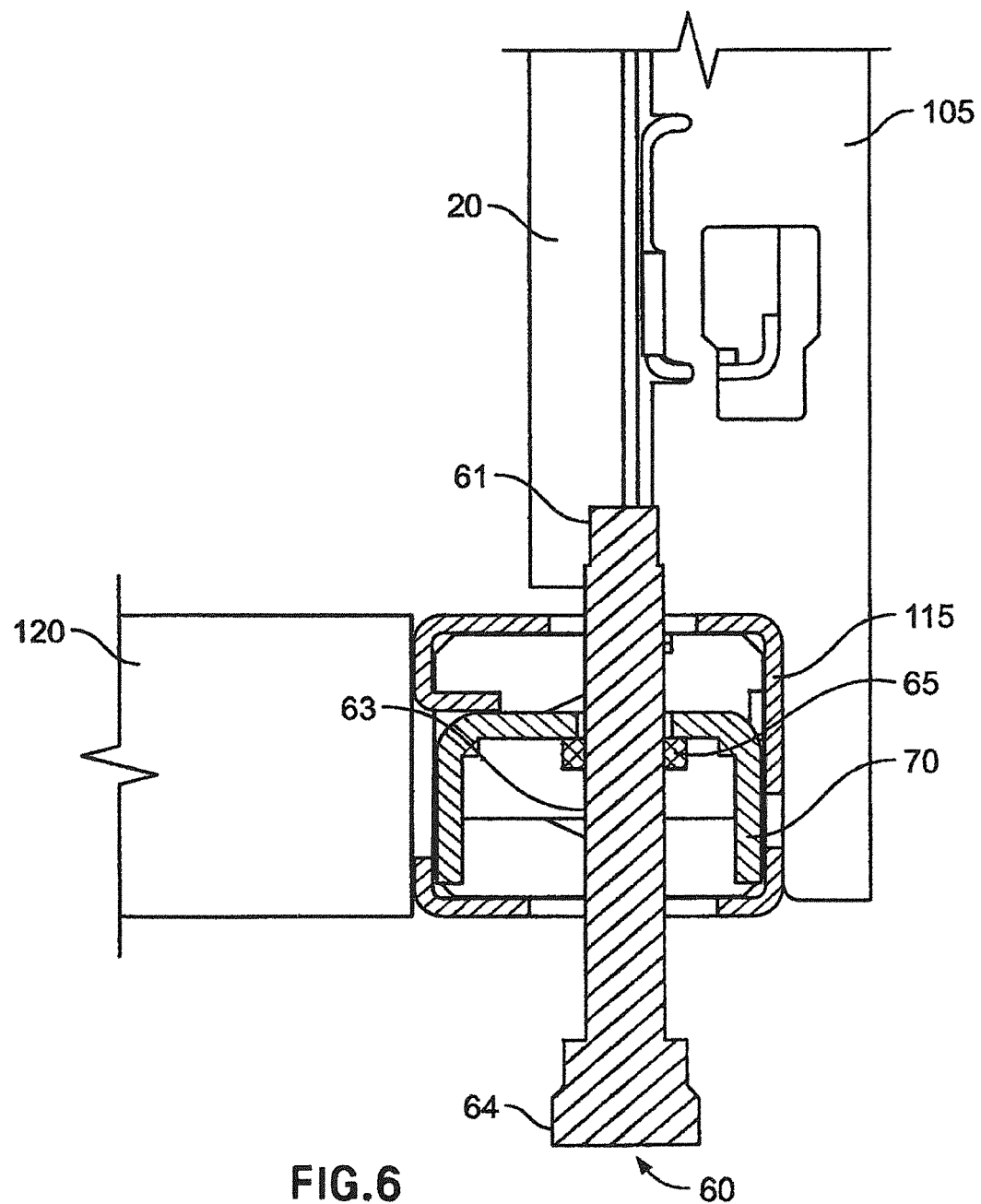
FIG. 6 is a cross-sectional view taken along line 6-6 in FIG. 2A.

Referring to FIGS. 4A and 6, four leveling legs 60 extend below the front to back base beams 115 to provide support and leveling capability for the network cabinet. As can best be seen in FIG. 6, in this embodiment each leveling leg 60 has a top portion 61 that extends through the top surface of the front to back base beam 115 and is accessible above the front to back base beam 115. The top portion 61 has a hexagonal or other cross-section that can be used with a socket wrench or other similar tool to raise and lower the leveling legs 60, as described below. Alternatively, the top portion 61 could be slotted so that it can be used with a screwdriver or other similar tool to raise and lower the leveling legs 60. Each leveling leg 60 also has a threaded body portion 63. The threaded body portion 63 is threaded through a nut 65 that is welded to a leveling leg support 70, which is attached and bonded to the front to back base beam 115, such as by welding. This secures the leveling leg 60 to the front to back base beam 115 and allows adjustment of the leveling leg 60, as discussed below. The foot 64 of the leveling leg is positioned below the front to back base beam 115 and is the portion of the leveling leg 60 that rests on the ground or floor to provide support.

With this construction, to adjust the height or level the network cabinet, a socket wrench or other similar tool is placed on the top portion 61 and the leveling leg 60 is rotated. As the leveling leg 60 is rotated, the interaction of the threaded body portion 63 and the nut 65 will raise or lower the leveling leg 60 depending on the direction of rotation. In this fashion, adjustment of the height of the front to back base beam 115 off of the floor can be accomplished. Being able to access and rotate the leveling legs 60 from the top allows the leveling legs 60 to be easily adjusted without having to tip or move the network cabinet. It also assists with the installation/removal of optional casters, which is discussed in more detail below. Furthermore, when casters are not installed, the leveling legs 60 can be fully retracted into the front to back base beams 115 so that the front to back base beams 115 and side to side base beams 120 will sit on the ground and the cabinet load will be distributed.

Referring to FIGS. 7A, 7B, 8A, and 9, the side panels 300 in this embodiment are generally rectangular sheet steel that can be solid or perforated for aesthetics and air flow. Alternatively, rather than using a single side panel 300 per side of the network cabinet, multiple side panels could be used on each side and various geometries, materials, and designs could be used depending on the particular application. Here, the side panels 300 have hooks 305 attached to the bottom inside surface of the side panels 300 and latches 315 attached to the top of the side panels 300.

To mount the side panels 300, a bar 310 is attached between the front and back door mounts 15 by end brackets 312. The bar 310 is also supported near its center by center bracket 311, which is attached to the front to back base beam 115. As can best be seen in FIGS. 8A and 9, the hooks 305 are placed over the bar 310 to support the side panel 300 and the side panel 300 is aligned. The side panel 300 is then rotated into a vertical position and the latches 315 secure the side panel 300 to a side flange 202 of the top cover 200. Alternatively, the latches 315 can also have a locking assembly that allows the latches 315 to be locked into position once the side panels 300 have been mounted.

Figure 7A:
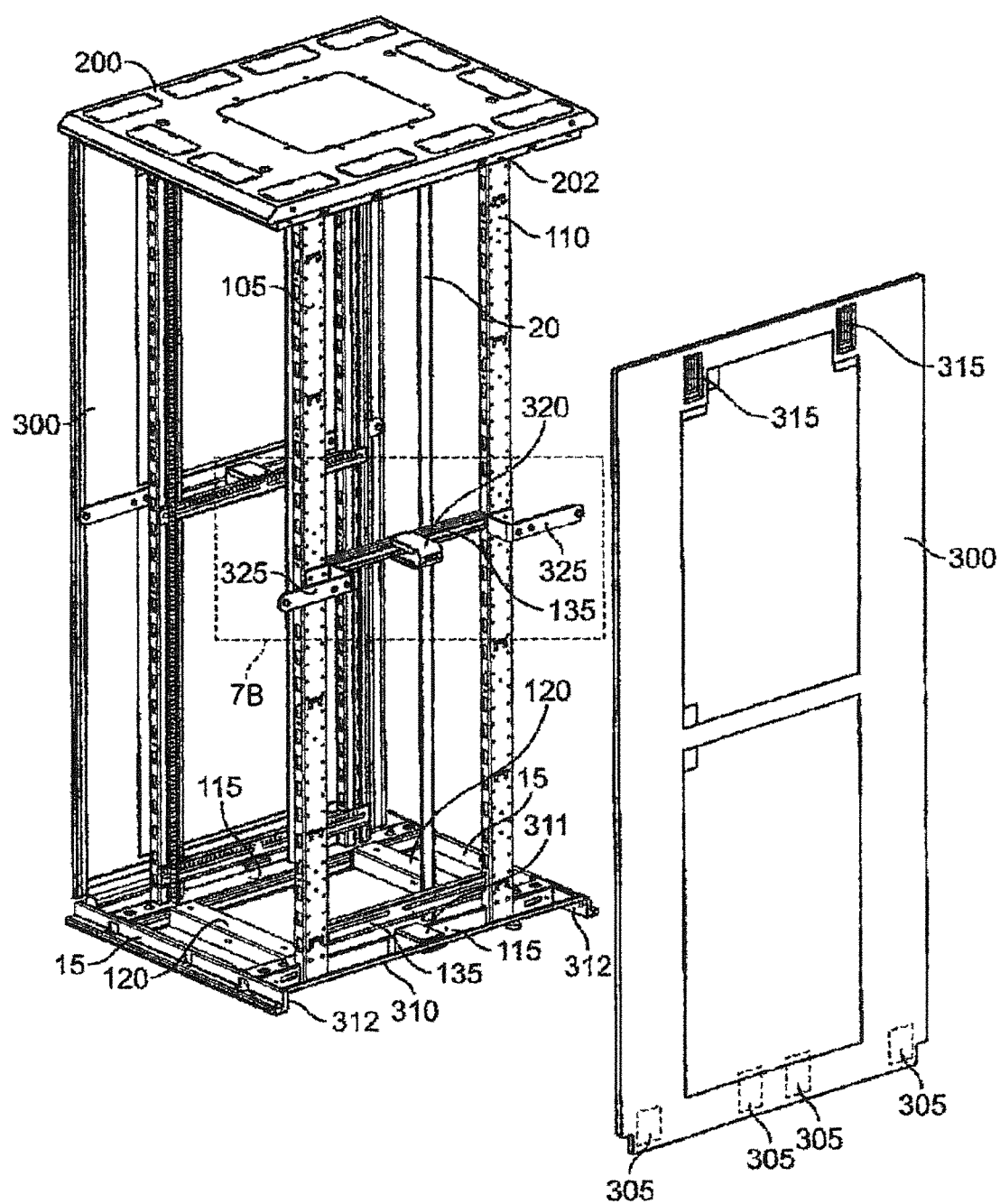
FIG. 7A is an exploded perspective view of the base frame, top cover, and side panels of the network cabinet of the present invention.
Figure 7B:
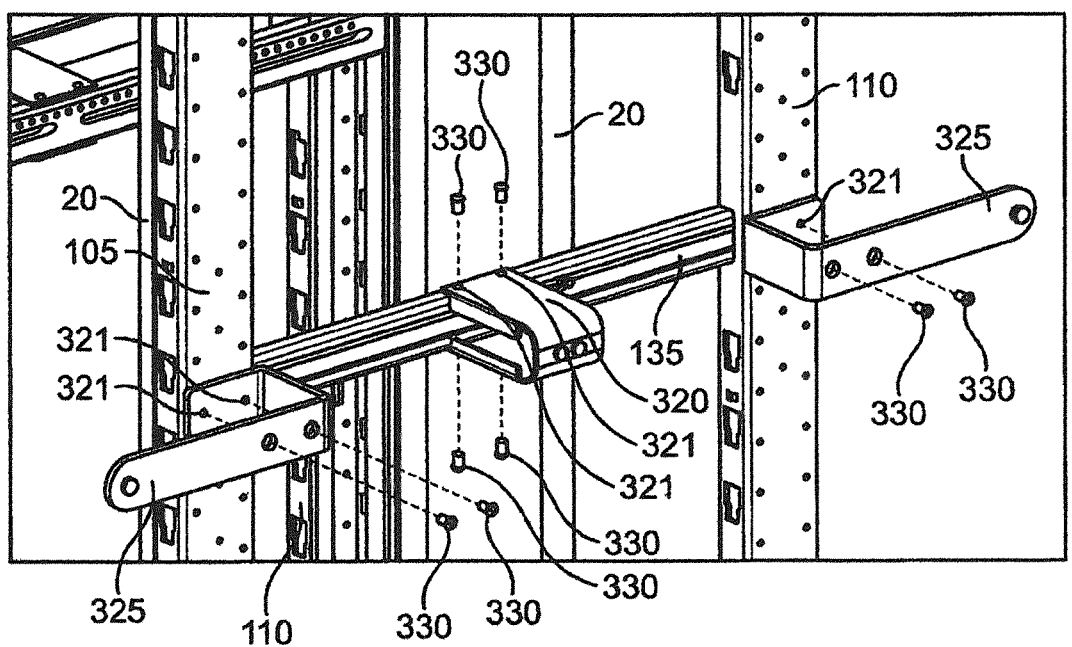
FIG. 7B is an enlarged partial exploded view of the base frame and side panel brackets shown in FIG. 7A.

As can best be seen in FIG. 7B, in this embodiment a center bracket 320 is attached and bonded to the center front to back support beam 135 and side brackets 325 are attached and bonded to a front vertical frame rail 105 and a back vertical frame rail 110. Trilobular screws 330 can be inserted through holes 321 in the brackets 320, 325 and threaded into the front to back support beam 135 and vertical frame rails 105, 110, securing the brackets 320, 325 to the front to back support beam 135 and vertical frame rails 105, 110. The trilobular screws 330 can also be used to bond to the front and back support beam 135 and vertical frame rails 105, 110 by cutting threads into the metal of the front to back support beam 135 and vertical frame rails 105, 110. An area around the holes 321 in the brackets 320, 325 is masked and left unpainted, thereby also bonding the trilobular screws 330 to the brackets 320, 325. Alternatively, rather than masking portions around the holes 321, a trilobular screw having teeth on the underside of the head that will cut into the metal of the brackets 320, 325 can be used if bonding is desired.

In this embodiment, the brackets 320, 325 provide support for the side panels 300 and offset the side panels 300 from the front and back vertical frame rails 105, 110 and front to back support beams 135, thereby providing easily accessible vertical cable management pathways between the side panels 300 and the front and back vertical frame rails 105, 110 and front to back support beams 135. In addition, brackets 325 on each side of bracket 320 provide a guide or channel for placing cables extending in a vertical direction within the cabinet and proximate to the respective corners of the cabinet. Alternatively, brackets 320, 325 could be removed if not needed for a particular application.

Figure 8A:
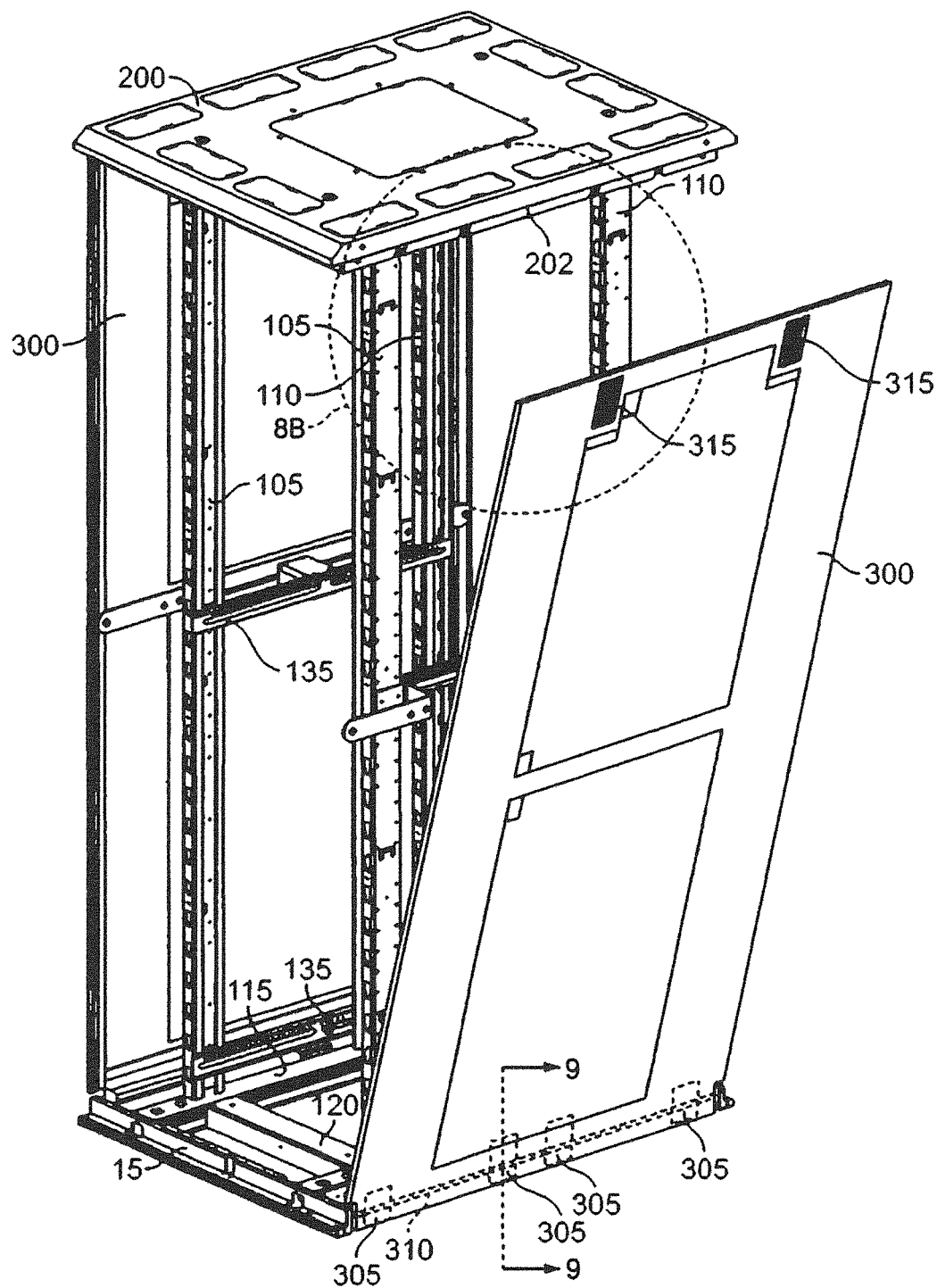
FIG. 8A is a perspective view of the base frame, top cover, and side panels of the network cabinet of the present invention, with one side panel partially installed.
Figure 8B:
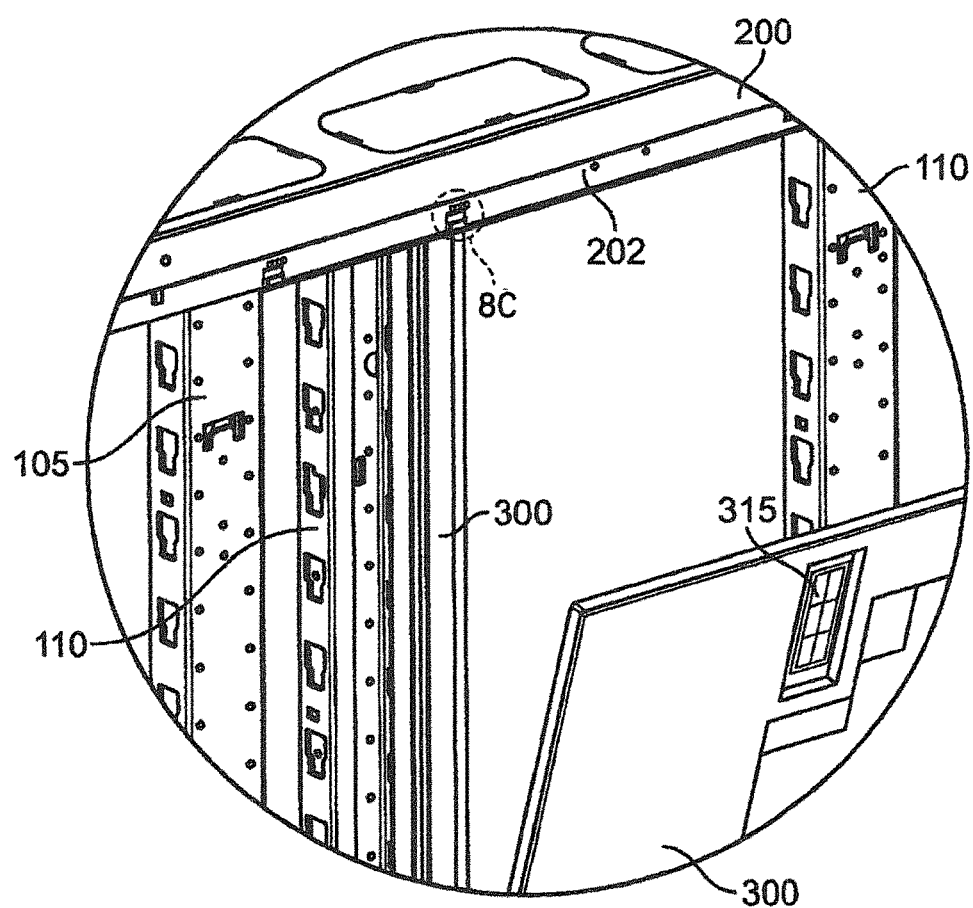
FIG. 8B is an enlarged partial view of the base frame, top cover, and side panel shown in FIG. 8A.
Figure 8C:
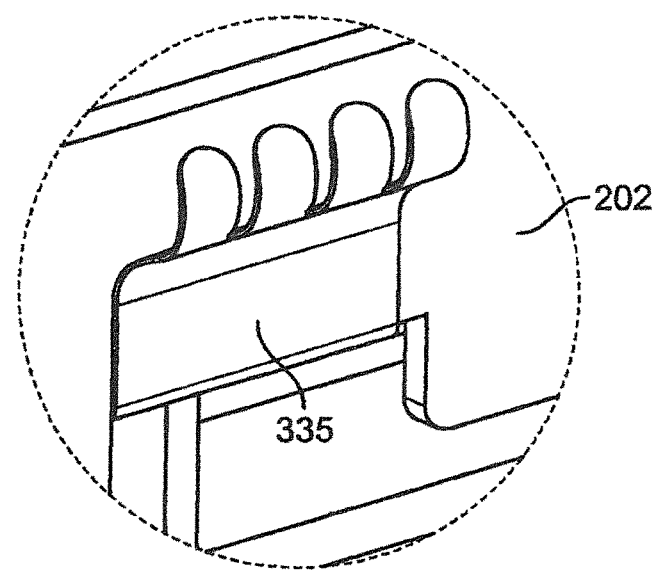
FIG. 8C is an enlarged partial view of the top cover and grounding clip shown in FIG. 8B.
Figure 9:
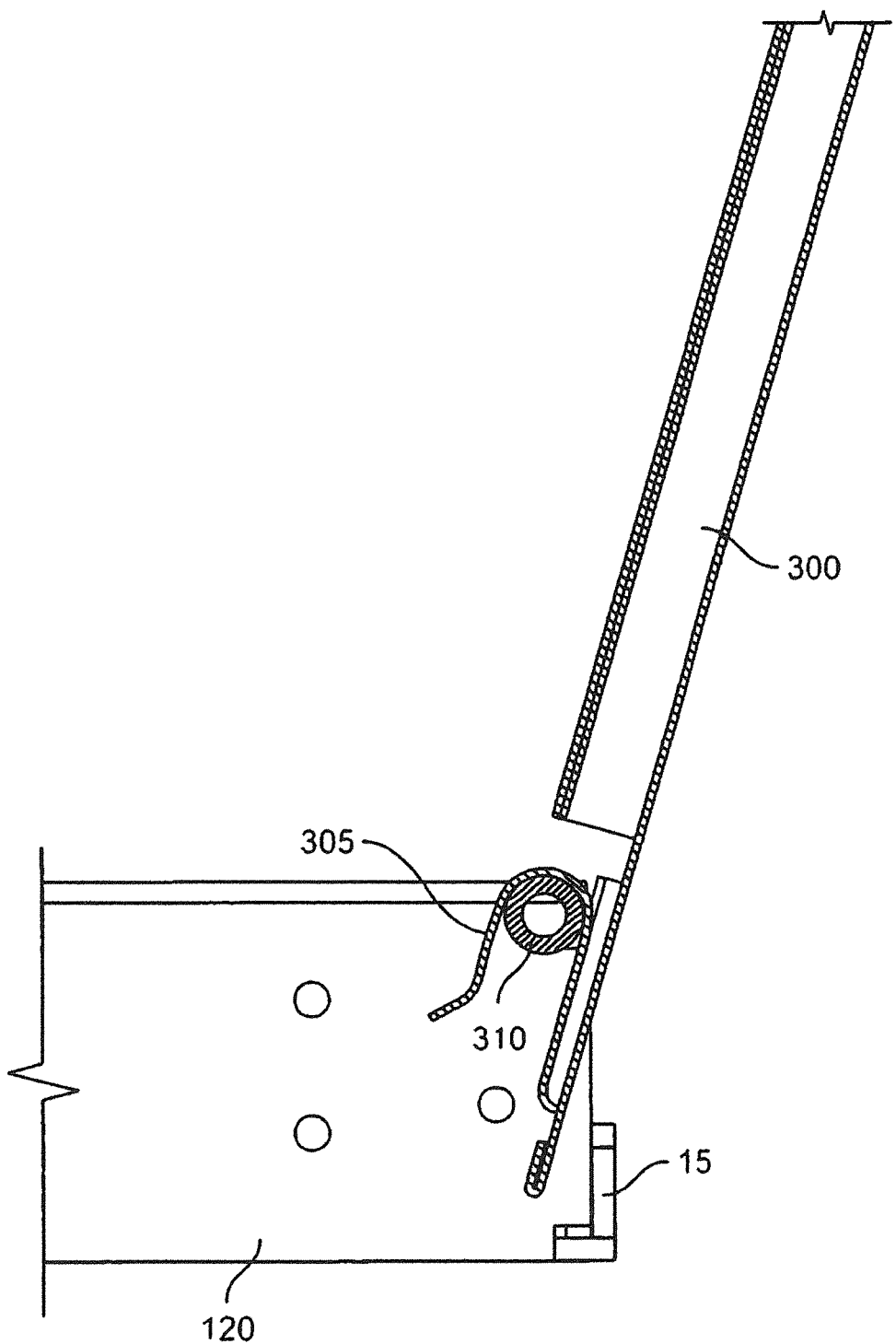
FIG. 9 is a cross-sectional view taken along line 9-9 in FIG. 8A.

Referring to FIGS. 8A, 8B, and 8C, in this embodiment the side panels 300 are bonded to top cover 200 through a grounding clip 335. The grounding clip 335 is attached to a masked, unpainted portion of the side flange 202 of the top cover 200. Each side panel 300 also has a masked, unpainted portion of the inside surface that contacts the grounding clip 335 and compresses the grounding clip 335 once the side panel 300 is latched in place. The contact of the grounding clip 335 with the masked, unpainted portions of the top cover 200 and side panel 300 bonds each side panel 300 to the top cover 200.

Alternatively, rather than using grounding clips 335 to bond the side panels 300 to the top cover 200, the side panels 300 could be bonded to the base frame 100 through the bar 310 and hooks 305. To provide bonding in this manner, one of the end brackets 312, which is welded to the bar 310, would be attached to a door mount 15 so that a bond is created and one of the hooks 305 would be attached to the side panel 300 so that a bond is created, such as by welding or the use of internal tooth lock washers, trilobular screws, paint masking, etc., as described throughout. A bond would then be created between the bar 310 and the bonded hook 305 by paint masking the bar 310 in the area that will contact the hook 305.

Figure 10A:
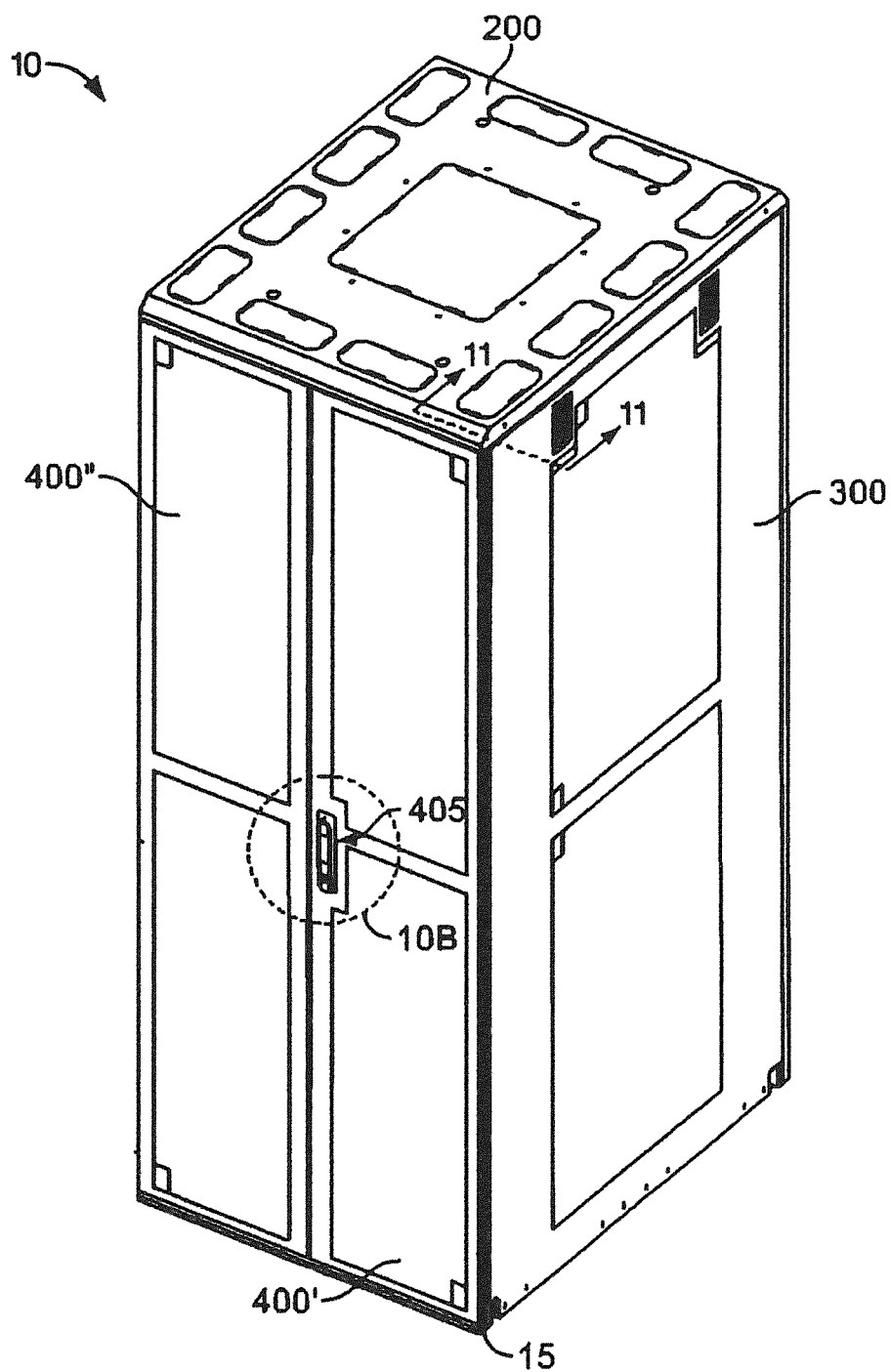
FIG. 10A is a back perspective view of the network cabinet of the present invention.

Referring to FIG. 10A, in this embodiment the back doors 400 are mounted to the back of the network cabinet 10 between the top cover 200 and the back door mount 15. In the example shown, the back doors 400 are split doors and are generally rectangular sheet steel that can be solid or perforated for aesthetics and air flow. Alternatively, rather than using split doors, a single back door or any other type of door having various geometries and being made of various materials could be used depending on the particular application. Here, each of the back doors 400 hinges open on pins at the top and bottom of the outside corners of the back doors 400.

Figure 10B:
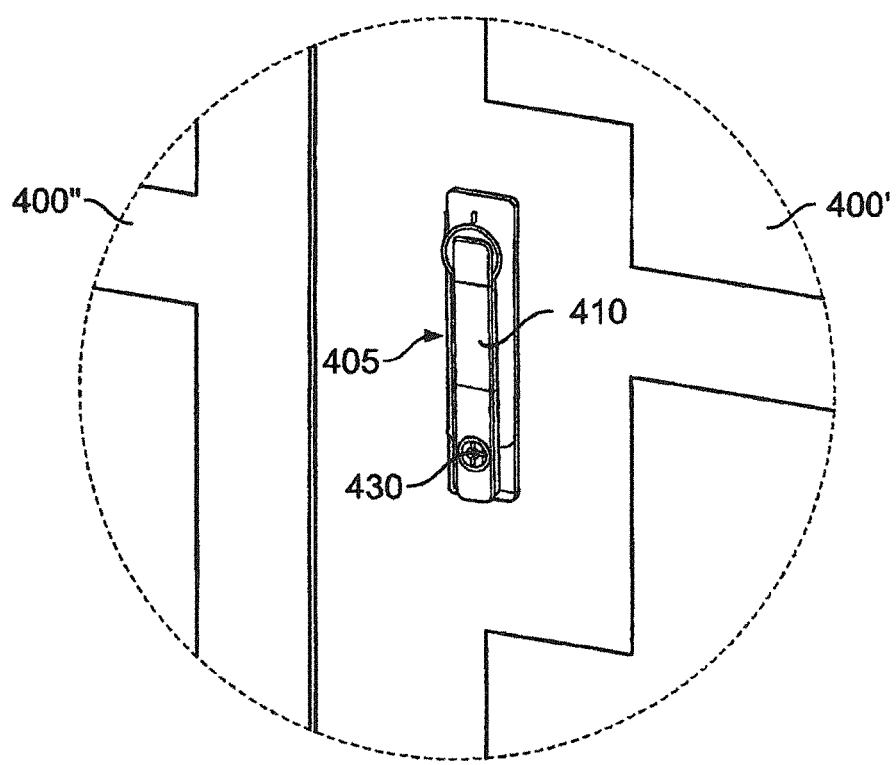
FIG. 10B is an enlarged partial view of the door handle shown in FIG. 10A.
Figure 10C:
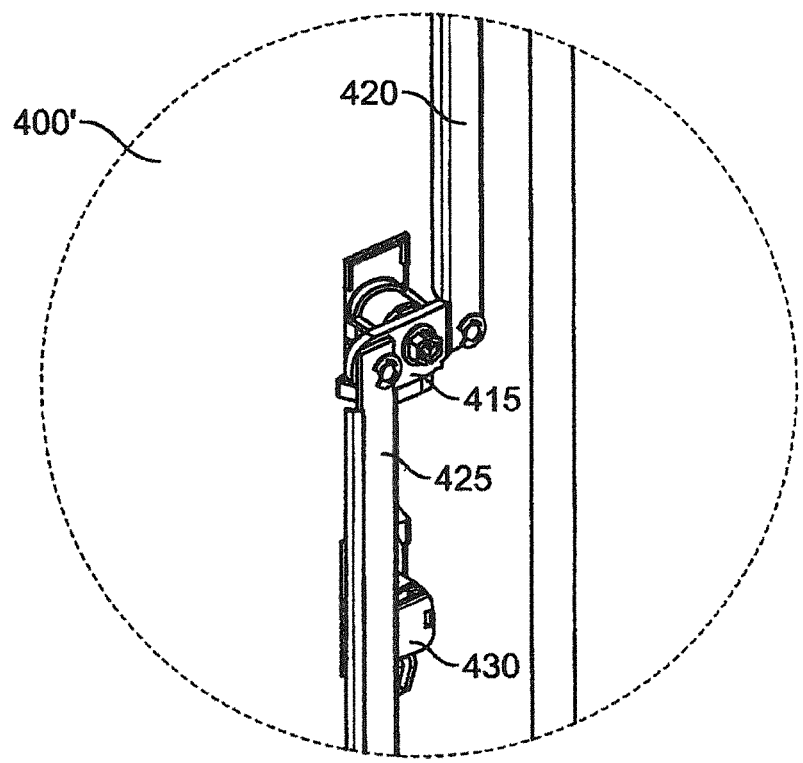
FIG. 10C is an enlarged partial view of the back of the door handle shown in FIG. 10B.

Referring to FIGS. 10A, 10B, and 10C, in the example shown, one of the back doors 400' has a latch mechanism 405 that secures the door to the top cover 200 and back door mount 15. The latch mechanism 405 has a door handle 410 that is accessible from the outside of the back door 400' and can also have a cylinder lock 430 that can lock the door handle 410 in the closed position. On the inside of the back door 400', the door handle 410 is connected to a cam plate 415 that can rotate as the door handle 410 is rotated. An upper rod 420 is attached to one end of the cam plate 415 and a lower rod 425 is attached to the other end of the cam plate 415, opposite the upper rod 420. The upper rod 420 extends generally vertically from the cam plate 415 up to the top cover 200 and the lower rod 425 extends generally vertically from the cam plate 415 down to the door mount 15. When in the closed position, the upper rod 420 extends into a hole in the top cover 200 and the lower rod 425 extends into a hole in the door mount 15, thereby securing the back door closed.

In the example shown in FIGS. 10A, 10B, and 10C, one of the back doors 400' has a latch mechanism 405 and the opposite back door 400" is overlapped by the back door 400' with the latch mechanism to hold it in the closed position. Alternatively, rather than overlapping, both back doors 400', 400" could have latch mechanisms 405.

Figure 10D:
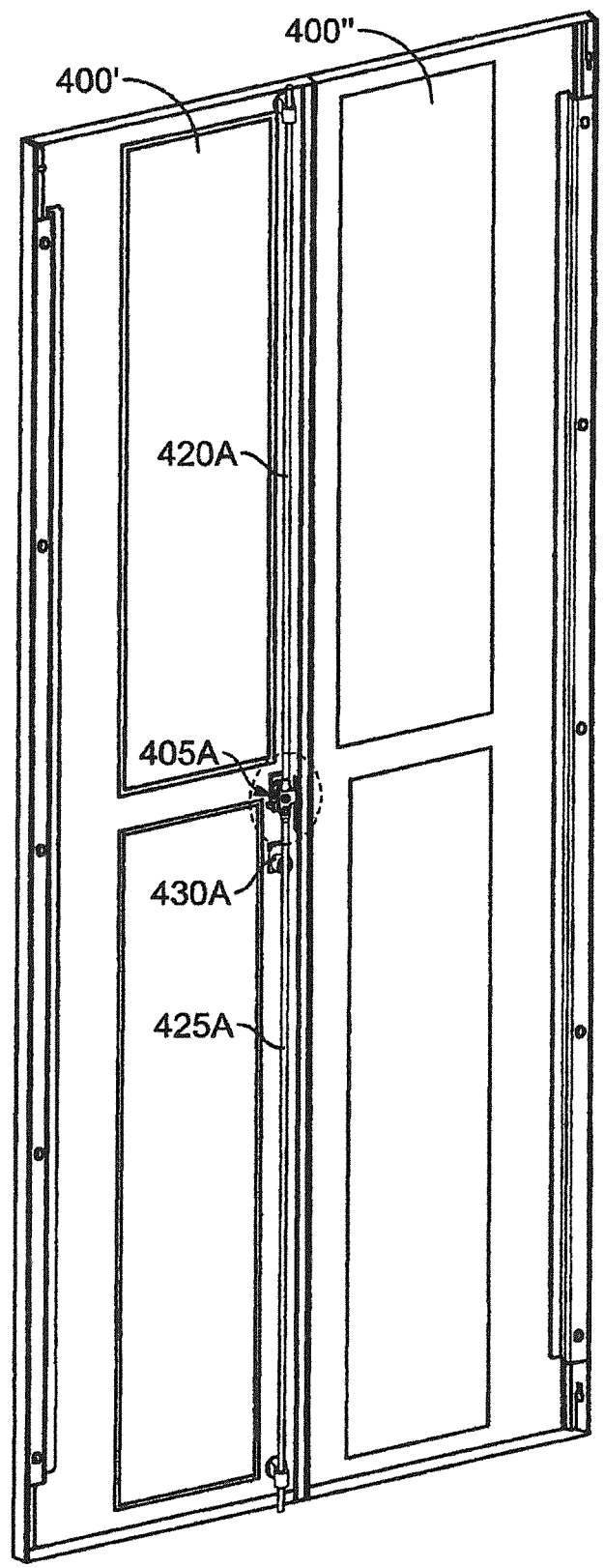
FIG. 10D is a back perspective view of the back doors of the network cabinet of the present invention with an alternative latch mechanism.
Figure 10E:
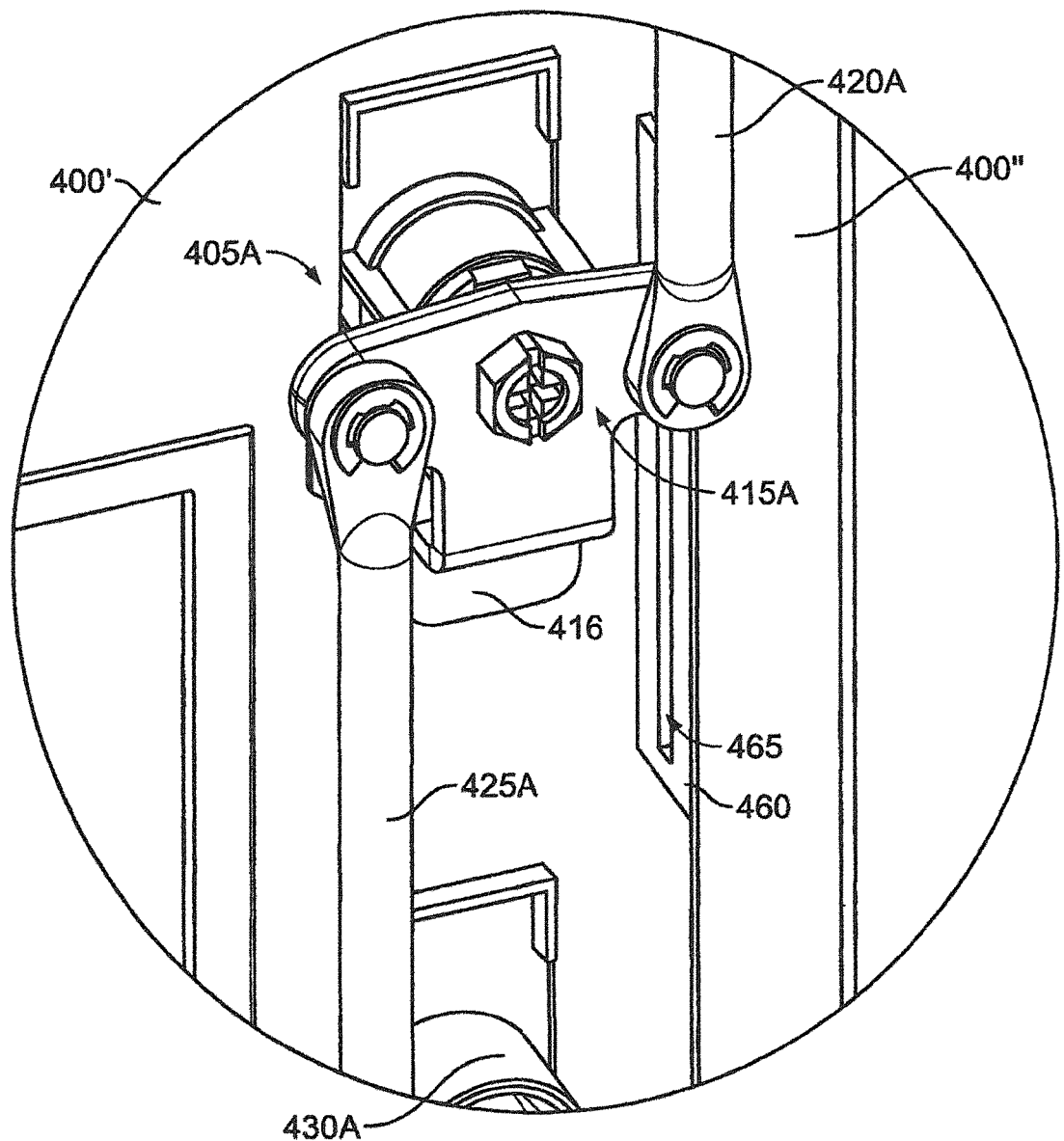
FIG. 10E is an enlarged partial view of the alternative latch mechanism shown in FIG. 10D in the open position.
Figure 10F:
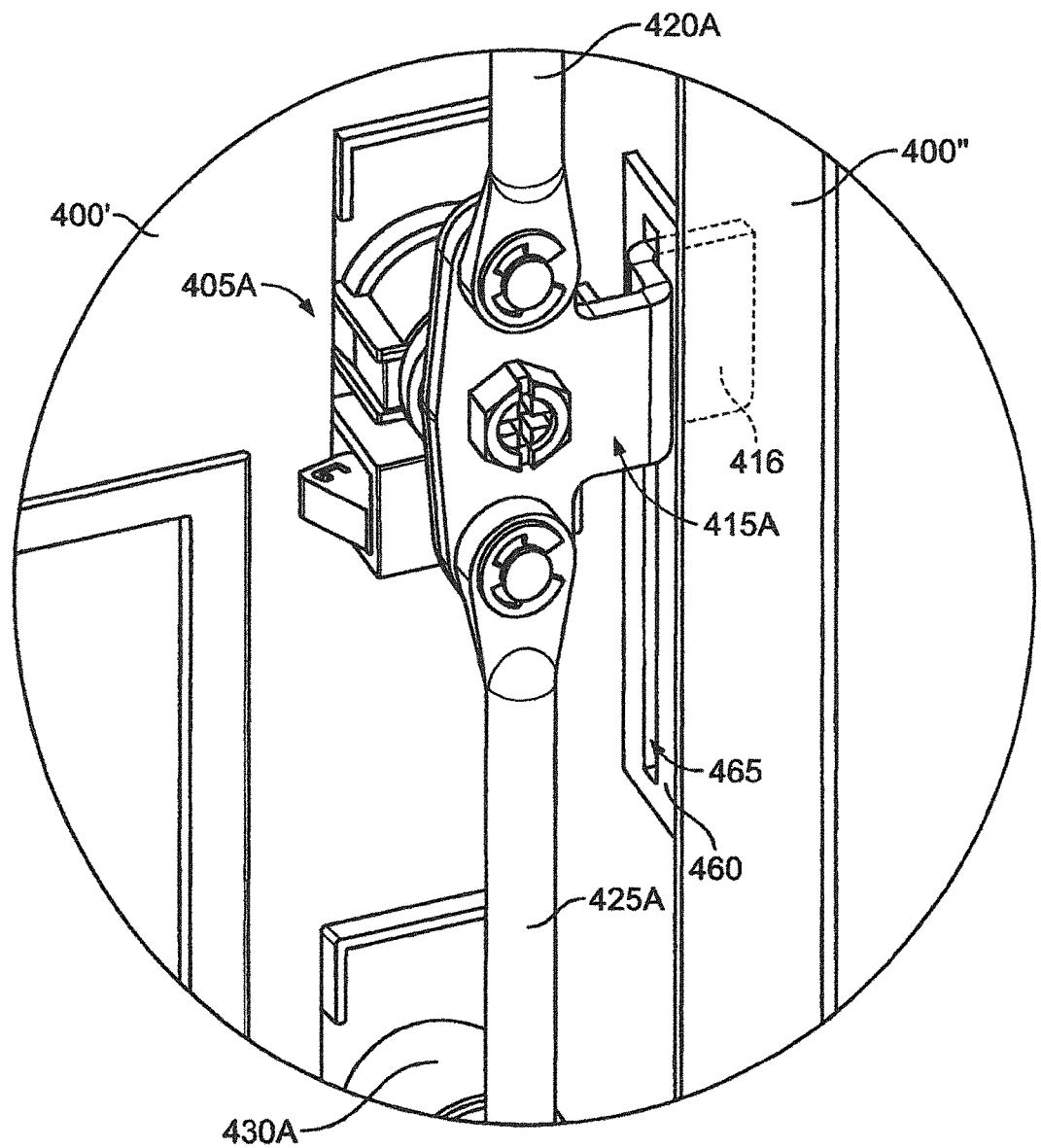
FIG. 10F is an enlarged partial view of the alternative latch mechanism shown in FIG. 10D in the closed position.

In another example, shown in FIGS. 10D, 10E, and 10F, one of the back doors 400' again has a latch mechanism 405A that secures the door to the top cover 200 and back door mount 15. The latch mechanism 405A has a door handle (not shown) that is accessible from the outside of the back door 400' and can also have a cylinder lock 430A that can lock the door handle in the closed position. On the inside of the back door 400', the door handle is connected to a cam plate 415A that can rotate as the door handle is rotated. An upper rod 420A is attached to one end of the cam plate 415A and a lower rod 425A is attached to the other end of the cam plate 415A, opposite the upper rod 420A. The upper rod 420A extends generally vertically from the cam plate 415A up to the top cover 200 and the lower rod 425A extends generally vertically from the cam plate 415A down to the door mount 15. When in the closed position, the upper rod 420A extends into a hole in the top cover 200 and the lower rod 425A extends into a hole in the door mount 15, thereby securing the back door closed.

Referring specifically to FIGS. 10E and 10F, in the example shown, the back doors 400', 400" still overlap to hold the second door 400" in the closed position, but also have an additional feature to provide extra security for the second door 400". In the example shown, cam plate 415A has a locking arm 416 that extends outward from and generally perpendicular to the axis of rotation of cam plate 515A and back door 400" has a plate 460 that includes a slot 465, which is configured to receive locking arm 416. Plate 460 can be a separate piece that is attached to back door 400", such as by welding or screws, or plate 460 can be integrally formed with back door 400". In addition, locking arm 416 can be shaped in a stair-step configuration towards the back door 400' to move locking arm 416 away from the inside of the network cabinet 10, which reduces the risk that locking arm 416 will pinch or catch cables or wiring that are in the network cabinet 10.

As can be seen in FIG. 10E, when the latch mechanism 405A is in an open position, locking arm 416 extends downward and does not engage slot 465 and the back doors 400', 400" can be opened. Conversely, as can be seen in FIG. 10F, when the latch mechanism 405A is moved to a closed position, locking arm 416 rotates until it is generally horizontal and engages slot 465. When in this position, the back door 400" is secured by the overlap of back door 400' over back door 400" and also by the engagement of locking arm 416 with slot 465.

Figure 11:
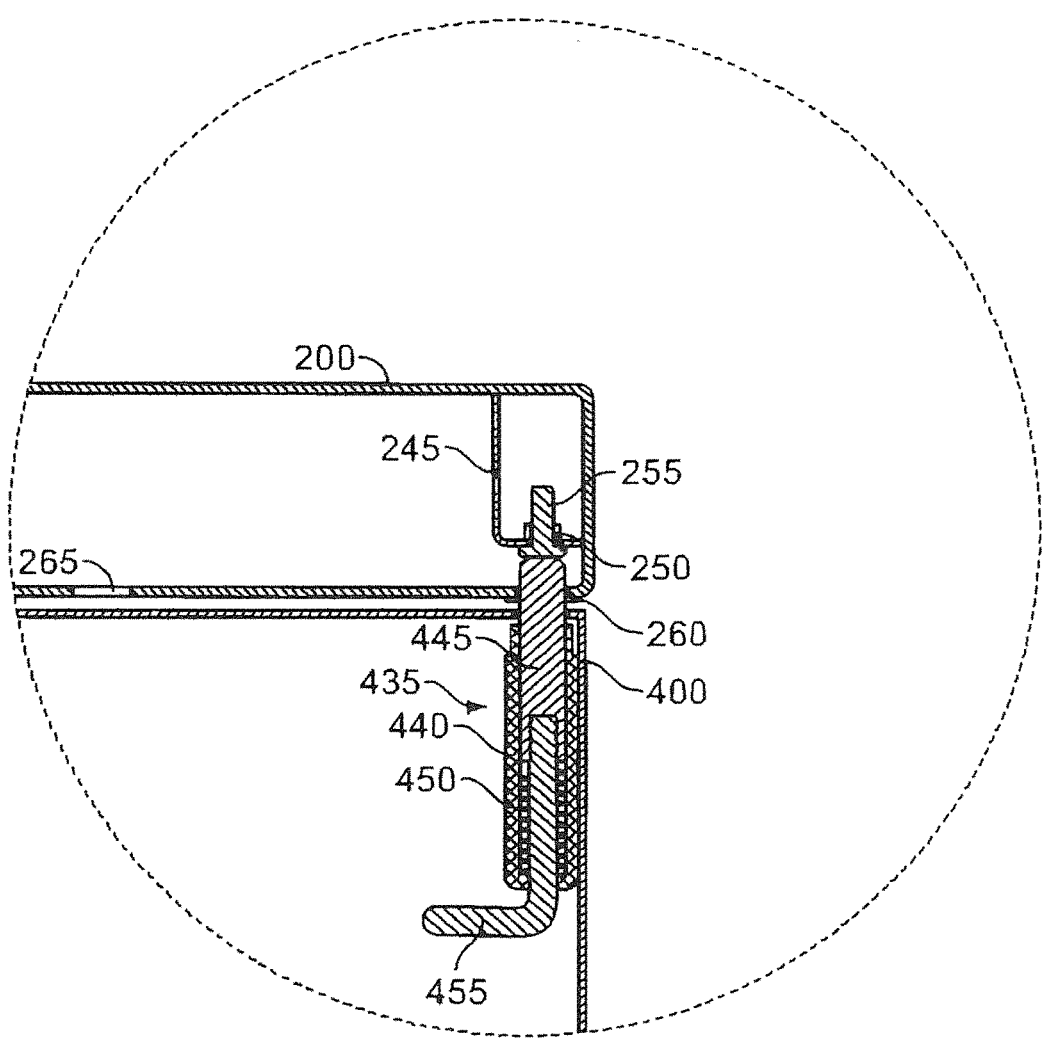
FIG. 11 is a cross-sectional view taken along line 11-11 in FIG. 10A.

Referring to FIG. 11, each of the back doors 400 can be bonded to the top cover 200 through a spring loaded hinge assembly 435, which includes a generally cylindrical body 440, hinge pin 445, release arm 455, and spring 450. The body 440 is steel, or other conductive material, and is welded to the inside surface of the back door 400. The hinge pin 445 is steel, or other conductive material, and is positioned inside the body 440. The release arm 455 is generally "L" shaped, extends through a hole in the end of the body 440, and threads into the hinge pin 445. Spring 450 is positioned inside of the body 440 and is compressed between the hinge pin 445 and the end of the body 440. Spring 450 biases the hinge pin 445 outward from the body 440 and allows the hinge pin 445 to be retracted when the release arm 455 is pulled. Hinge pin 445 extends from the end of the body 440, through a hole in the top of the back door 400 and through bushing 260 in top cover 200, where hinge pin 445 contacts a thread forming screw 255 that is bonded to the top cover 200.

To bond the thread forming screw to the top cover 200, a conductive ground angle 245 is welded to the inside surface of the top cover 200 and the thread forming screw 255 is threaded into the ground angle 245 and into a nut 250 that is welded to the ground angle 245, thereby providing a bond between the top cover 200 and the screw 255.

To install or remove the back door 400, the release arm 455 is pulled downward, which compresses the spring 450 and retracts the hinge pin 445 into the body 440. With the hinge pin 445 below the level of the bushing 260, the back door 400 can be placed in position or removed. Once the back door 400 is in position, the release arm 455 is released and the spring 450 pushes the hinge pin 445 outward through the bushing 260 until the hinge pin 445 contacts the screw 255.

In this example, the spring loaded hinge assembly 435 provides the hinge mechanism for the back door 400 and also provides a positive grounding path when the back doors 400 are installed. This allows the removal of the back doors 400 without the need of disconnecting any grounding jumper wires.

Referring to FIGS. 2A and 2B, in this example the door mounts 15 also have holes 18 that are inset from the bushings 600 that receive the bottom fixed hinge pin for the back doors 400. Although FIGS. 2A and 2B show the door mount 15 for the front door 500, the two door mounts 15 are mirror images of each other and the door mount 15 for the back doors 400 contains identical holes 18. Referring to FIGS. 4A, 4B, and 11, the top cover 200 has holes 265 that are inset from the bushings 260 that receive the hinge pin 445 of the spring loaded hinge assembly 435. Each of the holes 18 in the door mounts 15 is aligned in a generally vertical axis with a corresponding hole 265 in the top cover 200 and provides a storage mechanism for a back door 400 that has been removed.

For example, as described above, a back door 400 can be removed by pulling downward on the release arm 455, which retracts the hinge pin 445 and allows the back door 400 to be tilted and removed. Rather than having to lean the removed back door 400 on the network cabinet 10 or against a wall or other equipment where it can be bumped into or knocked over, the removed back door 400 can be stored using holes 18 and 265 in the door mount 15 and top cover 200. To store the removed back door 400, the opposite back door is opened, the fixed hinge pin on the bottom of the removed back door 400 is inserted into the hole 18 in the door mount 15 nearest the bushing 600 of the open back door, and the hinge pin 445 of the spring loaded hinge assembly 435 is inserted into the corresponding hole 265 in the top cover 200 by pulling downward on the release arm 455.

Figure 12A:
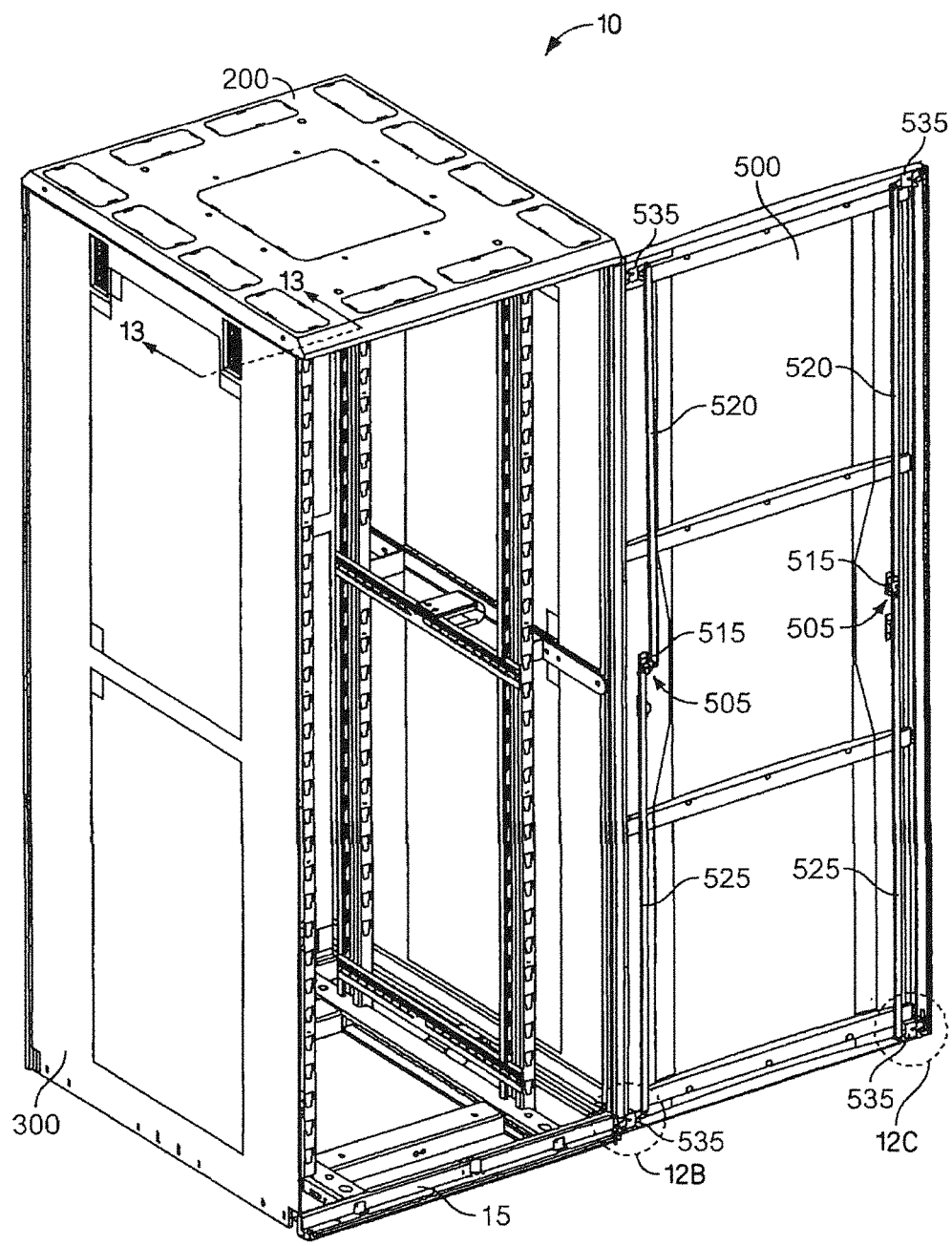
FIG. 12A is a front perspective view of the network cabinet of the present invention, with the front door partially open.

Referring to FIG. 12A, in this embodiment front door 500 is mounted to the front of the network cabinet 10 between top cover 200 and the front door mount 15. In the example shown, the front door 500 is generally rectangular sheet steel that can be solid or perforated for aesthetics and air flow, is dual hinged, as described in more detail below, and can be opened from either the left or right side giving full access to either the left or right rack and vertical cable management channels without having to remove front door 500. Alternatively, rather than using a single dual hinged door, split doors, a single hinged door, or any other type of door could be used as well and front door 500 could be made of any geometry and of any material and design as required for a particular application.

Figure 19:
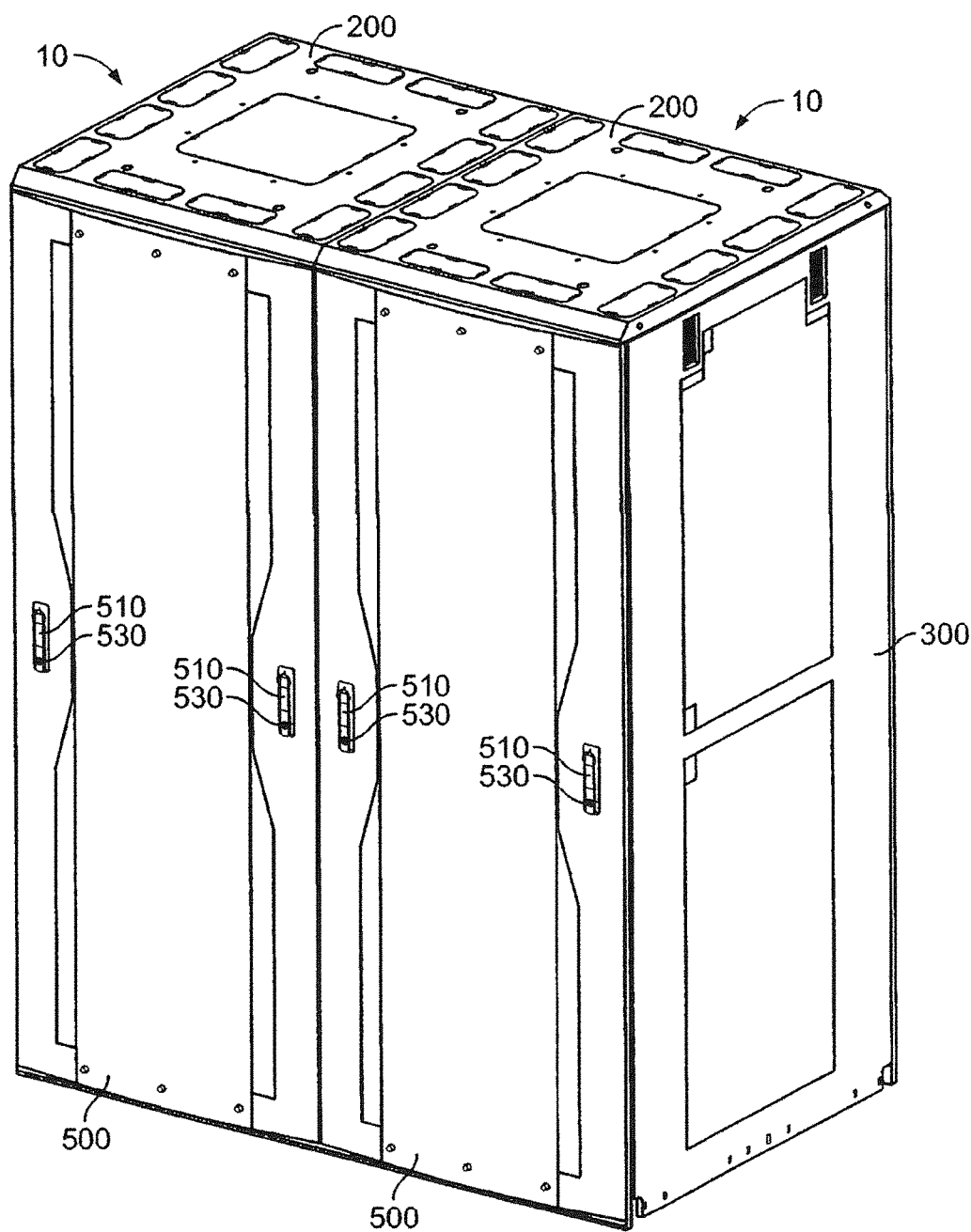
FIG. 19 is a front perspective view of two network cabinets ganged together.

Referring to FIG. 12A, in this example, front door 500 has two latch mechanisms 505, one on each side of the front door 500. The latch mechanisms 505 have a door handle 510 (as shown in FIG. 19), cam plate 515, upper rod 520, and lower rod 525, and are substantially identical in operation to the latch mechanism 405 described above for the back doors 400 (see FIGS. 10B and 10C). The latch mechanisms 505 can also have a cylinder lock 530 (as shown in FIG. 19), which can lock the door handle 510 in the closed position.

Figure 12B:
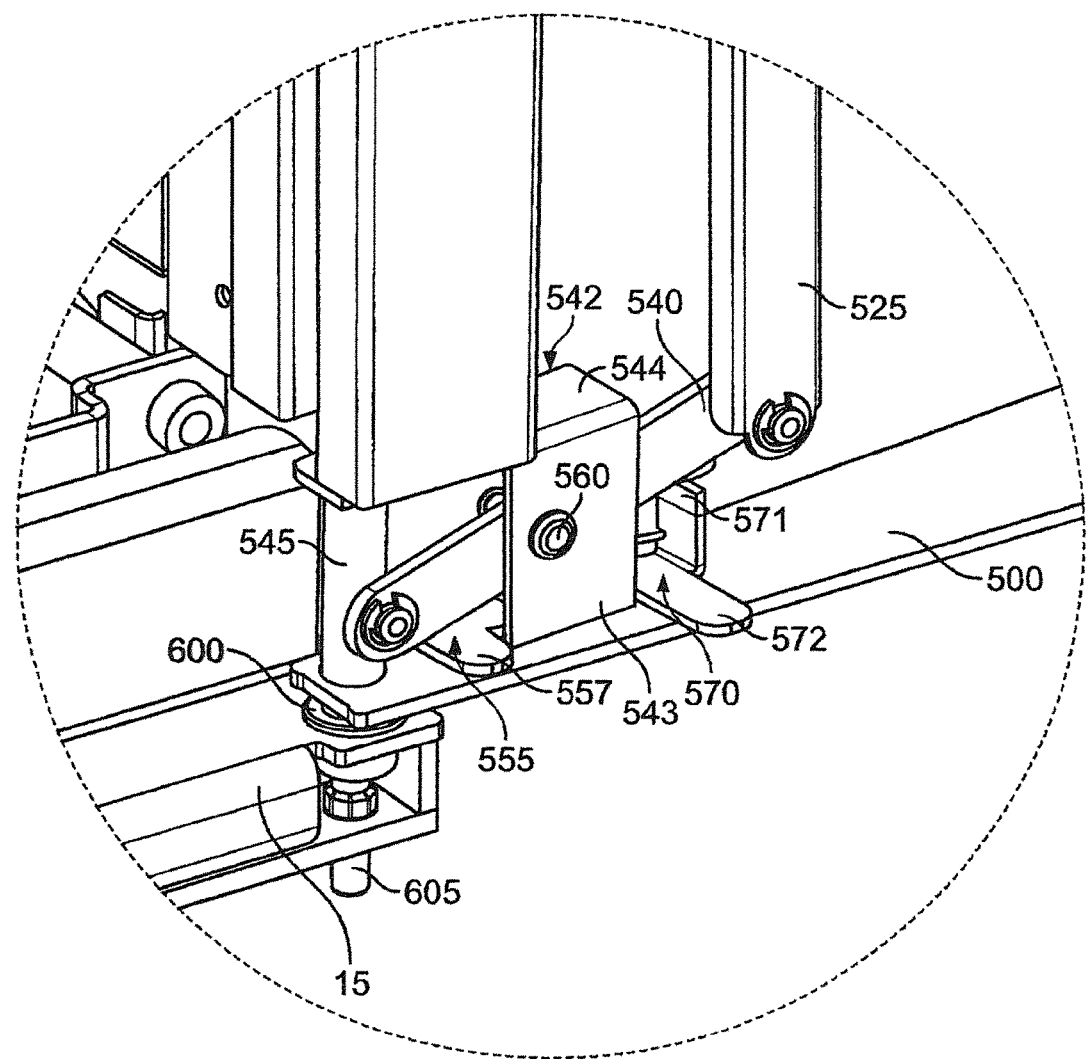
FIG. 12B is an enlarged partial view of a safety hinge of the front door shown in FIG. 12A.
Figure 12C:
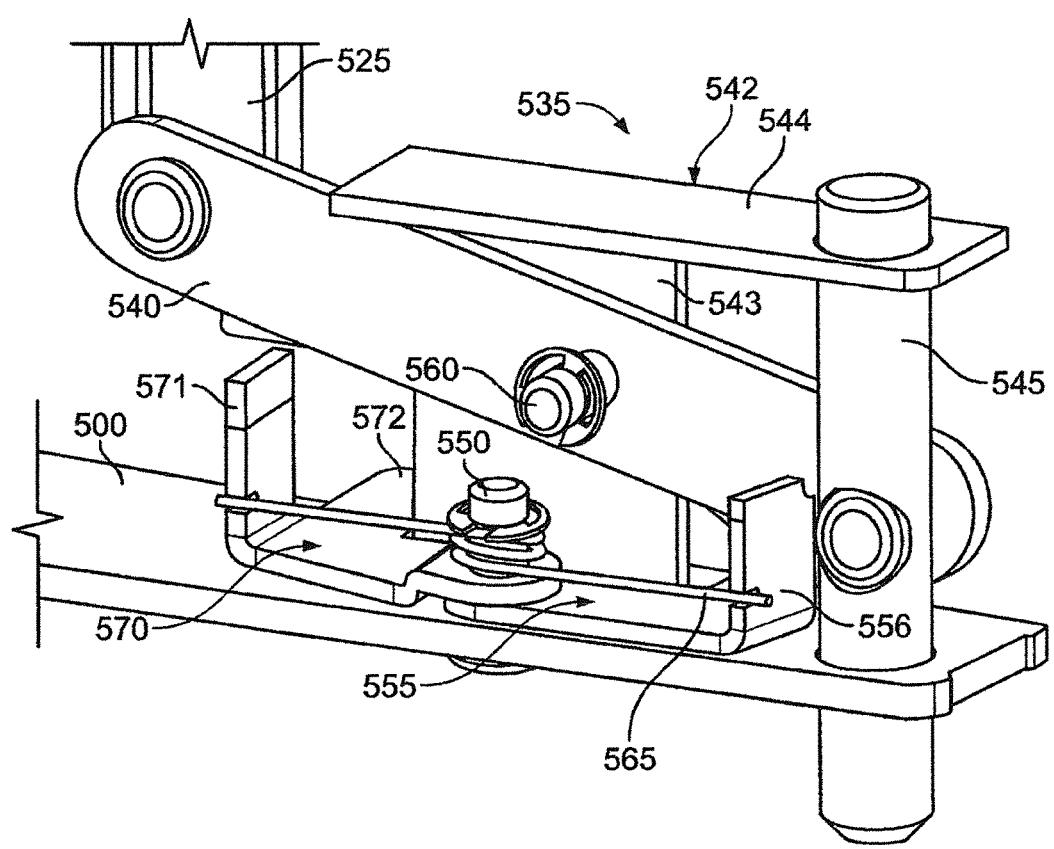
FIG. 12C is a back view of the safety hinge in FIG. 12B.
Figure 12D:
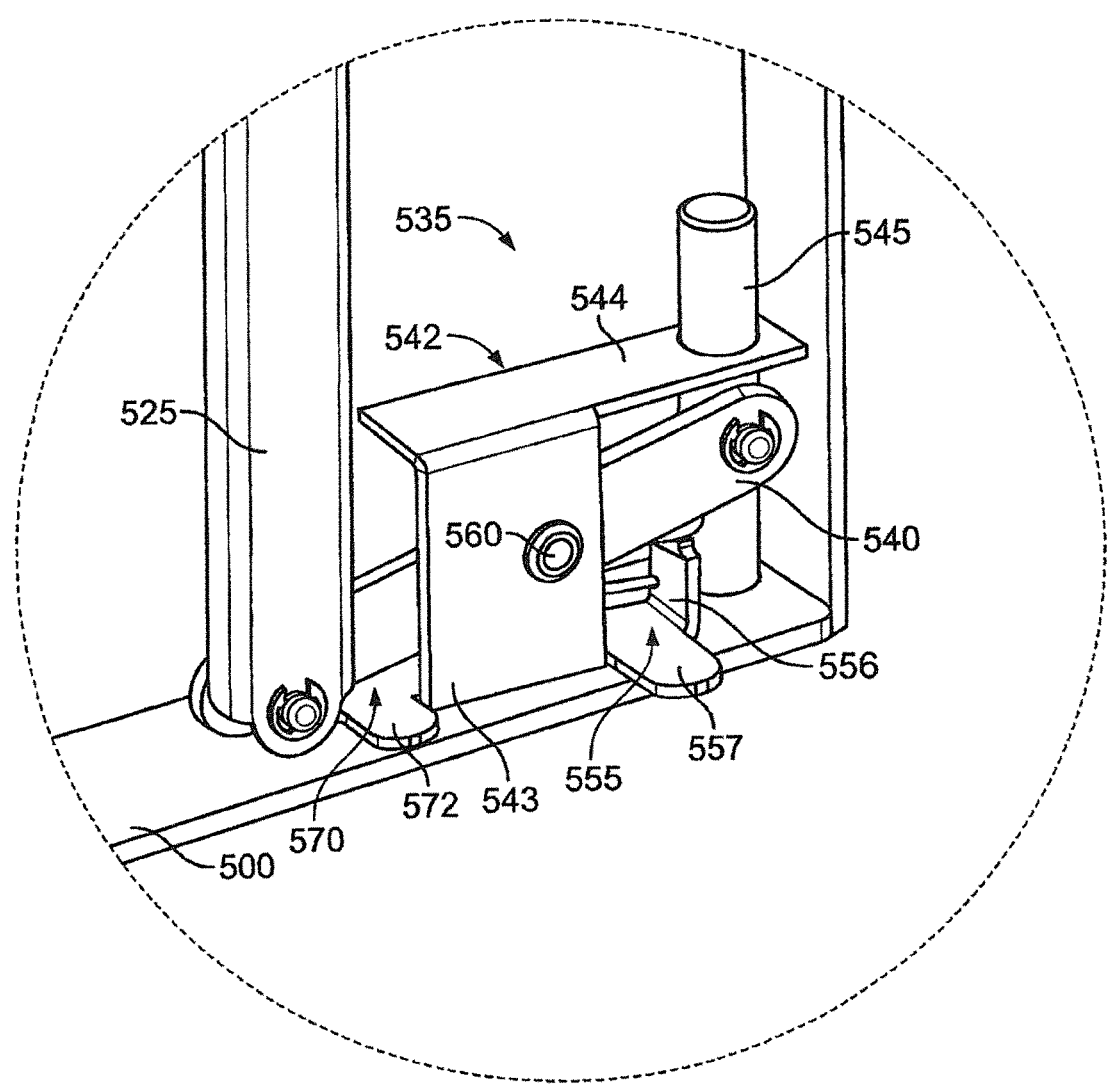
FIG. 12D is an enlarged partial view of a second safety hinge of the front door shown in FIG. 12A.

Referring to FIG. 12A, at each top and bottom corner of the front door 500 (four positions total) is a locking hinge assembly 535. FIGS. 12B and 12D show the locking hinge assemblies 535 on the bottom corners of the front door 500 and it will be understood that the assemblies on the top corners are identical to those described herein for the bottom corners. FIG. 12C shows the backside of the latch mechanism shown in FIG. 12B. Each locking hinge assembly 535 includes a hinge lever 540, hinge support 542, hinge pin 545, an inner lever stop 555, and an outer lever stop 570. As used herein, an inner lever stop 555 is the lever stop that is closest to the hinge pin 545 and an outer lever stop 570 is the lever stop that is furthest from the hinge pin 545.

The hinge support 542 has a generally vertical wall 543 that is attached to the front door 500, such as by welding, with screws, etc., and a generally horizontal wall 544 extends generally perpendicular from the top of the vertical wall 543. The hinge lever 540 is mounted to the vertical wall 543 of hinge support 542 by pin 560 such that hinge lever 540 can rotate about pin 560. Hinge lever 540 is also rotatably connected to a lower rod 525 (or upper rod 520 depending on which locking hinge assembly) at one end and to the hinge pin 545 at the end opposite the lower rod 525. The hinge pin 545 extends generally vertically through the front door 500 and through the horizontal wall 544.

A lever stop hinge pin 550, as seen in FIG. 12C, is attached to the front door 500 and the lever stops 555, 570 are mounted onto the lever stop hinge pin 550 such that the lever stops 555, 570 can rotate about the hinge pin 550. Each of the lever stops 555, 570 has a generally vertical stop arm 556, 571 and a generally horizontal release arm 557, 572. A torsion spring 565 is mounted on the lever stop hinge pin 550 and has ends that extend out to the stop arms 556, 571 of the lever stops 555, 570 to bias the lever stops 555, 570 into a forward position.

In operation, when the front door 500 is closed (the closed position is defined as both top corners of the front door 500 seated against the top cover 200 and both bottom corners of the front door 500 seated against the door mount 15) the upper and lower rods 520, 525 are pulled towards the center of the front door 500, thereby rotating the hinge levers 540 and extending the hinge pins 545 into their corresponding bushings 600 in the door mount 15 or top cover 200. Therefore, the hinge pins 545 in each of the four corners of the front door 500 engage the bushings 600 in the door mount 15 or top cover 200 and the front door 500 is fully secured. In addition, when in the closed position, the door mount 15 or top cover 200 will push against the release arms 557, 572 of both lever stops 555, 570, thereby disengaging the stop arms 556, 571 of both lever stops 555, 570 from the hinge lever 540. This allows the hinge lever 540 to rotate freely in either direction. Referring specifically to FIG. 12B, when a door handle is rotated from a closed to an open position the lower rod 525 is lowered, the hinge lever 540 is rotated counter-clockwise about pin 560, and the hinge pin 545 is raised. This enables the front door 500 to be hinged open about the hinge pins 545 in the opposite side. Conversely, when the lower rod 525 is raised (e.g. the door handle is moved from an open to a closed position), the hinge lever 540 will rotate clockwise about pin 560 and lower the hinge pin 545.

Referring specifically to FIGS. 12B and 12D, operation of the locking hinge assemblies 535 is shown when the left side of the front door is unlocked and the front door is opened from left to right (as seen when facing the front of the network cabinet 10), as shown in FIG. 12A. FIG. 12B shows the operation of the locking hinge assemblies 535 on the side of the front door 500 that remains engaged, and FIG. 12D shows the operation of the locking hinge assemblies 535 on the side of the front door 500 that is disengaged.

Referring to FIG. 12B, when the front door 500 is moved from the closed position the door mount 15 no longer pushes against the release arms 557, 572 of the lever stops 555, 570 and the torsion spring attempts to push the lever stops 555, 570 into a forward position. Because the hinge lever 540 is still in the locked position, the inner lever stop 555 is blocked by the hinge lever 540 and cannot rotate forward. However, the outer lever stop 570 is not obstructed by the hinge lever 540 and is pushed into a forward position by the torsion spring. When the outer lever stop 570 is in the forward position, the stop arm 571 is positioned underneath the hinge lever 540, thereby preventing the hinge lever 540 from rotating. Therefore, in this position, if a user were to attempt to turn the door handle (attempting to move the lower rod 525 downward) the stop arm 571 prevents the hinge lever 540 from moving, thereby preventing the door handle from being moved. This prevents an engaged hinge from being accidentally disengaged if the opposing hinge is disengaged and the front door 500 is open. Should this accidental disengagement not be prevented, front door 500 could easily fall onto and injure a person positioned in front of the network cabinet 10.

Referring to FIG. 12D, to move the front door 500 from the closed position the locking hinge assembly 535 on the side to be opened must be disengaged. When a user turns the door handle the lower rod 525 is pushed down, which rotates the hinge lever 540 and pulls back the hinge pin 545. After the locking hinge assembly 535 have been disengaged and the front door 500 is moved from the closed position, the door mount 15 no longer pushes against the release arms 557, 572 of the lever stops 555, 570 and the torsion spring attempts to push the lever stops 555, 570 into a forward position. Because the hinge lever 540 has been moved from the locked position, the outer lever stop 570 is blocked by the hinge lever 540 and cannot rotate forward. However, the inner lever stop 555 is not obstructed by the hinge lever 540 and is pushed into a forward position by the torsion spring. When the inner lever stop 555 is in the forward position, the stop arm 556 is positioned underneath the hinge lever 540, thereby preventing the hinge lever 540 from rotating. Therefore, in this position, if a user were to attempt to turn the door handle (attempting to move the lower rod 525 upward) the stop arm 556 prevents the hinge lever 540 from moving, thereby preventing the door handle from being moved. This prevents the closing of the door handle until the front door 500 is in the fully closed position such that lever stop 555 has been pushed backward thereby unobstructing hinge lever 540 allowing hinge pin 545 to be lowered through and fully engage bushing 600.

As can be seen from the above description, the locking hinge assemblies 535 require that the front door 500 be in a closed position before the user can change the state of the front door 500 (e.g. engage or disengage the locking hinge assemblies 535). This accomplishes two important goals: (1) it prevents unexpected and accidental removal of the front door 500 (when one side is open, the other side is locked and cannot be disengaged until the front door 500 is closed); and (2) it prevents a user from mistakenly thinking that the front door 500 is closed when it is still ajar (the door handle cannot be moved into the closed position until the front door 500 is completely closed and the lever stops allow movement of the hinge lever).

To remove the front door 500, the front door 500 is first placed in the closed position. In this position all of the inner and outer lever stops 555, 570 of all of the locking hinge assemblies 535 are pushed into a retracted position allowing all of the hinge levers 540 to move freely. While in the closed position, both of the door handles are turned which will disengage all of the locking hinge assemblies 535 by extending the upper and lower rods 520, 525 and retracting the hinge pins 545 from their respective bushings 260, 600, allowing removal of the front door 500. Once the front door 500 has been removed, the inner lever stops 555 are move into their forward position by the torsion spring 565, thereby obstructing the hinge lever 540 and preventing the door handles from being turned. To install the front door 500, the above process is reversed. The front door 500 is placed against the door mount 15 and top cover 200 such that the hinge pins 545 are aligned with their respective bushings 260, 600. In this position, the door mount 15 and top cover 200 will push the inner lever stops 555 backwards and out of the way of the hinge lever 540, thereby allowing the hinge lever 540 to move freely. Both of the door handles are then turned to retract the upper and lower rods 520, 525 and thereby extend the hinge pins 545 into their respective bushings 260, 600.

Figure 12E:
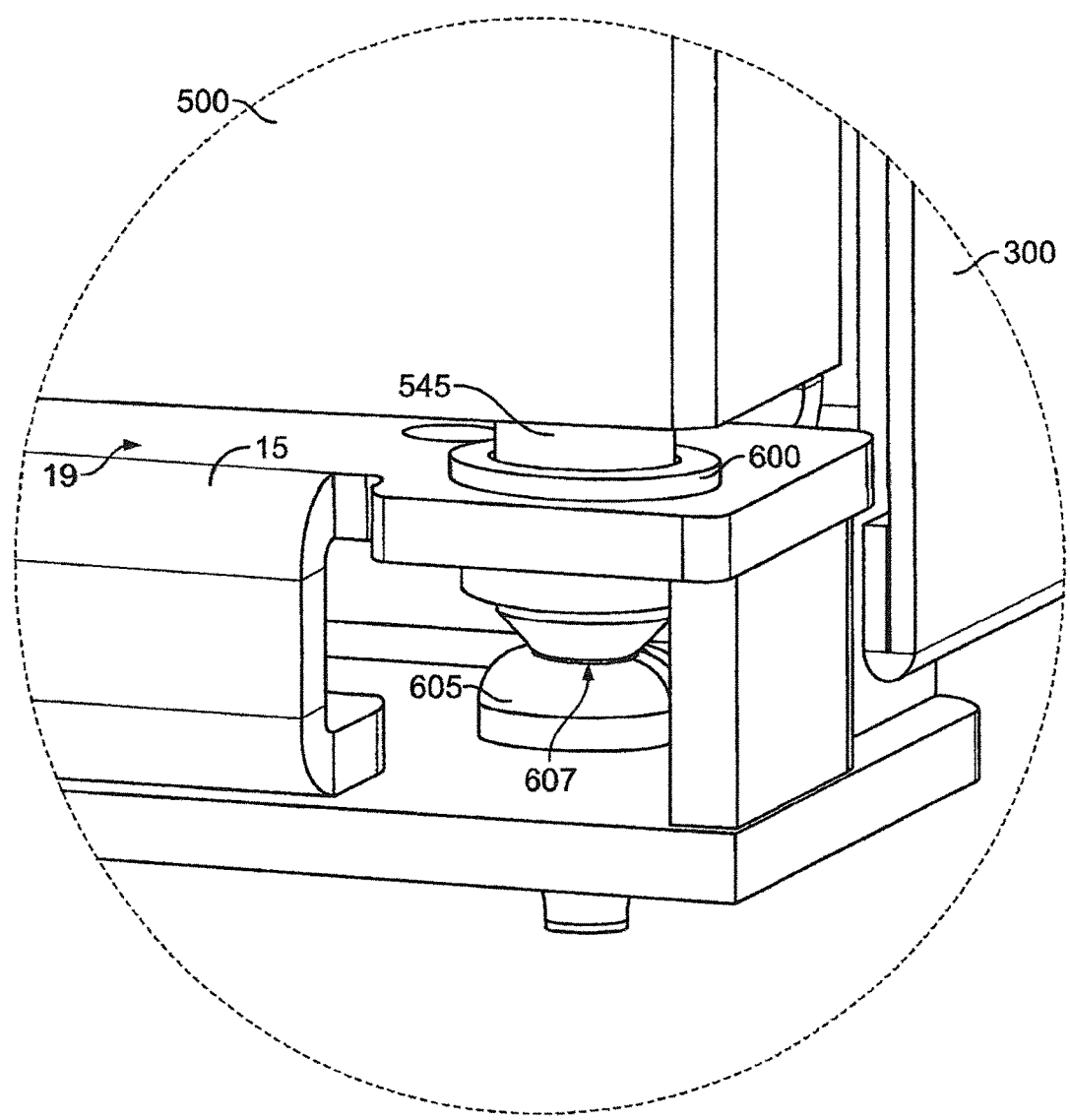
FIG. 12E is an enlarged partial view of a front door lifting mechanism of the front door shown in FIG. 12A.

Referring to FIG. 12E, the engagement between the hinge pin 545 of the front door 500 and the door mount 15 is shown. The hinge pin 545 extends through and engages a bushing 600 that is positioned in a hole in the top of the door mount 15. In this example, lifting screw 605 is threaded into the bottom portion of the door mount 15 just below the bushing 600 that engages the hinge pin 545. As the door handle is moved into the closed position, the hinge pin 545 moves down through the bushing 600 and contacts the lifting screw 605. After the hinge pin 545 contacts the lifting screw 605, the hinge pin 545 continues to move downward and lifts the front door 500 off of the bushing 600. Therefore, the front door 500 rides on the hinge pin 545, which provides clearance between front door 500 and door mount 15 when closing the front door 500 and compensates for door sag and/or worst case tolerance stack-ups.

Figure 12F:
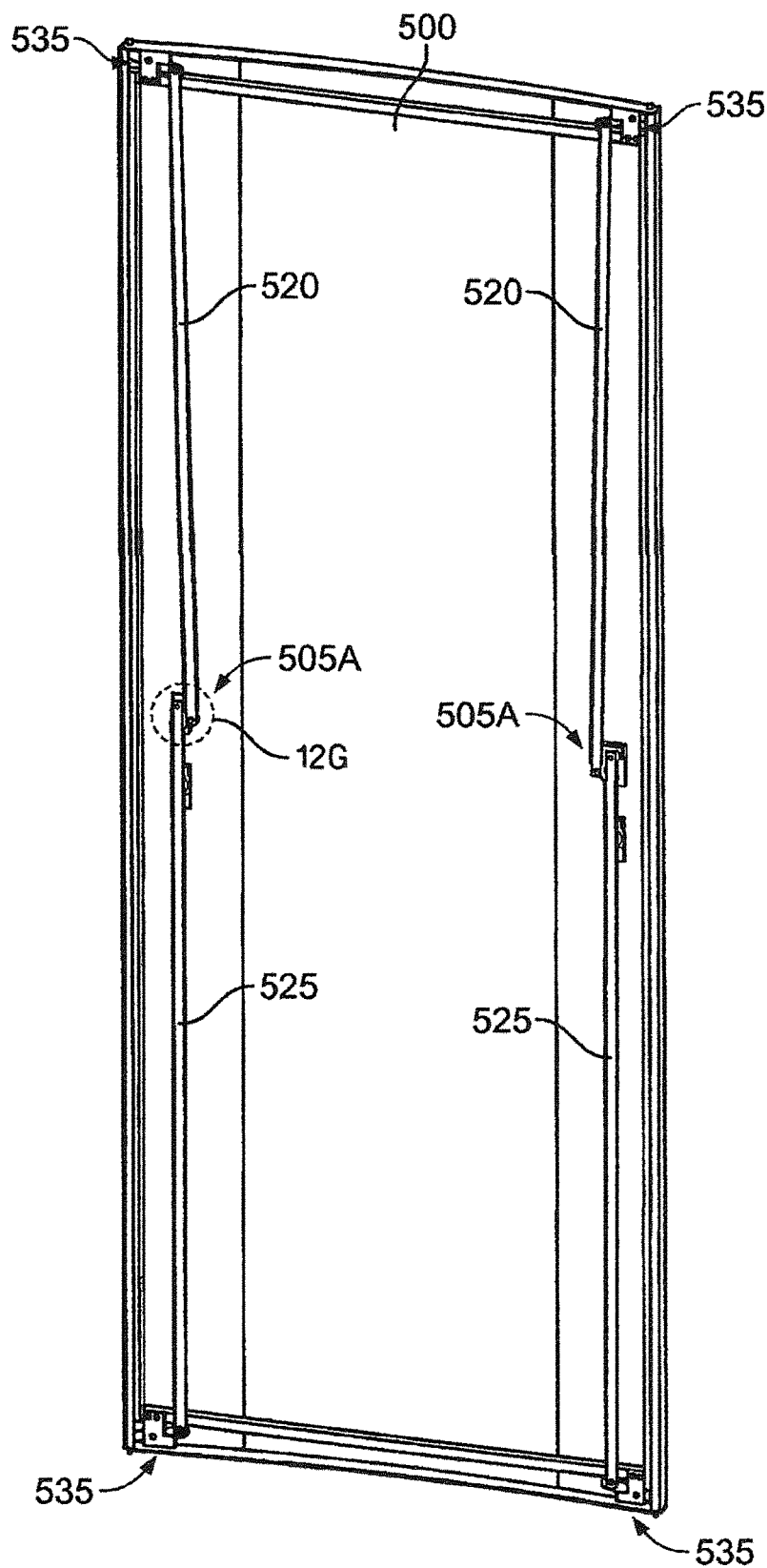
FIG. 12F is a back perspective view of the front door of the network cabinet shown in FIG. 12A with an alternative latch mechanism.
Figure 12G:
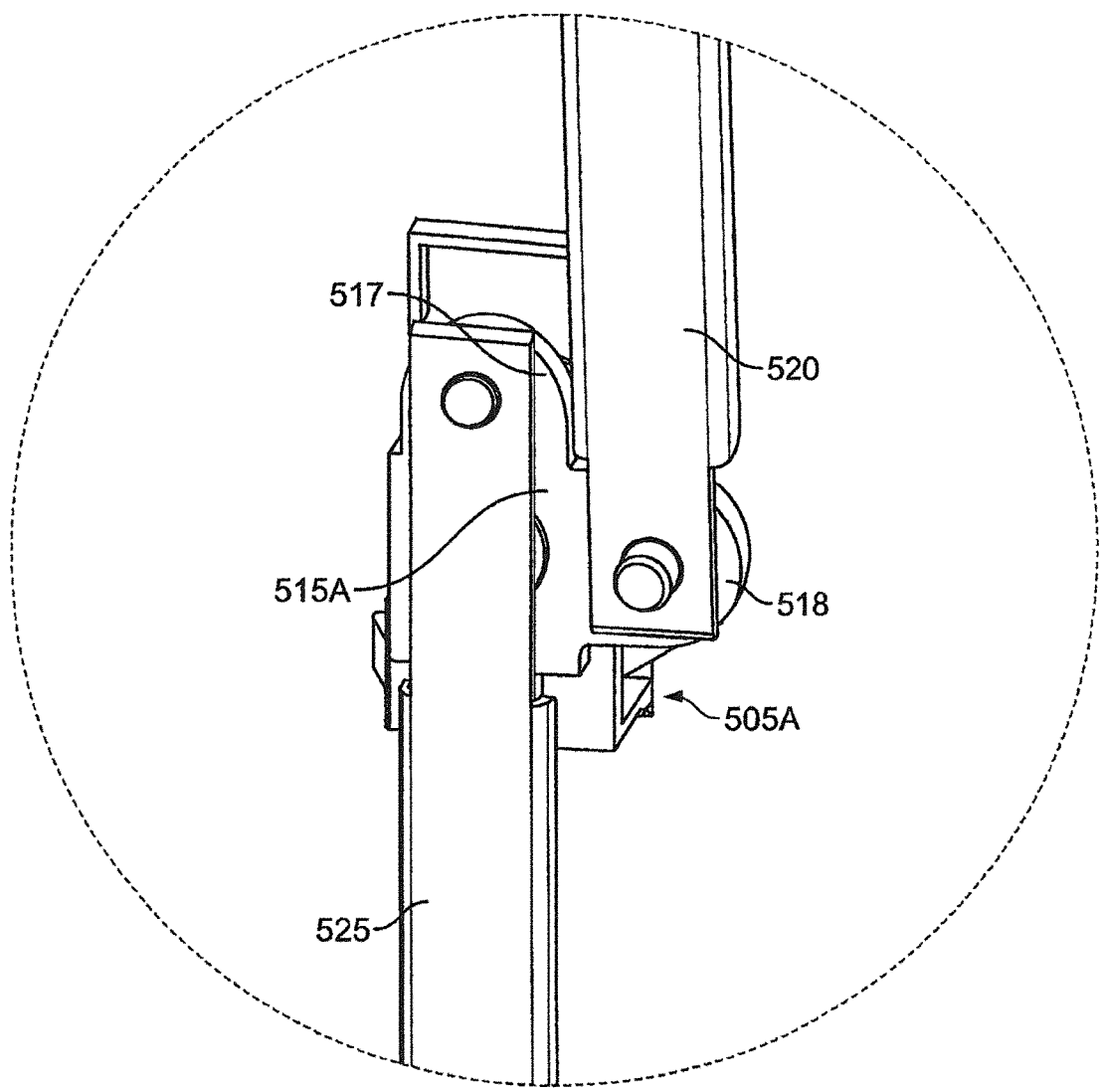
FIG. 12G is an enlarged partial view of the alternative latch mechanism of the front door shown in FIG. 12F.

In the example described above, with the weight of front door 500 riding on hinge pin 545 (rather than on bushing 600), there is a constant force on the bottom hinge pins 545 attempting to push hinge pins 545 into a retracted position. If the door handle is not fully engaged when the front door 500 is in the closed position, the force on the hinge pins 545 could cause the door handle to rotate towards an open position and possibly disengage locking hinge assemblies 535. To prevent this from happening an overcam latch mechanism can be used. Referring to FIGS. 12F and 12G, the overcam latch mechanism 505A is substantially identical to latch mechanisms 505 described above in that it has a door handle (not shown), a cam plate 515A connected to the door handle, and upper and lower rods 520, 525 that are connected to lobes of the cam plate 515A. The main difference between latch mechanism 505 and latch mechanism 505A is the design of the cam plate 515A. The cam plate 515 in latch mechanism 505 has lobes that are aligned and extend outward from the axis of rotation of the cam plate 515. Conversely, the cam plate 515A in the overcam latch mechanism 505A has lobes 517, 518 that are generally perpendicular to each other and extend outward from the axis of rotation of the cam plate 515A.

As can best be seen in FIG. 12G, when the front door 500 is in the closed position and the locking hinge assemblies 535 are engaged, the lobe 517 that is connected to lower rod 525 (and therefore bottom hinge pin 545) is extending substantially vertically. In operation, a force exerted on the lower hinge pin 545 that attempts to retract the hinge pin 545 (such as the weight of the front door 500 riding on hinge pin 545) will place a downward force on the lower rod 525. However, since lobe 517 is oriented vertically, this downward force on lower rod 525 will not cause the cam plate 515A (and therefore the door handle) to rotate. In order to rotate the door handle and cam plate 515A, a positive rotational force must be placed on the door handle to move the lobe 517 from a vertical position. This design prevents the door cam plate 515A and door handle from rotating due to the force exerted by the weight of front door 500 on lower hinge pin 545.

Figure 13:
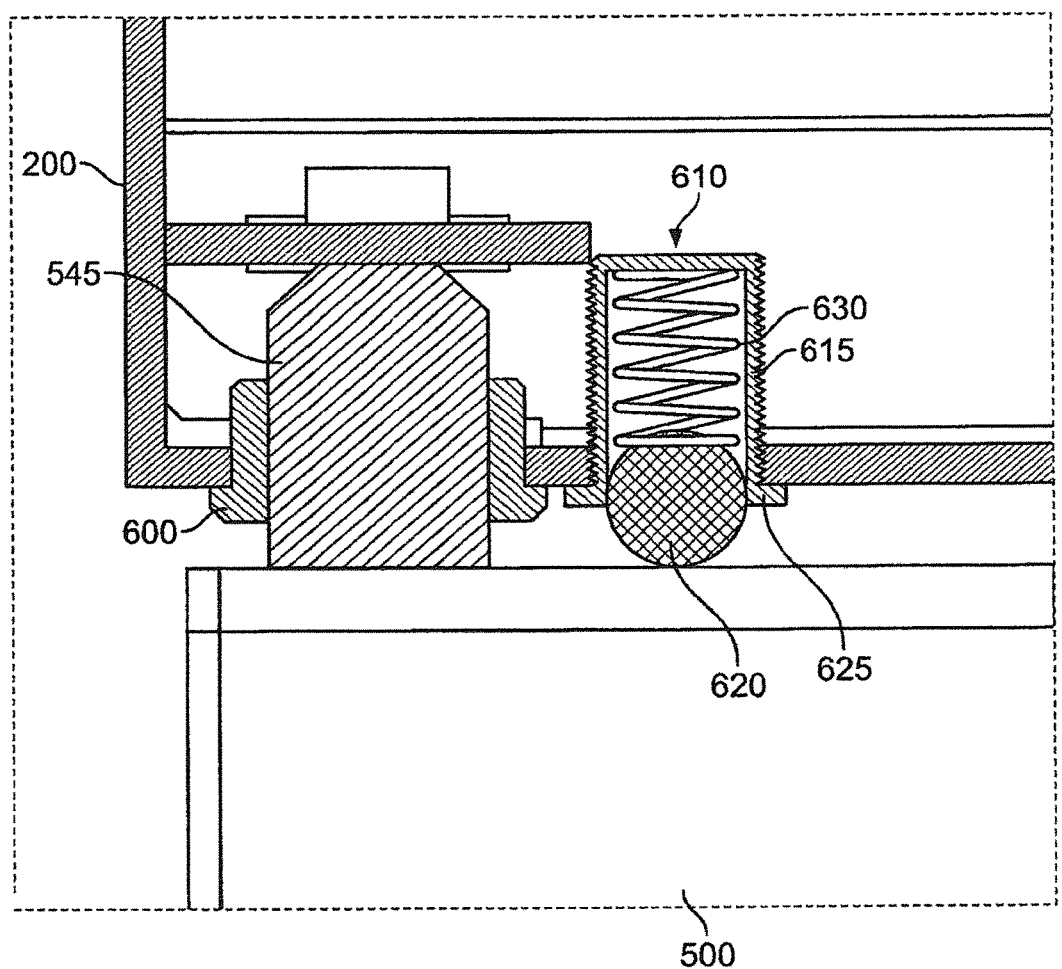
FIG. 13 is a cross-sectional view taken along line 13-13 in FIG. 12A.

Referring to FIG. 13, in this embodiment the front door 500 is also bonded to the top cover 200 by spring loaded bearing assemblies 610. Two spring loaded bearing assemblies 610 are positioned one at opposite corners of the top cover 200, one near each bushing 600 and hinge pin 545. In positioning spring loaded bearing assembly 610 near hinge pin 545, bearing assembly 610 maintains contact with front door 500 as front door 500 is swung to an open position. By using two bearing assemblies 610, the front door 500 stays bonded to the top cover 200 when closed, open to the left, or open to the right. Each spring loaded bearing assembly 610 has a generally cylindrical body 615, a ball bearing 620, a face plate 625, and a spring 630. Body 615 is steel or another conductive material and has external threads that permit body 615 to be screwed into paint masked compatible threads in the top cover 200 until the steel face plate 625 is flush with the top cover 200, which provides a bond between the spring loaded bearing assembly 610 and the top cover 200. Ball bearing 620 is steel or other conductive material and is biased towards face plate 625 by conductive spring 630 and protrudes beyond face plate 625 so that it contacts the top of the front door 500. The top of the front door 500 is masked where the ball bearing 620 will contact the front door 500, which provides a bond between the bearing assembly 610 and the front door 500. The bearing assemblies are positioned close enough to the bushing 600 and hinge pin 545 so that the front door 500 can open to approximately 160 degrees while maintaining the bond between the front door 500 and the top cover 200. The use of the bearing assemblies 610 to create the bond between the front door 500 and the top cover 200 allows for the removal of the front door 500 without the need to disconnect any jumper wires.

Alternatively, as can be seen in FIGS. 12B and 12E, rather than bonding the front door 500 to the base frame 100 through a spring loaded bearing assembly 610 in the top cover 200, the front door 500 can be bonded to the base frame 100 through the lifting screw 605 in the door mount 15. To bond the front door 500 in this manner, the lifting screw 605 is first bonded to the door mount 15. This can be done by using a trilobular lifting screw, by placing an internal tooth lock washer between the head of the lifting screw and the door mount, by using a lifting screw that has teeth on the underside of the head, or by paint masking the portion of the door mount that will contact the head of the lifting screw. The hinge pin 545 is then bonded to the front door 500, such as by attaching a jumper wire between the hinge pins 545 and the front door 500. Therefore, when the hinge pins 545 contact the lifting screws 605, a bond is created between the front door 500 and the door mount 15 through the jumper wire, hinge pins 545, and lifting screws 605.

As can be seen from the detailed descriptions above, in this embodiment when the network cabinet 10 is fully assembled, all of the components of the cabinet are bonded together. The components that make up the base frame 100 are all bonded by welding them together. The door mounts 15, equipment rails 20, and top cover 200 are bonded to the base frame by use of internal tooth lock washers. The side panels 300 are bonded to the top cover 200 by use of grounding clips 335. The back doors 400 are grounded to the top cover 200 by spring loaded grounding hinge assembly 435. Finally, the front door 500 is grounded to the top cover 200 by the spring loaded bearing assemblies 610. By bonding all of the components of the cabinet together, separate grounding jumper wires are not required and the network cabinet 10 is completely grounded and requires only a single point of contact with the main building ground (e.g. the ground whip 25).

Figure 14A:
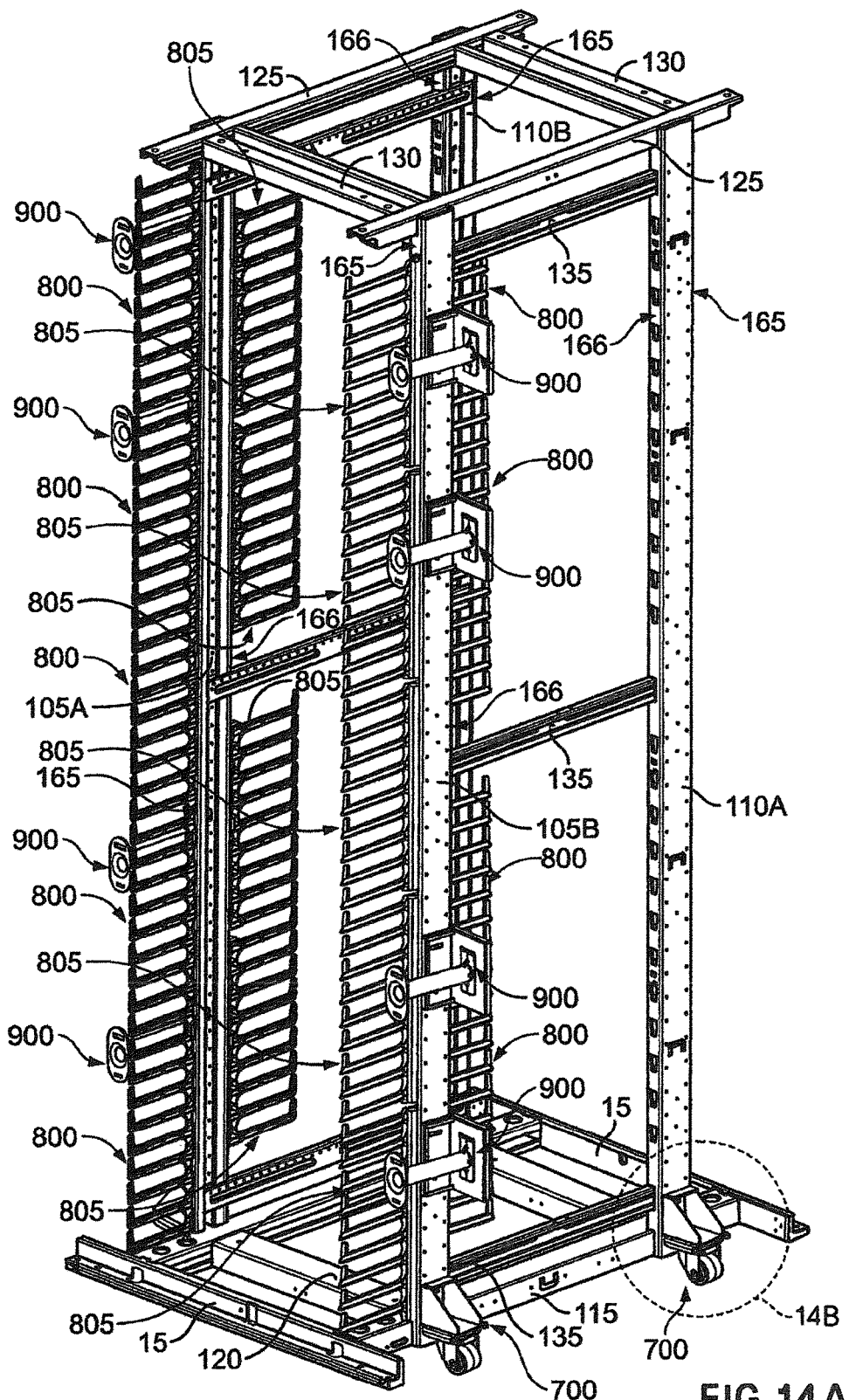
FIG. 14A is a front perspective view of the base frame of the network cabinet of the current invention with caster assemblies, cable management units, and slack management spools attached.

Referring to FIG. 14A, the network cabinet 10 can also include caster assemblies 700, cable management units 800, and slack management spools 900.

Figure 14B:
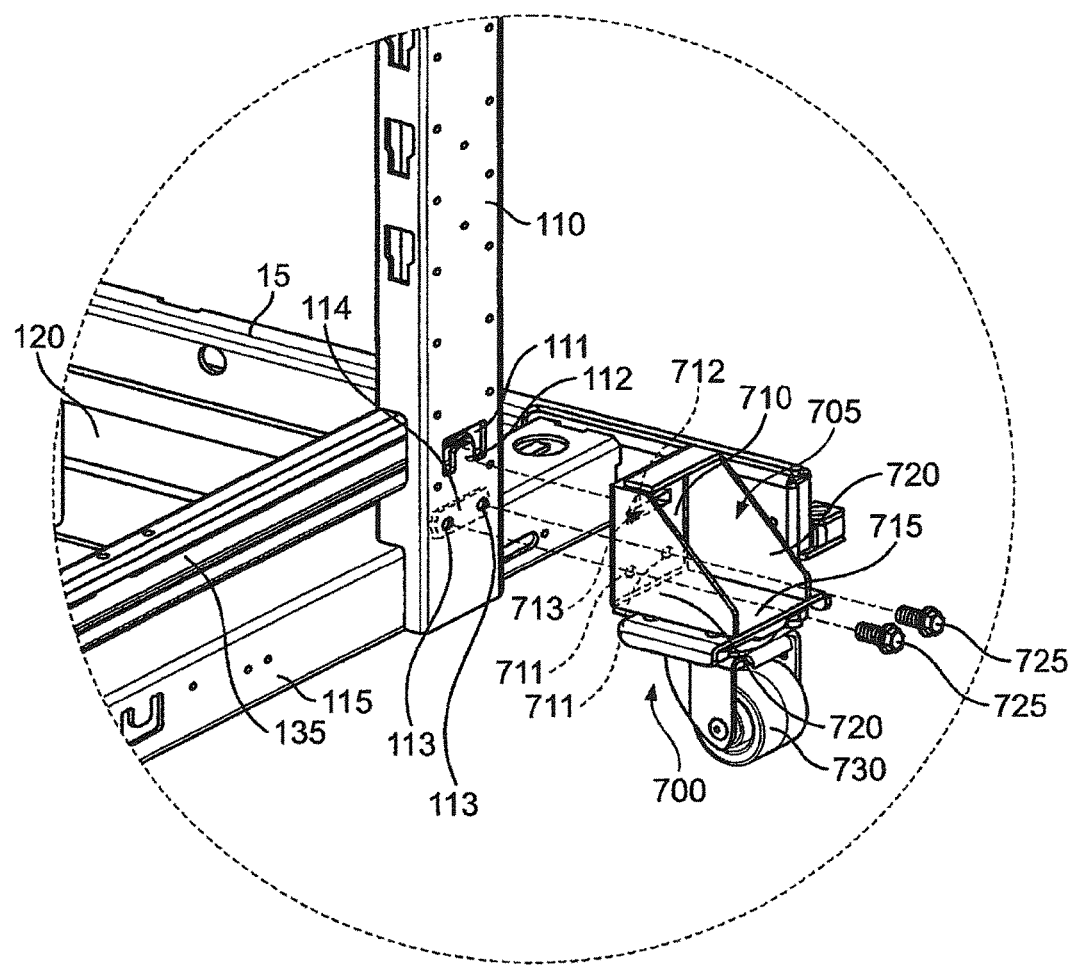
FIG. 14B is an exploded, enlarged partial view of a caster assembly shown in FIG. 14A.

Referring to FIGS. 14A and 14B, in this example caster assemblies 700 are mounted to the sides of front and back vertical frame rails 105, 110, alleviating the need to tip or turn the network cabinet 10 or base frame 100 in order to install, remove, or repair the caster assemblies 700. Caster assemblies 700 include a body 705, which is steel or other conductive material and is formed by a first wall 710, a second wall 715 that extends generally perpendicular to the first wall 710, and a pair of support walls 720 that extend between the first wall 710 and second wall 715 to provide strength and rigidity to the body 705.

A standard caster wheel 730 is attached to the second wall 715 of the body 705. The first wall 710 of the body 705 has a pair of holes 711 and a wall member 712 that extends from the first wall 710 to form a slot 713 between the wall member 712 and the first wall 710.

As shown in FIG. 14B, to install caster assembly 700, the base frame 100 is raised by rotating the leveling legs 60. The first wall 710 of the caster assembly 700 is placed against the back vertical frame rail 110 such that the wall member 712 extends into an aperture 111 in the vertical frame rail 110. The caster assembly 700 is then lowered such that a tongue 112 formed in the aperture 111 engages the slot 713 formed between the wall member 712 and the first wall 710 and holes 711 in the first wall 710 are aligned with holes 113 that are formed in the back vertical frame rail 110. A pair of bolts 725 are inserted through the holes 711 in the first wall 710 and the holes 113 in the back vertical frame rail 110 and are threaded into a jam-nut 114 that is welded to the back vertical frame rail 110. The base frame 100 is then lowered by rotating the leveling legs 60 until the base frame rests on the caster assemblies 700. In addition to attaching the caster assembly 700 to the back vertical frame rail 110, the bolts 725 and jam-nut 114 can also provide bonding between the caster assembly 700 and the back vertical frame rail 110. To create the bond, the bolts 725 can have serrations or teeth on the underside of the head that bite through any paint into the metal of the body 705 to provide a bond between the body 705 and the bolts 725. Alternatively, standard bolts could also be used with internal tooth lock washers to provide the bond or standard bolts could be used and the area around the holes 711 could be paint masked to provide the bond if bonding is desired.

Figure 15A:
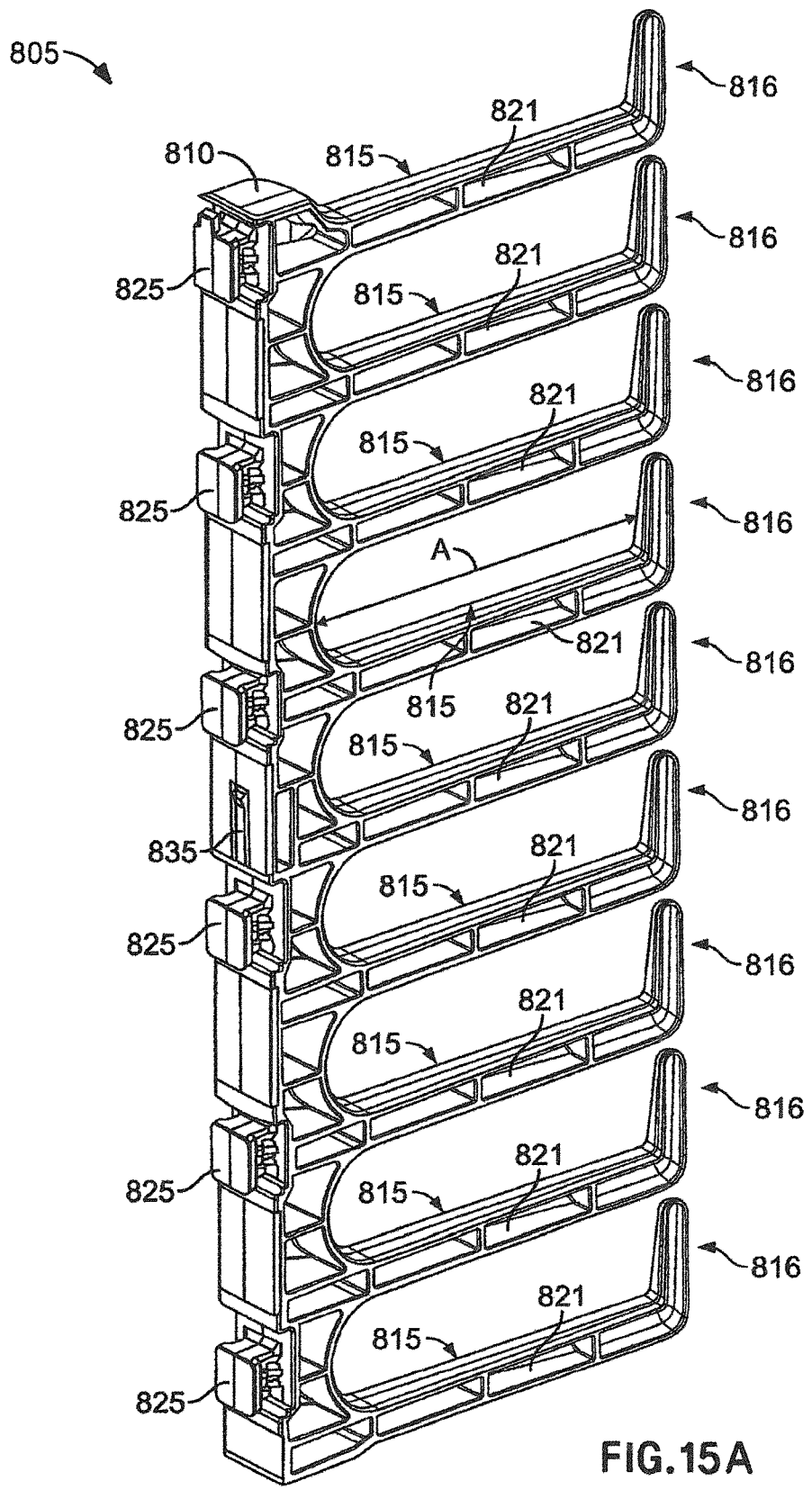
FIG. 15A is a back perspective view of a right hand cable management unit.
Figure 15B:
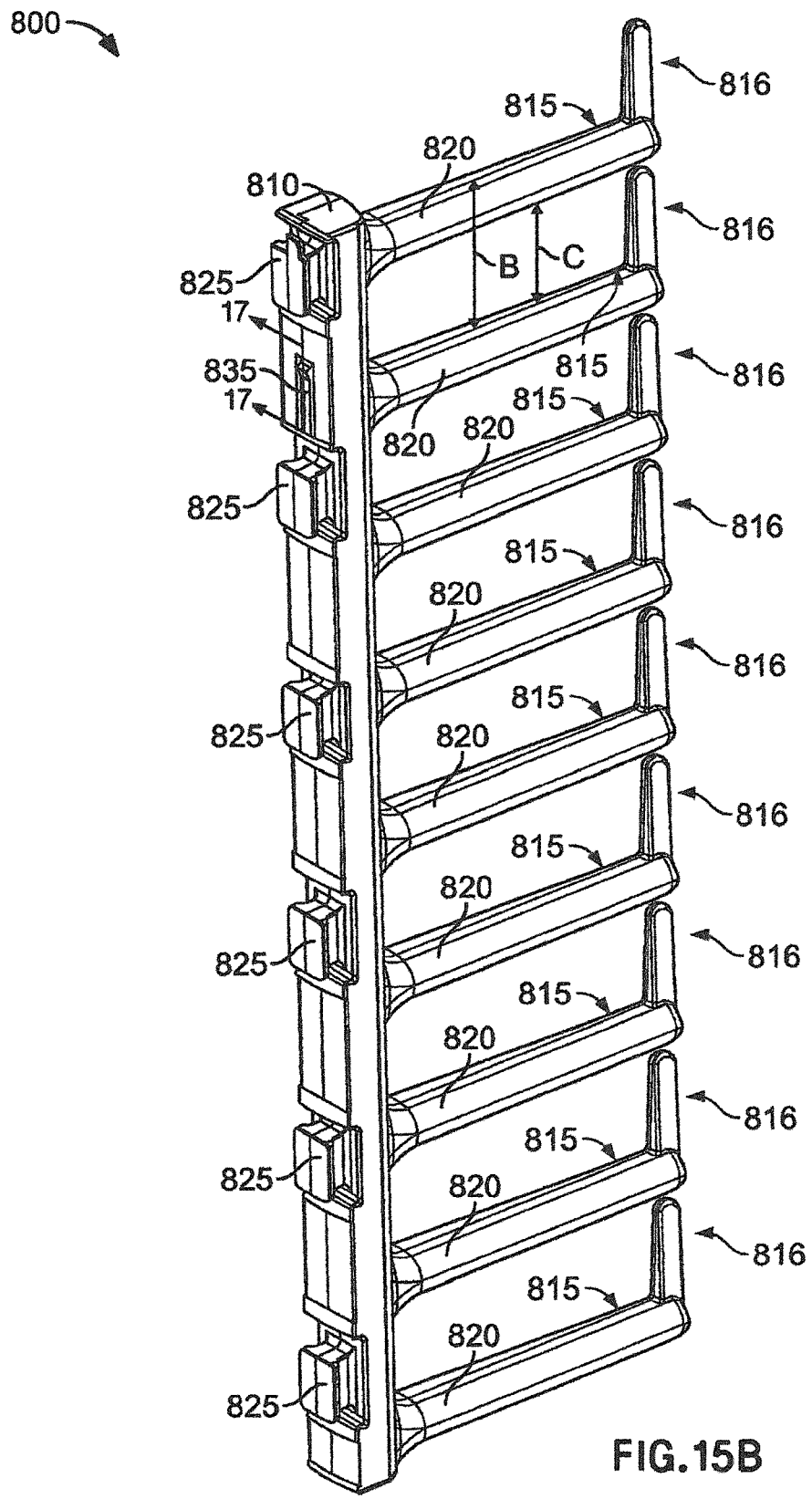
FIG. 15B is a back perspective view of a left hand cable management unit.

Referring to FIGS. 14A, 15A, and 15B, in this example multiple left hand cable management units 800 and right hand cable management units 805, which are mirror images of each other, can be mounted to the front and back faces of front vertical frame rails 105A, 105B and front and back faces of the back vertical frame rails 110A, 110B. As used herein, the front faces of front and back vertical frames rails 105A, 105B, 110A, and 110B are the faces that face outward from base frame 100 and are directly accessible from the outside of base frame 100. The back faces of front and back vertical frame rails 105A, 105B, 110A, and 110B are the faces that are opposite the front faces, face inward towards the inside of base frame 100, and are generally accessible from the inside or sides of base frame 100. For convenience, FIG. 14A shows left and right hand cable management units 800, 805 mounted only to the front and back faces of front vertical frame rails 105A and 105B.

As described in more detail below, left hand cable management units 800 would be mounted to the front faces of left side front vertical frame rail 105A (left side when facing the cabinet from the front) and left side back vertical frame rail 110A (left side when facing the cabinet from the back) and to the back faces of right side front vertical frame rail 105B and right side back vertical frame rail 110B. Right hand cable management units 805 would be mounted to the front faces of right side front vertical frame rail 105B and right side back vertical frame rail 110B and to the back faces of left side front vertical frame rail 105A and left side back vertical frame rail 110A. In this example, five cable management units 800, 805 can be mounted on the front faces of front and back vertical frame rails 105A, 105B, 110A, and 110B and four cable management units 800, 805 can be mounted in the back faces of front and back vertical frame rails 105A, 105B, 110A, and 110B.

As can best be seen in FIGS. 15A and 15B, in this example each cable management unit 800, 805 is molded plastic and includes a base 810 and nine fingers 815 that protrude and extend from base 810. Each finger 815 has a generally vertically oriented cable retainer 816 at its distal end (opposite the base 810) that prevents cables from spilling out of fingers 815 and provides approximately 6.2 inches of cable management length (shown as A in FIG. 15A) between base 810 and cable retainers 816. Each finger 815 has a semi-circular cross-section in which the outside surface 820 (the surface that faces outside base frame 100 when installed and will contact cables) is solid and has a bend radius of approximately 0.25 inches and inside surface 821 (the surface that faces inside base frame 100 when installed) is cored out to make fingers 815 generally hollow. The bend radius of outside surface 820 provides for the management of cable without any sharp corners which can damage the cables. Conversely, inside surface 821 does not generally contact the cables and therefore can be designed without bend radii and can be cored out for manufacturability purposes.

In the example shown, the spacing between the tops of adjacent fingers 815 is approximately 1.75 inches (shown as B in FIG. 15 B), which is equivalent to one rack unit ("RU"). Each finger 815 has a height of approximately 0.5 inches, which provides approximately 1.25 inches of cable management height (shown as C in FIG. 15B). The finger height and spacing combine to allow for management of 48 Cat 6 cables, 24 cat6A cables, or other types of cabling, such as communication cabling, in each RU. The area where base 810 meets each finger 815 also has a bend radius of approximately 0.3 inches.

Figure 16A:
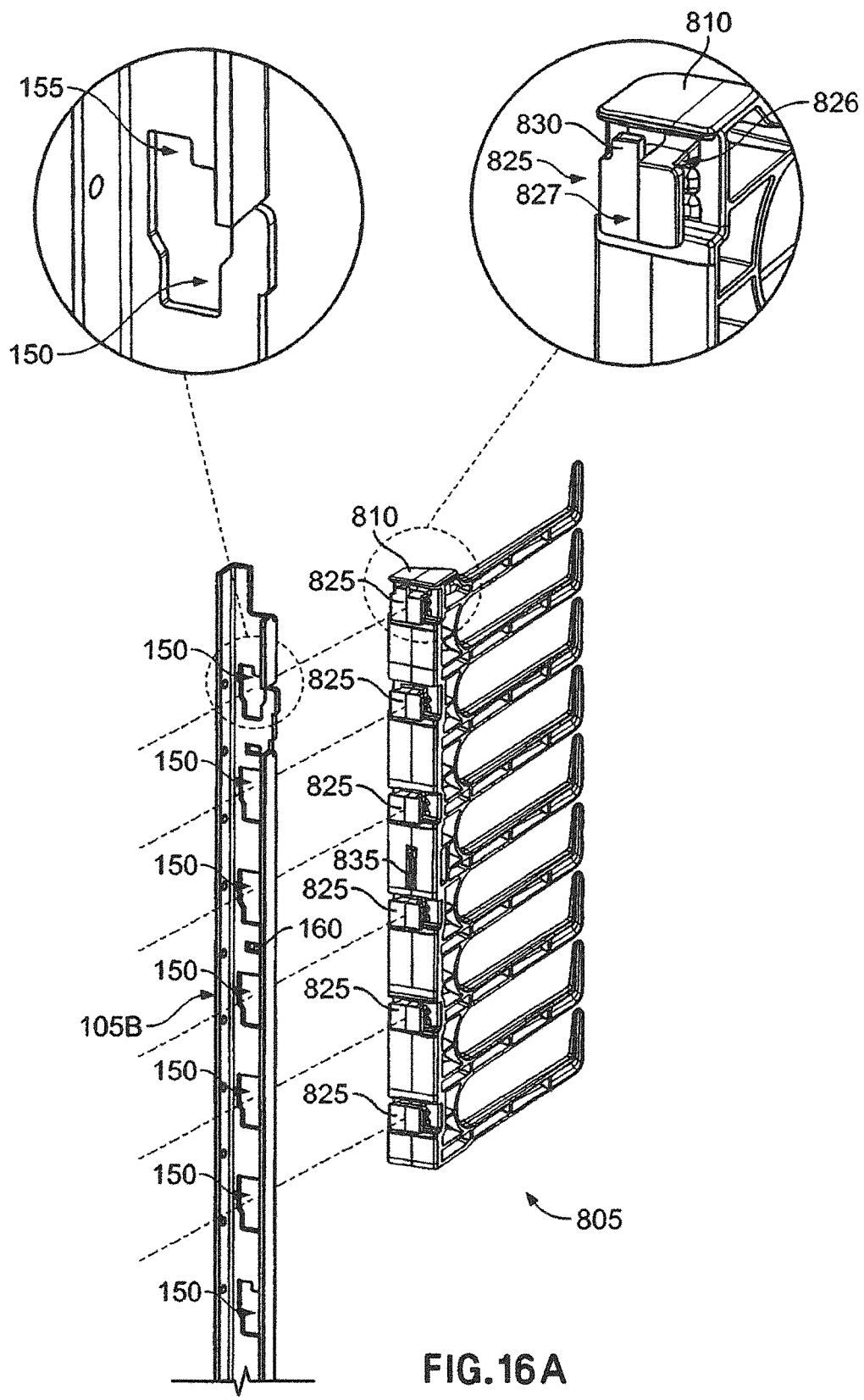
FIG. 16A is an exploded partial enlarged view showing the attachment of a right hand cable management unit to the base frame of the network cabinet of the present invention.
Figure 16B:
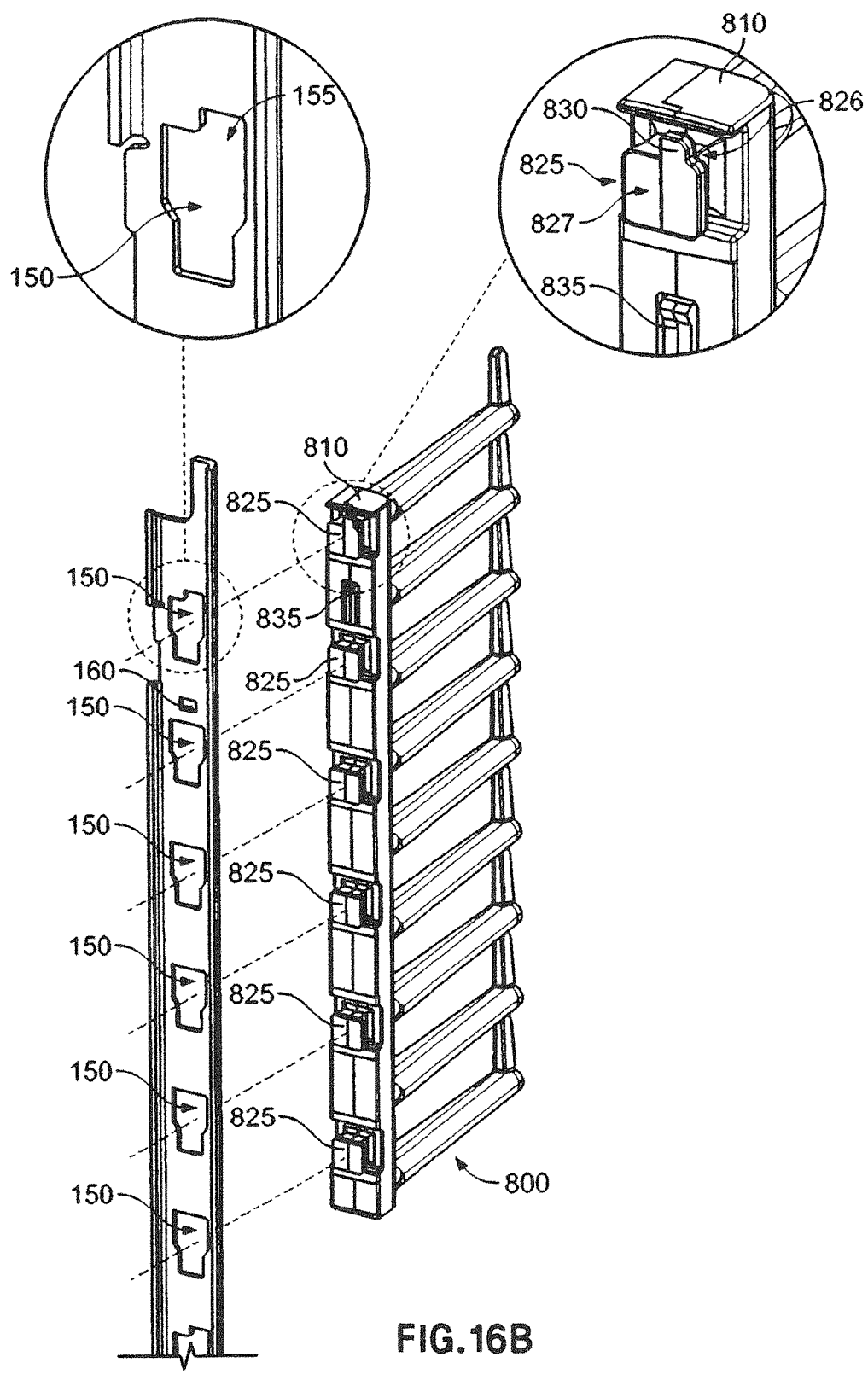
FIG. 16B is an exploded partial enlarged view showing the attachment of a left hand cable management unit to the base frame of the network cabinet of the present invention.

Referring additionally to FIGS. 16A and 16B, in this example each cable management unit 800, 805 includes buttons 825 that protrude from the back surface of base 810, opposite the fingers 815. Buttons 825 are adapted to engage corresponding apertures 150 in the faces of front and back vertical frame rails 105, 110 to mount cable management units 800, 805 to vertical frame rails 105, 110. Buttons 825 are inserted into corresponding apertures 150 and the cable management unit 800, 805 is pushed down to snap it into place. This allows the manual assembly and removal of cable management units 800, 805 with no additional fasteners or tools. In addition, when multiple cable management units are mounted, a gap of approximately 0.75 inches is left between adjacent units to allow for removal of individual units without having to remove units mounted above.

As can best be seen in the enlarged partial views in FIGS. 16A and 16B, on each cable management unit 800, 805, one of the buttons 825 will also include a protrusion 830 that extends laterally from one side of the button. In the example shown, protrusion 830 extends from the top of the button and is skewed to the left for left hand cable management units 800 and skewed to the right for right hand cable management units 805. This protrusion 830 is adapted to coincide with a slot 155 that extends from one side of an aperture 150. One button on each cable management unit 800, 805 will have a protrusion 830 and only selected apertures 150 in vertical frame rails 105, 110 will have slots 155, which act as a keying feature to prevent cable management units 800, 805 from being mounted on the wrong side of a vertical frame rail 105, 110 or from being mounted upside down. Having slots 155 only in predetermined apertures 150 also requires that cable management units 800, 805 be mounted in predetermined positions. Alternatively, all of the buttons 825 could have protrusions 830 and all apertures 150 could have slots 155. This would allow the vertical positioning of the cable management units 800, 805 anywhere along a vertical frame rail while still preventing the mounting on the wrong side of a vertical frame rail or mounting upside down.

Figure 17:
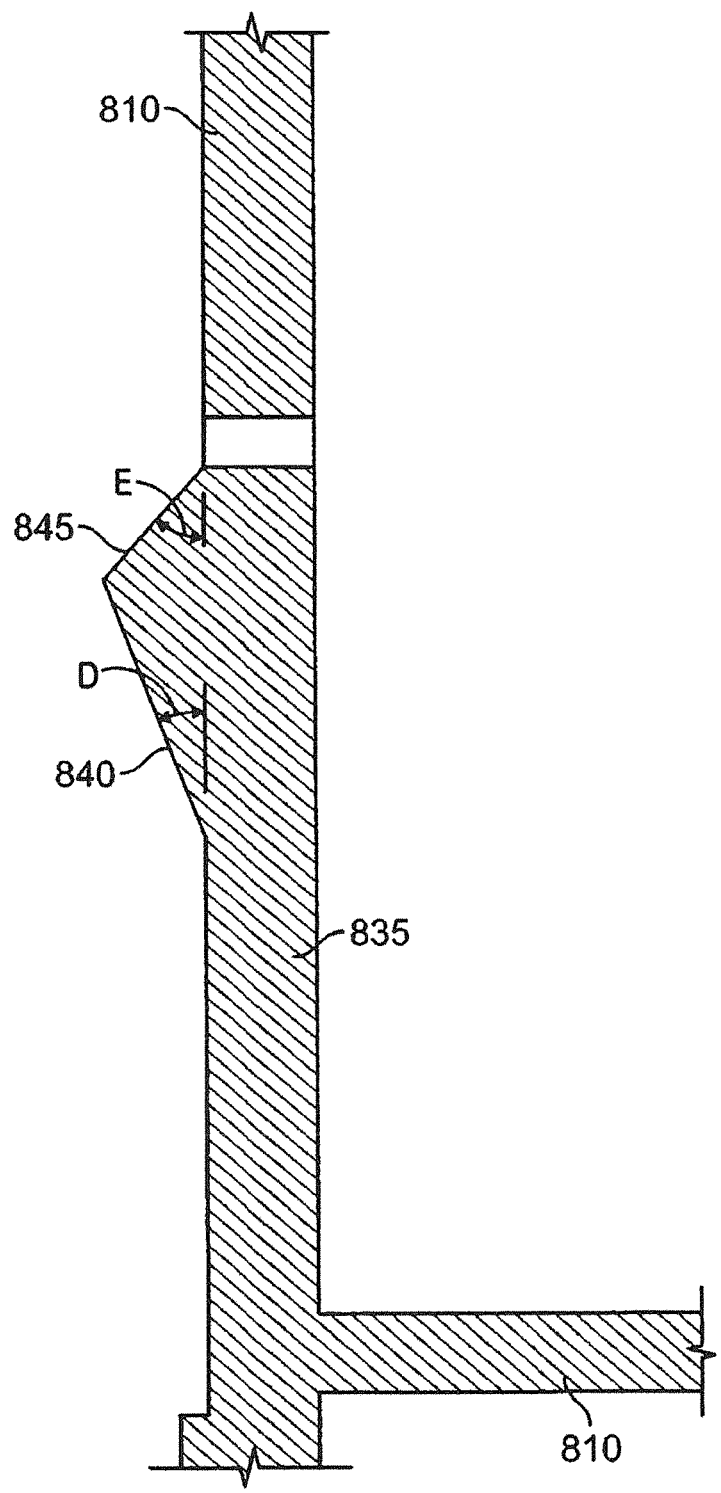
FIG. 17 is a cross-sectional view taken along line 17-17 in FIG. 15B.

As can best be seen in FIGS. 15A, 15B, and 17, each cable management unit 800, 805 can also have a cantilevered locking finger 835 formed in the back surface of base 810. The outside surface of locking finger 835 has a shallow inclined lead in face 840, which is angled from the back surface approximately 20-40 degrees (lead in angle shown as D in FIG. 17), and a steep inclined lead out face 845, which is angled from the back surface approximately 30-50 degrees (lead out angle shown as E in FIG. 17). Locking finger 835 and faces 840, 845 are adapted to engage and snap into a locking slot 160 in vertical frame rails 105, 110 (see FIGS. 16A and 16B) to secure cable management units 800, 805 to vertical frame rails 105, 110. The shallow lead in angle D allows for easy mounting of the cable management units 800, 805, while the steep lead out angle E provides more resistance so that cable management units 800, 805 can be, but are not easily, removed.

Figure 18A:
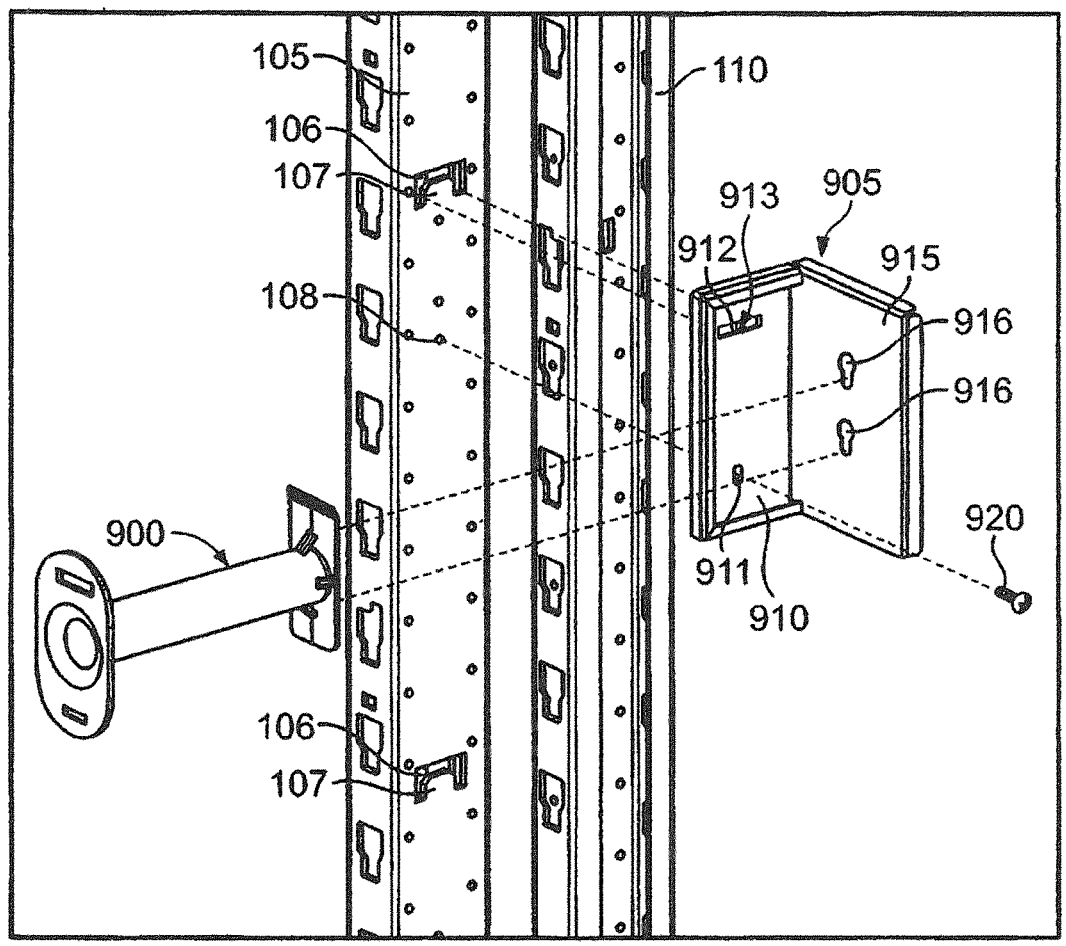
FIG. 18A is an exploded partial enlarged view showing the attachment of a slack management spool to the base frame of the network cabinet of the present invention.
Figure 18B:
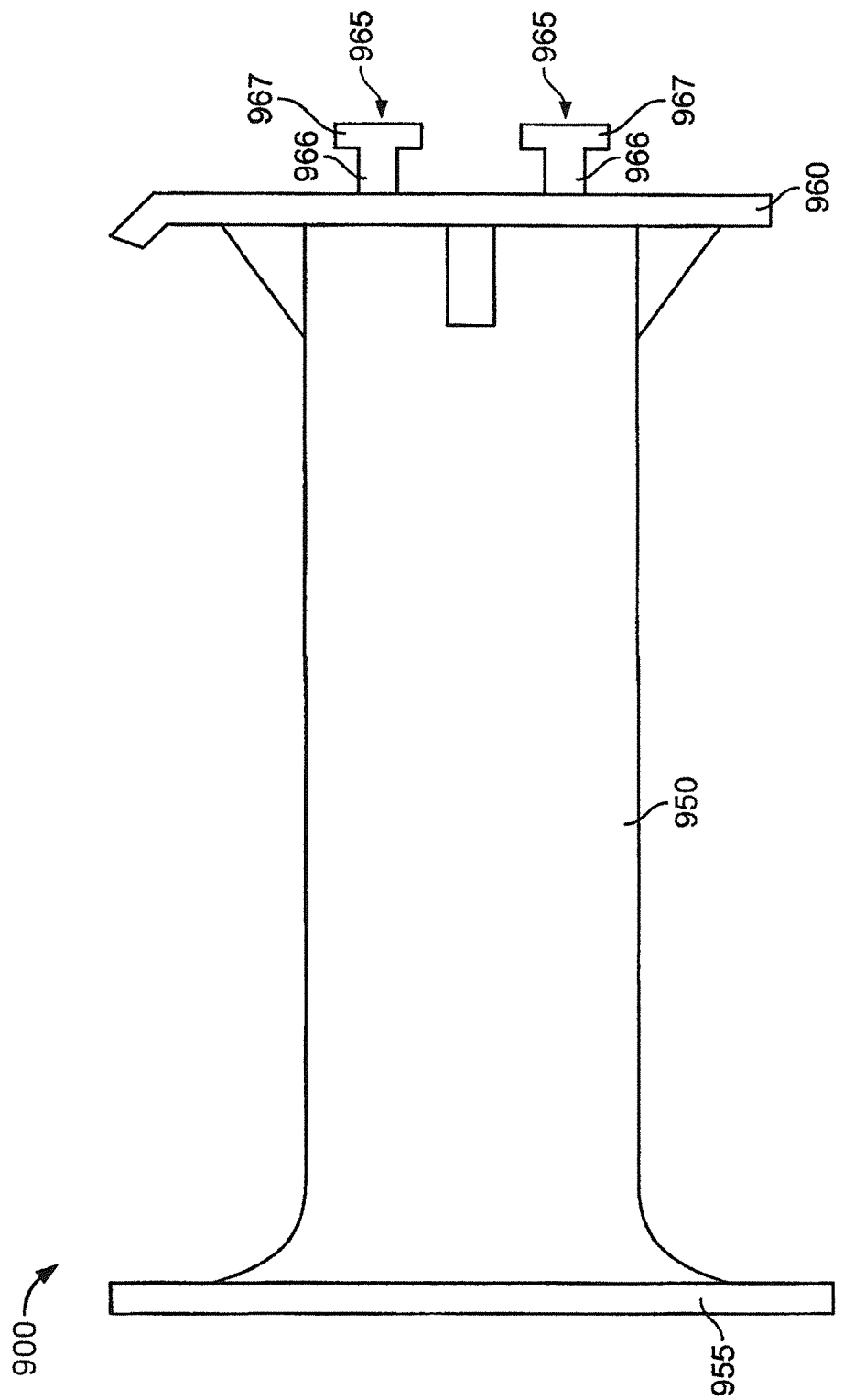
FIG. 18B is a side view of the slack management spool shown in FIG. 18A.

Referring to FIGS. 14A, 18A, and 18B, slack management spools 900 can also be mounted to front and back vertical frame rails 105, 110 via brackets 905.

Referring specifically to FIG. 18B, a slack management spool 900 is shown that, in this example, is plastic and includes a generally cylindrical spool body 950, a stop wall 955 formed at one end of the spool body 950, and a mounting wall 960 formed at the second end of the spool body 950 opposite the stop wall 955. The mounting wall 960 has a pair of generally cylindrical protrusions 965 that are adapted to engage mounting holes in the brackets 905, as seen in FIG. 18A and as discussed in more detail below. Each of the protrusions 965 has a first section 966 that extends from the surface of the mounting wall 960 and has a first dimension and a second section 967 at the end of the first section 966 that has a second dimension, which is greater than the first dimension. In this example, first section 966 and second section 967 are generally circular in design, wherein the first and second dimensions are diameters.

Referring specifically to FIG. 18A, the mounting of a slack management spool 900 to a front vertical frame rail 105 by a bracket 905 is shown. Bracket 905, in this example, is steel and is generally "L" shaped having a first wall 910 and a second wall 915 that extends generally perpendicular to the first wall 910. Alternatively, bracket 905 could be made in any geometry and of any material appropriate for a given application. First wall 910 has a hole 911 and a wall member 912 that extends from first wall 910 to form a slot 913 between wall member 912 and first wall 910. Second wall 915 has a pair of mounting holes 916 that are adapted to receive and secure the protrusions extending from mounting wall 960 of slack management spools 900.

To mount a bracket 905 to a front vertical frame rail 105, first wall 910 of bracket 905 is placed against the front vertical frame rail 105 such that wall member 912 extends into an aperture 106 in front vertical frame rail 105. Apertures 106 are positioned spaced apart along vertical frame rails 105, 110. In this example, four apertures 106 are provided in each vertical frame rail 105, 110, as can be seen in FIG. 14A. Bracket 905 is then lowered such that a tongue 107 formed in aperture 106 engages slot 913 formed between wall member 912 and first wall 910. Bracket 905 is lowered until hole 911 in first wall 910 is aligned with a hole 108 formed in the front vertical frame rail 105. A trilobular screw 920 can be inserted through hole 911 in first wall 910 and is threaded into hole 108 in front vertical frame rail 105. Trilobular screw 920 provides a bond to the front vertical frame rail 105 by cutting threads into the metal of front vertical frame rail 105. To provide a bond between trilobular screw 920 and bracket 905, trilobular screw 920 has serrations or teeth on the underside of the head that bite into the metal of bracket 905. Alternatively, a standard bolt could be used with an internal tooth lock washer or a standard bolt could be used and the area around hole 911 could be paint masked and the area within hole 108 could be paint masked as well if bonding is desired.

Slack management spool 900 is then mounted to bracket 905 by inserting protrusions 965 extending from mounting wall 960 through mounting holes 916 in bracket 905 and sliding spool 900 downward until the first section 966 of protrusions 965 engage mounting holes 916.

Figure 20:
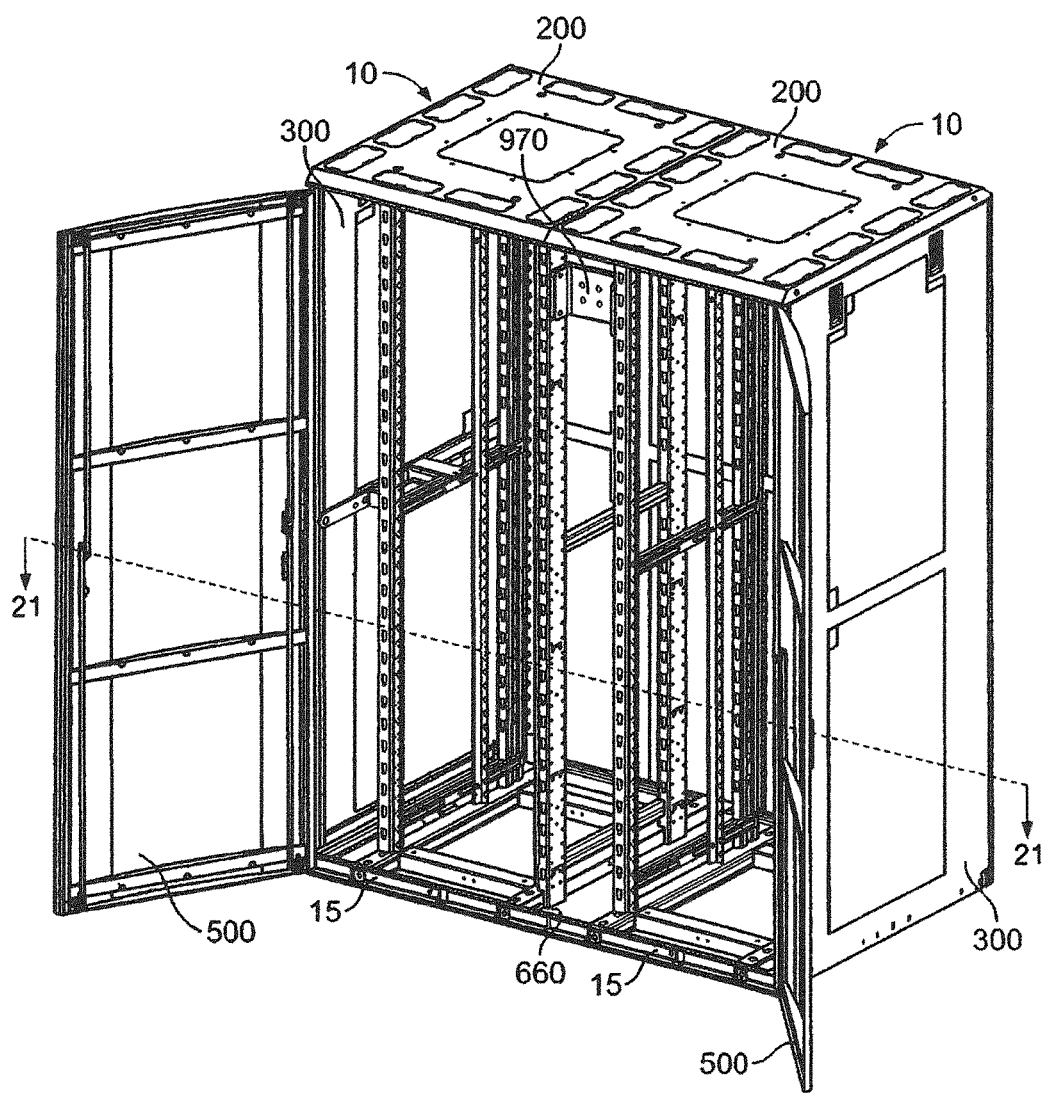
FIG. 20 is a front perspective view of the network cabinets in FIG. 19, with the front doors open.
Figure 21:
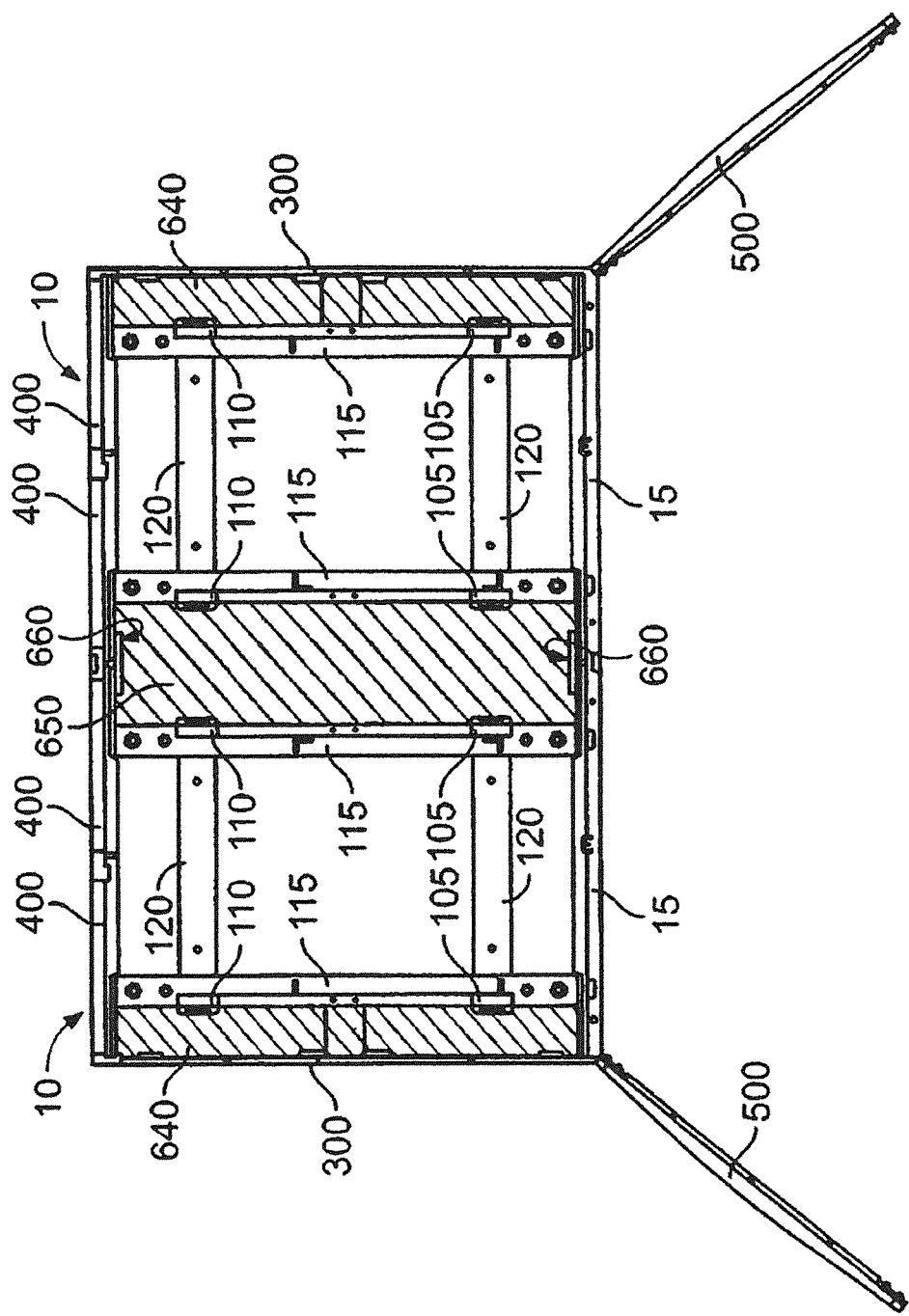
FIG. 21 is a cross-sectional view taken along line 21-21 in FIG. 20.

Referring to FIGS. 19-21, there is shown two network cabinets 10 that are ganged, or joined, together. To gang two network cabinets 10 together the left side panel 300 of the right cabinet is removed and the right side panel 300 is removed from the left cabinet. The cabinets are then positioned next to each other such that the sides with side panels 300 removed are positioned adjacent one another. Top covers 200 of the adjacent network cabinets 10 are secured together by inserting bolts through holes in the adjacent side flanges 202 (not shown in FIGS. 19-21) of top covers 200 and threading nuts onto the bolts to secure the top covers 200 together. Generally "L" shaped steel brackets 660 are also bolted or screwed to the adjacent ends of front and back door mounts 15. In addition, generally "U" shaped double spool brackets 970 could also be attached between the adjacent front vertical frame rails 105 and back vertical frame rails 110 of the ganged cabinets.

Referring specifically to FIG. 21, the cross hatched areas (side cable management pathways 640 and center cable management pathway 650) show the cable management pathways that are created as a result of inset frame structure of the network cabinets 10 when two network cabinets 10 are ganged together. Side cable management pathways 640 are bounded by side panels 300 on the outside and front and back vertical frame rails 105, 110 and front to back support beams 135 on the inside. Center cable management pathway 650 is a larger cable management pathway that is bounded on the left and right by the adjacent front and back vertical frame rails 105, 110 and front to back support beams 135. Hinging front doors 500 outward (as shown in FIG. 21) provides clear access to center cable management pathway 650. Hinging front doors 500 inward provides clear access to the corresponding side cable management pathways 640, which can also be clearly accessed by removing the corresponding side panel 300.

With reference to FIGS. 22-51, another exemplary embodiment of the present invention is illustrated. This illustrated exemplary embodiment includes a data center 2000 comprising a plurality of network cabinets 2004, such as server cabinets 2004A and switch cabinets 2004B, that are ganged together.

Data center architects like to use passive 10G SFP+ cabling to connect electrical components supported within the network cabinets 2004 because such cabling has a low latency, requires low power and is low in cost. However, such 10G SFP+ cabling has a length limitation of about 7 meters (i.e., about 22.966 feet). Therefore, electrical components to be connected by 10G SFP+ cabling can be no further than 7 meters apart and, in most cases, much closer than 7 meters because cabling usually cannot make a straight run between electrical components. Hence, with the use of 10G SFP+ cabling, the number of network cabinets 2004 that may be ganged together and contain electrical components desired to be connected together with 10G SFP+ cabling is limited. Conventionally, when using 10G SFP+ cabling, data center architects were restricted to having a maximum of three network cabinets ganged together in a Middle-of-Row (MoR) architecture comprised of a middle switch cabinet and two outside server cabinets.

Figure 22:
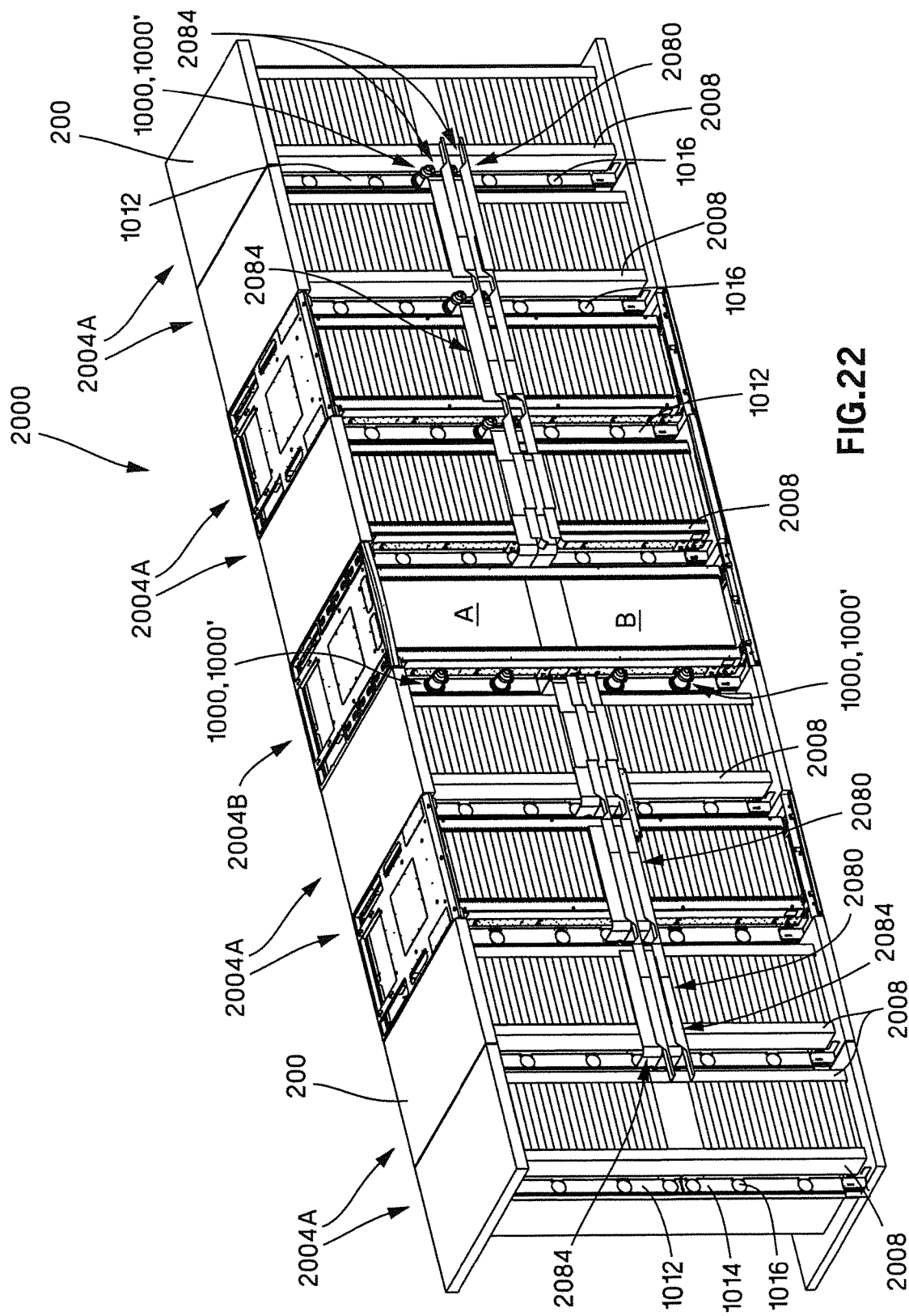
FIG. 22 is a top front perspective view of data center including a plurality of ganged together network cabinets of the present invention.
Figure 23:
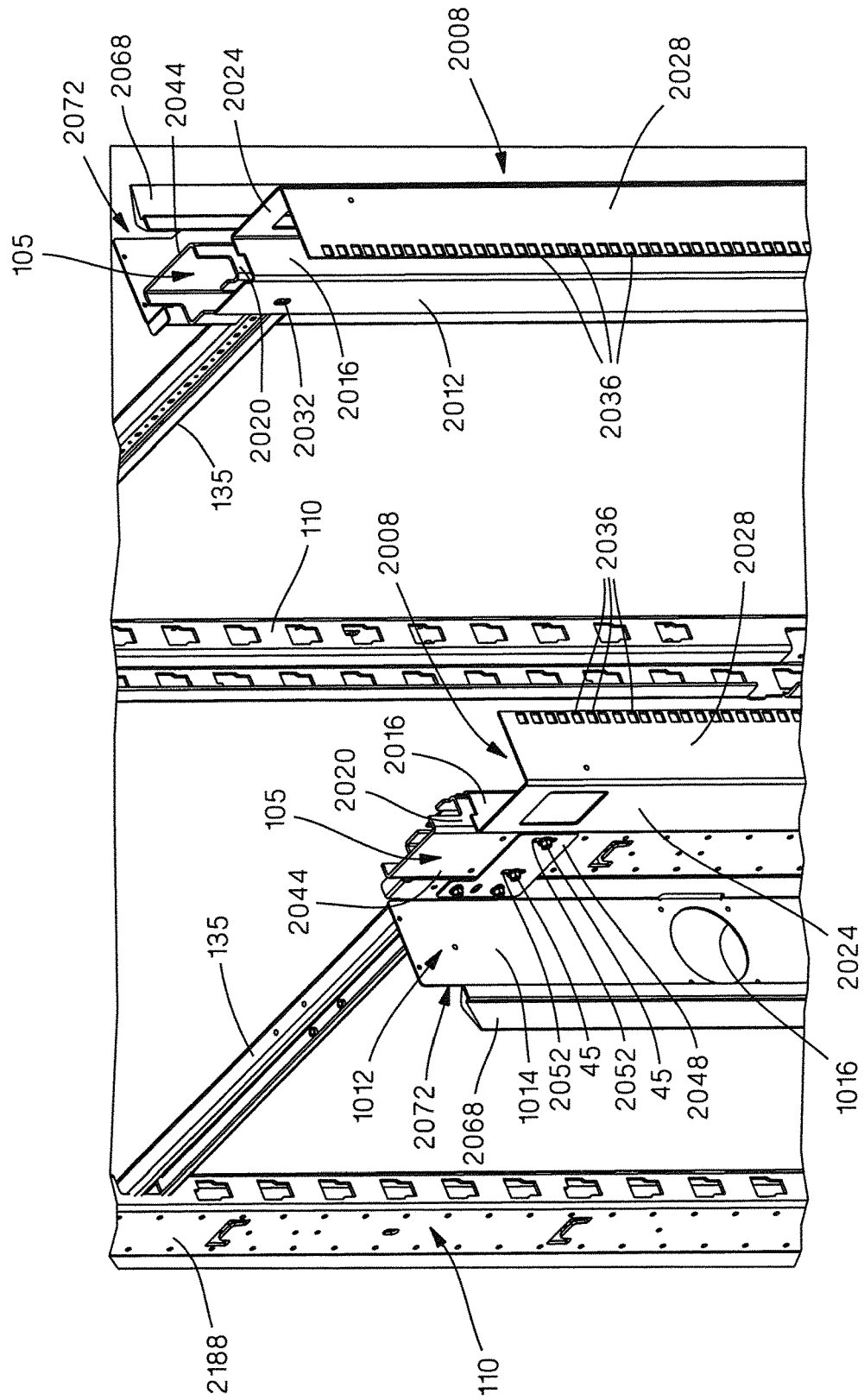
FIG. 23 is a partial top front perspective view of a portion of one of the network cabinets shown in FIG. 22.
Figure 24:
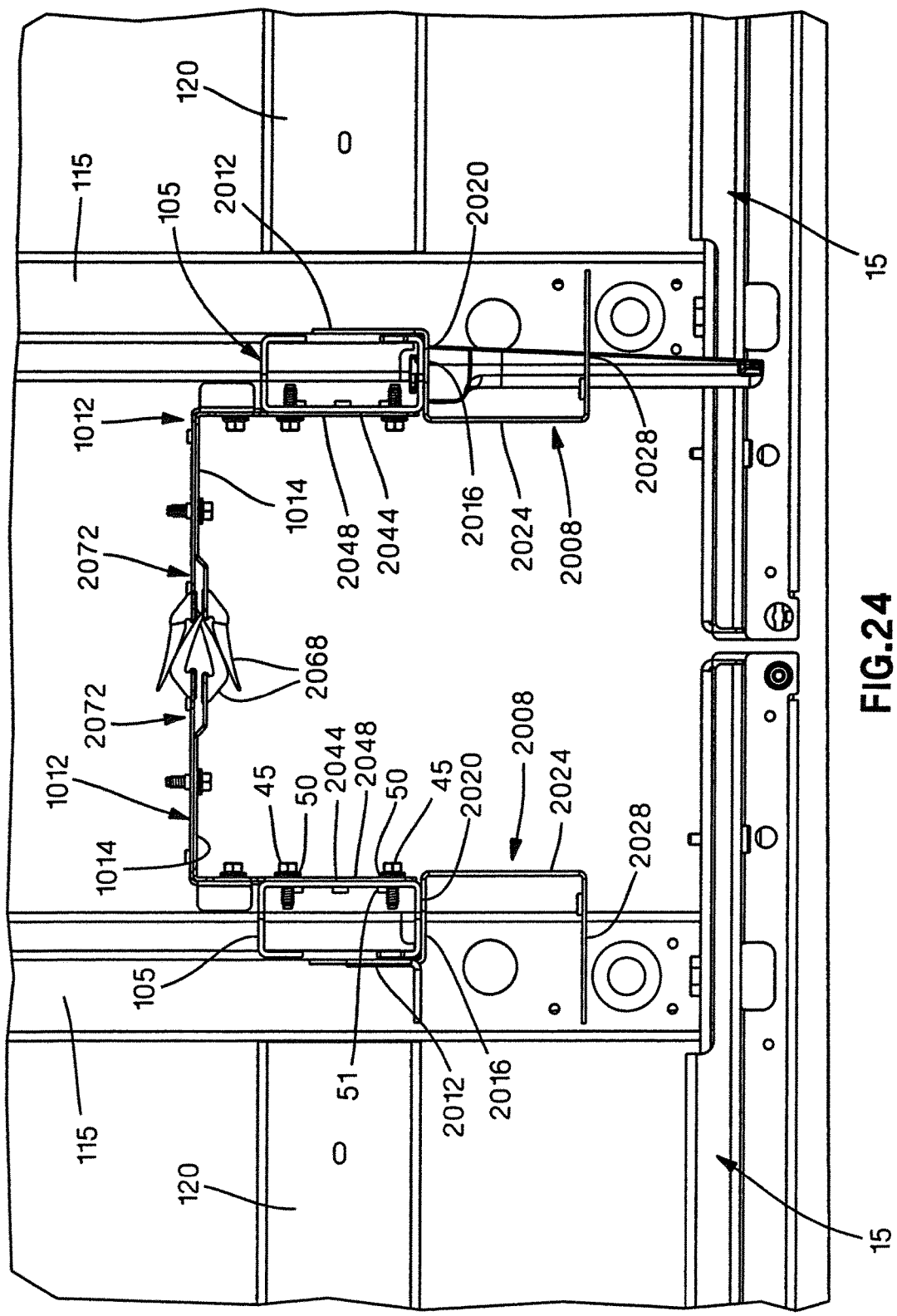
FIG. 24 is a partial top view of a portion of the network cabinets shown in FIG. 22.
Figure 25:
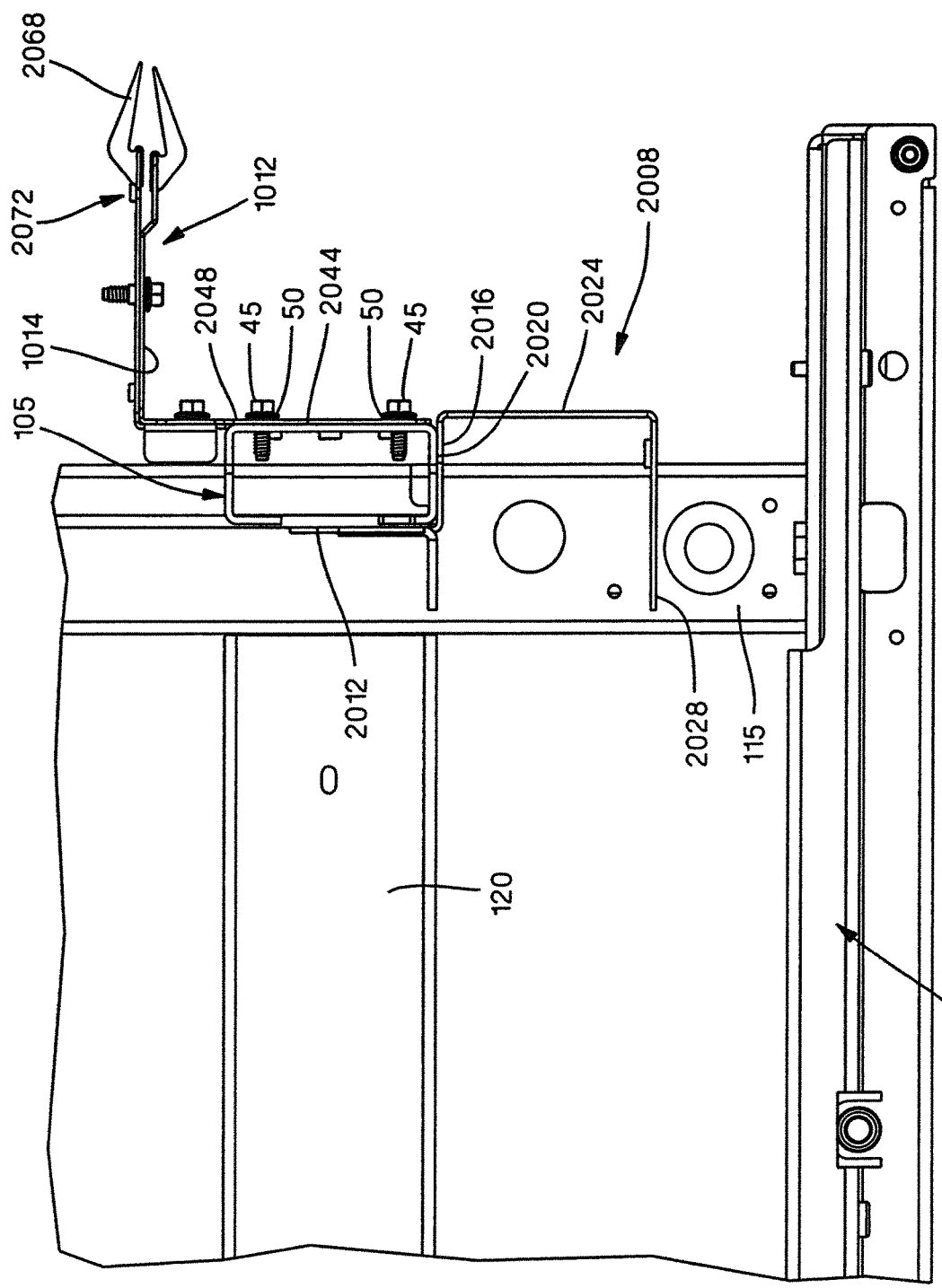
FIG. 25 is a partial top view of a portion of one of the network cabinets shown in FIG. 22.

Referring now to FIG. 22, the data center 2000 of the present invention is illustrated and is adapted to maximize the number of network cabinets 2004 that may be ganged together and contain electrical components electrically connected by 10G SFP+ cabling. In the illustrated exemplary embodiment, the data center 2000 contains nine total network cabinets 2004 arranged in a MoR architecture with a middle switch cabinet 2004B and eight server cabinets 2004A. With this MoR configuration, the switches in the switch cabinet 2004B may be connected to servers contained in server cabinets 2004A as far out as four network cabinets in either direction. When fully assembled, the exemplary network cabinets 2004 in the data center 2000 may be about 32 inches wide, about 40 inches deep, and about 84 inches high and have 45 rack units with a 2,000 pound load rating. In other exemplary embodiments, the data center 2000 may include more or less network cabinets 2004 and may have architectures other than MoR such as, for example, End-of-Row (EoR) (i.e., switch cabinet 2004B at end of row), the switch cabinet 2004B disposed somewhere between a middle and an end of the row, or any other architecture. In order to describe the present invention, the embodiment of the data center 2000 illustrated in FIG. 22 will be used herein. However, it should be understood that the description and illustration of the exemplary embodiment included herein is not intended to be limiting and any other configuration of data centers and network cabinets are intended to be within the spirit and scope of the present invention.

With continued reference to FIG. 22, the switch cabinet 2004B contains switches identified as switch A and switch B. The four server cabinets 2004A to each side of the switch cabinet 2004B may contain servers. The switch cabinet 2004B and the server cabinets 2004A may all have similar structural configurations and functional capabilities as the network cabinets 10 described above in connection with FIG. 1-21. For example, the switch cabinet 2004B and server cabinets 2004A may all include a base frame 100, top cover 200, side panels 300, back doors 400, and front door 500. Additionally, for example, the base frame 100 is conductive and generally includes a pair of front vertical frame rails 105, a pair of back vertical frame rails 110, a pair of front to back base beams 115, a pair of side to side base beams 120, a pair of front to back top beams 125, a pair of side to side top beams 130, and front to back support beams 135, all of which are typically steel but can be made of any suitable conductive or non-conductive material. The front and back vertical frame rails 105, 110 are inset from side panels 300, back doors 400, front door 500, and the corners of the network cabinet 2004 that are formed by side panels 300, back doors 400, and front door 500. This inset provides unobstructed space along all of the sides of the network cabinet 2004 for cable management pathways. The side to side base beams 120 have a rectangular cross-section geometry and are positioned between and perpendicular to the front to back base beams 115, which also have a rectangular cross-section geometry. The side to side base beams 120 are welded to the front to back base beams 115 and, along with the door mounts 15, form a base member for the network cabinet 2004 and define openings 123 (see FIG. 49). By welding together all of the steel components of the base frame 100, the base frame 100 is a single conductive, bonded unit. It should be understood that some of these components have been removed in order to illustrate interiors of the network cabinets 2004.

In some exemplary embodiments, all of the network cabinets 2004 of the data center 2000 may have similar structure and function. Thus, only one of the network cabinets 2004 will be described in detail herein unless otherwise stated and such exemplary single network cabinet 2004 will be described and illustrated as a server cabinet 2004A.

Referring now to FIGS. 23-28, each server cabinet 2004A includes a pair of server equipment rails 2008, connected to the front to back support beams 135 of the server cabinet 2004A in the same manner as the equipment rails described above. The server equipment rails 2008 replace the front movable equipment rails within the network cabinet.

Each server equipment rail 2008 includes a first flange 2012 connected to the front to back support beams 135 of the server cabinet 2004A in the same manner as the equipment rails described above, a second flange 2016 extending from the first flange 2012 in a perpendicular direction along a front surface 2020 of the corresponding front vertical frame rail 105, a third flange 2024 extending from the second flange 2016 in a perpendicular direction toward a front of the server cabinet 2004A, and a fourth flange 2028 extending from the third flange 2024 in a perpendicular direction toward an interior of the server cabinet 2004A and parallel to a front of the server cabinet 2004A. In the illustrated exemplary embodiment, the first flange 2012 includes three holes 2032 for connecting the server equipment rail 2008 to the corresponding front to back support beams 135. The fourth flange 2028 includes a plurality of apertures 2036 for connecting servers to the server equipment rail 2008. The plurality of apertures 2036 provides great flexibility in deciding how and where to connect servers to the server equipment rail 2008.

Referring now to FIGS. 23-25 and 29, the server cabinet 2004A also includes a pair of air dams 1012, one connected to an exterior surface 2044 of each of the front vertical frame rails 105. The air dams 1012 are connected to the front vertical frame rails 105 in a manner that enables electrical conduction between the two components and grounding of the air dams 1012. In addition, the air dams 1012 are rigidly and securely connected to the front vertical frame rails 105. The connection between the air dams 1012 and the front vertical frame rails 105 may be bonded by placing an internal tooth lock washer 50 between a bolt 45 and each air dam 1012 and a second internal tooth lock washer 51 between a nut and each of the front vertical frame rails 105. The internal tooth lock washers 50, 51 have teeth that pierce the paint or coating and bite into the metal of the air dams 1012 and the front vertical frame rails 105. An anti-oxidant paste could also be placed on the air dams 1012 and the front vertical frame rails 105, underneath the lock washers 50, 51, to prevent possible corrosion where the teeth of the lock washers 50, 51 bite into the metal of the air dams 1012 and the front vertical frame rails 105. This provides a ground path from the air dams 1012 to the front vertical frame rails 105 through the bolt 45, lock washers 50, 51, and nut. Alternatively, regular washers could be used and the area around the holes in the air dams 1012 and the holes in the front vertical frame rails 105 could be masked off or a serrated head bolt could be used in place of the bolt 45 and lock washer 50.

Each air dam 1012 includes a first flange 2048 including a plurality of holes 2052 (see FIG. 23) for connecting the air dam 1012 to the exterior surface 2044 of the corresponding front vertical frame rail 105, a second flange 2056 extending in a perpendicular direction from the first flange 2048 and including a plurality of sealing assembly apertures 1016 defined therein, a plurality of sealing assemblies 1000 with one sealing assembly 1000 positioned in each of the sealing assembly apertures 1016 and coupled to the second flange 2056, and a resilient member 2068 extending from an outer end 2072 of the second flange 2056. The first flange 2048 may not extend an entire height of the air dam 1012 and instead may comprise a plurality of smaller flanges located at positions where it is desirable to connect the air dam 1012 to the corresponding front vertical frame rail 105. The second flange 2056 may extend the entire height of the air dam 1012 and may define sealing assembly apertures 1016 therein at any desired increment. The resilient member 2068 is intended to engage the side panel 300 of the server cabinet 2004A or a resilient member 2068 of another air dam 1012 connected to an adjacent network cabinet 2004 (see FIG. 24) when ganged together in order to inhibit hot air located behind the engaged air dams 1012 from mixing with cool air located in front of the engaged air dams 1012. This is possible since side panels 300 are removed in the network cabinets 2004 internal of the data center row when the network cabinets 2004 are ganged together. Only the outer most or end network cabinets 2004 have their outer most side panels 300. The resiliency of the resilient members 2068 facilitates a good seal between the air dams 1012. In instances where a network cabinet 2004 is at an end of a data center row, the resilient member 2068 located on the outside end of the network cabinet 2004 may engage an interior wall of a side panel 300.

Referring now to FIGS. 29-44, exemplary sealing assemblies are illustrated and will be described. With specific reference to FIGS. 30-39, one example of a sealing assembly 1000 is shown as installed around a cable 1018 passing through an air dam 1012. As can be seen in FIG. 30, the air dam 1012 has a front surface 1014, which is typically an electrically conductive material such as metal, and an aperture 1016, which allows the passage of cable 1018 through the front surface 1014 of the air dam 1012. Cable 1018 could be a single cable, multiple cables, a cable bundle, or multiple cable bundles, depending on the particular installation. In this example, sealing assembly 1000 generally has a sleeve 1020, cover 1050, frame 1040, and grommet 1060.

Referring generally to FIGS. 30, 31, 33, and 36, in this example, sleeve 1020 is constructed of a sheet of flexible material that can be wrapped around cable 1018 during installation. This simplifies the installation of sleeve 1020 and allows for installation of sleeve 1020 around existing cables that are already installed. Alternatively, sleeve 1020 could be of a generally tubular construction that requires cable 1018 to be passed through sleeve 1020 for installation. In the example shown, strips of hook and loop type fastener 1038, 1039, such as Velcro®, are attached to first and second side edges 1032, 1034 of sleeve 1020. Strips 1038, 1039 engage each other to connect first and second side edges 1032, 1034 and position sleeve 1020 around cable 1018. In alternate embodiments, any well known method could be used to connect first and second side edges 1032, 1034 of sleeve 1020, such as snaps, buttons, rivets, double sided tape, etc.

In addition to being flexible, in this example, sleeve 1020 is constructed of a material that is electrically conductive, such as Dura-stat 3983, so that sleeve 1020 assists in the dissipation of static electricity from cable 1018, as discussed below. For example, sleeve 1020 could be constructed of a static-dissipative, vinyl-coated fabric having conductive fibers wound therein. In order to meet specific codes, sleeve 1020 could also be constructed of a material that is flame retardant.

Drawstring 1036 is positioned in the top portion of sleeve 1020 and extends through a passageway or holes formed in sleeve 1020. Drawstring 1036 is used to cinch the top portion of sleeve 1020 around cable 1018 and any similar cinching mechanism could also be used. In installations where a single cable is present, drawstring 1036 can be used to seal a first end of sleeve 1020 around cable 1018. However, if multiple cables, a cable bundle, or multiple cable bundles pass through aperture 1016, use of only drawstring 1036 will leave air gaps between the cables/cable bundles and will not provide a complete seal.

In order to provide a more complete seal around multiple cables, a cable bundle, or multiple cable bundles, a strip of hook and loop type fastener 1037, such as Velcro®, is attached to sleeve 1020 above drawstring 1036 and adjacent first edge 1026 of sleeve 1020. Strip 1037 extends across substantially the entire first edge 1026 such that varying portions of strip 1037 can be closely wrapped around individual cables and/or individual cable bundles and engaged to seal the top portion of sleeve 1020 around the individual cables and/or cable bundles (see FIG. 44).

Figure 36:
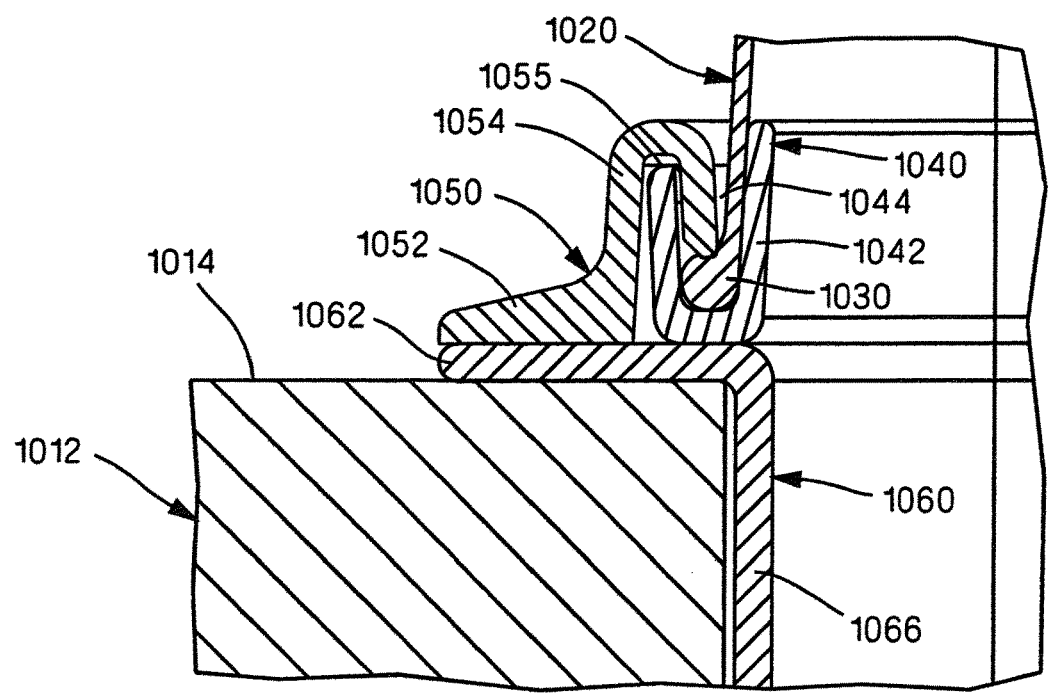
FIG. 36 is an enlarged partial view of the sealing assembly shown in the circle of FIG. 35.
Figure 37:
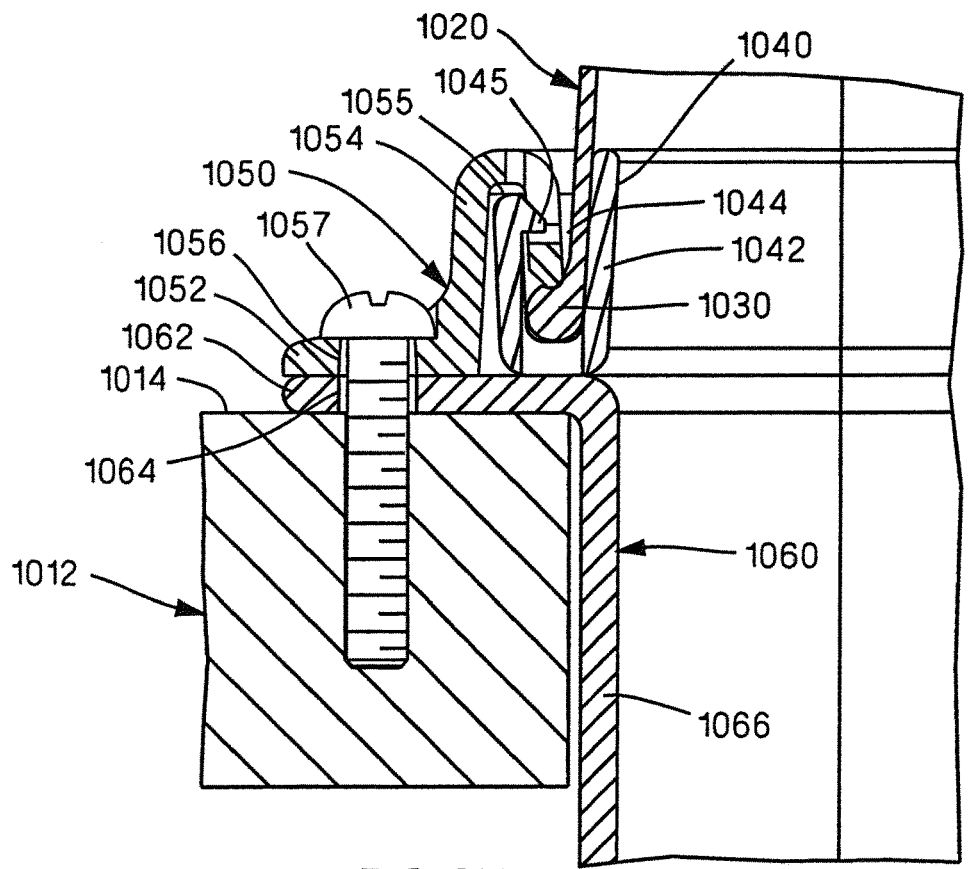
FIG. 37 is a cross-sectional view taken along line 37-37 in FIG. 34.

As can best be seen in FIGS. 33, 36, and 37, at a second end of sleeve 1020, second edge 1028 has protuberance 1030, which allows the second end of sleeve 1020 to be secured to front surface 1014 through frame 1040 and cover 1050, as described below.

Referring generally to FIGS. 32, 33, 35-37, in this example frame 1040 and cover 1050 are used to secure sleeve 1020 to front surface 1014.

In the example shown, frame 1040 is generally square and is formed by wall 1042. Wall 1042 is generally U shaped, forming channel 1044, which is configured to receive protuberance 1030 of sleeve 1020 and to receive the inside wall of second wall 1054 of cover 1050, as seen in FIGS. 36 and 37. As described in more detail below, protuberance 1030 is first positioned within channel 1044 and then the inside wall of second wall 1054 of cover 1050 is inserted into channel 1044, trapping protuberance 1030 between frame 1040 and cover 1050. In addition, at specified intervals around frame 1040, the outer wall of U shaped wall 1042 has protrusions 1045 (see FIG. 37) that extend into channel 1044 and engage apertures in second wall 1054 of cover 1050 to secure cover 1050 to frame 1040.

Figure 33:
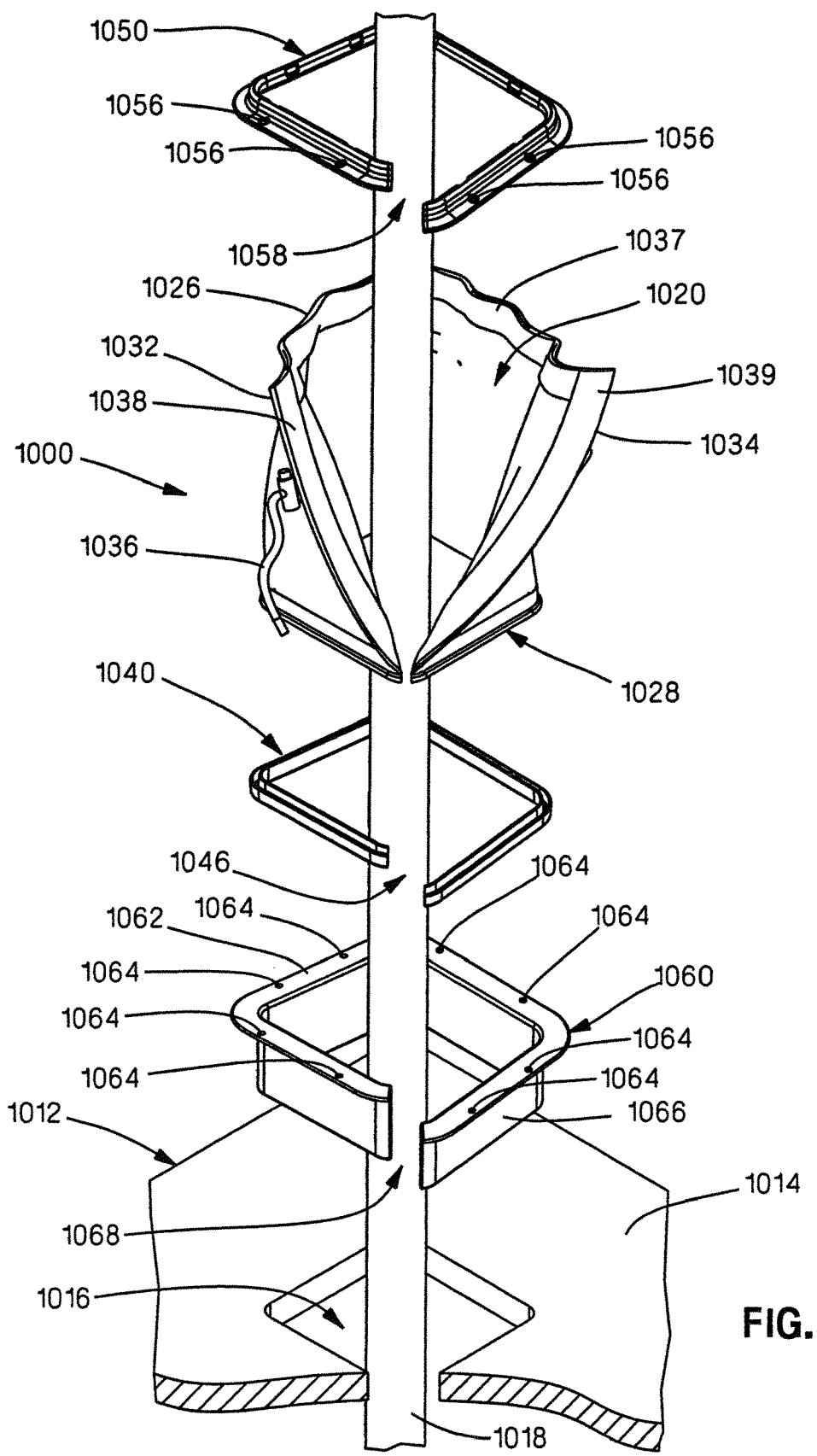
FIG. 33 is an exploded view of the sealing assembly shown in FIG. 30 with a cable/cable bundle.
Figure 34:
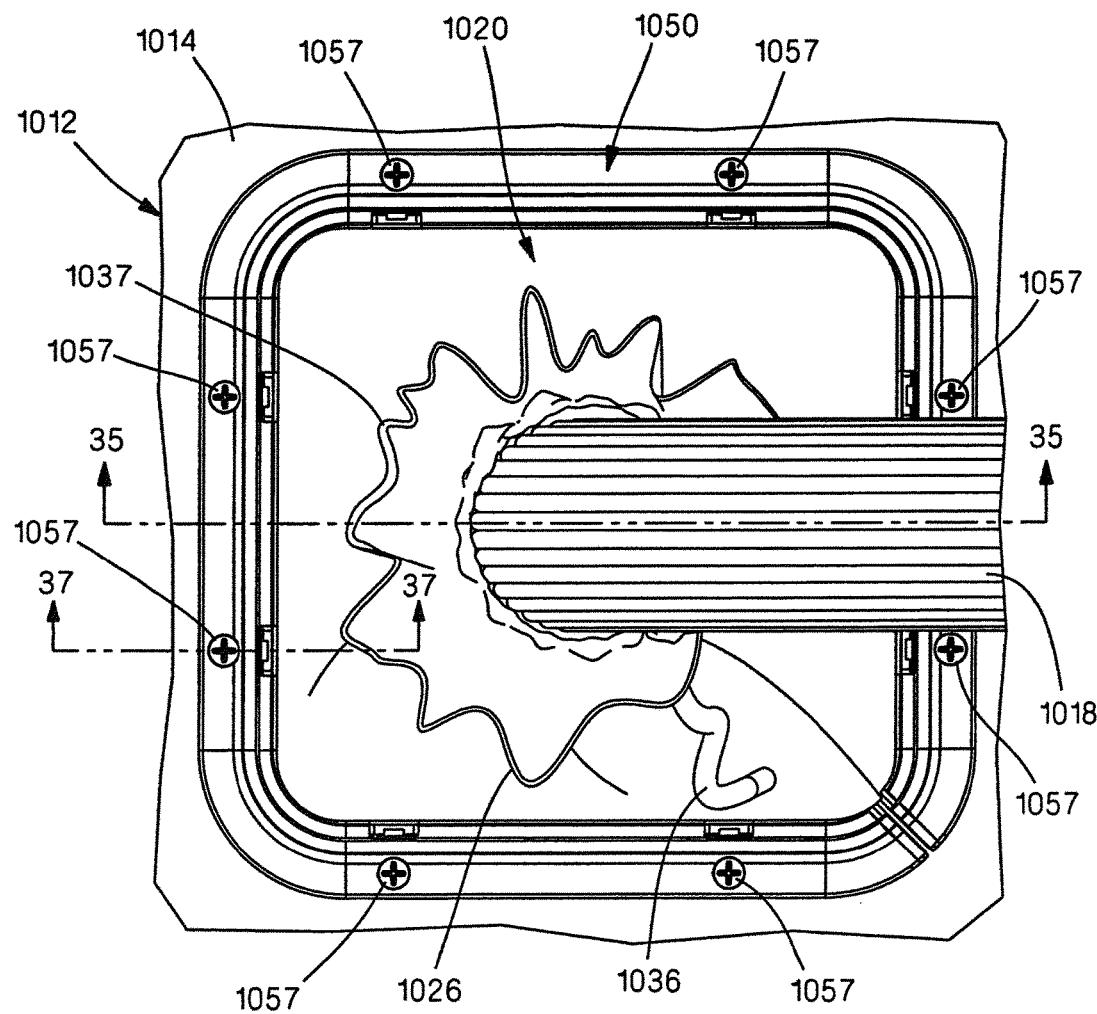
FIG. 34 is a front view of the sealing assembly shown in FIG. 30.
Figure 35:
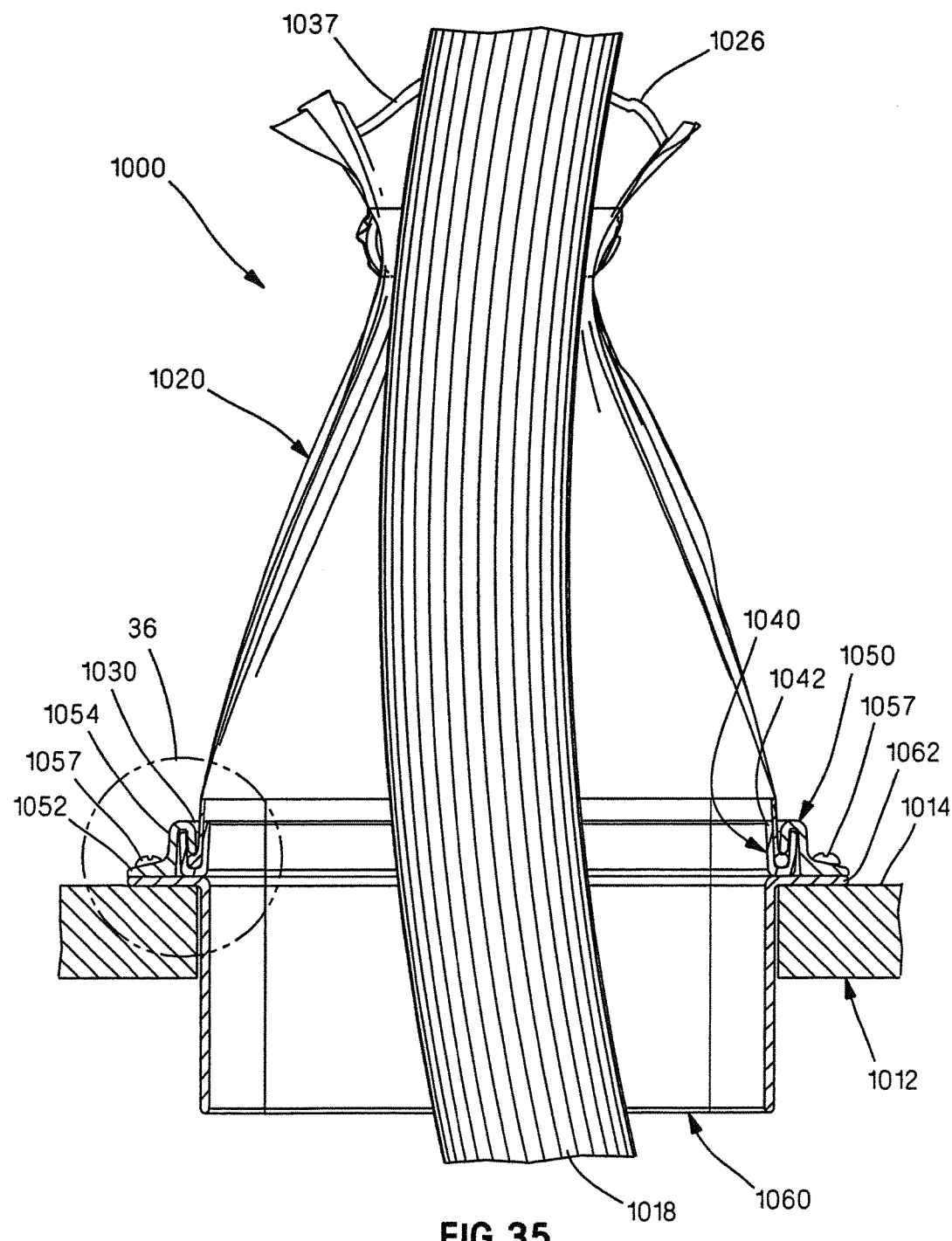
FIG. 35 is a cross-sectional view taken along line 35-35 in FIG. 34.

In the specific example shown, frame 1040 also has slit 1046, as can best be seen in FIGS. 1032 and 33, which simplifies the installation of frame 1040 and allows for installation of frame 1040 around existing cables that are already installed. In addition, frame 1040 could be made of an electrically conductive polycarbonate, such as Stat-kon D-FR, to assist in the dissipation of static electricity from cable 1018. However, if cover 1050 is constructed of an electrically conductive material, this may not be necessary. Furthermore, to meet specific codes, frame 1040 could also be constructed of a flame retardant material.

Similarly, in the example shown, cover 1050 is also generally square, is formed by first wall 1052 and second wall 1054, and is configured to fit over frame 1040 and second edge 1028 at the second end of sleeve 1020. First wall 1052 is generally planar, is configured to engage first wall 62 of grommet 1060, as seen in FIGS. 36 and 37. In this example, first wall 1052 also has apertures 1056, which are used to secure cover 1050 to front surface 1014 of air dam 1012 via screws 1057, as described in more detail below. Second wall 1054 extends generally perpendicular to first wall 1052 and is generally "U" shaped, forming channel 1055, which is configured to receive the outer wall of U shaped wall 1042 of frame 1040. In addition, at specified intervals around cover 1050, second wall 1054 has apertures (see FIG. 37) that are positioned and configured to receive protrusions 1045 in frame 1040.

Figure 32:
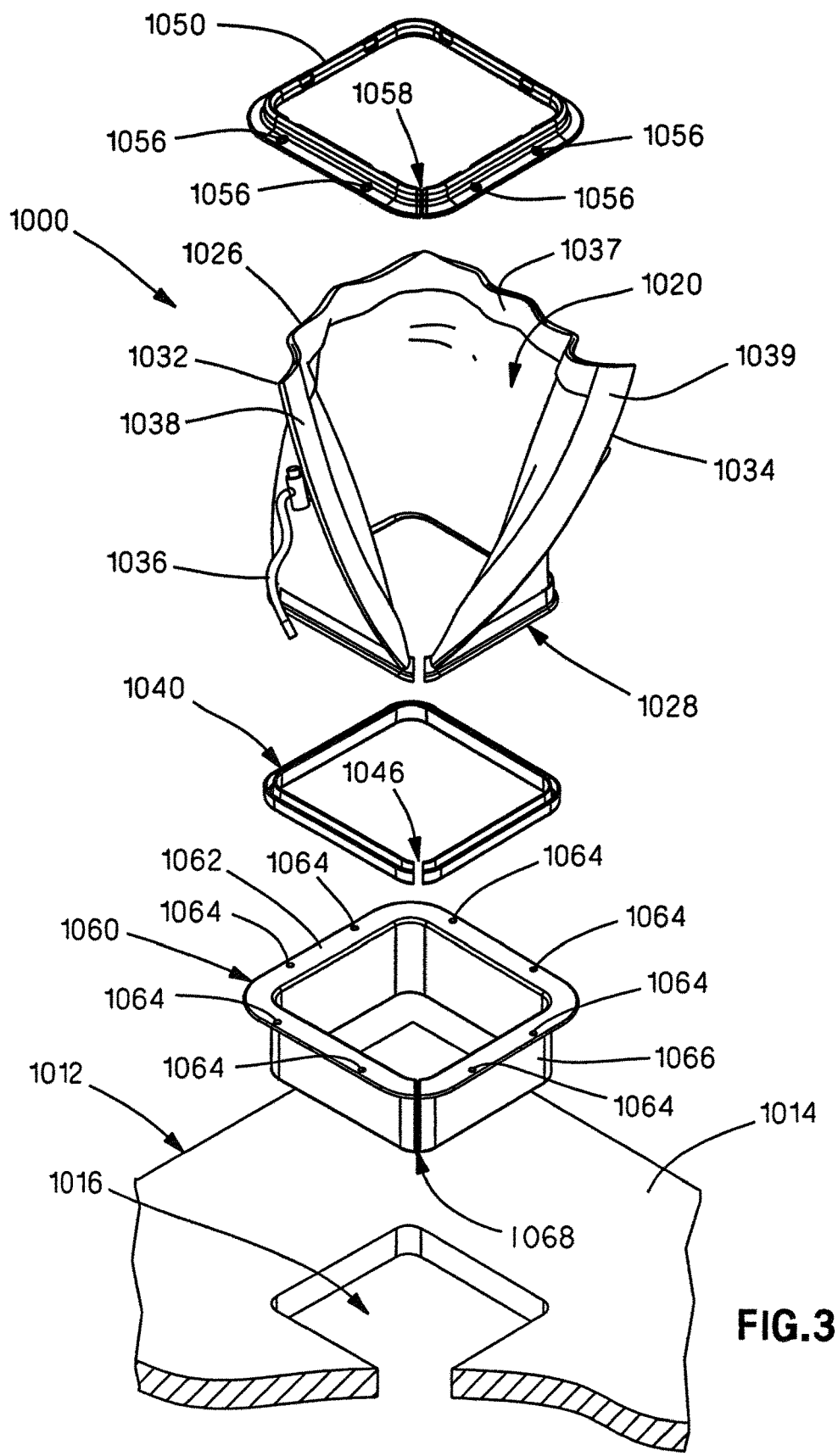
FIG. 32 is an exploded view of the sealing assembly shown in FIG. 30 without a cable/cable bundle.

In the specific example shown, cover 1050 also has slit 1058, as can best be seen in FIGS. 32 and 33, which simplifies the installation of cover 1050 and allows for installation of cover 1050 around existing cables that are already installed. In addition, in this example, cover 1050 is constructed of an electrically conductive polycarbonate, such as Stat-kon D-FR, to assist in the dissipation of static electricity from cable 1018 to front surface 1014 of air dam 1012. To secure cover 1050 to front surface 1014 and to complete the grounding circuit between cable 1018 and front surface 1014, self tapping screws 1057 are inserted through apertures 1056 and threaded into front surface 1014, as seen in FIG. 37. To provide an electrical contact between screws 1057 and cover 1050, any well known method may be used. For example, if cover 1050 is electrically conductive and does not contain any cover or coating, the contact between screws 1057 and cover 1050 will provide the contact. If cover 1050 is painted or otherwise covered, the area around where screws 1057 will contact cover 1050 could be masked to provide a bare surface. In addition, internal tooth lock washers could be placed between the heads of screws 1057 and cover 1050 such that the teeth will bite into the material of cover 1050 or screws having teeth underneath the head could be used, such that the teeth will bite into the material of cover 1050. Furthermore, to meet specific codes, cover 1050 could also be constructed of a flame retardant material.

Referring generally to FIGS. 30, 32-34, and 37, in the example shown grommet 1060 is also generally square and is formed by first wall 1062 and second wall 1066. First wall 1062 is generally planar and is configured to engage first wall 1052 of cover 1050 and front surface 1014 of air dam 1012. In this example, first wall 1062 also has apertures 1064, which are axially aligned with apertures 1056 in cover 1050 such that they receive screws 1057 during installation. Second wall 1066 extends generally perpendicular to first wall 1062 and is configured to extend into and through aperture 1016 in front surface 1014 of air dam 1012.

In the specific example shown, grommet 1060 also has slit 1068, as can best be seen in FIGS. 32 and 33, which simplifies the installation of grommet 1060 and allows for the installation of grommet 1060 around existing cables that are already installed. In addition, grommet 1060 could be made of an electrically conductive material, such as Santoprene 251-80, to assist in the dissipation of static electricity from cable 1018. However, if cover 1050 is constructed of an electrically conductive material, this may not be necessary. Furthermore, to meet specific codes, grommet 1060 could also be constructed of a flame retardant material.

Figure 38:
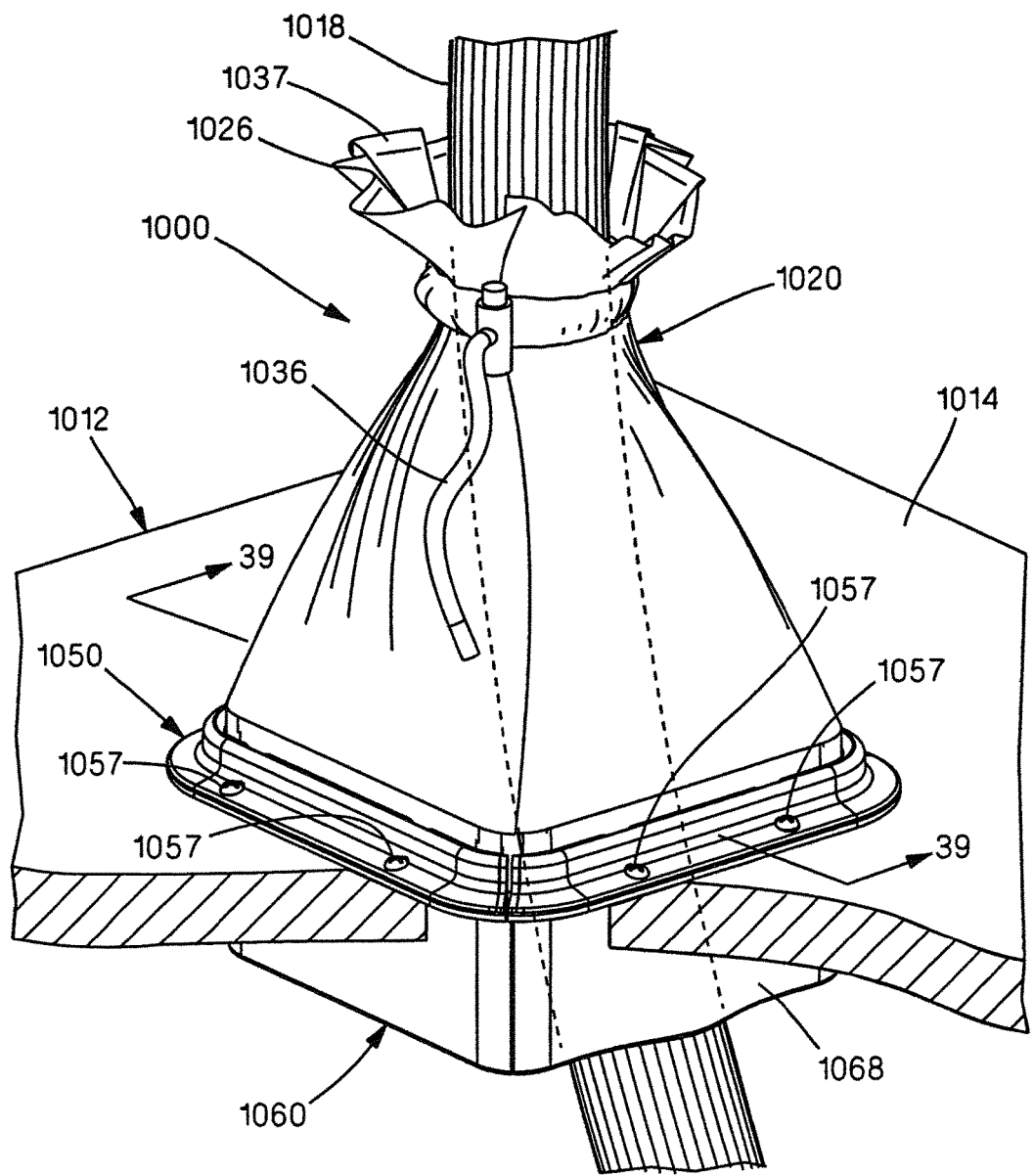
FIG. 38 is a front perspective view of the sealing assembly shown in FIG. 30 with a cable/cable bundle in a non-centered position.
Figure 39:
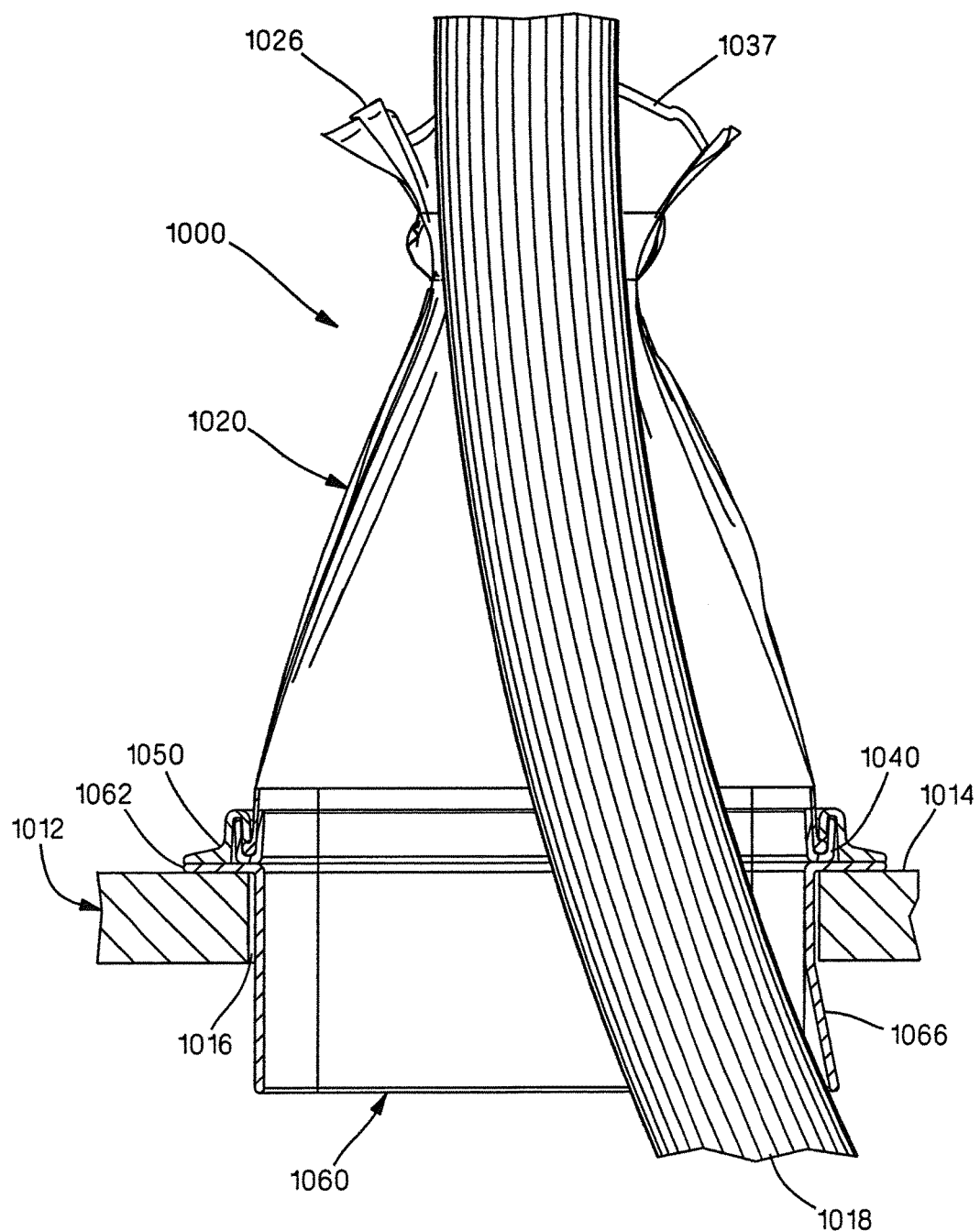
FIG. 39 is a cross-sectional view taken along line 39-39 in FIG. 38.

Furthermore, in the specific example shown, grommet 1060 is constructed of a flexible material, such as a rubberized thermoplastic vulcanizate, so that second wall 1066 protects cable 1018. Referring specifically to FIGS. 38 and 39, if cable 1018 is not centered in aperture 1016, it is possible for cable 1018 to contact and/or rub the edge of air dam 1012 at the perimeter of aperture 1016, which could be rough or sharp. This contact could cut, fray, or otherwise damage cable 1018. However, flexible second wall 1066 of grommet 1060 provides protection for cable 1018 from sharp edges associated with aperture 1016 in front surface 1014. As can be seen in FIG. 39, if cable 1018 is not centered, second wall 1066 of grommet 1060 will bend and conform to the natural bend of cable 1018, which protects cable 1018 from the potentially sharp bottom edge of air dam 1012 at the perimeter of aperture 1016.

Grommet 1060 is most easily used in new installations where aperture 1016 in front surface 1014 can be cut to a predetermined size to fit grommet 1060 or in existing installations where aperture 1016 can be enlarged to fit grommet 1060. However, as will be seen in other installation examples below, grommet 1060 is optional and sealing assembly 1000 could be installed and used without grommet 1060.

Figure 40:
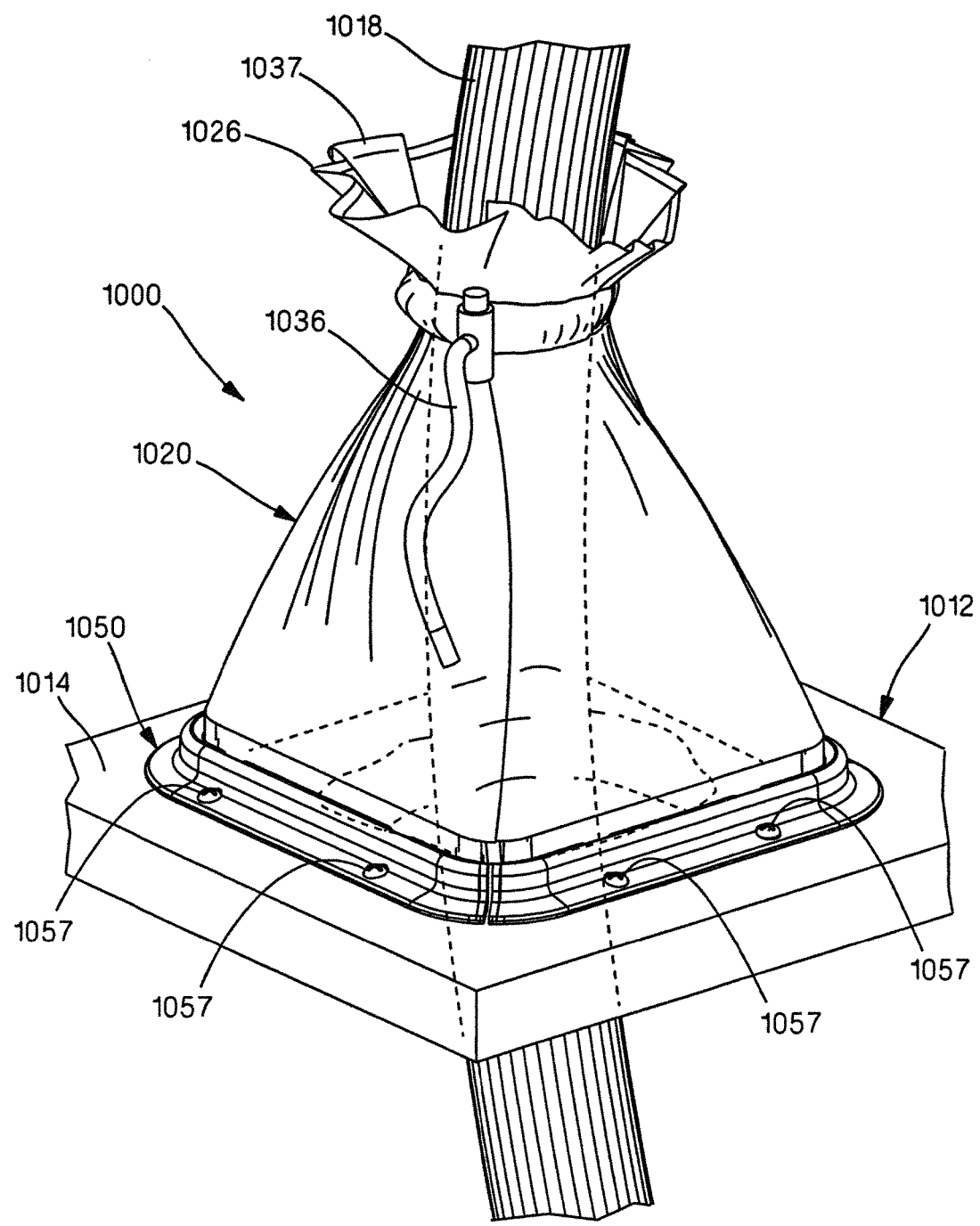
FIG. 40 is a front perspective view of the sealing assembly shown in FIG. 30 as installed without a grommet.

Referring now to FIGS. 40-42, an alternate installation of exemplary sealing assembly 1000 is shown. As discussed above, sealing assembly 1000 can be used in existing installations where apertures 1016 are already formed in front surface 1014 of air dam 1012 and cable 1018 is already extending through aperture 1016. In this case, if grommet 1060 does not fit into or through aperture 1016, sealing assembly 1000 can be installed without grommet 1060. As can be seen in FIGS. 40-42, in this type of installation sleeve 1020 is still inserted into frame 1040 and cover 1050 is placed over the bottom portion of sleeve 1020 and frame 1040. The difference in the installation in these figures is that frame 1040 and cover 1050 are placed directly onto front surface 1014 and secured with self-tapping screws 1057, rather than placing cover 1050 onto first wall 1062 of grommet 1060.

Figure 43:
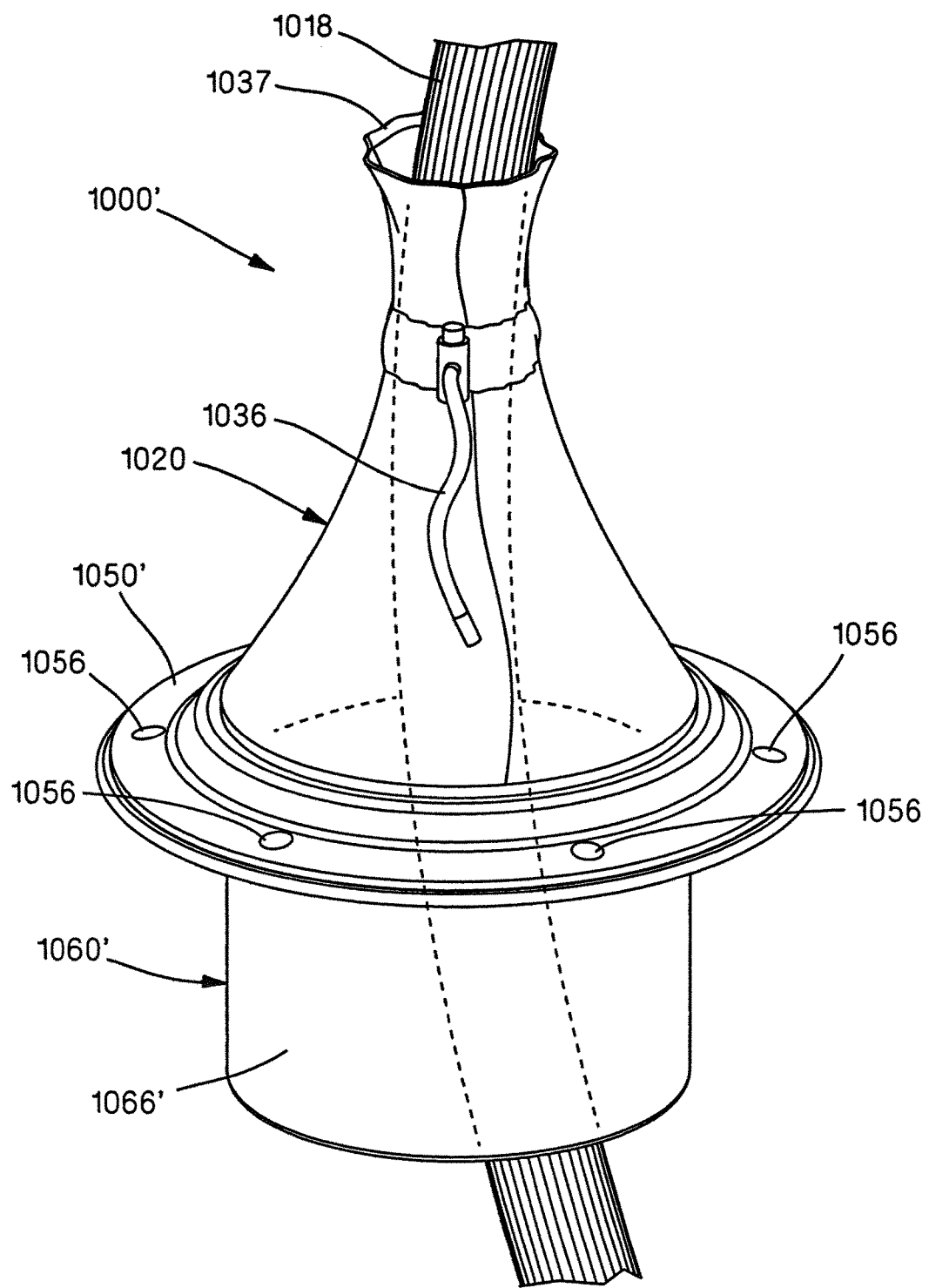
FIG. 43 is a front perspective view of another exemplary sealing assembly installable on an air dam of the network cabinets shown in FIG. 22.
Figure 44:
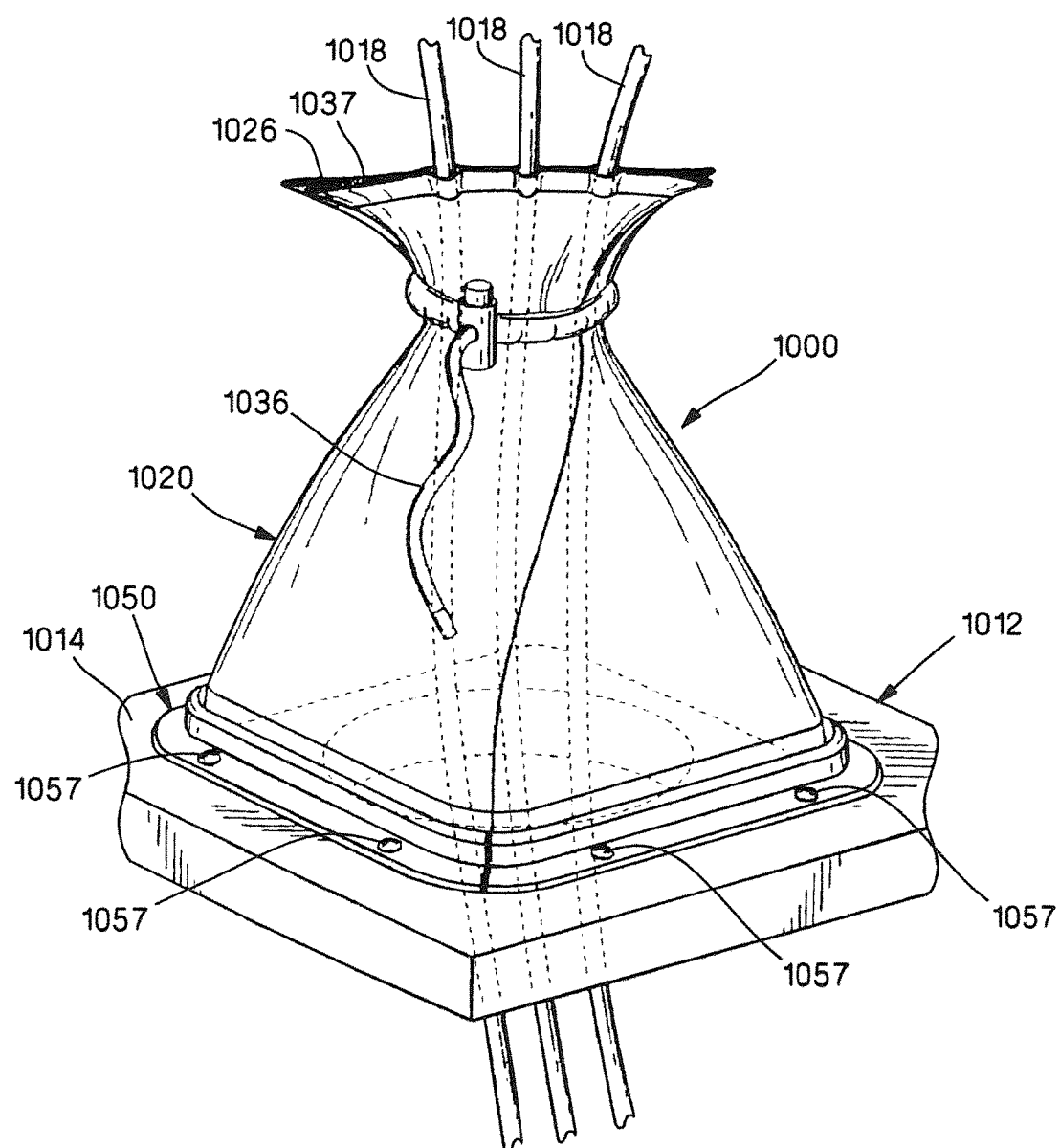
FIG. 44 is a front perspective view of the sealing assembly of FIG. 40 with a plurality of cables spaced apart from one another and a sleeve of the sealing assembly sealed around each of the plurality of cables.

Referring to FIG. 43, another example of a sealing assembly 1000' is shown. The sealing assembly 1000' is essentially the same as sealing assembly 1000 shown in FIGS. 30-39 and common parts between the exemplary assemblies are designated with the same reference numbers. The main difference between the example shown in FIG. 43 and the example shown in FIGS. 30-39 is that in the sealing assembly 1000' shown in FIG. 43, cover 1050', frame 1040' (not shown), and grommet 1060' are circular, rather than square. Other than the difference in shape, the construction, characteristics, installation, etc., the sealing assembly 1000' is the same as that described above. This circular configuration of the sealing assembly illustrated in FIG. 43 is similar to the embodiment of the sealing assembly illustrated in FIGS. 22-29.

As can be seen in the various examples above, in various installations square sealing assemblies 1000 could be used, circular sealing assemblies 1000' could be used, or a combination of square and circular sealing assemblies, or other shapes, could be used. For example, in the same installation square sealing assemblies 1000 could be used with data cables and circular sealing assemblies 1000' could be used with power cables or small data bundles. The use of both square and circular sealing assemblies provides an easy way to quickly and accurately identify the different cables and avoids data signal contamination that can occur when data cables and power cables are run together.

As mentioned above, sealing assemblies 1000, 1000' can be used to provide a grounding circuit between cable 1018 and front surface 1014 of air dam 1012 to provide static dissipation from cable 1018. As discussed above, a ground path is created between cable 1018 and front surface 1014 through: (1) sleeve 1020, which is electrically conductive and contacts cable 1018 when sealed; (2) cover 1050, which is electrically conductive and contacts sleeve 1020; and (3) self tapping screws 1057, which are electrically conductive and contact cover 1050 and are threaded into front surface 1014, which in data centers 2000 is typically constructed of a conductive material, such as metal.

In new installations where apertures 1016 in front surface 1014 have not been formed and installation where apertures 1016 can be adapted to fit grommet 1060, 1060', sealing assemblies 1000, 1000' shown in FIGS. 30-39 and 43 would typically be used.

To install sealing assemblies 1000 or 1000' in these types of installations, aperture 1016 is cut into front surface 1014 according to the size and shape of grommet 1060 used and grommet 1060 is positioned in aperture 1016. If cable 1018 is already extending through aperture 1016, slit 1068 in grommet 1060 can be used to position grommet 1060 around cable 1018. Frame 1040 is then positioned on grommet 1060 and second edge 1028 of sleeve 1020 is inserted into channel 1044 in frame 1040 such that protuberance 1030 is positioned within channel 1044. Again, if cable 1018 is already extending through aperture 1016, slit 1046 in frame 1040 can be used to position frame 1040 around cable 1018. Similarly, first and second side edges 1032, 1034 of sleeve 1020 can be separated by disengaging the hook and loop type fasteners 1038, 1039, sleeve 1020 placed around cable 1018, and fasteners 1038, 1039 re-engaged. Cover 1050 is then placed over sleeve 1020 and frame 1040 such that the inner wall of second wall 1054 is positioned with channel 1044 of frame 1040, thereby trapping protuberance 1030 of sleeve 1020, and apertures 1056 in cover 1050 are aligned with apertures 1064 in grommet 1060. Again, if cable 1018 is already extending through aperture 1016, slit 1058 in cover 1050 can be used to position cover 1050 around cable 1018. Screws 1057 are then inserted through apertures 1056, 1064 in cover 1050 and grommet 1060 and screwed into front surface 1014. This secures sealing assembly 1000 to front surface 1014 and provides a ground path from cable 1018 to front surface 1014. At this point, if cable 1018 has not been inserted, cable 1018 is extended through aperture 1016, grommet 1060, frame 1040, cover 1050, and sleeve 1020. The first end of sleeve 1020 is then cinched around cable 1018 by pulling drawstring 1036 closed. In installations where drawstring 1036 does not provide sufficient sealing or where multiple cables, cable bundles, or multiple cable bundles extend through sealing assembly 1000, the first end of sleeve 1020 can be sealed around each individual cable by engaging hook and loop fastener 1037 around each cable or cable bundle (see FIG. 44).

In installations where apertures 1016 are already formed in front surface 1014 and cannot be adapted to fit grommets 1060, 1060', sealing assemblies 1000, 1000' can be installed as shown in FIGS. 40-42.

To install sealing assemblies 1000 or 1000' in these types of installations, Frame 1040 is positioned on front surface 1014 such that frame 1040 surrounds aperture 1016. Second edge 1028 of sleeve 1020 is inserted into channel 1044 in frame 1040 such that protuberance 1030 is positioned within channel 1044. If cable 1018 is already extending through aperture 1016, slit 1046 in frame 1040 can be used to position frame 1040 around cable 1018. Similarly, first and second side edges 1032, 1034 of sleeve 1020 can be separated by disengaging the hook and loop type fasteners 1038, 1039, sleeve 1020 placed around cable 1018, and fasteners 1038, 1039 re-engaged. Cover 1050 is then placed over sleeve 1020 and frame 1040 such that the inner wall of second wall 1054 is positioned within channel 1044 of frame 1040, thereby trapping protuberance 1030 of sleeve 1020. Again, if cable 1018 is already extending through aperture 1016, slit 1058 in cover 1050 can be used to position cover 1050 around cable 1018. Screws 1057 are then inserted through apertures 1056 in cover 1050 and screwed into front surface 1014. This secures sealing assembly 1000 to front surface 1014 and provides a ground path from cable 1018 to front surface 1014. At this point, if cable 1018 has not been inserted, cable 1018 is extended through aperture 1016, frame 1040, cover 1050, and sleeve 1020. First end of sleeve 1020 is then cinched around cable 1018 by pulling drawstring 1036 closed. In installations where drawstring 1036 does not provide sufficient sealing or where multiple cables, cable bundles, or multiple cable bundles extend through sealing assembly 1000, first end of sleeve 1020 can be sealed around each individual cable by engaging hook and loop fastener 1037 around each cable or cable bundle (see FIG. 44).

Finally, a cover 2076 (see FIGS. 46-48) may be placed over sealing assembly apertures 1016 if a sealing assembly 1000, 1000' is not connected to the apertures 1016. Or, the sealing assembly apertures 1016 may initially be manufactured with a punch-out plate 2076 in the sealing assembly apertures 1016 and the punch-out plate 2076 may be punched-out when it is desired to connect sealing assemblies 1000, 1000' to apertures 1016. If cable 1018 is not immediately pulled through aperture 1016 after initial installation, an optional safety cover may be provided to place over sealing assembly 1000, 1000' to prevent foot injuries until cable 1018 is pulled through aperture 1016 and sealing assembly 1000, 1000'.

Figure 29:
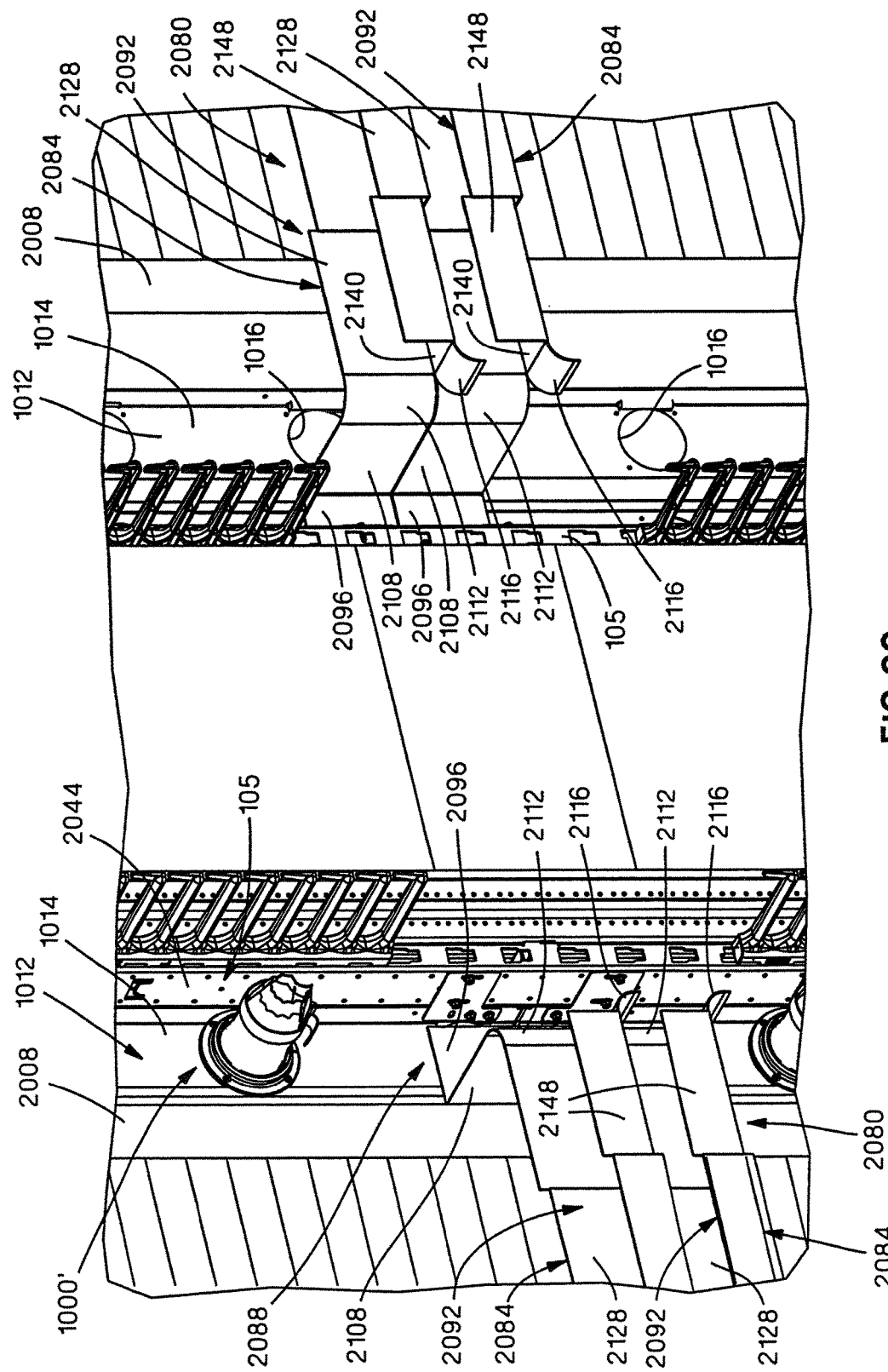
FIG. 29 is a partial top front perspective view of a portion of the network cabinets shown in FIG. 22.
Figure 30:
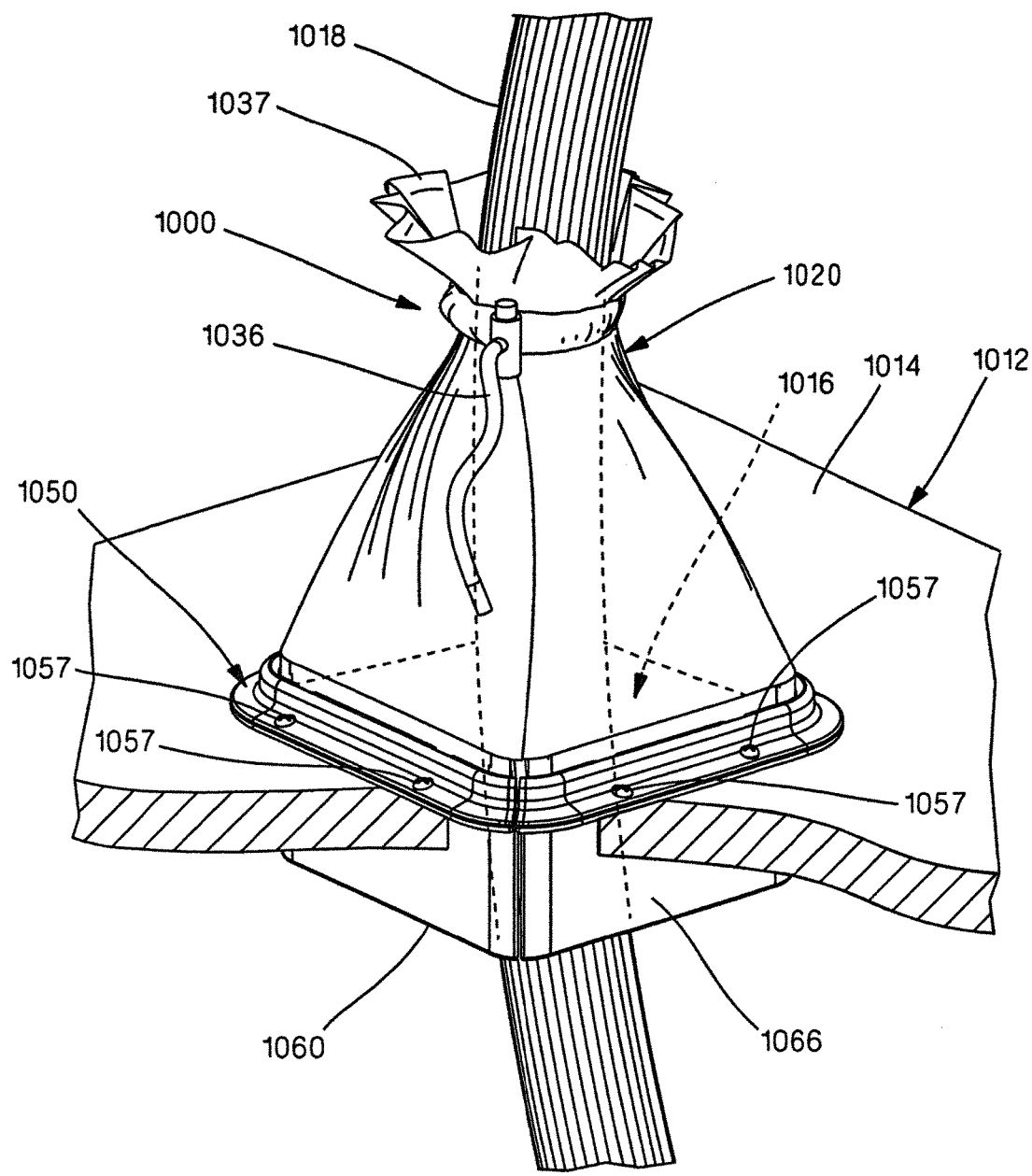
FIG. 30 is a front perspective view of an exemplary sealing assembly as installed on a partially cut away air dam of the network cabinets shown in FIG. 22.
Figure 31:
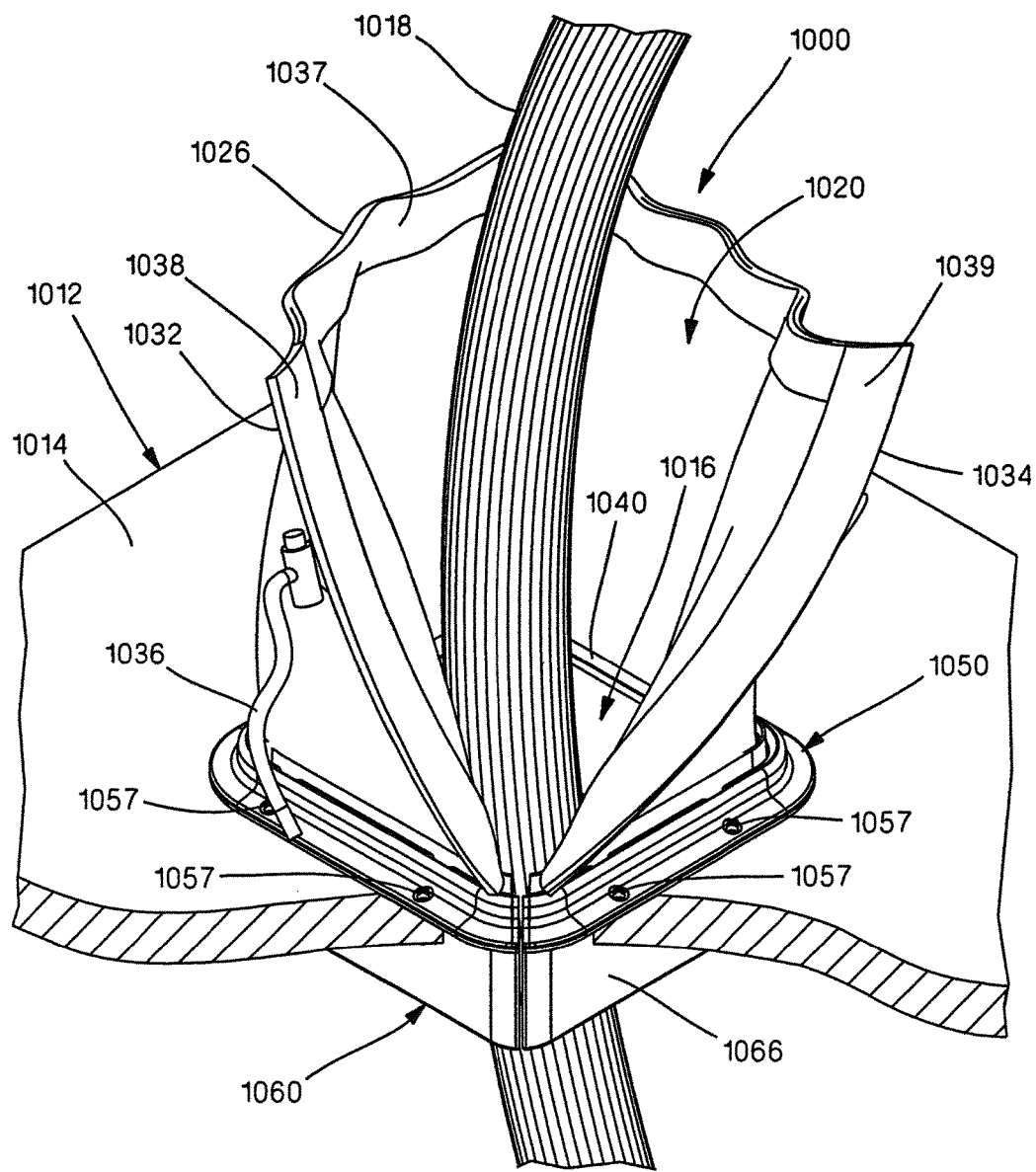
FIG. 31 is a front perspective view of the sealing assembly shown in FIG. 30 with a sleeve of the sealing assembly in an open position.
Figure 45:
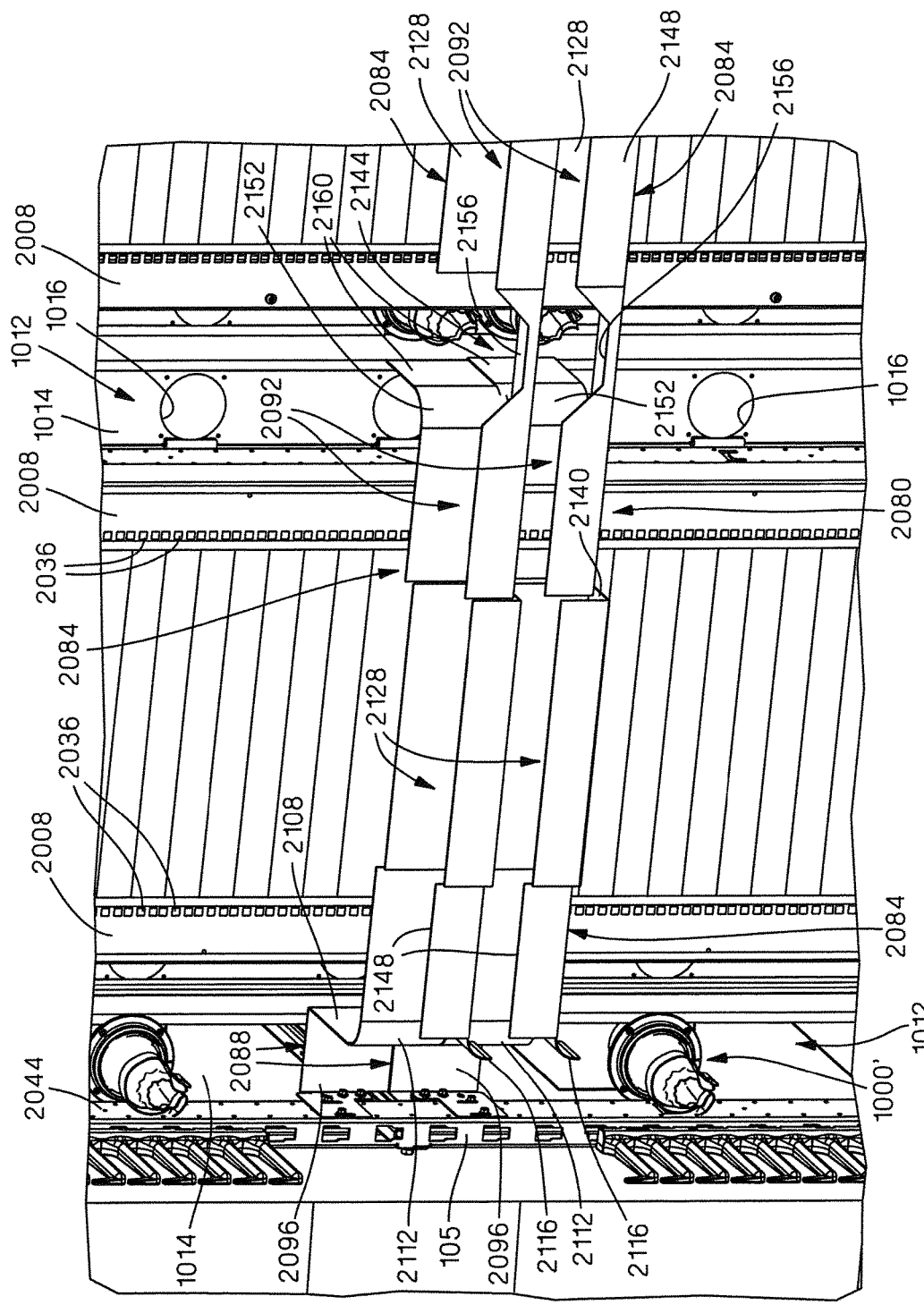
FIG. 45 is a partial top front perspective view of a portion of the network cabinets shown in FIG. 22.
Figure 46:
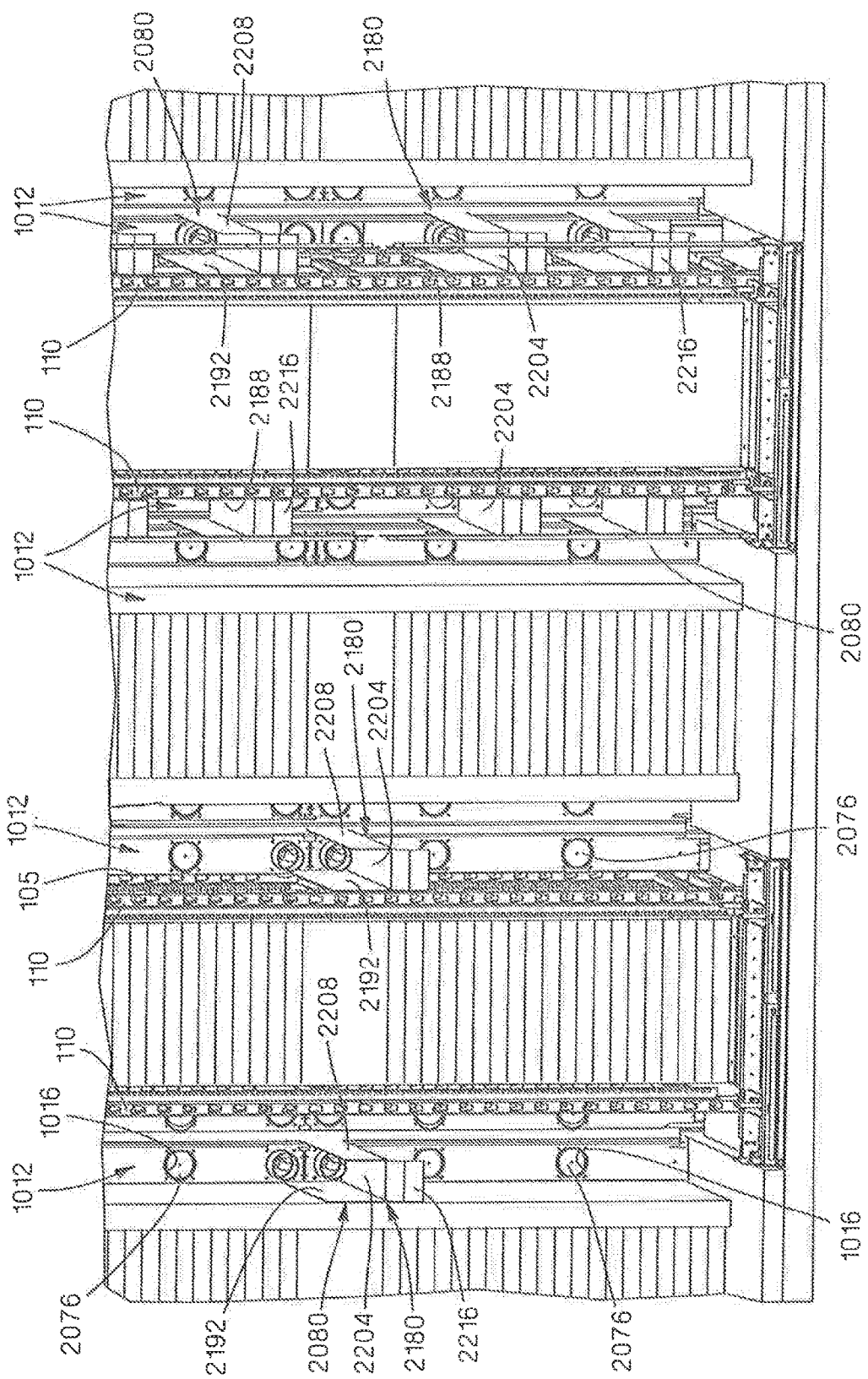
FIG. 46 is a partial top rear perspective view of a portion of the network cabinets shown in FIG. 22.
Figure 47:
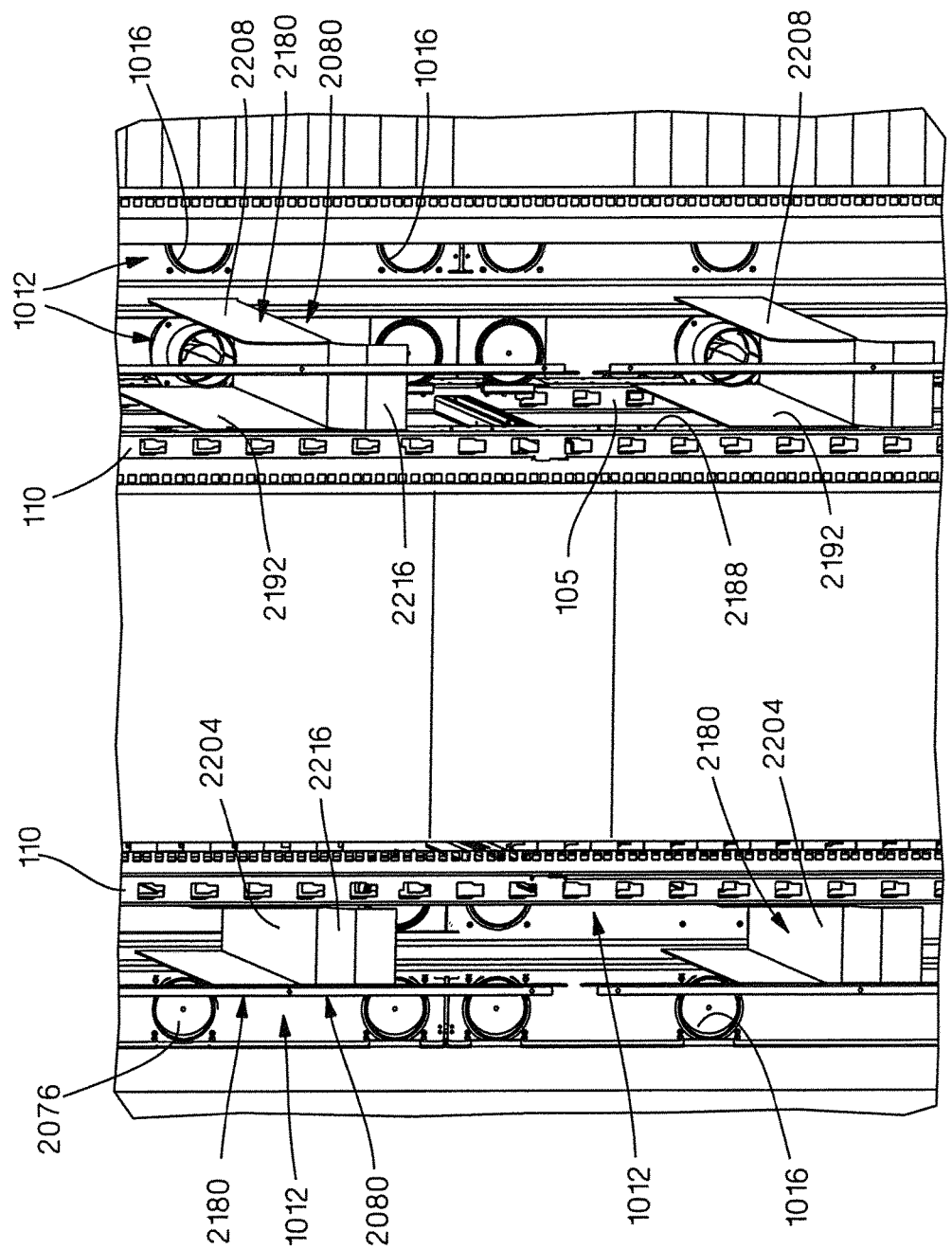
FIG. 47 is a partial top rear perspective view of a portion of the network cabinets shown in FIG. 22.
Figure 48:
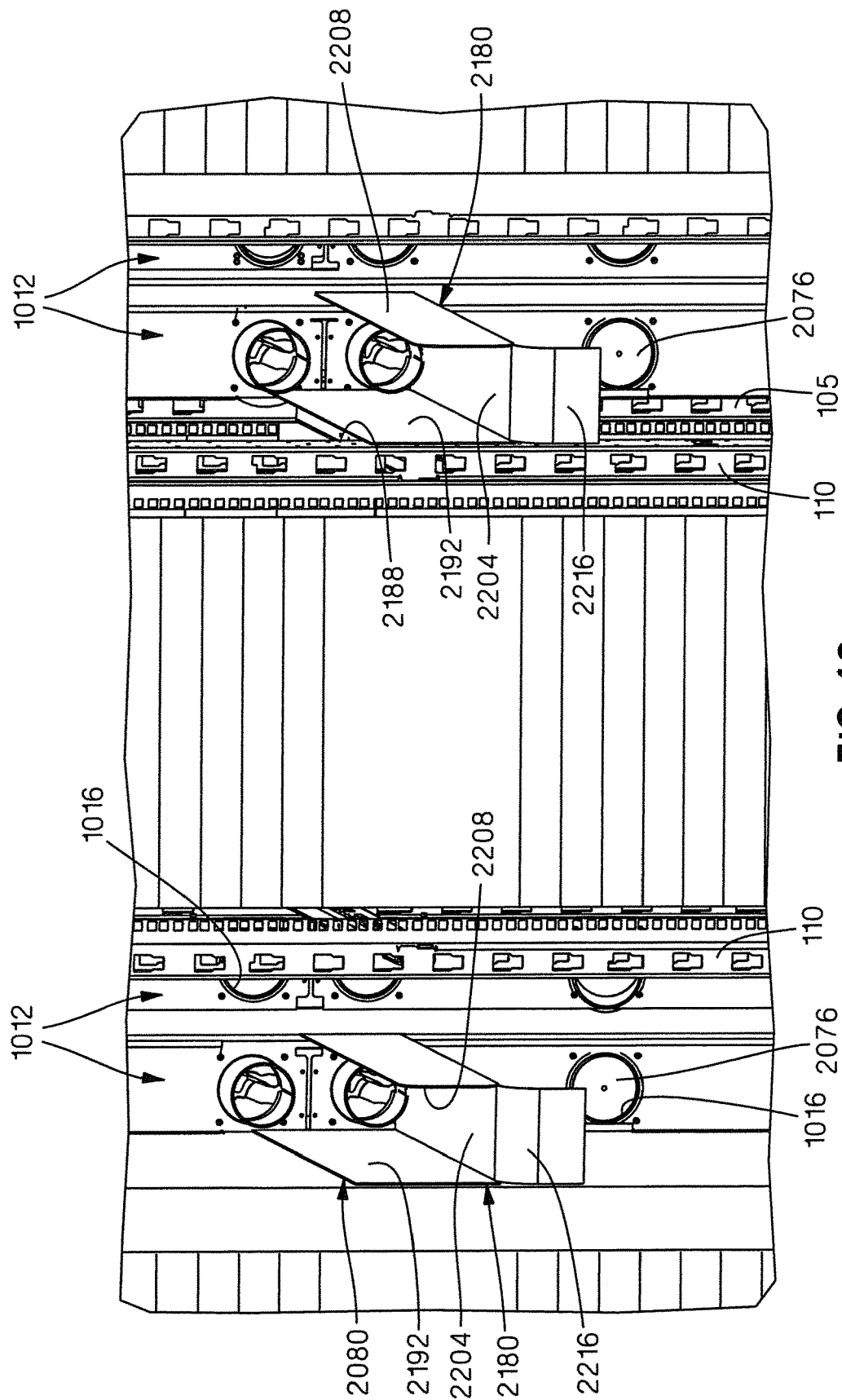
FIG. 48 is a partial top rear perspective view of a portion of the network cabinets shown in FIG. 22.
Figure 49:
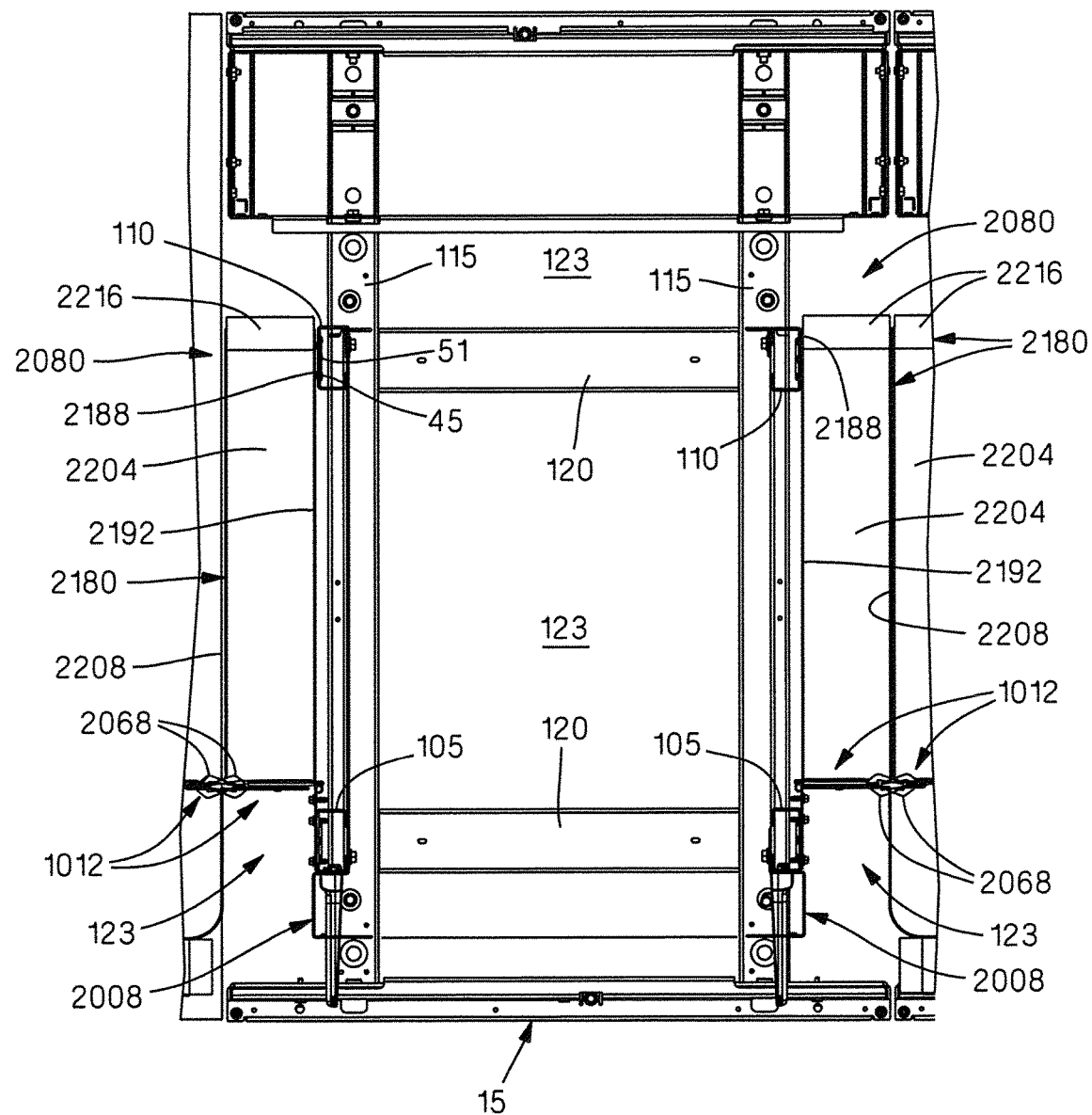
FIG. 49 is a top view of a base frame and a pair of rear cable trays of one of the network cabinets shown in FIG. 22.
Figure 50:
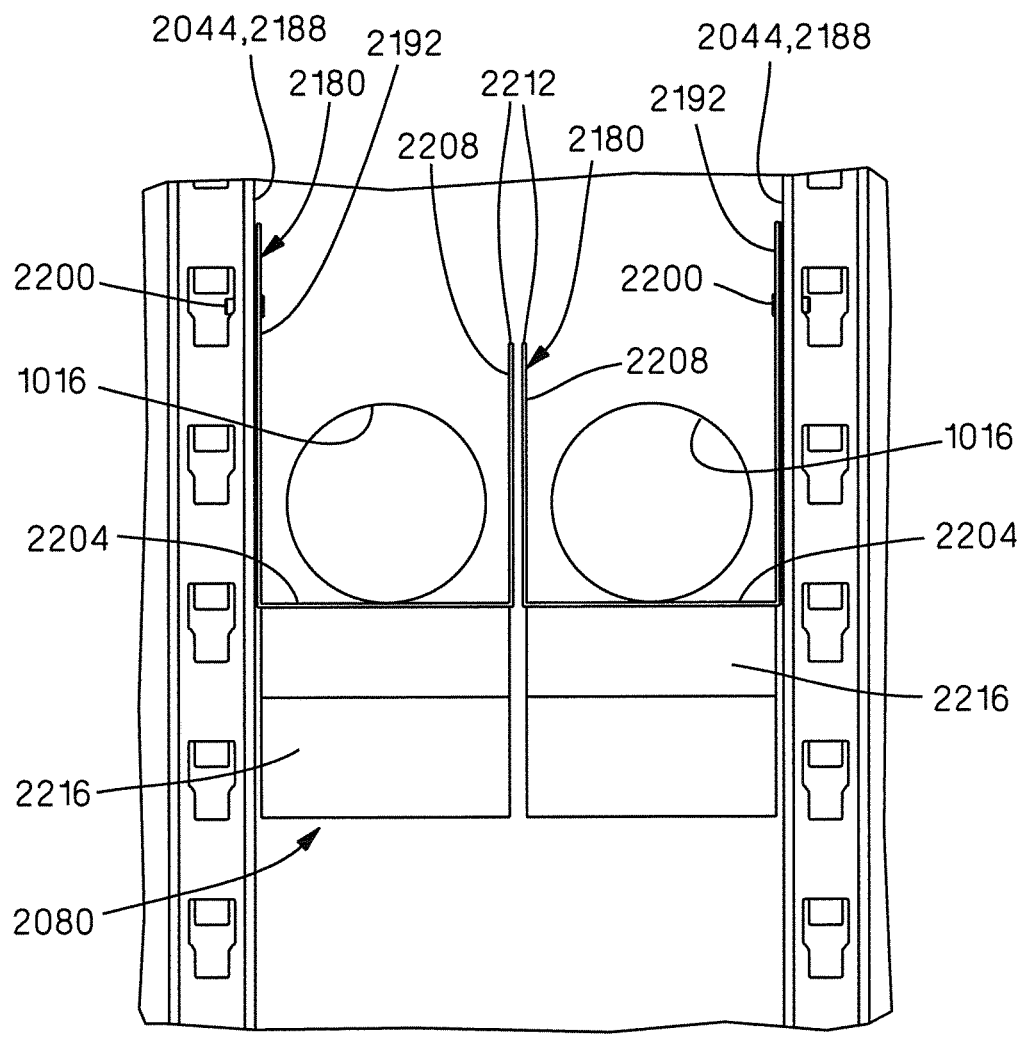
FIG. 50 is a partial rear view of a vertical frame rail from a first network cabinet shown in FIG. 22 and a vertical frame rail of a second network cabinet shown in FIG. 22 positioned adjacent to the first network cabinet, the adjacent network cabinets are each shown with a rear cable tray connected to the corresponding vertical frame rail.

Referring now to FIGS. 22, 29, and 45, the data center 2000 includes a cable management system 2080 coupled to the network cabinets 2004. In the illustrated exemplary embodiment, the cable management system 2080 is connected to the network cabinets 2004 near a middle of the height of the network cabinets 2004 and is configured to accommodate a data center 2000 having nine total network cabinets 2004 with a switch cabinet 2004B in the middle (MoR architecture). It should be understood that the cable management system 2080 may be configured to accommodate any number of network cabinets 2004 arranged in any type of architecture.

The illustrated exemplary embodiment of the cable management system 2080 includes a pair of front cable supports 2084, one front cable support 2084 disposed above another front cable support 2084, across select server cabinets 2004A. The multiple front cable supports 2084 provide more capacity for cables and organizational benefits (i.e., some cables can be place in top cable support and other cables may be placed in bottom cable support). It should also be understood that the cable management system 2080 is capable of having any number of front cable supports 2084 positioned and oriented in any manner relative to the server cabinets 2004A and be within the intended spirit and scope of the present invention. In the illustrated exemplary embodiment, the front cable supports 2084 are all substantially the same structurally and functionally. Thus, for simplicity, only one front cable support 2084 will be described.

In the illustrated exemplary embodiment, switches are supported in the switch cabinet 2004B and servers are located in the remainder of the server cabinets 2004A in the data center row. The location of the switches and location of the servers relative to the switches will determine which front cable support 2084 provides the cable with the shortest run to reach the server. For example, with reference to FIG. 22, if a first end of a cable is connected to the top switch and a second end of the cable is connected to a server supported in and near a top of the third server cabinet 2004A to the right (as illustrated) of the switch cabinet 2004B, then the shortest run for the cable would be to extend down into the top front cable support 2084 to the right of the switch cabinet 2004B, extend through the top front cable support 2084 past the first two server cabinets 2004A to the right of the switch cabinet 2004B, and up out of the top front cable support 2084 and to the server in the third server cabinet 2004A to the right of the switch cabinet 2004B. Other combinations of switches and servers may provide alternative shortest runs to cables connecting such combinations of switches and servers.

With continued reference to FIGS. 22, 29, and 45, each front cable support 2084 includes a transition member 2088 and a plurality of trays 2092. The transition member 2088 is connected to a front surface 1014 of one of the air dams 1012 of the switch cabinet 2004B. The transition member 2088 should be connected to the air dam 1012 in a manner that enables electrical conduction between the two components and grounding of the transition member 2088. The connection between the transition member 2088 and the front surface 1014 of the air dam 1012 may be bonded by placing an internal tooth lock washer between a bolt and the transition member 2088 and a second internal tooth lock washer between a nut and a rear surface 1013 of the air dam 1012. The internal tooth lock washers have teeth that pierce the paint or coating and bite into the metal of the transition member 2088 and the air dam 1012. An anti-oxidant paste could also be placed on the transition member 2088 and the air dam 1012, underneath the lock washers to prevent possible corrosion where the teeth of the lock washers bite into the metal of the transition member 2088 and the air dam 1012. This provides a ground path from the transition member 2088 to the air dam 1012 through the bolt, washers, and nut. Alternatively, regular washers could be used and the area around the hole in the transition member 2088 and the hole in the air dam 1012 could be masked off or a serrated head bolt could be used in place of the bolt and lock washer.

The transition member 2088 includes a first flange 2096 defining at least one hole therein alignable with a hole in the air dam 1012 and through which a fastener or fastener combination, such as those mentioned in the previous paragraph, may pass to secure the transition member 2088 to the air dam 1012. The transition member 2088 also includes a second flange 2108 extending perpendicular from the first flange 2096 and toward a front of the network cabinet 2004, a rounded corner 2112 extending from a forward end of the second flange 2108 and gradually curving to position its end 90-degrees from where the rounded corner 2112 began, and a curved flange 2116 curving downward from a first end of a tray 2092 (described in more detail below) to provide a bend radius for cables passing into the transition member 2088.

Each tray 2092 generally extends the width between the vertical frame rails 105 of one of the server cabinets 2004A and is connected to front surfaces of both server equipment rails 2008 of one of the server cabinets 2004A. The tray 2092 is connected to the server equipment rails 2008 in a manner that enables electrical conduction between the two components and grounding of the tray 2092. The connection between the tray 2092 and the front surfaces of the server equipment rails 2008 may be bonded by placing an internal tooth lock washer 50 between a bolt and the tray 2092 and a second internal tooth lock washer between a nut and rear surfaces of the server equipment rails 2008. The internal tooth lock washers have teeth that pierce the paint or coating and bite into the metal of the tray 2092 and the server equipment rails 2008. An anti-oxidant paste could also be placed on the tray 2092 and the server equipment rails 2008, underneath the lock washers, to prevent possible corrosion where the teeth of the lock washers bite into the metal of the tray 2092 and the server equipment rails 2008. This provides a ground path from the tray 2092 to the server equipment rails 2008 through the bolt, washers, and nut. Alternatively, regular washers could be used and the area around the holes in the tray 2092 and the holes in the server equipment rails 2008 could be masked off or a serrated head bolt could be used in place of the bolt and lock washer.

The tray 2092 forms a generally U-shaped channel and includes a rear vertical flange 2128 defining a pair of holes therein that are alignable with holes defined in the server equipment rails 2008 and through which a fastener or fastener combination, such as those described above, may pass to connect the tray 2092 to the server equipment rails 2008. The tray 2092 also includes a bottom flange 2140 extending perpendicular from a bottom end of the first flange 2128 toward a front of the network cabinet 2004 and is generally horizontal or parallel to a ground surface upon which the network cabinet 2004 rests. At the end of the tray 2092, an aperture 2144 is defined in the bottom flange 2140 and allows cables running through the tray 2092 to exit downward from the tray 2092 without having to extend over a front flange 2148 of the tray 2092. As can be seen in FIG. 45, both the top and bottom trays 2092 include an aperture 2144 in their bottom flanges 2140 such that cables extending downward from the top tray 2092 may exit the top tray 2092 and pass through the aperture 2144 defined in the bottom flange 2140 of the bottom tray 2092 to access servers disposed below the cable management system 2080.

Additionally, the tray 2092 includes a front vertical flange 2148 extending upward and perpendicular from a front end of the bottom flange 2140. The rear flange 2128 has a first height that is greater than a second height of the front flange 2148. This enables a person to access the fasteners used to connect the tray 2092 to the server equipment rails 2008. That is, if the front flange 2148 has a height that was the same or greater than the height of the rear flange 2128, the front flange 2148 would inhibit a person from getting a tool on the fasteners, thereby making it difficult to connect and/or disconnect the tray 2092 from the server equipment rails 2008.

A first end of the tray 2092 may be coupled to the transition member 2088 in a wide variety of manners including, for example, fasteners, clips, screws, bonding, or any other appropriate manner of coupling. Such coupling between the first end of the tray 2092 and the transition member 2088 should be in a manner that enables electrical conduction between the two components and grounding of the transition member 2088 and the tray 2092. Such electrical conduction and grounding may occur in any of a wide variety of manners all of which are intended to be within the spirit and scope of the present invention. When the transition member 2088 is connected to the first end of the tray 2092, the rounded corner 2112 of the transition member 2088 abuts with a first end of the rear flange 2128 to provide a smooth surface along which cables can run and the curved flange 2116 abuts with a first end of the bottom flange 2140 to provide a smooth surface along which cables can run.

The tray 2092 also includes a second end that splits into a rounded corner portion 2152 (see FIG. 45) and a straight portion 2156 (see FIG. 45). The rounded corner portion 2152 gradually curves about 90-degrees to provide a smooth surface that does not inflict significant stress or pressure on the cables that may result in cable breakage. A straight flange 2160 extends rearward from the rounded corner portion 2152 and abuts a front surface 1014 of one of the other air dam 1012 of the server cabinet 2004A. The straight portion 2156 extends beyond the rounded corner portion 2152 toward a tray 2092 of the adjacent server cabinet 2004A. More particularly, the front flange 2148 and a portion of the bottom flange 2140 extend beyond the rounded corner portion 2152 and abut a first end of the tray 2092 of the adjacent server cabinet 2004A. In addition to abutment, the second end of the tray 2092 may be coupled to the first end of the adjacent tray 2092 in a wide variety of manners including, for example, fasteners, clips, screws, bonding, or any other appropriate manner of coupling. The second end of the tray 2092 should be connected to the first end of the adjacent tray 2092 in a manner that enables electrical conduction between the two components and grounding of the two trays 2092. Such electrical conduction and grounding may occur in any of a wide variety of manners all of which are intended to be within the spirit and scope of the present invention.

Any number of trays 2092 may abut and be connected end to end to traverse any number of network cabinets 2004. With particular reference to the exemplary embodiment illustrated in FIG. 22, each cable support 2084 includes three trays 2092 that abut and are connected end to end to traverse the first three server cabinets 2004A to the right and to the left of the switch cabinet 2004B. An end cap (not shown) is connected to a second end of the third tray 2092 to terminate the cable support 2084. The end cap again is a generally U-shaped channel and may include a first end abutting the second end of the tray 2092 and a second end engaging a front surface 1014 of an air dam 1012 of the last network cabinet 2004. The end cap may include a vertical wall extending upward from a bottom surface that inhibits cables from continually running straight through the end cap. Rather, the vertical wall promotes the cables to run upward out of the tray 2092 or end cap, run downward through an aperture in the bottom flange of the tray 2092 or an aperture in the bottom surface of the end cap. Alternatively, no end cap may be used at the end of the cable support 2084.

Since the cable management system 2080 is positioned within the front of the network cabinet 2004, the cable management system 2080 should not interfere with the opening and closing of the front door 500 of the network cabinet 2004. The front door 500 is spaced a distance in front of the server equipment rails 2008 and, to inhibit interference with the front door 500, the depth of the trays 2092 of the cable management system 2080 are less than the distance between the front door 500 and the front surface of the server equipment rails 2008.

Referring now to FIGS. 46-50, the cable management system 2080 also includes rear cable trays 2180 connected to the vertical frame rails 105, 110 of the network cabinets 2004 near the sealing apertures 1016 and sealing assemblies 1000, 1000' positioned in the sealing apertures 1016. In the illustrated exemplary embodiment, each rear cable tray 2180 is connected near its front end to an exterior surface 2044 of a corresponding front vertical frame rail 105 and near its rear end to an exterior surface 2188 of a corresponding back vertical frame rail 110.

The cable management system 2080 may include any number of rear cable trays 2180 and may have rear cable trays 2180 positioned near any number of the sealing apertures 1016 and associated sealing assemblies 1000, 1000' including, but not limited to, all of the sealing apertures 1016 and sealing assemblies 1000, 1000', none of the sealing apertures 1016 and sealing assemblies, or any number of sealing apertures 1016 and sealing assemblies 1000, 1000' there between. It should be understood that numerous sealing assemblies 1000, 1000' and rear cable trays 2180 are intentionally removed from the illustrated exemplary embodiment for simplicity and to avoid cluttering of the figures. Such intentional omission of sealing assemblies 1000, 1000' and rear cable trays 2180 is not intended to be limiting upon the present invention and, rather, the present invention is capable of having any number of sealing assemblies 1000, 1000' and rear cable trays 2180.

The rear cable trays 2180 are connected to the exterior surfaces 2044, 2188 of the vertical frame rails 105, 110 in a manner that enables electrical conduction between the components and grounding of the rear cable trays 2180. The connection between each rear cable tray 2180 and the exterior surfaces 2044, 2188 of the vertical frame rails 105, 110 may be bonded by placing an internal tooth lock washer 50 between a bolt 45 and the rear cable tray 2180 and a second internal tooth lock washer between a nut and the vertical frame rails 105, 110. The internal tooth lock washers have teeth that pierce the paint or coating and bite into the metal of the rear cable tray 2180 and the vertical frame rails 105, 110. An anti-oxidant paste could also be placed on the rear cable tray 2180 and the vertical frame rails 105, 110, underneath the lock washers, to prevent possible corrosion where the teeth of the lock washers bite into the metal of the rear cable tray 2180 and the vertical frame rails 105, 110. This provides a ground path from the rear cable tray 2180 to the vertical frame rails 105, 110 through the bolt, washers, and nut. Alternatively, regular washers could be used and the area around the holes in the rear cable tray 2180 and the holes in the vertical frame rails 105, 110 could be masked off or a serrated head bolt could be used in place of the bolt 45 and lock washer 50.

The rear cable trays 2180 are form generally U-shaped channels and include a first vertical flange 2192 defining holes therein that are alignable with holes defined in the exterior surfaces 2044, 2188 of the corresponding front and back vertical frame rails 105, 110 and through which fasteners 2200 or fastener combinations 2200, such as those described above, may pass to connect the rear cable tray 2180 to the corresponding front and back vertical frame rails 105, 110. The rear cable tray 2180 also includes a bottom wall 2204 extending perpendicular from a bottom end of the first flange 2192 and substantially parallel to a ground surface upon which the network cabinet 2004 rests. A second vertical flange 2208 extends upward and perpendicular from a second end of the bottom wall 2204. The first vertical flange 2192 has a first height and the second vertical flange 2208 has a second height less than the first height of the first vertical flange 2192. The holes defined through the first flange 2192 are disposed above a top edge 2212 (see FIG. 50) of the second vertical flange 2208 to position the fasteners 2200 above the top edge 2212 of second vertical flange 2208. With this configuration, the second vertical flange 2208 does not block the fasteners 2200 and a person is able to easily access the fasteners 2200 with a tool to connect or disconnect the rear cable tray 2180 to or from the vertical frame rails 105, 110. Each rear cable tray 2180 further includes a downward curved flange 2216 curving rearward and downward from a rear of the bottom wall 2204. This curved flange 2216 provides a smooth surface and bend radius that may be engaged by the cables and does not create stress on the cable that may cause breakage or cracking of the cables.

Figure 51:
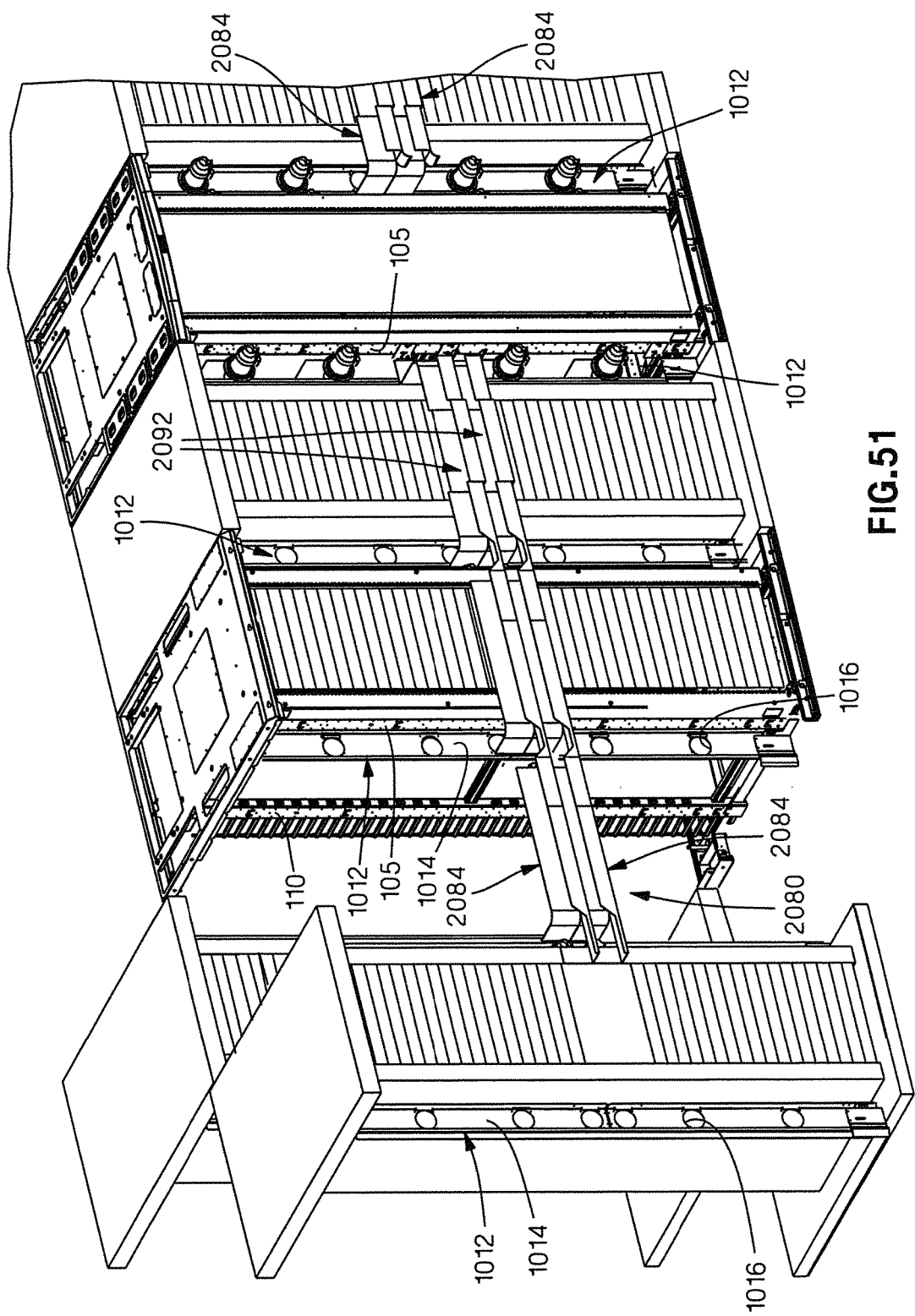
FIG. 51 is a partial top front perspective view of the network cabinets shown in FIG. 22 with one of the network cabinets removed from a rear of the remainder of the network cabinets.

With reference to FIG. 51, removal of one of the server cabinets 2004A from the data center row will be described. To remove one of the server cabinets 2004A, cables must be disconnected from the servers supported by the server cabinet 2004A and the corresponding front cable trays 2092 must be disconnected from the server cabinet 2004A. The cables are disconnected from the servers and may rest, at least in part, in one or both of the front cable supports 2084 and can be moved to the rear cable trays 2180 of the adjacent server cabinet 2004A or switch cabinet 2004B while the server cabinet 2004A is removed. The front cable supports 2084 and the rear cable trays 2180 assist with maintaining organization of the cables when they are disconnected from the servers and also provides vertical support to the cables to inhibit excess force on the cables as they hang disconnected from servers. The front cable trays 2092 are disconnected from both server equipment rails 2008 by removing the fasteners or fastener combinations, such as those described above, and the front cable trays 2092 will be supported by their connections to the adjacent trays 2092 and/or transition members 2088. Now that the cables and the front cable trays 2092 are disconnected from the server cabinet 2004A, the server cabinet 2004A may be removed from the data center row from a rear of the data center row. A replacement server cabinet 2004A may be introduced into the data center row, from a rear of the data center row, to replace the removed server cabinet 2004A. The cables are already well organized and supported, at least in part, in place by the front cable supports 2084 and the rear cable trays 2180. Thus, reconnection of the cables to the servers in the replacement server cabinet 2004A is relatively easy. Additionally, the front cable trays 2092 are easily connected to both server equipment rails 2008 of the replacement server cabinet 2004A by using fasteners or fastener combinations, such as those described above.

With reference to FIGS. 52-67, another exemplary embodiment of the present invention is illustrated. This illustrated exemplary embodiment includes a data center 2000" comprising a plurality of ganged together network cabinets 2004" and a plurality of docking assemblies 2220 connected together. Similar to the exemplary embodiment illustrated in FIGS. 22-51, the exemplary embodiment illustrated in FIGS. 52-67 accommodates data centers using passive 10G SFP+ cabling having a length limitation of 7 meters.

Figure 52:
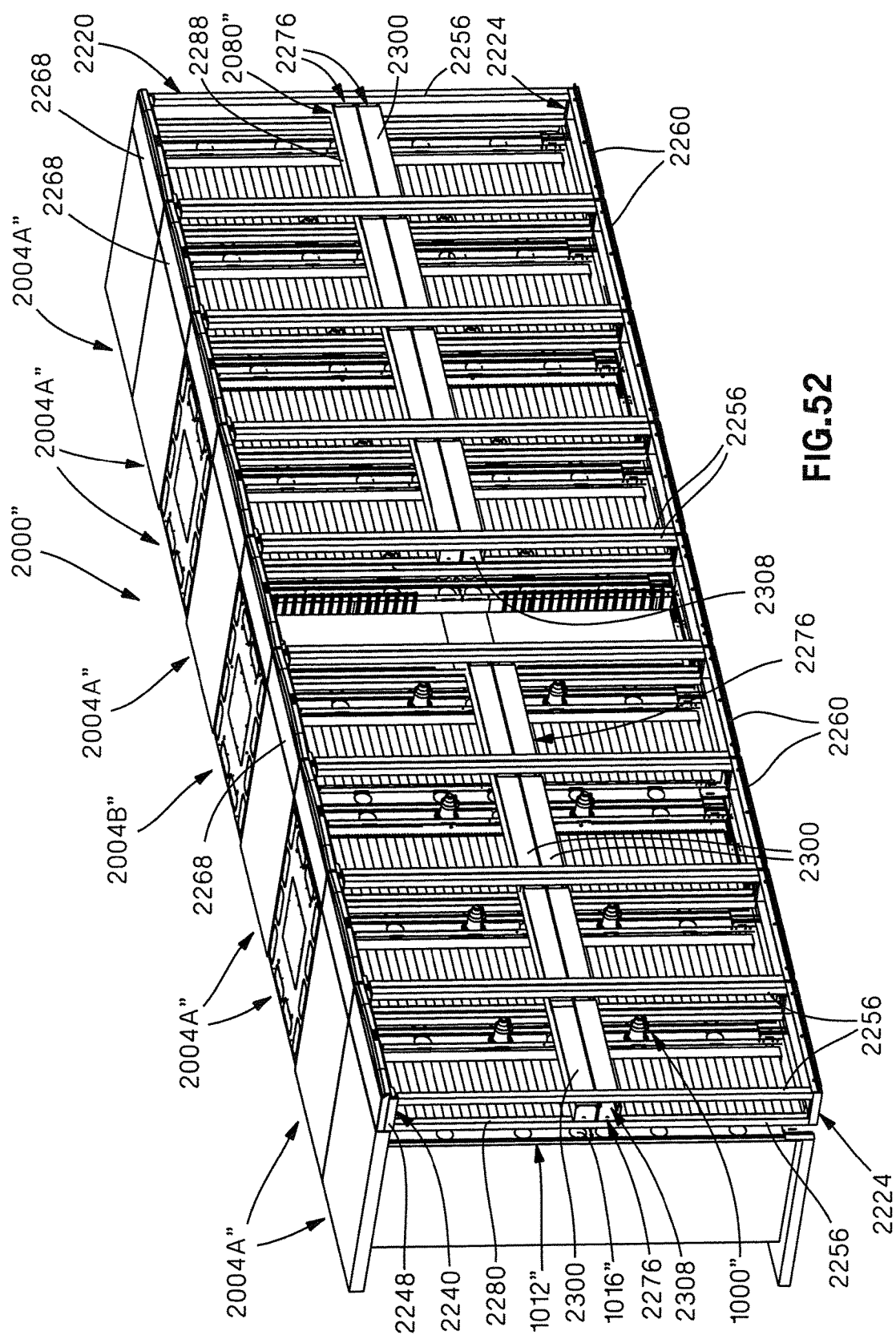
FIG. 52 is a top front perspective view of a plurality of network cabinets and a plurality of docking assemblies of the present invention.

Referring now to FIG. 52, the data center 2000" of the present invention is illustrated and is adapted to maximize a number of network cabinets 2004" that may be ganged together and contain electrical components electrically connected by passive 10G SFP+ cabling. In the illustrated exemplary embodiment, the data center 2000" contains nine total network cabinets 2004" arranged in a MoR architecture with a middle network cabinet containing switches (switch cabinet 2004B″) and the other eight network cabinets containing servers (server cabinets 2004A″). With this MoR configuration, the switches in the middle switch cabinet 2004B″ may be connected to servers contained in server cabinets 2004A″ as far out as four network cabinets in either direction. When fully assembled, the exemplary network cabinets 2004″ in the data center 2000″ may be about 32 inches wide, about 40 inches deep, and about 84 inches high and have 45 rack units with a 2,000 pound load rating. In other exemplary embodiments, the data center 2000″ may include more or less network cabinets 2004″ and may have architectures other than MoR such as, for example, End-of-Row (EoR) (i.e., switch cabinet 2004B″ at end of row), the switch cabinet 2004B″ disposed somewhere between a middle and an end of the row, or any other architecture. In order to describe the present invention, the embodiment of the data center 2000″ illustrated in FIG. 52 will be used herein. However, it should be understood that the description and illustration of the exemplary embodiment included herein is not intended to be limiting and any other configuration of data centers, network cabinets, and docking assemblies are intended to be within the spirit and scope of the present invention.

With continued reference to FIG. 52, the middle network cabinet of the data center row is the switch cabinet 2004B″ and contains switches identified as switch A and switch B. The four network cabinets to each side of the switch cabinet 2004B″ are server cabinets 2004A″ and may contain servers. The switch cabinet 2004B″ and the server cabinets 2004A″ may all have similar structural configurations and functional capabilities as the network cabinets described above in connection with FIG. 1-51. For example, the switch cabinet 2004B″ and server cabinets 2004A″ may all include a base frame 100″, top cover 200″, side panels 300″, back doors 400″, and front door 500″. Additionally, for example, the base frame 100″ is conductive and generally includes a pair of front vertical frame rails 105″, a pair of back vertical frame rails 110″, a pair of front to back base beams 115″, a pair of side to side base beams 120″, a pair of front to back top beams 125″, a pair of side to side top beams 130″, and front to back support beams 135″, all of which are typically steel but can be made of any suitable conductive or non-conductive material. The front and back vertical frame rails 105″, 110″ are inset from side panels 300″, back doors 400″, front door 500″, and the corners of the network cabinet 2004″ that are formed by side panels 300″, back doors 400″, and front door 500″. This inset provides unobstructed space along all of the sides of the network cabinet 2004″ for cable management pathways. The side to side base beams 120″ have a rectangular cross-section geometry and are positioned between and perpendicular to the front to back base beams 115″, which also have a rectangular cross-section geometry. The side to side base beams 120″ are welded to the front to back base beams 115″ and, along with the door mounts 15″, form a base member for the network cabinet 2004″ and define openings 123″. By welding together all of the steel components of the base frame 100″, the base frame 100″ is a single conductive, bonded unit. It should be understood that some of these components have been removed in order to illustrate interiors of the network cabinets 2004″.

Figure 66:
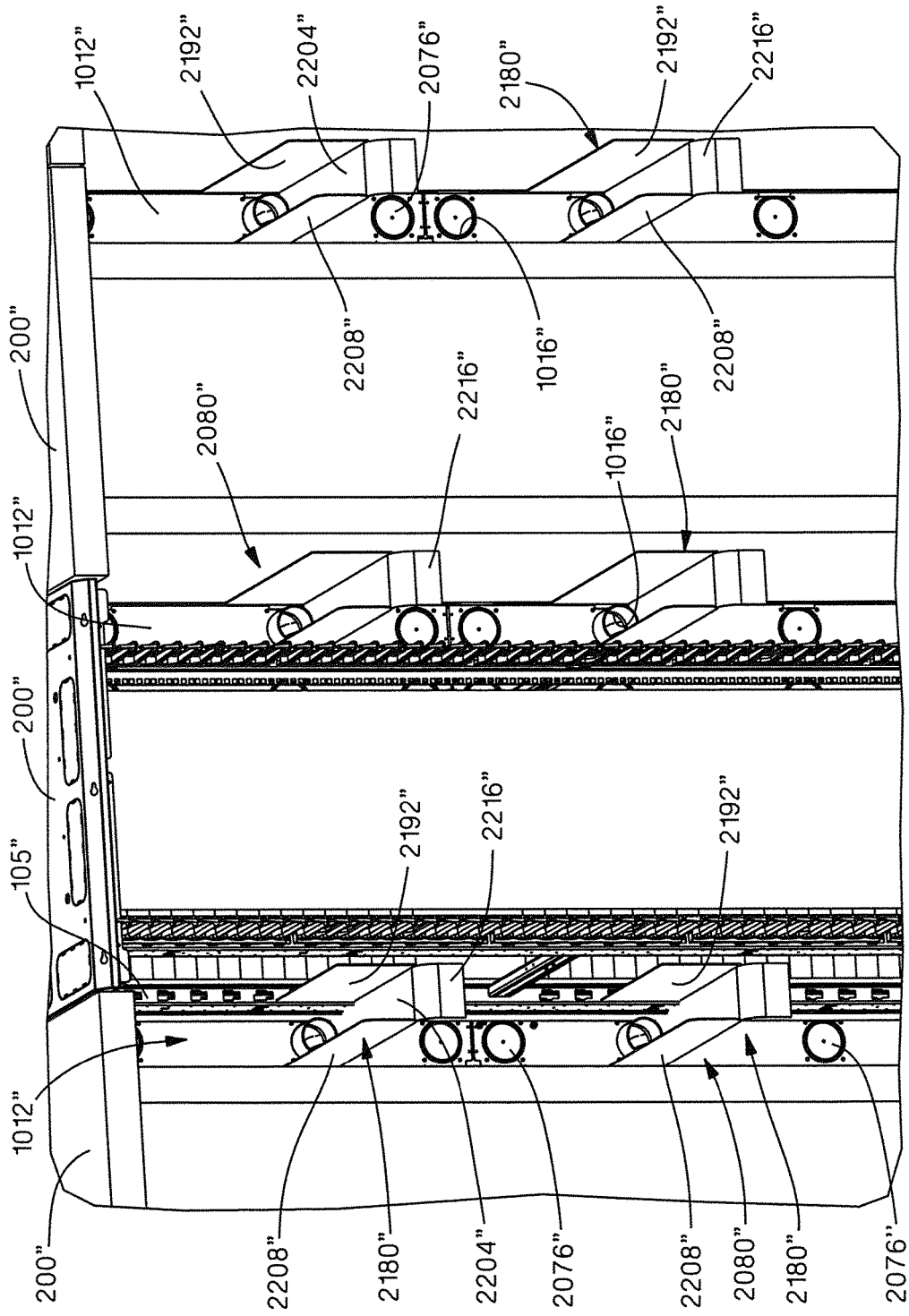
FIG. 66 is a top rear perspective view of a portion of the network cabinets and the docking assemblies shown in FIG. 52.

With reference to FIGS. 52, 63, and 66, this illustrated exemplary embodiment of the data center 2000″ includes some of the same components as the data center 2000 illustrated in FIGS. 22-51. More particularly, the present data center 2000″ illustrated in FIGS. 52-67 includes air dams 1012″, sealing assemblies 1000″, and rear cable trays 2180″ that are similar in structure and functionality to the air dams 1012, sealing assemblies 1000, 1000′, and rear cable trays 2180 of the exemplary embodiment of the data center 2000 illustrated in FIGS. 22-51. Thus, for the sake of brevity, the air dams 1012″, sealing assemblies 1000″, and rear cable trays 2180″ of the exemplary embodiment illustrated in FIGS. 52-67 will not be described herein. Rather, reference is made to the above description relating to the air dams 1012, sealing assemblies 1000, 1000′, and rear cable trays 2180 of FIGS. 22-51.

Figure 53:
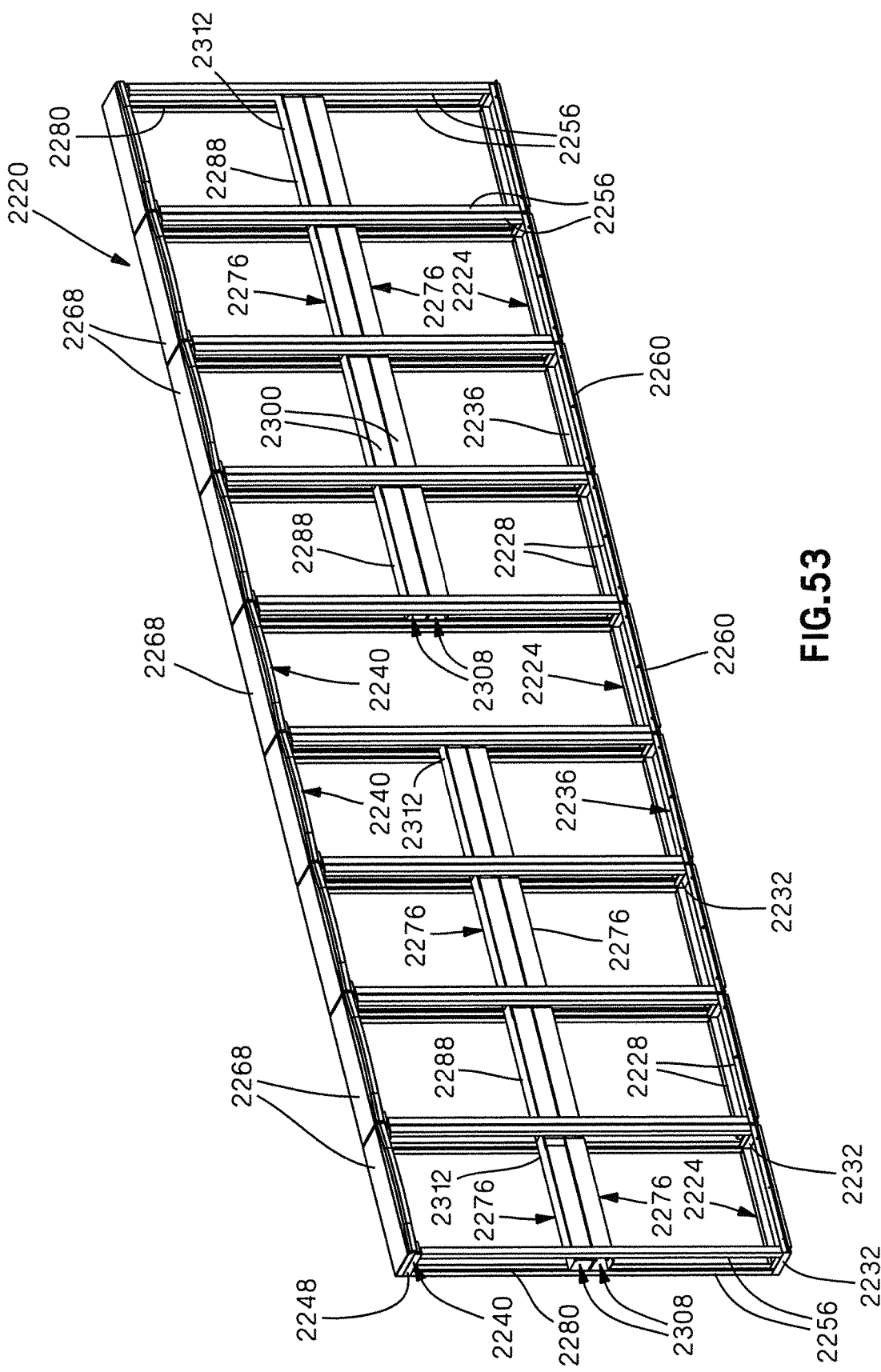
FIG. 53 is a top front perspective view of the plurality of docking assemblies shown in FIG. 52 with the docking assemblies coupled together.

Referring now to FIGS. 52 and 53, the data center 2000″ includes a plurality of docking assemblies 2220, with one docking assembly 2220 connected to a front of each network cabinet 2004″ and with adjacent docking assemblies 2220 connected to one another. In the illustrated exemplary embodiment, the data center 2000″ includes the same number of docking assemblies 2220 as the number of network cabinets 2004″. With this configuration, one docking assembly 2220 is associated with each network cabinet 2004″.

In some exemplary embodiments, all of the network cabinets 2004″ of the data center 2000″ may have similar structure and function. Thus, all of the docking assemblies 2220 may have similar structure and function. Thus, only one of the network cabinets 2004″ and its associated docking assembly 2220 will be described in detail herein unless otherwise stated.

Each docking assembly 2220 includes a base member 2224 comprised of a pair of spaced apart side to side base members 2228 and a pair of spaced apart front to back base members 2232. The side to side base members 2228 are connected to the front to back base members 2232 to form a base member 2224 having a generally rectangular shape with an opening 2236 in an interior of the base member 2224. The docking assembly 2220 also includes a top member 2240 comprised of a pair of spaced apart side to side top members 2244 and a pair of spaced apart front to back top members 2248. The side to side top members 2244 are connected to the front to back top members 2248 to form a top member 2240 having a generally rectangular shape with an opening in an interior of the top member 2240. Additionally, the docking assembly 2220 includes four vertical frame rails 2256 connected at their ends to respective base and top members. In the illustrated exemplary embodiment, the four vertical frame rails 2256 of the docking assembly 2220 are located at the four corners of the base and top members. The base member 2224, the top member 2240, and the four vertical frame rails 2256 together form a base frame of the docking assembly 2220.

The components of the base frame should be connected together in a manner that enables electrical conduction between the components and grounding of the base frame. One such manner is by welding the components of the base frame together. This ensures electrical conduction between components and grounding of the base frame. Alternatively, the components of the base frame may be connected together using fasteners or fastener combinations. For example, the components of the base frame may be bonded by using internal tooth lock washers, bolts, and nuts to connect the components of the base frame. The internal tooth lock washers have teeth that pierce the paint or coating and bite into the metal of the components. An anti-oxidant paste could also be placed on the components, underneath the lock washers, to inhibit possible corrosion where the teeth of the lock washers bite into the metal of the components of the base frame. This provides a ground path through the components of the base frame through the bolts, washers, and nuts. Alternatively, regular washers could be used and the area around connection holes in the components of the base frame could be masked off or a serrated head bolt could be used in place of the bolts and lock washers.

The docking assembly 2220 also includes a door mount 2260 connected to a front of the base member 2224 and a top cover 2268 connected to a top of the top member 2240 and overhangs a front of the top member 2240. In the illustrated exemplary embodiment, the door mount 2260 and the overhanging top cover 2268 cooperate to support a front door 500" in a manner similar to that performed by the network cabinets described above. In this exemplary embodiment, the front door 500" may be removed from the network cabinet 2004", the docking assembly 2220 may be connected to the front of the network cabinet 2004", and the front door 500" may be connected to the door mount 2260 and top cover 2268 of the docking assembly 2220. Alternatively, the front surface of the base frame could be flat or any other configuration and configured to receive any type of front door and hinging assembly desired, or no front door at all.

Figure 54:
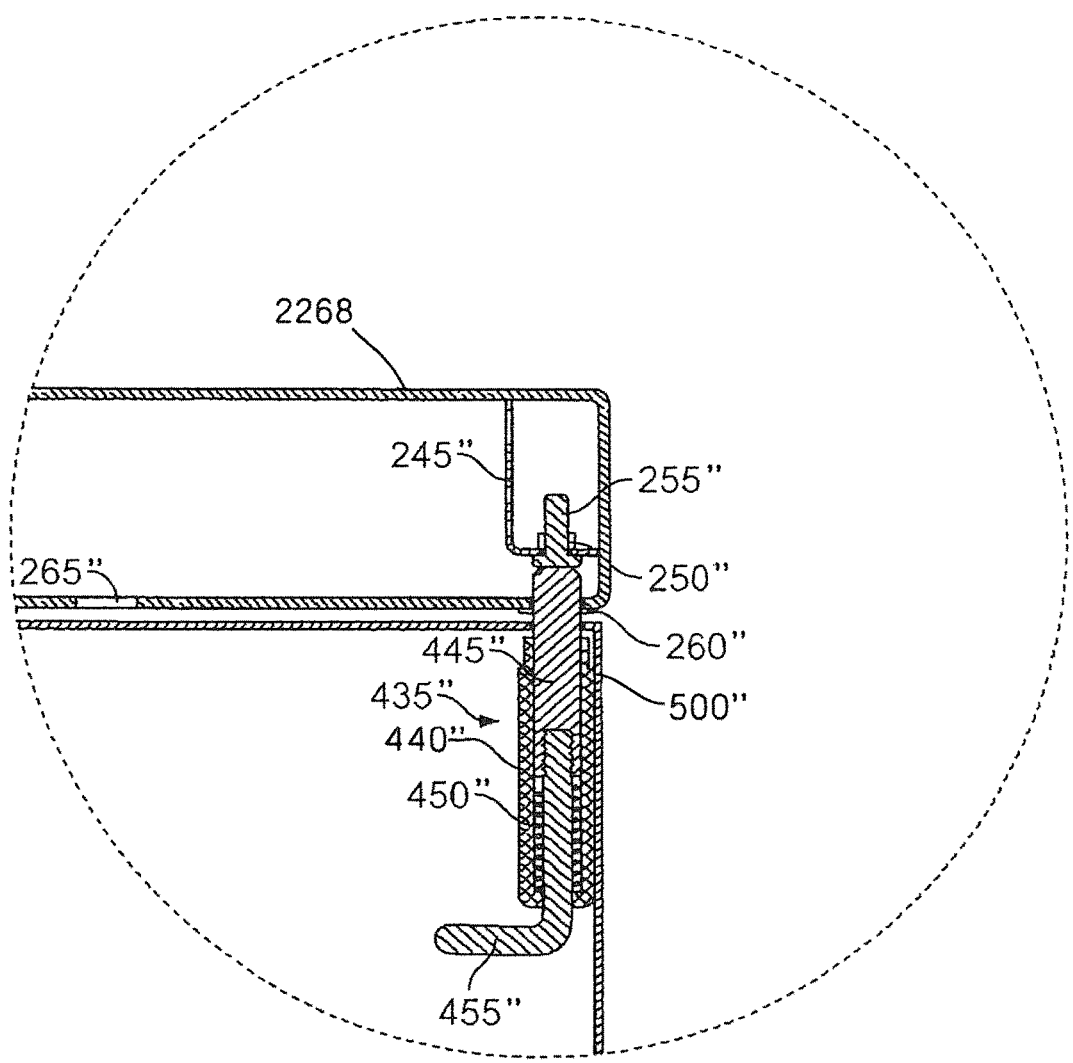
FIG. 54 is a cross-sectional view of a top hinge connection of a front door of one of the docking assemblies shown in FIG. 52.

Referring to FIG. 54, the front door 500" may be bonded to the top cover 2268 of the docking assembly 2220 through a spring loaded hinge assembly 435", which includes a generally cylindrical body 440", hinge pin 445", release arm 455", and spring 450". The body 440" is steel, or other conductive material, and is welded to the inside surface of the front door 500". The hinge pin 445" is steel, or other conductive material, and is positioned inside the body 440". The release arm 455" is generally "L" shaped, extends through a hole in the end of the body 440", and threads into the hinge pin 445". Spring 450" is positioned inside of the body 440" and is compressed between the hinge pin 445" and the end of the body 440". Spring 450" biases the hinge pin 445" outward from the body 440" and allows the hinge pin 445" to be retracted when the release arm 455" is pulled. Hinge pin 445" extends from the end of the body 440", through a hole in the top of the front door 500" and through bushing 260" in top cover 2268 of the docking assembly 2220, where hinge pin 445" contacts a thread forming screw 255" that is bonded to the top cover 2268 of the docking assembly 2220.

To bond the thread forming screw 255" to the top cover 2268 of the docking assembly 2220, a conductive ground angle 245" is welded to the inside surface of the top cover 2268 of the docking assembly 2220 and the thread forming screw 255" is threaded into the ground angle 245" and into a nut 250" that is welded to the ground angle 245", thereby providing a bond between the top cover 2268 and the screw 255".

To install or remove the front door 500", the release arm 455" is pulled downward, which compresses the spring 450" and retracts the hinge pin 445' into the body 440". With the hinge pin 445" below the level of the bushing 260", the front door 500" can be placed in position or removed. Once the front door 500" is in position, the release arm 455" is released and the spring 450" pushes the hinge pin 445" outward through the bushing 260" until the hinge pin 445" contacts the screw 255".

In this example, the spring loaded hinge assembly 435" provides the hinge mechanism for the front door 500" and also provides a positive grounding path when the front door 500" is installed. This allows the removal of the front door 500" without the need of disconnecting any grounding jumper wires.

With continued reference to FIG. 54, the top cover 2268 of the docking assembly 2220 has holes 265" that are inset from the bushings 260" that receive the hinge pin 445" of the spring loaded hinge assembly 435". Each of the holes in the door mounts 2260 is aligned in a generally vertical axis with a corresponding hole 265" in the top cover 2268 of the docking assembly 2220 and provides a storage mechanism for a front door 500" that has been removed.

For example, as described above, a front door 500" can be removed by pulling downward on the release arm 455", which retracts the hinge pin 445" and allows the front door 500" to be tilted and removed. Rather than having to lean the removed front door 500" on the network cabinet 2004" or against a wall or other equipment where it can be bumped into or knocked over, the removed front door 500" can be stored using holes 2272 and 265" in the door mount 2260 and top cover 2268 of the docking assembly 2220. To store the removed front door 500", the fixed hinge pin on the bottom of the removed front door 500" is inserted into the hole 2272 in the door mount 2260 and the hinge pin 445" of the spring loaded hinge assembly 435" is inserted into the corresponding hole 265" in the top cover 2268 of the docking assembly 2220 by pulling downward on the release arm 455".

Figure 55:
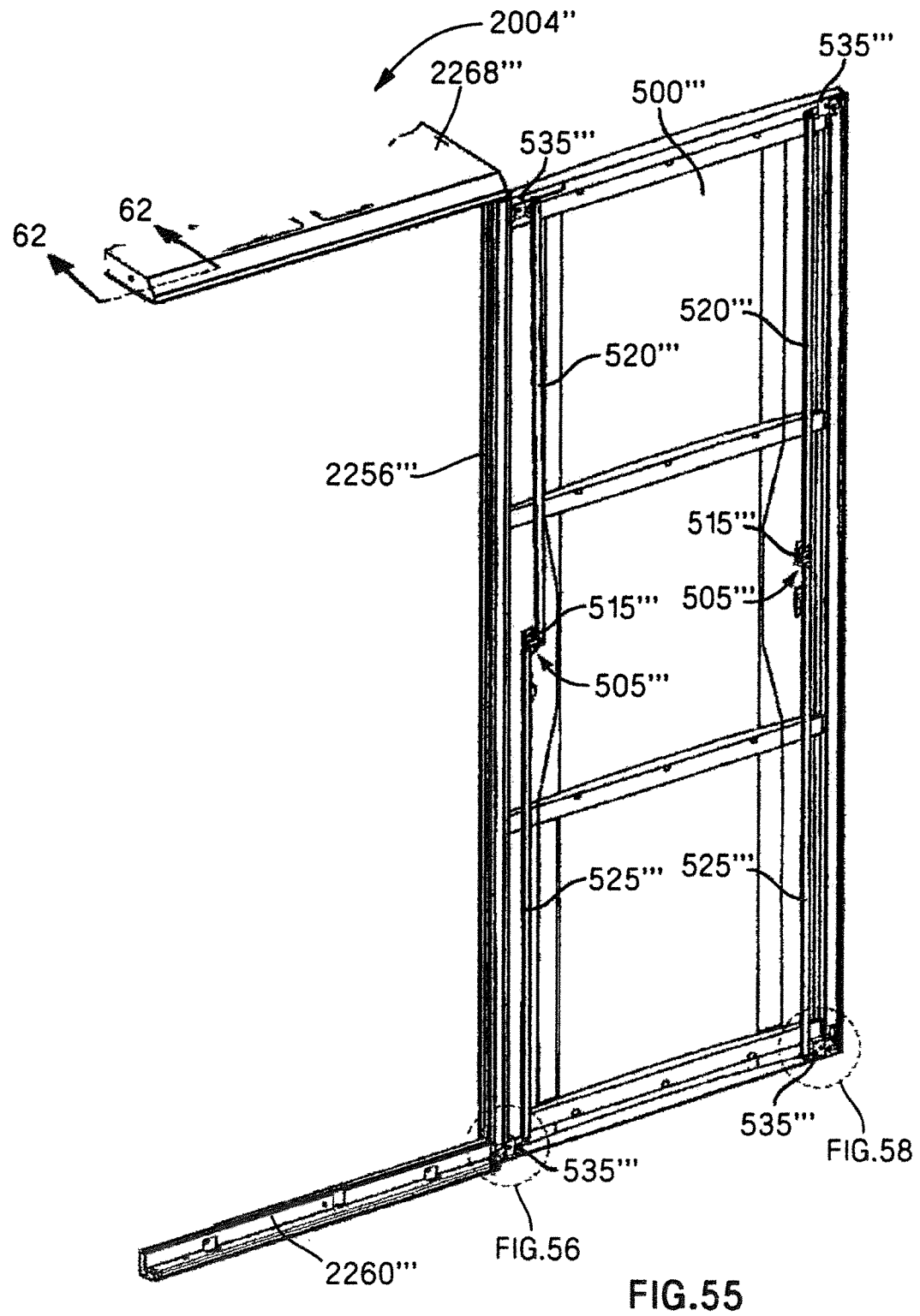
FIG. 55 is a top front perspective view of a portion of one of the docking assemblies shown in FIG. 52 with the front door partially open.

Referring to FIG. 55, another exemplary embodiment of the front door 500''' and a manner of connecting and disconnecting the front door 500''' is illustrated. In this embodiment, front door 500''' is mounted to the front of docking assembly 2220''' between top cover 2268''' and the front door mount 2260''' of the docking assembly 2220. In the example shown, the front door 500''' is generally rectangular sheet steel that can be solid or perforated for aesthetics and air flow, is dual hinged, as described in more detail below, and can be opened from either the left or right side giving full access to either the left or right rack and vertical cable management channels without having to remove front door 500'''. Alternatively, rather than using a single dual hinged door, split doors, a single hinged door, or any other type of door could be used as well and front door 500''' could be made of any geometry and of any material and design as required for a particular application.

With continued reference to FIG. 55, in this example, front door 500''' has two latch mechanisms 505''', one on each side of the front door 500'''. The latch mechanisms 505''' have a door handle 510''', cam plate 515''', upper rod 520''', and lower rod 525'''. The latch mechanisms 505''' can also have a cylinder lock 530''', which can lock the door handle 510''' in the closed position.

Figure 56:
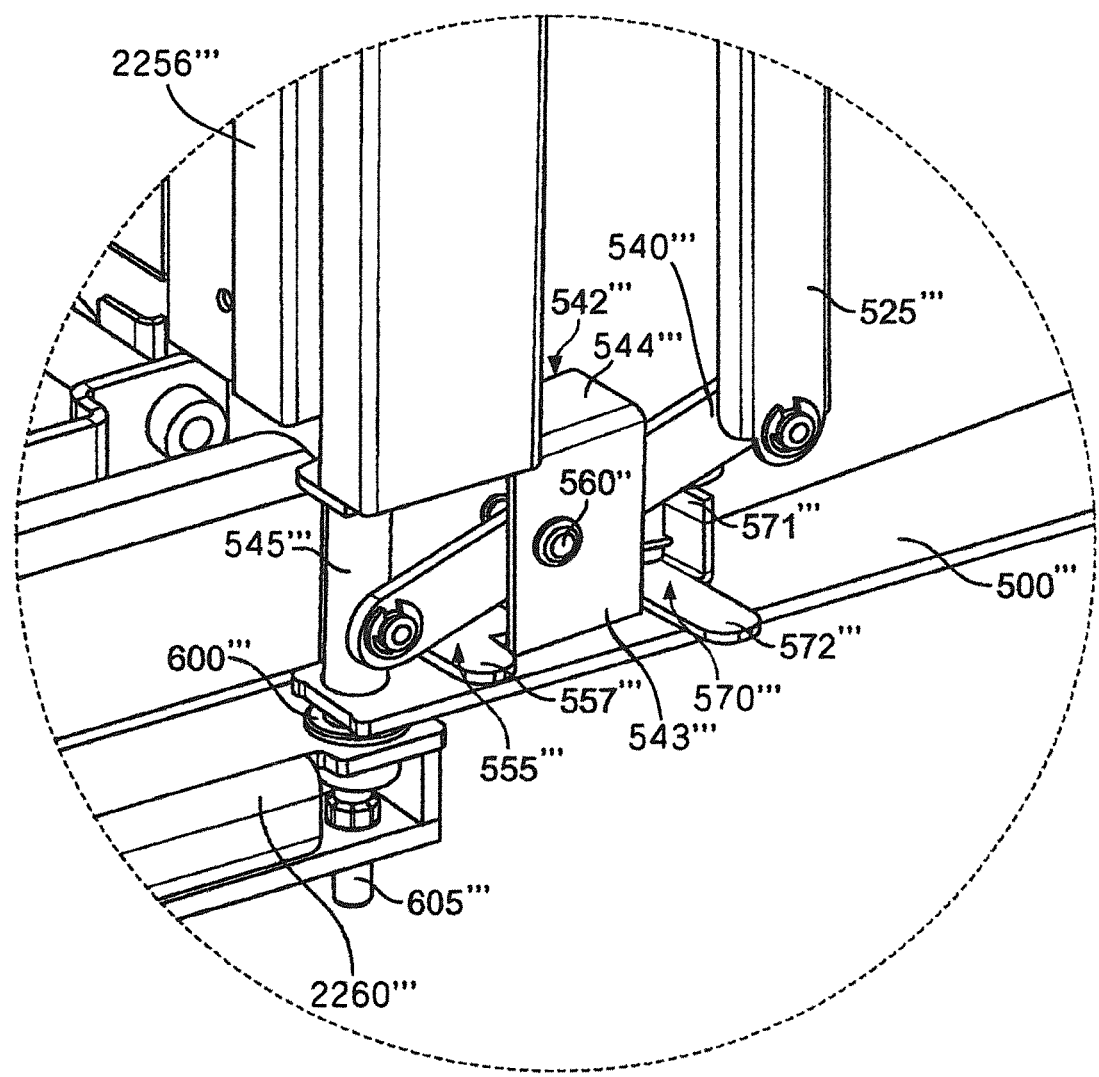
FIG. 56 is an enlarged partial view of a safety hinge of the front door shown in FIG. 55.
Figure 57:
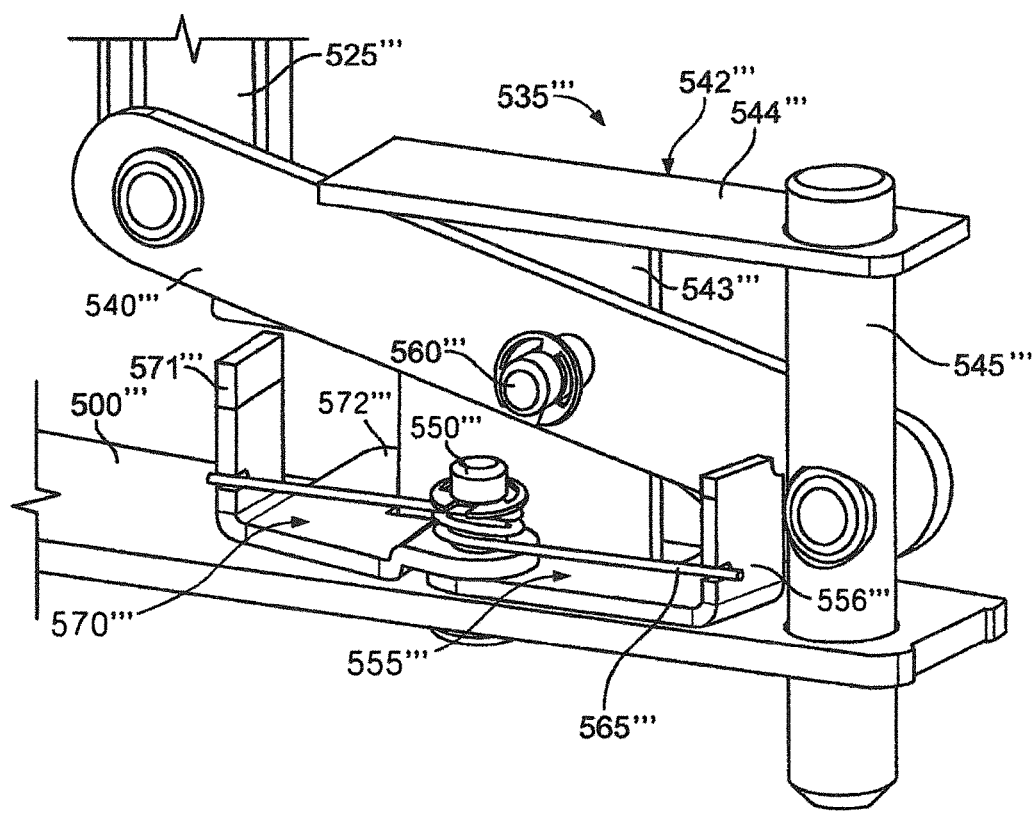
FIG. 57 is a back view of the safety hinge shown in FIG. 56.
Figure 58:
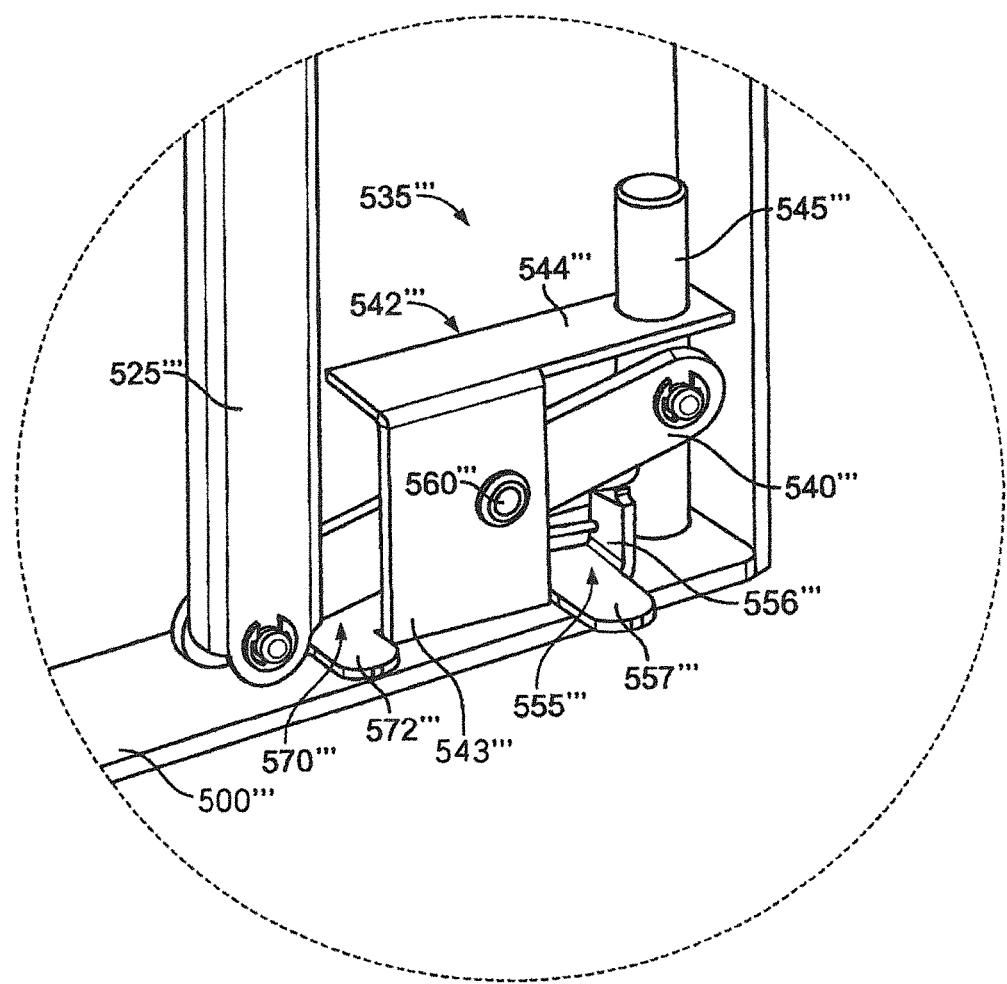
FIG. 58 is an enlarged partial view of a second safety hinge of the front door shown in FIG. 55.

At each top and bottom corner of the front door 500''' (four positions total) is a locking hinge assembly 535'''. FIGS. 56 and 58 show the locking hinge assemblies 535''' on the bottom corners of the front door 500''' and it will be understood that the assemblies on the top corners are identical to those described herein for the bottom corners. FIG. 57 shows the backside of the latch mechanism shown in FIG. 56. Each locking hinge assembly 535''' includes a hinge lever 540''', hinge support 542''', hinge pin 545''', an inner lever stop 555''', and an outer lever stop 570'''. As used herein, an inner lever stop 555''' is the lever stop that is closest to the hinge pin 545''' and an outer lever stop 570''' is the lever stop that is furthest from the hinge pin 545'''.

The hinge support 542''' has a generally vertical wall 543''' that is attached to the front door 500''', such as by welding, with screws, etc., and a generally horizontal wall 544''' extends generally perpendicular from the top of the vertical wall 543'''. The hinge lever 540''' is mounted to the vertical wall 543''' of hinge support 542''' by pin 560''' such that hinge lever 540''' can rotate about pin 560'''. Hinge lever 540''' is also rotatably connected to a lower rod 525''' (or upper rod 520 depending on which locking hinge assembly) at one end and to the hinge pin 545''' at the end opposite the lower rod 525'''. The hinge pin 545''' extends generally vertically through the front door 500''' and through the horizontal wall 544'''.

A lever stop hinge pin 550''', as seen in FIG. 57, is attached to the front door 500''' and the lever stops 555''', 570''' are mounted onto the lever stop hinge pin 550''' such that the lever stops 555''', 570''' can rotate about the hinge pin 550'''. Each of the lever stops 555''', 570''' has a generally vertical stop arm 556''', 571''' and a generally horizontal release arm 557''', 572'''. A torsion spring 565''' is mounted on the lever stop hinge pin 550''' and has ends that extend out to the stop arms 556''', 571''' of the lever stops 555''', 570''' to bias the lever stops 555''', 570''' into a forward position.

In operation, when the front door 500''' is closed (the closed position is defined as both top corners of the front door 500''' seated against the top cover 2268''' of the docking assembly 2220''' and both bottom corners of the front door 500''' seated against the door mount 2260''' of the docking assembly 2220''') the upper and lower rods 520''', 525''' are pulled towards the center of the front door 500''', thereby rotating the hinge lever 540''' and extending the hinge pins 545''' into their corresponding bushings 600''' in the door mount 2260''' or top cover 2268''' of the docking assembly 2220'''. Therefore, the hinge pins 545''' in each of the four corners of the front door 500''' engage the bushings 600''' in the door mount 2260''' or top cover 2268''' of the docking assembly 2220''' and the front door 500''' is fully secured. In addition, when in the closed position, the door mount 2260''' or top cover 2268''' will push against the release arms 557''', 572''' of both lever stops 555''', 570''', thereby disengaging the stop arms 556''', 571''' of both lever stops 555''', 570''' from the hinge lever 540'''. This allows the hinge lever 540''' to rotate freely in either direction. Referring specifically to FIG. 56, when a door handle is rotated from a closed to an open position the lower rod 525''' is lowered, the hinge lever 540''' is rotated counter-clockwise about pin 560''', and the hinge pin 545''' is raised. This enables the front door 500''' to be hinged open about the hinge pins 545''' in the opposite side. Conversely, when the lower rod 525''' is raised (e.g. the door handle is moved from an open to a closed position), the hinge lever 540''' will rotate clockwise about pin 560''' and lower the hinge pin 545'''.

Referring specifically to FIGS. 56 and 58, operation of the locking hinge assemblies 535''' is shown when the left side of the front door is unlocked and the front door is opened from left to right (as seen when facing the front of the network cabinet 2004'''), as shown in FIG. 55. FIG. 56 shows the operation of the locking hinge assemblies 535''' on the side of the front door 500''' that remains engaged, and FIG. 58 shows the operation of the locking hinge assemblies 535''' on the side of the front door 500''' that is disengaged.

Referring to FIG. 56, when the front door 500''' is moved from the closed position, the door mount 2260''' of the docking assembly 2220''' no longer pushes against the release arms 557''', 572''' of the lever stops 555''', 570''' and the torsion spring attempts to push the lever stops 555''', 570''' into a forward position. Because the hinge lever 540''' is still in the locked position, the inner lever stop 555''' is blocked by the hinge lever 540''' and cannot rotate forward. However, the outer lever stop 570''' is not obstructed by the hinge lever 540''' and is pushed into a forward position by the torsion spring. When the outer lever stop 570''' is in the forward position, the stop arm 571''' is positioned underneath the hinge lever 540''', thereby preventing the hinge lever 540''' from rotating. Therefore, in this position, if a user were to attempt to turn the door handle (attempting to move the lower rod 525''' downward) the stop arm 571''' prevents the hinge lever 540''' from moving, thereby preventing the door handle from being moved. This prevents an engaged hinge from being accidentally disengaged if the opposing hinge is disengaged and the front door 500''' is open. Should this accidental disengagement not be prevented, front door 500''' could easily fall onto and injure a person positioned in front of the docking assembly 2220'''.

Referring to FIG. 58, to move the front door 500''' from the closed position the locking hinge assembly 535''' on the side to be opened must be disengaged. When a user turns the door handle the lower rod 525''' is pushed down, which rotates the hinge lever 540''' and pulls back the hinge pin 545'''. After the locking hinge assembly 535''' have been disengaged and the front door 500''' is moved from the closed position, the door mount 2260''' of the docking assembly 2220''' no longer pushes against the release arms 557''', 572''' of the lever stops 555''', 570''' and the torsion spring attempts to push the lever stops 555''', 570''' into a forward position. Because the hinge lever 540''' has been moved from the locked position, the outer lever stop 570''' is blocked by the hinge lever 540''' and cannot rotate forward. However, the inner lever stop 555''' is not obstructed by the hinge lever 540''' and is pushed into a forward position by the torsion spring. When the inner lever stop 555''' is in the forward position, the stop arm 556''' is positioned underneath the hinge lever 540''', thereby preventing the hinge lever 540''' from rotating. Therefore, in this position, if a user were to attempt to turn the door handle (attempting to move the lower rod 525''' upward) the stop arm 556''' prevents the hinge lever 540''' from moving, thereby preventing the door handle from being moved. This prevents the closing of the door handle until the front door 500''' is in the fully closed position such that lever stop 555''' has been pushed backward thereby unobstructing hinge lever 540''' allowing hinge pin 545''' to be lowered through and fully engage bushing 600'''.

As can be seen from the above description, the locking hinge assemblies 535''' require that the front door 500''' be in a closed position before the user can change the state of the front door 500''' (e.g. engage or disengage the locking hinge assemblies 535'''). This accomplishes two important goals: (1) it prevents unexpected and accidental removal of the front door 500''' (when one side is open, the other side is locked and cannot be disengaged until the front door 500''' is closed); and (2) it prevents a user from mistakenly thinking that the front door 500''' is closed when it is still ajar (the door handle cannot be moved into the closed position until the front door 500''' is completely closed and the lever stops allow movement of the hinge lever).

To remove the front door 500''' from the docking assembly 2220''', the front door 500''' is first placed in the closed position. In this position all of the inner and outer lever stops 555''', 570''' of all of the locking hinge assemblies 535''' are pushed into a retracted position allowing all of the hinge levers 540''' to move freely. While in the closed position, both of the door handles are turned which will disengage all of the locking hinge assemblies 535''' by extending the upper and lower rods 520''', 525''' and retracting the hinge pins 545''' from their respective bushings 260''', 600''', allowing removal of the front door 500'''. Once the front door 500''' has been removed, the inner lever stops 555''' are moved into their forward position by the torsion spring 565''', thereby obstructing the hinge lever 540''' and preventing the door handles from being turned. To install the front door 500''', the above process is reversed. The front door 500''' is placed against the door mount 2260''' and top cover 2268''' of the docking assembly 2220''' such that the hinge pins 545''' are aligned with their respective bushings 260''', 600'''. In this position, the door mount 2260''' and top cover 2268''' of the docking assembly 2220''' will push the inner lever stops 555''' backwards and out of the way of the hinge lever 540''', thereby allowing the hinge lever 540''' to move freely. Both of the door handles are then turned to retract the upper and lower rods 520''', 525''' and thereby extend the hinge pins 545''' into their respective bushings 260''', 600'''.

Figure 59:
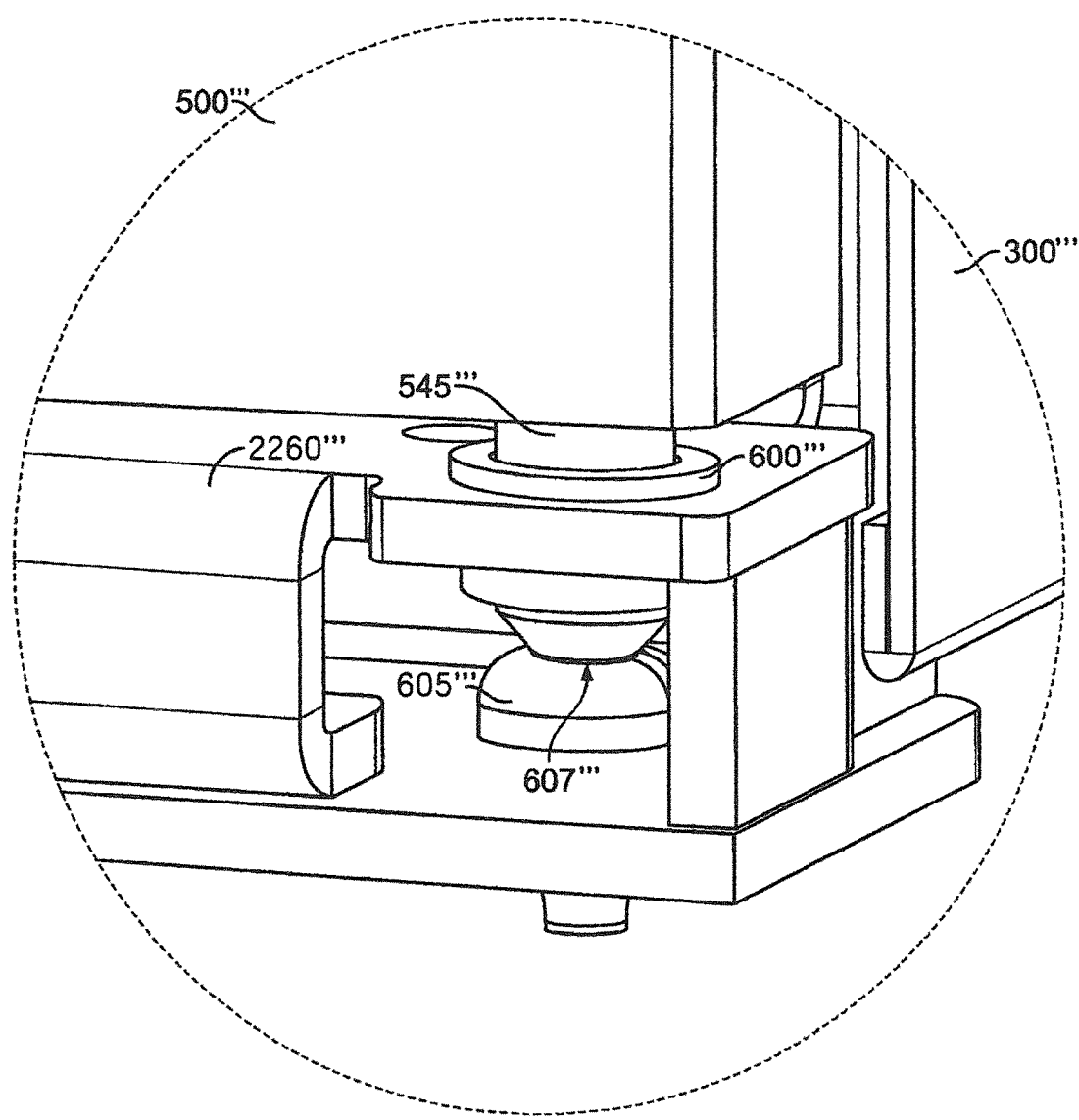
FIG. 59 is an enlarged partial view of a front door lifting mechanism of the front door shown in FIG. 55.

Referring to FIG. 59, the engagement between the hinge pin 545''' of the front door 500''' and the door mount 2260''' of the docking assembly 2220''' is shown. The hinge pin 545''' extends through and engages a bushing 600''' that is positioned in a hole in the top of the door mount 2260''' of the docking assembly 2220'''. In this example, lifting screw 605''' is threaded into the bottom portion of the door mount 2260''' just below the bushing 600''' that engages the hinge pin 545'''. As the door handle is moved into the closed position, the hinge pin 545''' moves down through the bushing 600''' and contacts the lifting screw 605'''. After the hinge pin 545''' contacts the lifting screw 605''', the hinge pin 545''' continues to move downward and lifts the front door 500''' off of the bushing 600'''. Therefore, the front door 500''' rides on the hinge pin 545''', which provides clearance between front door 500''' and door mount 2260''' when closing the front door 500''' and compensates for door sag and/or worst case tolerance stack-ups.

Figure 60:
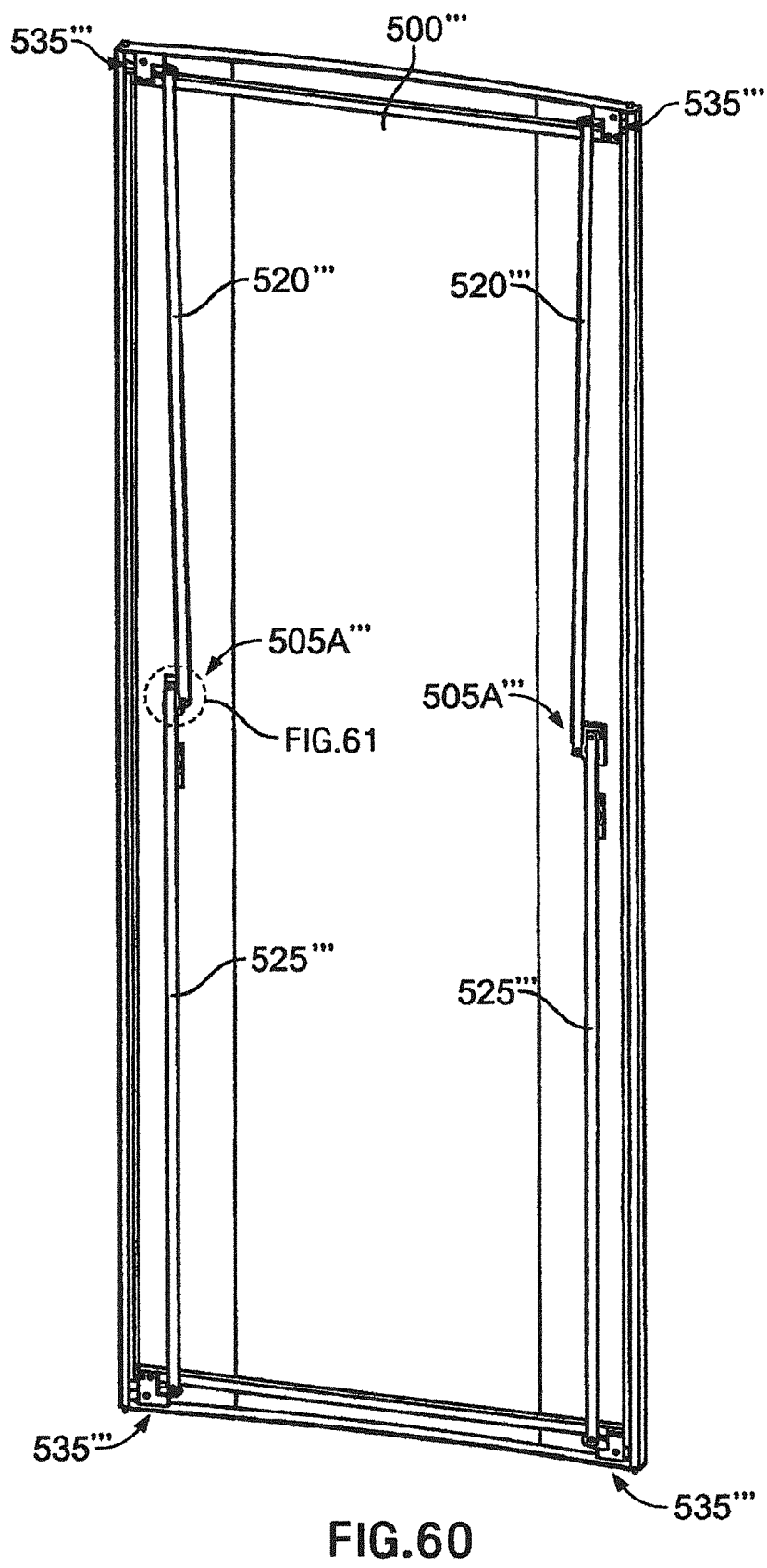
FIG. 60 is a back perspective view of the front door of the docking assembly shown in FIG. 55 with an alternative latch mechanism.
Figure 61:
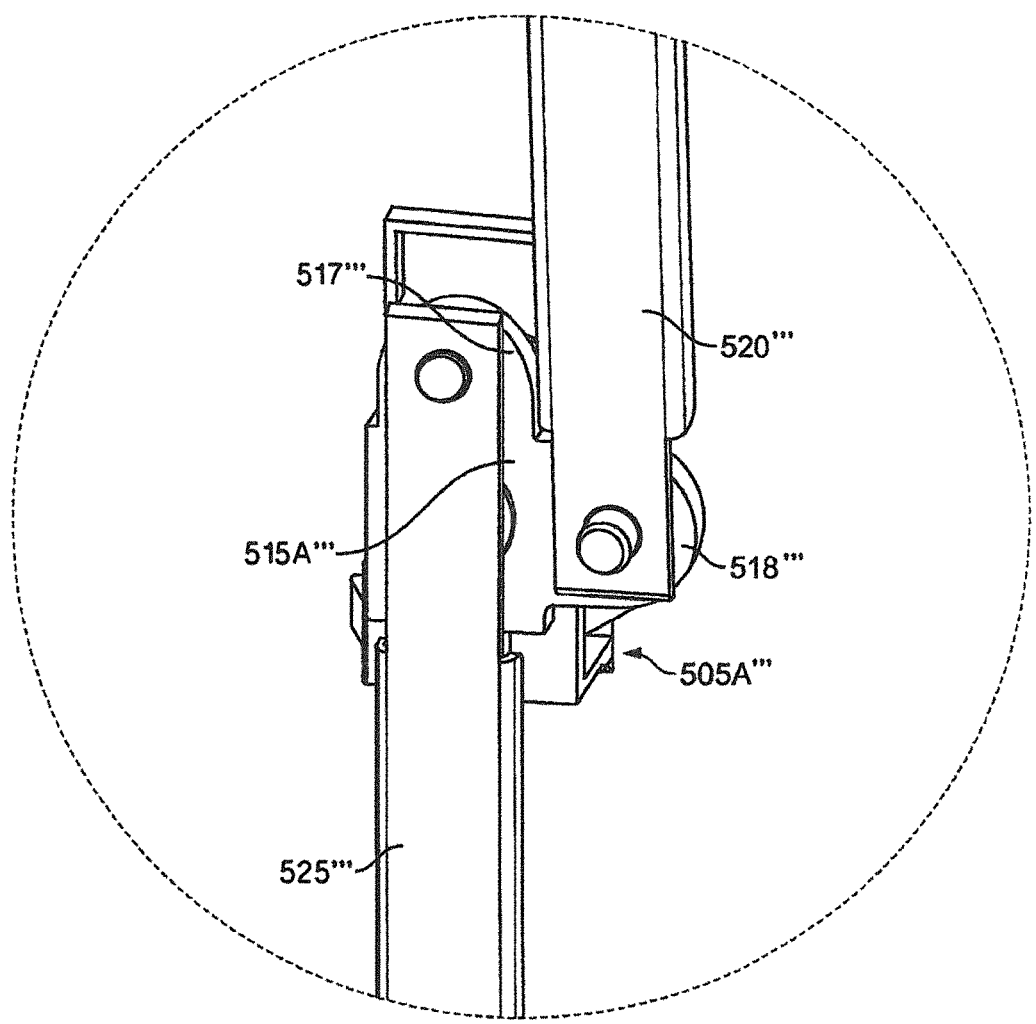
FIG. 61 is an enlarged partial view of the alternative latch mechanism of the front door shown in FIG. 60.

In the example described above, with the weight of front door 500''' riding on hinge pin 545''' (rather than on bushing 600'''), there is a constant force on the bottom hinge pins 545''' attempting to push hinge pins 545''' into a retracted position. If the door handle is not fully engaged when the front door 500''' is in the closed position, the force on the hinge pins 545''' could cause the door handle to rotate towards an open position and possibly disengage locking hinge assemblies 535'''. To prevent this from happening, an overcam latch mechanism can be used. Referring to FIGS. 60 and 61, the overcam latch mechanism 505A''' is substantially identical in structure and functionality to latch mechanisms 505A illustrated in FIGS. 12F and 12G and described above. Thus, for the sake of brevity, latch mechanism 505A''' will not be described herein. Rather, reference is made to the above description relevant to the latch mechanism 505A of FIGS. 12F and 12G.

Figure 62:
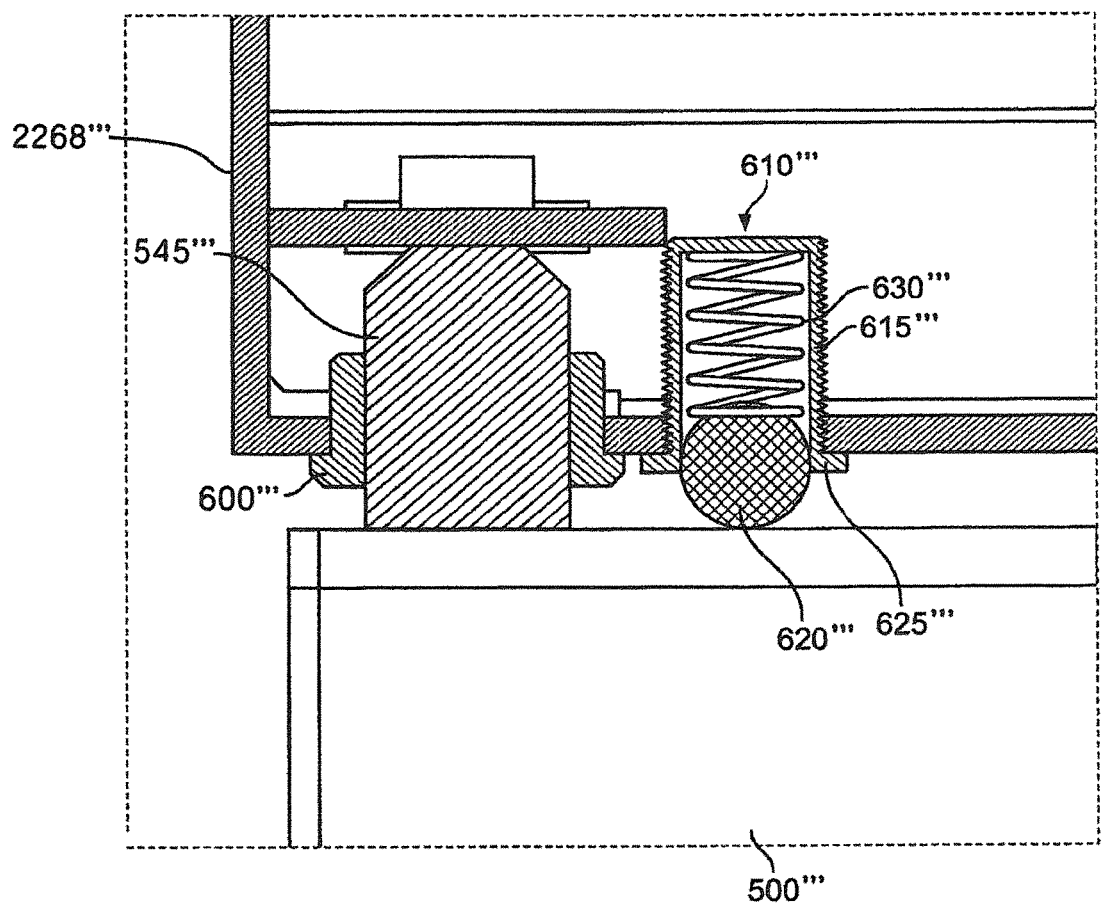
FIG. 62 is a cross-sectional view taken along line 62-62 in FIG. 55.

Referring to FIG. 62, in this embodiment, the front door 500''' is also bonded to the top cover 2268''' of the docking assembly 2220''' by spring loaded bearing assemblies 610'''. Two spring loaded bearing assemblies 610''' are positioned one at opposite corners of the top cover 2268''', one near each bushing 600''' and hinge pin 545'''. In positioning spring loaded bearing assembly 610''' near hinge pin 545''', bearing assembly 610''' maintains contact with front door 500''' as front door 500''' is swung to an open position. By using two bearing assemblies 610''', the front door 500''' stays bonded to the top cover 2268''' when closed, open to the left, or open to the right. Each spring loaded bearing assembly 610''' has a generally cylindrical body 615''', a ball bearing 620''', a face plate 625''', and a spring 630'''. Body 615''' is steel or another conductive material and has external threads that permit body 615''' to be screwed into paint masked compatible threads in the top cover 2268''' until the steel face plate 625''' is flush with the top cover 2268''', which provides a bond between the spring loaded bearing assembly 610''' and the top cover 2268''' of the docking assembly 2220'''. Ball bearing 620''' is steel or other conductive material and is biased towards face plate 625''' by conductive spring 630''' and protrudes beyond face plate 625''' so that it contacts the top of the front door 500'''. The top of the front door 500''' is masked where the ball bearing 620''' will contact the front door 500''', which provides a bond between the bearing assembly 610''' and the front door 500'''. The bearing assemblies are positioned close enough to the bushing 600''' and hinge pin 545''' so that the front door 500''' can open to approximately 160-degrees while maintaining the bond between the front door 500''' and the top cover 2268''' of the docking assembly 2220'''. The use of the bearing assemblies 610''' to create the bond between the front door 500''' and the top cover 2268''' allows for the removal of the front door 500''' without the need to disconnect any jumper wires.

Alternatively, as can be seen in FIGS. 56 and 59, rather than bonding the front door 500''' to the base frame of the docking assembly 2220''' through a spring loaded bearing assembly 610''' in the top cover 2268''' of the docking assembly 2220''', the front door 500''' can be bonded to the base frame of the docking assembly 2220''' through the lifting screw 605''' in the door mount 2260''' of the docking assembly 2220'''. To bond the front door 500''' in this manner, the lifting screw 605''' is first bonded to the door mount 2260'''. This can be done by using a trilobular lifting screw, by placing an internal tooth lock washer between the head of the lifting screw and the door mount 2260''', by using a lifting screw that has teeth on the underside of the head, or by paint masking the portion of the door mount 2260''' that will contact the head of the lifting screw. The hinge pin 545''' is then bonded to the front door 500''', such as by attaching a jumper wire between the hinge pins 545''' and the front door 500'''. Therefore, when the hinge pins 545''' contact the lifting screws 605''', a bond is created between the front door 500''' and the door mount 2260''' of the docking assembly 2220''' through the jumper wire, hinge pins 545''', and lifting screws 605'''.

Referring now to FIGS. 52, 53, and 63-65, each docking assembly 2220 further includes a pair of front cable trays 2276 positioned adjacent each other near a middle of a height of the docking assembly 2220. While the illustrated exemplary embodiment of the docking assembly 2220 includes two adjacent trays 2276 positioned near a middle of the docking assembly 2220, it should be understood that the docking assembly 2220 may include any number of trays 2276 positioned in any manner relative to the docking assembly 2220.

Each tray 2276 is connected, near its ends, to front surfaces 2280 of the rear vertical frame rails 2256 of the docking assembly 2220. Each tray 2276 includes a C-shaped housing comprising a rear wall 2284 (see FIGS. 64 and 65), a top wall 2288, and a bottom wall 2292 (see FIGS. 64 and 65). Openings 2296 (see FIG. 65) are defined in the rear wall 2284 that are alignable with holes in the vertical frame rails 2256 of the docking assembly 2220 and through which fasteners 2298 or fastener combinations 2298 pass to connect the tray 2276 to the vertical frame rails 2256. The top wall 2288 extends from a top end of the rear wall 2284 in a perpendicular direction and substantially parallel to a ground surface upon which the network cabinet 2004" and the docking assembly 2220 rest. The bottom wall 2292 extends from a bottom end of the rear wall 2284 in a perpendicular direction and substantially parallel to a ground surface upon which the network cabinet 2004" and the docking assembly 2220 rest. Ends of the top and bottom walls 2288, 2292 distal the rear vertical frame rails 2256 of the docking assembly 2220 have a hinge configuration 2304 (see FIG. 65) that couples with a lid 2300 of the tray 2276. The lid 2300 includes a complementary configuration that couples with the hinge configuration 2304 of the tray 2276 to facilitate opening of the lid 2300 toward a front of the docking assembly 2220 from either a top or a bottom of the lid 2300 and correspondingly allow the lid 2300 to pivot or hinge about the hinge configuration 2304 of either the top wall 2288 or the bottom wall 2292.

Additionally, each tray 2276 includes open ends 2308 allowing cables to run from one tray 2276 to an adjacent tray 2276 without hindrance. Each tray 2276 further includes a pair of openings 2312 in the top wall 2288, one near each end of the tray 2276, and a pair of openings in the bottom wall 2292, one near each end of the tray 2276. These tray openings allow cables to enter and exit the tray 2276 as desired. When trays 2276 are vertically stacked and positioned adjacent to each other, openings in the bottom wall 2292 of the top tray 2276 align with openings 2312 in the top wall 2288 of the bottom tray 2276 to allow cables from the top tray 2276 to exit downward and allow cables from the bottom tray 2276 to exit upward. Additionally, all of the openings in the top tray 2276 and the bottom tray 2276 are vertically aligned to allow cables to pass easily into and out of the trays 2276.

Since the cable trays 2276 are positioned within the docking assembly 2220, the cable trays 2276 should not interfere with the opening and closing of the front door 500", 500''' coupled to the docking assembly 2220. The front 500", 500''' is spaced a distance in front of the rear vertical frame rails 2256 of the docking assembly 2220. To inhibit interference with the front door 500", 500''', the depth of the front cable trays 2276 are less than the distance between the inside of the front door 500", 500''' and the front of the rear vertical frame rails 2256 of the docking assembly 2220. In some exemplary embodiments, it may be desirable to connect ends of adjacent trays 2276 together. Ends of adjacent trays 2276 may be connected in a variety of different manners and all of such manners are intended to be within the intended spirit and scope of the present invention. Exemplary manners of connecting ends of adjacent trays may include, but are not limited to, clips, fasteners, bonding, etc.

An example of a front cable tray 2276 associated with the present invention illustrated in FIGS. 52-67 may be, for example, a PANDUIT® Type HS Hinged Cover Solid Wall Raceway manufactured by Panduit Corporation of Tinley Park, Ill.

To remove one of the server cabinets 2004A", cables must be disconnected from the servers supported by the server cabinet 2004A" and the corresponding docking assembly 2220 must be disconnected from the server cabinet 2004A". The cables are disconnected from the servers and may rest, at least in part, in one or both of the cable trays 2276 and can be moved to the rear cable trays 2180" of the adjacent server cabinet 2004A" or switch cabinet 2004B" while the server cabinet 2004A" is removed. The cable trays 2276 and the rear cable trays 2180" assist with maintaining organization of the cables when they are disconnected from the servers and also provides vertical support to the cables to inhibit excess force on the cables as they hang disconnected from servers. When the docking assembly 2220 is disconnected from the server cabinet 2004A", the cable trays 2276 remain with the docking assembly 2220 and continue to support the cables. The server cabinet 2004A" may then be removed from the data center row from a rear of the data center row. A replacement server cabinet 2004A" may be introduced into the data center row, from a rear of the data center row, to replace the removed server cabinet 2004A". The cables are already well organized and supported, at least in part, in place by the cable trays 2276 and the rear cable trays 2180".

Thus, reconnection of the cables to the servers in the replacement server cabinet 2004A" is relatively easy. Additionally, the replacement server cabinet 2004A" is easily connected to the corresponding docking assembly 2220.

Figure 67:
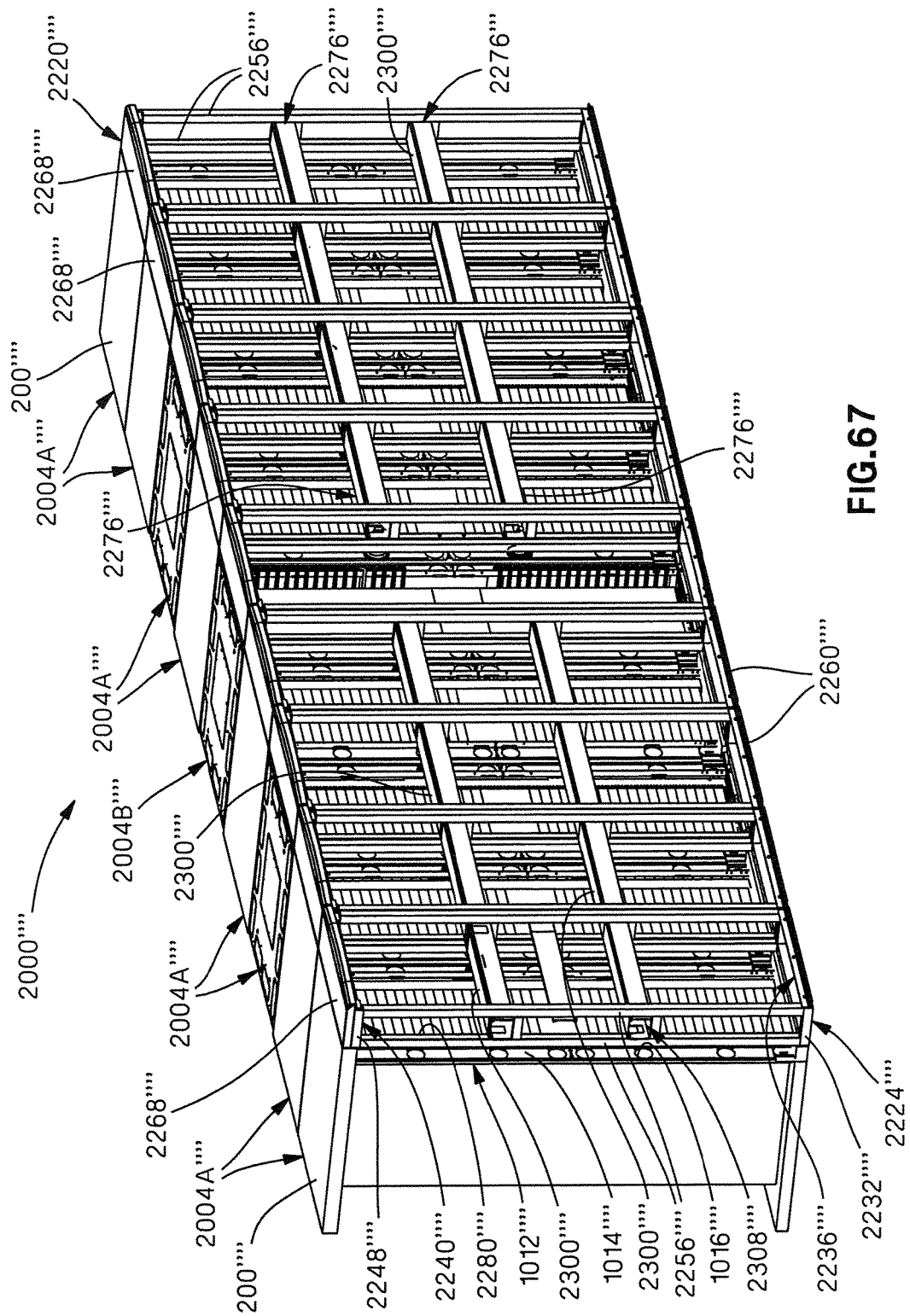
FIG. 67 is a top front perspective view of a plurality of network cabinets and a plurality of other exemplary docking assemblies of the present invention.

Referring now to FIG. 67, another exemplary embodiment of the present invention is illustrated and includes a data center 2000"" having many similarities to the data center illustrated in FIGS. 52-66. At least one difference between the data center 2000"" illustrated in FIG. 67 and the data center illustrated in FIGS. 52-66 is that the data center 2000"" illustrated in FIG. 67 includes front cable trays 2276"" that are positioned in a spaced apart manner from one another. In the illustrated exemplary embodiment, the front cable trays 2276"" are positioned at approximately the one-third and two-third height positions of the docking assemblies 2220"". Since the trays 2276"" are not stacked immediately on top of one another, the lids 2300"" of the front cable trays 2276"" may open upward rather than to a front as was the case with the front cable trays 2276 illustrated in FIGS. 52-66. In order for the lids 2300"" to open upward, the trays 2276"" are rotated ninety degrees such that the C-shaped housing now opens upward and the lid 2300"" is disposed on top. Openings 2296"" are now defined in what was the top wall of the trays illustrated in FIGS. 52-66, which, in its new rotated position for the embodiment illustrated in FIG. 67, is now the rear wall. Such openings 2296"" are aligned with openings in the front surfaces 2280"" of the rear vertical frame rails 2256"" of the docking assembly 2220"" through which fasteners 2298"" or fastener combinations 2298"", such as those described above, pass to connect the front cable trays 2276"" to the rear vertical frame rails 2256"" of the docking assembly 2220"".

The foregoing description has been presented for purposes of illustration and description, and is not intended to be exhaustive or to limit the invention to the precise form disclosed. The descriptions were selected to explain the principles of the invention and their practical application to enable others skilled in the art to utilize the invention in various embodiments and various modifications as are suited to the particular use contemplated. Although particular constructions of the present invention have been shown and described, other alternative constructions will be apparent to those skilled in the art and are within the intended scope of the present invention.

We claim:

1. A method of installing a cable management system for a network cabinet, comprising the steps of:
    mounting first and second air dams to a base frame of the network cabinet such that the air dams extend from the base frame towards opposing sides of the network cabinet;
    connecting a docking assembly to a front of the network cabinet, the docking assembly comprising a docking assembly base frame defining an internal area;
    positioning a generally C-shaped cable tray within the internal area of the docking assembly and connecting the cable tray to the docking assembly; and
    positioning one of the first and second air dams such that a resilient member extending from an outer end of the air dam engages a second resilient member extending from an outer end of an adjacent air dam mounted to an adjacent network cabinet.

2. The method of installing a cable management system of claim 1, wherein the first and second air dams are mounted to outer surfaces of corresponding outer surfaces of front vertical frame rails of the network cabinet.

3. The method of installing a cable management system of claim 1, further comprising the step of connecting the docking assembly to a second, adjacent docking assembly.

4. The method of installing a cable management system of claim 1, further comprising the step of positioning the cable tray midway along a height of the docking assembly.

5. The method of installing a cable management system of claim 1, further comprising the step of:
connecting a door mount to a front of the docking assembly base frame;
connecting a top cover to a top of the docking assembly base frame, the top cover extending past the front of the docking assembly base frame; and
mounting a door to the door mount and the top cover.

6. The method of installing a cable management system of claim 1, further comprising the step of aligning a generally U-shaped rear cable tray with an aperture formed in the air dam such that the rear cable tray extends longitudinally from a rear surface of the air dam and connecting the rear cable tray to at least one vertical frame rail of the network cabinet.

7. The method of installing a cable management system of claim 1, further comprising the step of mounting a sealing assembly to one of the first and second air dams adjacent an aperture formed in the air dam.

8. The method of installing a cable management system of claim 7, wherein the step of mounting the sealing assembly comprises the steps of:
positioning a frame adjacent the air dam and over the aperture in the air dam;
positioning a flexible sleeve adjacent the frame, the flexible sleeve comprising a top portion, a bottom portion, and a hook and loop type fastener attached to the top portion and being configured to receive at least one cable therethrough;
positioning a cover over the frame and the bottom portion of the sleeve; and
securing the frame, sleeve, and cover to the air dam.

9. The method of installing a cable management system of claim 8, further comprising the step of:
positioning a grommet adjacent the aperture in the air dam, the grommet having a first wall having a plurality of apertures for connecting the grommet to the air dam and a flexible second wall that extends substantially perpendicular to the first wall and through the aperture to protect the cable from sharp edges associated with the aperture in the air dam.

10. A method of installing a cable management system for a network cabinet, comprising the steps of:
mounting first and second air dams to a base frame of the network cabinet such that the air dams extend from the base frame towards opposing sides of the network cabinet;
connecting a docking assembly to a front of the network cabinet, the docking assembly comprising a docking assembly base frame defining an internal area;
positioning a generally C-shaped cable tray within the internal area of the docking assembly and connecting the cable tray to the docking assembly;
connecting a door mount to a front of the docking assembly base frame;
connecting a top cover to a top of the docking assembly base frame, the top cover extending past the front of the docking assembly base frame; and
mounting a door to the door mount and the top cover.

11. A method of installing a cable management system for a network cabinet, comprising the steps of:
mounting first and second air dams to a base frame of the network cabinet such that the air dams extend from the base frame towards opposing sides of the network cabinet;
connecting a docking assembly to a front of the network cabinet, the docking assembly comprising a docking assembly base frame defining an internal area;
positioning a generally C-shaped cable tray within the internal area of the docking assembly and connecting the cable tray to the docking assembly; and
aligning a generally U-shaped rear cable tray with an aperture formed in the air dam such that the rear cable tray extends longitudinally from a rear surface of the air dam and connecting the rear cable tray to at least one vertical frame rail of the network cabinet.

12. A method of installing a cable management system for a network cabinet, comprising the steps of:
mounting first and second air dams to a base frame of the network cabinet such that the air dams extend from the base frame towards opposing sides of the network cabinet;
connecting a docking assembly to a front of the network cabinet, the docking assembly comprising a docking assembly base frame defining an internal area;
positioning a generally C-shaped cable tray within the internal area of the docking assembly and connecting the cable tray to the docking assembly; and
mounting a sealing assembly to one of the first and second air dams adjacent an aperture formed in the air dam.

13. The method of installing a cable management system of claim 12, wherein the step of mounting the sealing assembly comprises the steps of:
positioning a frame adjacent the air dam and over the aperture in the air dam;
positioning a flexible sleeve adjacent the frame, the flexible sleeve comprising a top portion, a bottom portion, and a hook and loop type fastener attached to the top portion and being configured to receive at least one cable therethrough;
positioning a cover over the frame and the bottom portion of the sleeve; and
securing the frame, sleeve, and cover to the air dam.

14. The method of installing a cable management system of claim 13, further comprising the step of:
positioning a grommet adjacent the aperture in the air dam, the grommet having a first wall having a plurality of apertures for connecting the grommet to the air dam and a flexible second wall that extends substantially perpendicular to the first wall and through the aperture to protect the cable from sharp edges associated with the aperture in the air dam.

* * * * *